US012813255B2

(12) United States Patent
Zhu et al.

(10) Patent No.: US 12,813,255 B2
(45) Date of Patent: Nov. 24, 2026

(54) THREE-DIMENSIONAL MEMORY DEVICE AND METHOD OF MAKING THEREOF INCLUDING EXPANDED SUPPORT OPENINGS AND DOUBLE SPACER WORD LINE CONTACT FORMATION

(71) Applicant: Sandisk Technologies, Inc., Milpitas, CA (US)

(72) Inventors: Ruogu Matthew Zhu, San Jose, CA (US); Koichi Matsuno, Fremont, CA (US); Seyyed Ehsan Esfahani Rashidi, Milpitas, CA (US); Jixin Yu, Milpitas, CA (US); Johann Alsmeier, San Jose, CA (US)

(73) Assignee: Sandisk Technologies, Inc., Milpitas, CA (US)

(*) Notice: Subject to any disclaimer, the term of this patent is extended or adjusted under 35 U.S.C. 154(b) by 429 days.

(21) Appl. No.: 18/358,702

(22) Filed: Jul. 25, 2023

(65) Prior Publication Data

US 2024/0250023 A1 Jul. 25, 2024

Related U.S. Application Data

(60) Provisional application No. 63/480,636, filed on Jan. 19, 2023.

(51) Int. Cl.
*H10W 20/41* (2026.01)
*G11C 5/06* (2006.01)
(Continued)

(52) U.S. Cl.
CPC ........... *H10W 20/435* (2026.01); *G11C 5/063* (2013.01); *G11C 16/0483* (2013.01);
(Continued)

(58) Field of Classification Search
CPC .... H10W 20/435; H10W 20/42; G11C 5/063; G11C 16/0483; H10B 41/10; H10B 41/27;
(Continued)

(56) References Cited

U.S. PATENT DOCUMENTS 9,601,502 B2 3/2017 Sano et al.
9,853,038 B1 12/2017 Cui
(Continued)

OTHER PUBLICATIONS

ISR—Notification of Transmittal of The International Search Report and Written Opinion of the International Searching Authority for International Patent Application No. PCT/US2023/081643, mailed Apr. 10, 2024, 10 pages.
(Continued)

*Primary Examiner* — Steven H Loke
*Assistant Examiner* — Khatib A Rahman
(74) *Attorney, Agent, or Firm* — THE MARBURY LAW GROUP PLLC

(57) ABSTRACT

A memory device includes at least one alternating stack of respective insulating layers and respective electrically conductive layers and memory stack structures vertically extending through the at least one alternating stack. A layer contact via structure contacts a top surface of one of the electrically conductive layers, and is laterally surrounded by at least one dielectric spacer, which may include a plurality of dielectric spacers, and optionally by a plurality of dielectric support pillar structures. Additionally or alternatively, the layer contact via structure may comprise a convex surface segment that is adjoined to a straight sidewall segment.

16 Claims, 88 Drawing Sheets

(51) Int. Cl.

| | |
|---|---|
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10W 20/42*** | (2026.01) |

(52) U.S. Cl.
CPC ............. *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10W 20/42* (2026.01)

(58) Field of Classification Search
CPC ........ H10B 41/35; H10B 43/10; H10B 43/27; H10B 43/35; H10B 43/40; H10B 43/50; H01L 21/76805; H01L 21/76816; H01L 23/5226
See application file for complete search history.

(56) References Cited

U.S. PATENT DOCUMENTS

| | | | | |
|---|---|---|---|---|
| 9,960,181 | B1 | 5/2018 | Cui et al. | |
| 10,685,979 | B1 * | 6/2020 | Lu | H10B 43/10 |
| 10,707,233 | B1 * | 7/2020 | Cui | H10B 41/27 |
| 10,748,927 | B1 * | 8/2020 | Tsutsumi | H10B 41/41 |
| 10,756,186 | B2 * | 8/2020 | Chen | H10B 41/27 |
| 10,777,575 | B1 * | 9/2020 | Cui | H10B 43/10 |
| 10,804,282 | B2 * | 10/2020 | Baraskar | H10B 41/50 |
| 11,450,679 | B2 | 9/2022 | Tanaka et al. | |
| 11,488,975 | B2 | 11/2022 | Totoki et al. | |
| 11,495,612 | B2 | 11/2022 | Tanaka et al. | |
| 12,272,616 | B2 | 4/2025 | Yu et al. | |
| 12,532,475 | B2 | 1/2026 | Ogawa et al. | |
| 2020/0027835 | A1 | 1/2020 | Hsu et al. | |
| 2020/0303398 | A1 | 9/2020 | Otsu et al. | |
| 2022/0005818 | A1 | 1/2022 | Tanaka et al. | |
| 2022/0005824 | A1 | 1/2022 | Tanaka et al. | |
| 2022/0328413 | A1 | 10/2022 | Kubo et al. | |
| 2022/0352093 | A1 | 11/2022 | Yamada et al. | |
| 2022/0406379 | A1 | 12/2022 | Takeguchi et al. | |
| 2022/0406720 | A1 | 12/2022 | Hinoue et al. | |
| 2022/0406793 | A1 | 12/2022 | Takeguchi et al. | |
| 2022/0415907 | A1 | 12/2022 | Watanabe et al. | |
| 2023/0038557 | A1 | 2/2023 | Ogawa et al. | |
| 2023/0041950 | A1 | 2/2023 | Chibvongodze et al. | |
| 2023/0045001 | A1 | 2/2023 | Ogawa et al. | |
| 2023/0171965 | A1 * | 6/2023 | Lee | H10B 41/27 257/314 |
| 2023/0284443 | A1 | 9/2023 | Okina et al. | |
| 2023/0389338 | A1 | 11/2023 | Kang | |
| 2023/0413525 | A1 | 12/2023 | Lee et al. | |
| 2024/0090217 | A1 | 3/2024 | Nabesaka et al. | |
| 2024/0121960 | A1 | 4/2024 | Rajashekhar et al. | |
| 2024/0213145 | A1 | 6/2024 | Miyamoto et al. | |
| 2024/0251551 | A1 | 7/2024 | Zhu et al. | |
| 2024/0260266 | A1 | 8/2024 | Hosoda et al. | |
| 2024/0371789 | A1 | 11/2024 | Matsuno et al. | |
| 2026/0013125 | A1 | 1/2026 | Zhu et al. | |

OTHER PUBLICATIONS

Zhu, R. M. et al., "Three-Dimensional Memory Device and Method of Making Thereof Including Expanded Support Openings and Double Spacer Word Line Contact Formation," U.S. Appl. No. 18/358,727, filed Jul. 25, 2023.
IPRP-WO—Notification Concerning Transmittal of International Preliminary Report On Patentability and. Written Opinion of the International Searching Authority for International Patent Application No. PCT/US2023/081643, mailed Jul. 31, 2025, 5 pages.
Endoh et al., "Novel Ultra High-Density Memory with a Stacked-Surrounding Gate Transistor (S-SGT) Structured Cell," IEDM Proc. (2001) 33-36.
U.S. Appl. No. 17/556,298, filed Dec. 20, 2021, SanDisk Technologies LLC.
U.S. Appl. No. 17/663,951, filed May 18, 2022, SanDisk Technologies LLC.
U.S. Appl. No. 17/684,922, filed Mar. 2, 2022, SanDisk Technologies LLC.
U.S. Appl. No. 17/804,184, filed May 26, 2022, SanDisk Technologies LLC.
U.S. Appl. No. 17/806,390, filed Jun. 10, 2022, SanDisk Technologies LLC.
U.S. Appl. No. 17/806,579, filed Jun. 13, 2022, SanDisk Technologies LLC.
U.S. Appl. No. 17/807,804, filed Jun. 20, 2022, SanDisk Technologies LLC.
U.S. Appl. No. 17/822,182, filed Aug. 25, 2022, SanDisk Technologies LLC.
U.S. Appl. No. 18/062,807, filed Dec. 7, 2022, SanDisk Technologies LLC.
U.S. Appl. No. 18/221,689, filed Jul. 13, 2023, SanDisk Technologies LLC.
U.S. Appl. No. 18/221,711, filed Jul. 13, 2023, SanDisk Technologies LLC.
U.S. Appl. No. 18/352,726, filed Jul. 14, 2023, SanDisk Technologies LLC.
U.S. Appl. No. 18/352,752, filed Jul. 14, 2023, SanDisk Technologies LLC.
U.S. Appl. No. 18/353,577, filed Jul. 17, 2023, SanDisk Technologies LLC.
U.S. Appl. No. 18/354,283, filed Jul. 18, 2023, SanDisk Technologies LLC.
U.S. Appl. No. 18/354,325, filed Jul. 18, 2023, SanDisk Technologies LLC.
U.S. Appl. No. 18/355,067, filed Jul. 19, 2023, SanDisk Technologies LLC.
USPTO Office Communication, Non-Final Office Action for U.S. Appl. No. 18/358,727, mailed on Mar. 5, 2026, 25 pages.

* cited by examiner

THREE-DIMENSIONAL MEMORY DEVICE AND METHOD OF MAKING THEREOF INCLUDING EXPANDED SUPPORT OPENINGS AND DOUBLE SPACER WORD LINE CONTACT FORMATION

FIELD

The present disclosure relates generally to the field of semiconductor devices, and particularly to methods for forming a three-dimensional memory device including expanded support openings and double spacer word line contact formation, and structures formed by the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: at least one alternating stack of insulating layers and electrically conductive layers; memory stack structures vertically extending through the at least one alternating stack, wherein each of the memory stack structures comprises a respective vertical stack of memory elements and a vertical semiconductor channel; an electrically conductive layer contact via structure vertically extending through an upper portion of the at least one alternating stack and contacting a top surface of one of the electrically conductive layers; a plurality of support pillar structures having at least a dielectric outer sidewall vertically extending through each layer within the at least one alternating stack and contacting a respective first sidewall segment of the layer contact via structure; and a plurality of dielectric spacers vertically extending through the upper portion of the at least one alternating stack and contacting a respective second sidewall segment of the layer contact via structure.

According to another aspect of the present disclosure, a method of forming a semiconductor structure is provided. The method comprises: forming a first alternating stack of first insulating layers and first sacrificial material layers over a substrate; forming first sacrificial pillar structures through the first alternating stack; forming a first via cavity through a subset of layers within the first alternating stack; forming a first sacrificial via fill structure in a volume of the first via cavity; forming pillar cavities by removing at least the first sacrificial pillar structures; laterally expanding at least some of the pillar cavities by performing at least one isotropic etch process; forming dielectric pillar structures in the laterally expanded pillar cavities; replacing the first sacrificial material layers with first electrically conductive layers; and replacing the via-shaped material portion with an electrically conductive layer contact via structure that directly contacts a top surface of one of the first electrically conductive layers.

According to yet another aspect of the present disclosure, a device structure is provided, which comprises: at least one alternating stack of respective insulating layers and respective electrically conductive layers that are interlaced along a vertical direction; memory stack structures vertically extending through the at least one alternating stack, wherein each of the memory stack structures comprises a respective vertical stack of memory elements and a vertical semiconductor channel; and an electrically conductive layer contact via structure vertically extending through an upper portion of the at least one alternating stack and contacting a top surface of one of the electrically conductive layers, wherein the layer contact via structure is electrically isolated from each electrically conductive layer within the at least one alternating stack that overlies the one of the electrically conductive layers by a set of at least one dielectric isolation structure that comprises a first dielectric spacer, and wherein a sidewall of the layer contact via structure comprises a first straight sidewall segment that contacts a first portion of the first dielectric spacer and a first convex surface segment that contacts a concave surface of a second portion of the first dielectric spacer.

According to still another aspect of the present disclosure, a method of forming a semiconductor structure is provided. The method comprises: forming a first alternating stack of first insulating layers and first sacrificial material layers over a substrate; forming a first via cavity through a subset of layers within the first alternating stack; forming a layer stack of a dielectric spacer material layer and a sacrificial spacer material layer in the first via cavity and over the first alternating stack; forming a tubular sacrificial spacer by anisotropically etching the sacrificial spacer material layer; performing an isotropic etch process that etches a material of the dielectric spacer material layer selective to a material of the tubular sacrificial spacer, wherein a remaining portion of the dielectric spacer material layer comprises a main dielectric spacer portion; removing the tubular sacrificial spacer; forming a first sacrificial via fill structure in a void in the first via cavity; replacing the first sacrificial material layers with first electrically conductive layers; and replacing the first sacrificial via fill structure with an electrically conductive layer contact via structure that directly contacts a top surface of one of the first electrically conductive layers.

DETAILED DESCRIPTION

Figure 1:
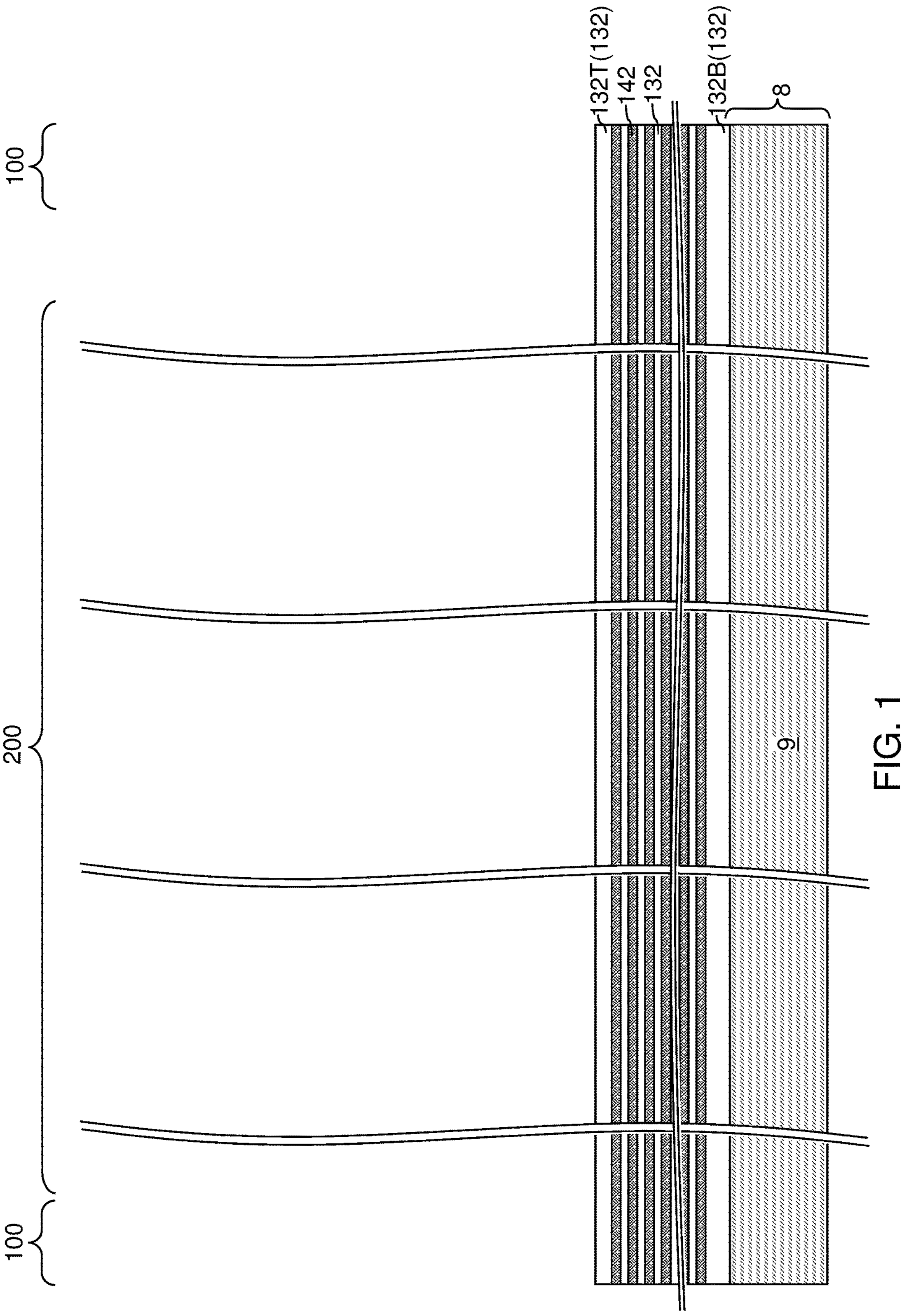
FIG. 1 is a vertical cross-sectional view of an exemplary structure after formation of a first alternating stack of first insulating layers and first sacrificial material layers according to an embodiment of the present disclosure.

As discussed above, the embodiments of the present disclosure are directed to a three-dimensional memory device and methods of forming the same including expanded support openings and double spacer word line contact formation, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure includes a substrate 8, such as a silicon wafer. The substrate 8 comprises a substrate material layer 9 at least at an upper portion thereof. In one embodiment, the substrate material layer 9 may be a semiconductor material layer, such as a doped well in a silicon wafer or an epitaxial silicon layer located on the silicon wafer. The exemplary structure comprises memory array regions 100 in which a three-dimensional memory array is subsequently formed, a contact region 200 in which layer contact via structures are subsequently formed.

An alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first alternating stack. The level of the first alternating stack is herein referred to as a first-tier level, and the level of the alternating stack to be subsequently formed immediately above the first-tier level is herein referred to as a second-tier level, etc.

The first alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While an embodiment is described in which sacrificial material layers are replaced with electrically conductive layers, alternative embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first alternating stack (132, 142) may have a uniform thickness that is substantially invariant within each respective first sacrificial material layer 142. In one embodiment, the bottommost layer of the first alternating stack (132, 142) may be the bottommost one of the first insulating layers 132, which is herein referred to as a bottommost first insulating layer 132B or a bottommost insulating layer. The topmost layer of the first alternating stack (132, 142) may be a topmost one of the first insulating layers, which is herein referred to as a topmost first insulating layer 132T.

Figure 2A:
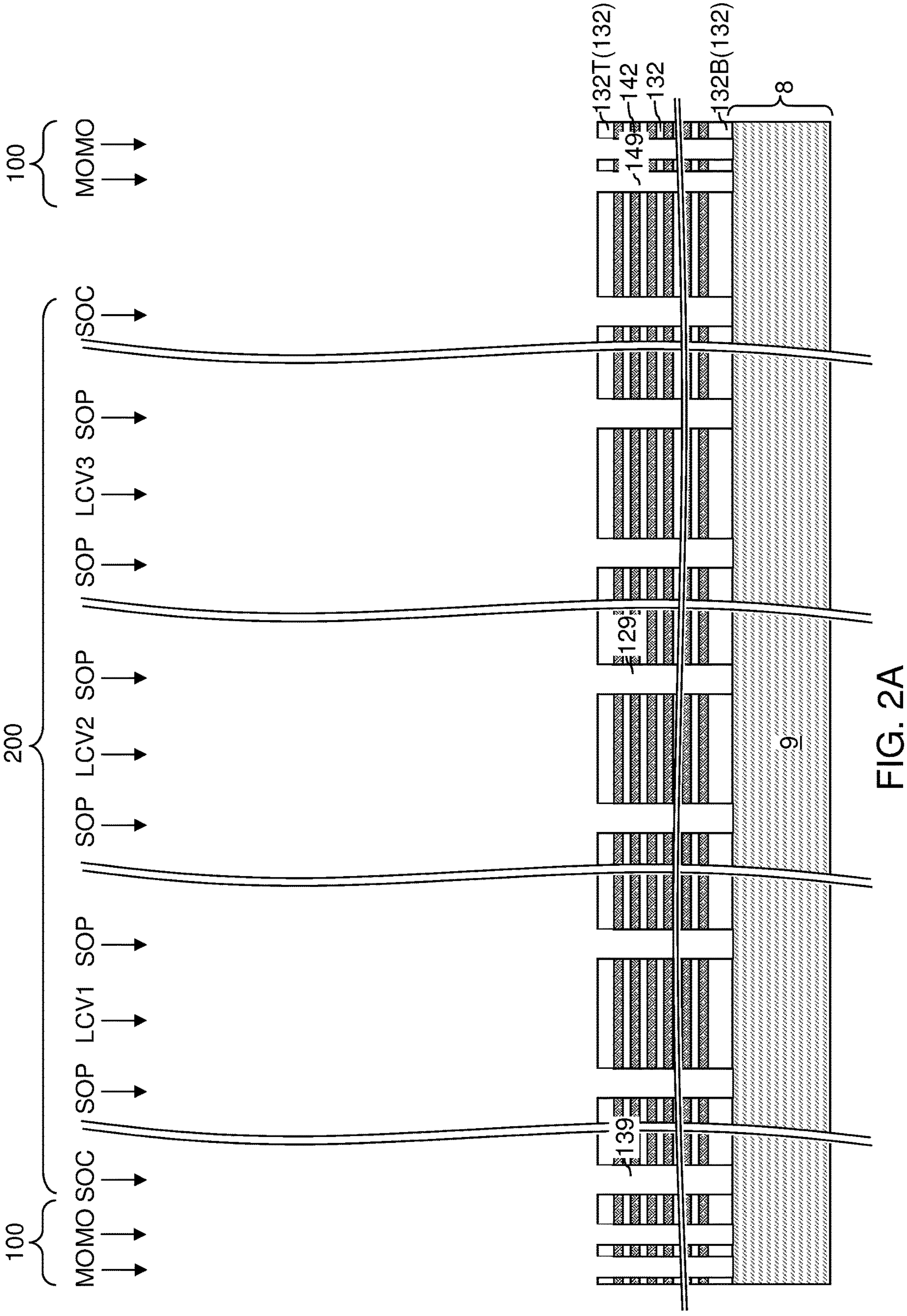
FIG. 2A is a vertical cross-sectional view of the exemplary structure after formation of first-tier openings according to an embodiment of the present disclosure.
Figure 2B:
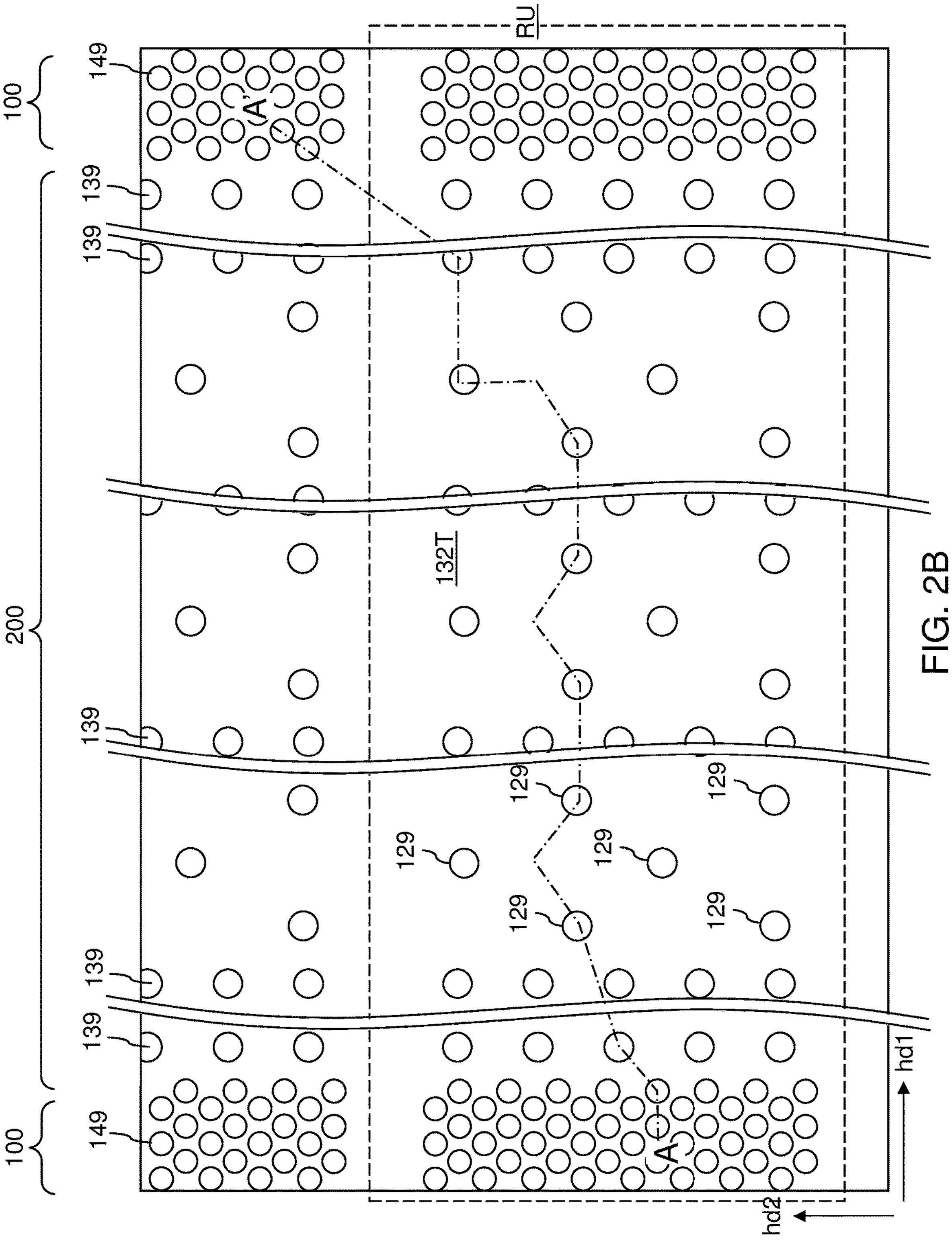
FIG. 2B is a top-down view of the exemplary structure of FIG. 2A. The hinged vertical plane A-A' is a cut plane of the vertical cross-sectional view of FIG. 2A.

Referring to FIGS. 2A and 2B, various first-tier openings (149, 139, 129) may be formed through the first alternating stack (132, 142). A photoresist layer (not shown) may be applied over the first alternating stack (132, 142), and may be lithographically patterned to form various openings therethrough. The pattern of openings in the photoresist layer may be transferred through the first alternating stack (132, 142) by a first anisotropic etch process to form the various first-tier openings (149, 139, 129) concurrently, i.e., during the first isotropic etch process. The various first-tier openings (149, 139, 129) may include first memory openings 149, primary first support openings 129, and supplementary first support openings 139. The locations of the first memory openings 149 are represented by arrows labeled with "MO," the locations of the primary first support openings 129 are represented by arrows labeled with "SOP," and the locations of the supplementary first support openings 139 are represented by arrows labeled with "SOC." Locations of layer contact via structures to be subsequently formed are represented by arrows labeled with "LCV1," "LCV2," and "LCV3."

The first memory openings 149 are openings that are formed in the memory array region 100 through each layer within the first alternating stack (132, 142) and are subsequently used to form memory stack structures therein. The first memory openings 149 may be formed in rows of first memory openings 149 that are arranged along a first horizontal direction (e.g., word line direction) hd1. Clusters of first memory openings 149 may be laterally spaced apart along a second horizontal direction (e.g., bit line direction) hd2. Each cluster of first memory openings 149 may comprise multiple rows of first memory openings 149. In one embodiment, each cluster of first memory openings 149 may be formed as a two-dimensional array of first memory openings 149.

The primary first support openings 129 are openings that are formed in areas around layer contact via structures to be subsequently formed. Primary dielectric support pillar structures can be subsequently formed in and around the areas of the primary first support openings 129. The supplementary first support openings 139 are optional openings that may be subsequently formed in areas distal from layer contact via structures to be subsequently formed. Supplementary dielectric support pillar structures may subsequently be formed in the supplementary first support openings 139. The supplementary first support openings 139 and the supplementary dielectric support pillar structures are optional structures, and as such, may be omitted. In one embodiment, the pattern of the various first-tier openings (149, 139, 129) may be formed with a periodicity along the second horizontal direction hd2 such that a pattern in a repetition unit RU is repeated along the second horizontal direction hd2 with a periodicity.

Figure 3:
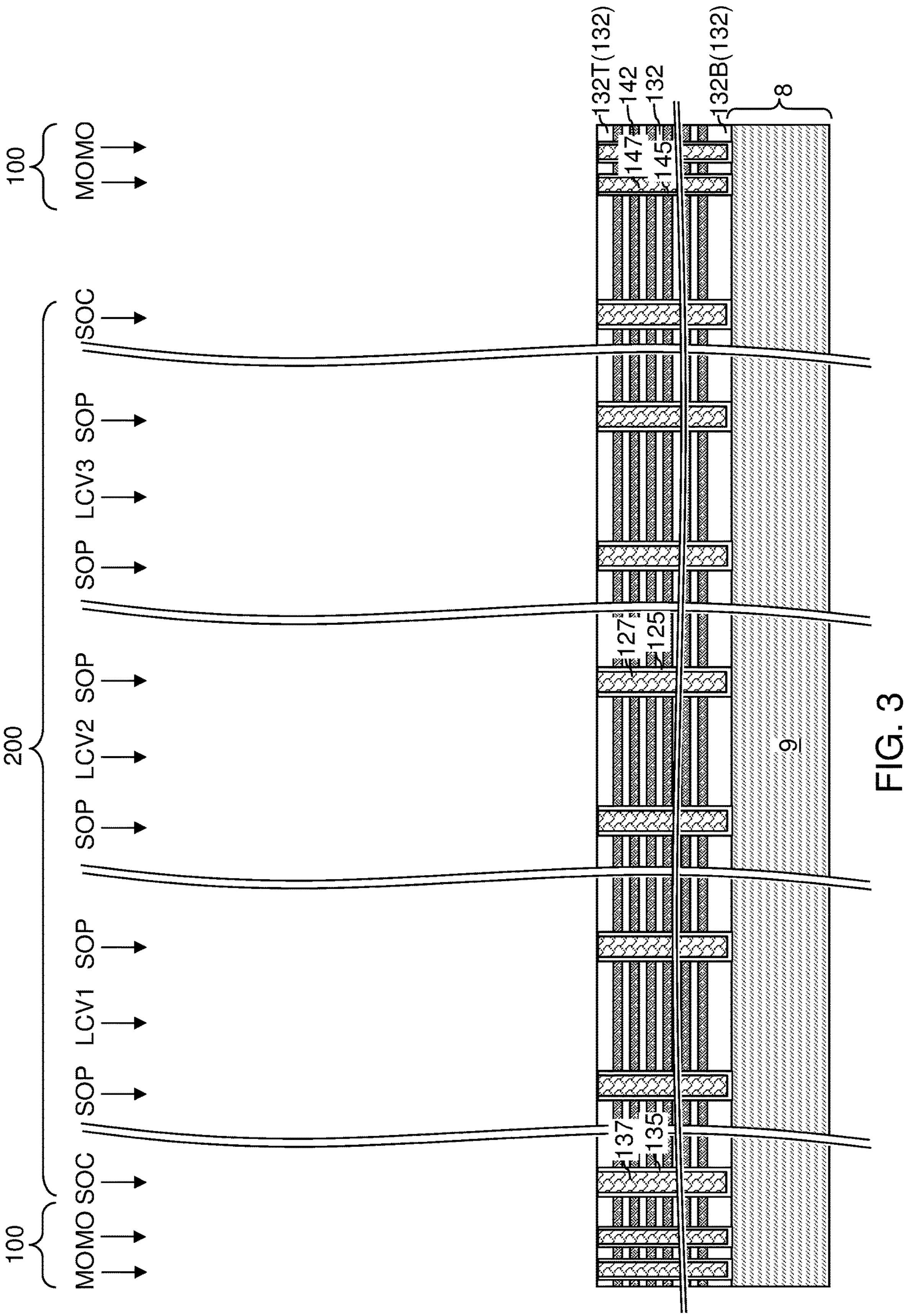
FIG. 3 is a vertical cross-sectional view of the exemplary structure after formation of first sacrificial opening fill structures according to an embodiment of the present disclosure.

Referring to FIG. 3, first sacrificial opening fill structures {(145, 147), (135, 137), (125, 127)} may be formed in the various first-tier openings (149, 129, 139). For example, an optional first-tier etch stop liner and a first sacrificial fill material can be deposited in each of the first-tier openings (149, 129, 139), and excess portions of the optional first-tier etch stop liner and the first sacrificial fill material can be removed from above the horizontal plane including the top surface of the first-tier alternating stack (132, 142). The first sacrificial fill material includes a material that may be subsequently removed selective to the material of the first-tier etch stop liner (if present) or to the materials of the first insulating layers 132 and the first sacrificial material layers 142 if the liner is omitted. The first-tier etch stop liner includes a thin etch stop material layer, such as a silicon oxide layer or a silicon nitride layer, having a thickness in a range from 1 nm to 3 nm. The first sacrificial fill material may be formed by a non-conformal deposition or a conformal deposition method.

In one embodiment, the first sacrificial fill material may include a semiconductor material such as silicon (e.g., a-Si or polysilicon), a silicon-germanium alloy, germanium, a III-V compound semiconductor material, or a combination thereof. In another embodiment, the first sacrificial fill material may include a silicon oxide material having a higher etch rate than the materials of the first insulating layers 132. For example, the first sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the first sacrificial fill material. The first sacrificial fill material may be formed by a non-conformal deposition or a conformal deposition method. In yet another embodiment, the first sacrificial fill material may include a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first alternating stack (132, 142) by a planarization process. The planarization process may include a recess etch, chemical mechanical planarization (CMP), or a combination thereof. Remaining portions of the first sacrificial fill material comprise first sacrificial opening fill structures {(145, 147), (135, 137), (125, 127)}. For example, a first sacrificial memory opening fill structure (145, 147) may be formed in each first memory opening 149. A primary first sacrificial pillar structure (125, 127) may be formed in each primary first sacrificial opening 129. A supplementary first sacrificial pillar structure (135, 137) may be formed in each supplementary first sacrificial opening 139. Each first sacrificial memory opening fill structure (145, 147) may comprise an optional first etch stop liner 145 and a first sacrificial memory opening fill material portion 147. Each primary first sacrificial pillar structure (125, 127) may comprise an optional first etch stop liner 125 and a primary first sacrificial fill material portion 127. Each supplementary first sacrificial pillar structure (135, 137) may comprise an optional first etch stop liner 135 and a supplementary first sacrificial fill material portion 137. The top surfaces of the first sacrificial opening fill structures {(145, 147), (135, 137), (125, 127)} may be coplanar with the top surface of the topmost first insulating layer 132T. Each of the first sacrificial opening fill structures {(145, 147), (135, 137), (125, 127)} may or may not, include cavities therein.

Figure 4A:
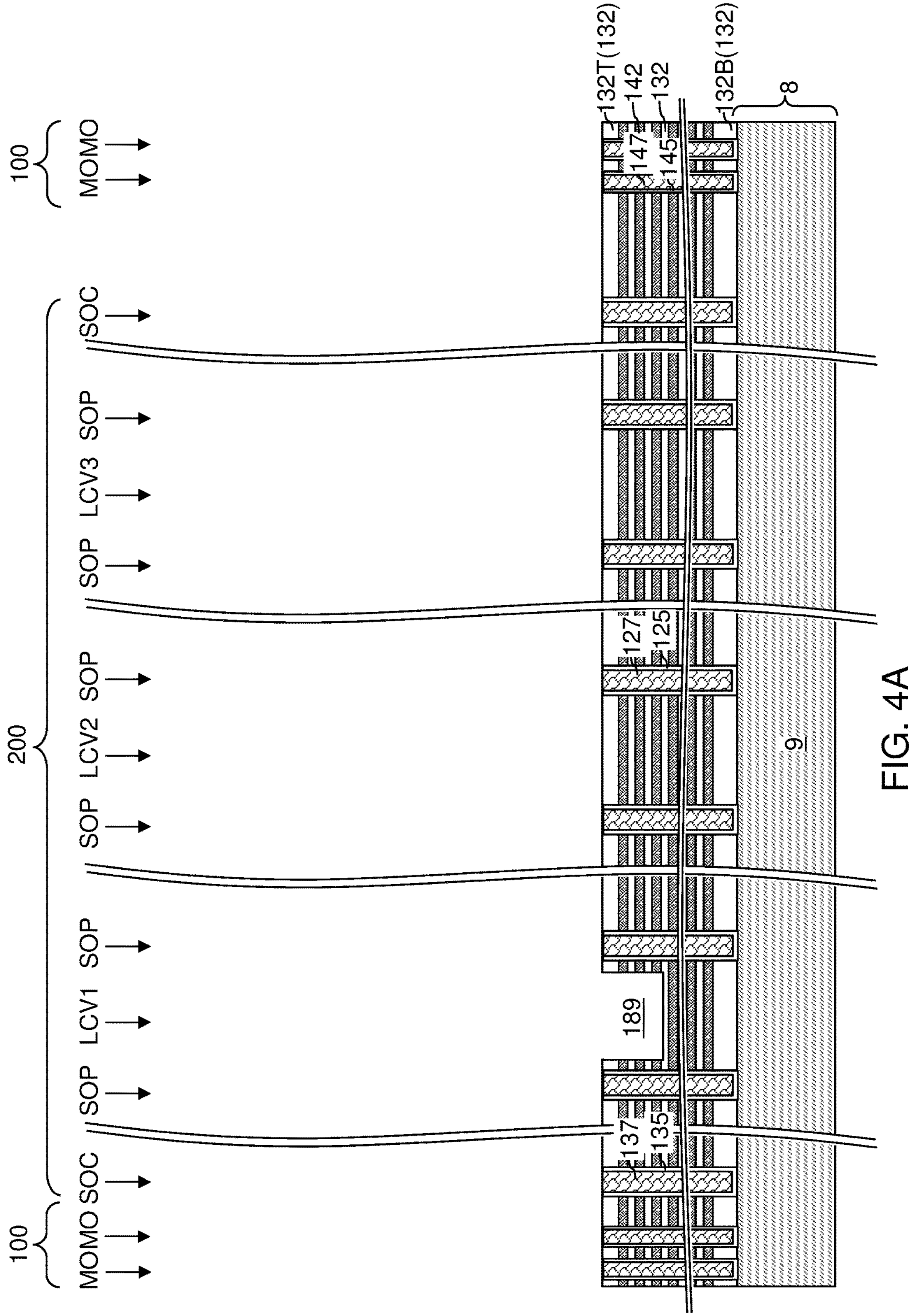
FIG. 4A is a vertical cross-sectional view of the exemplary structure after formation of first via cavities according to an embodiment of the present disclosure.
Figure 4B:
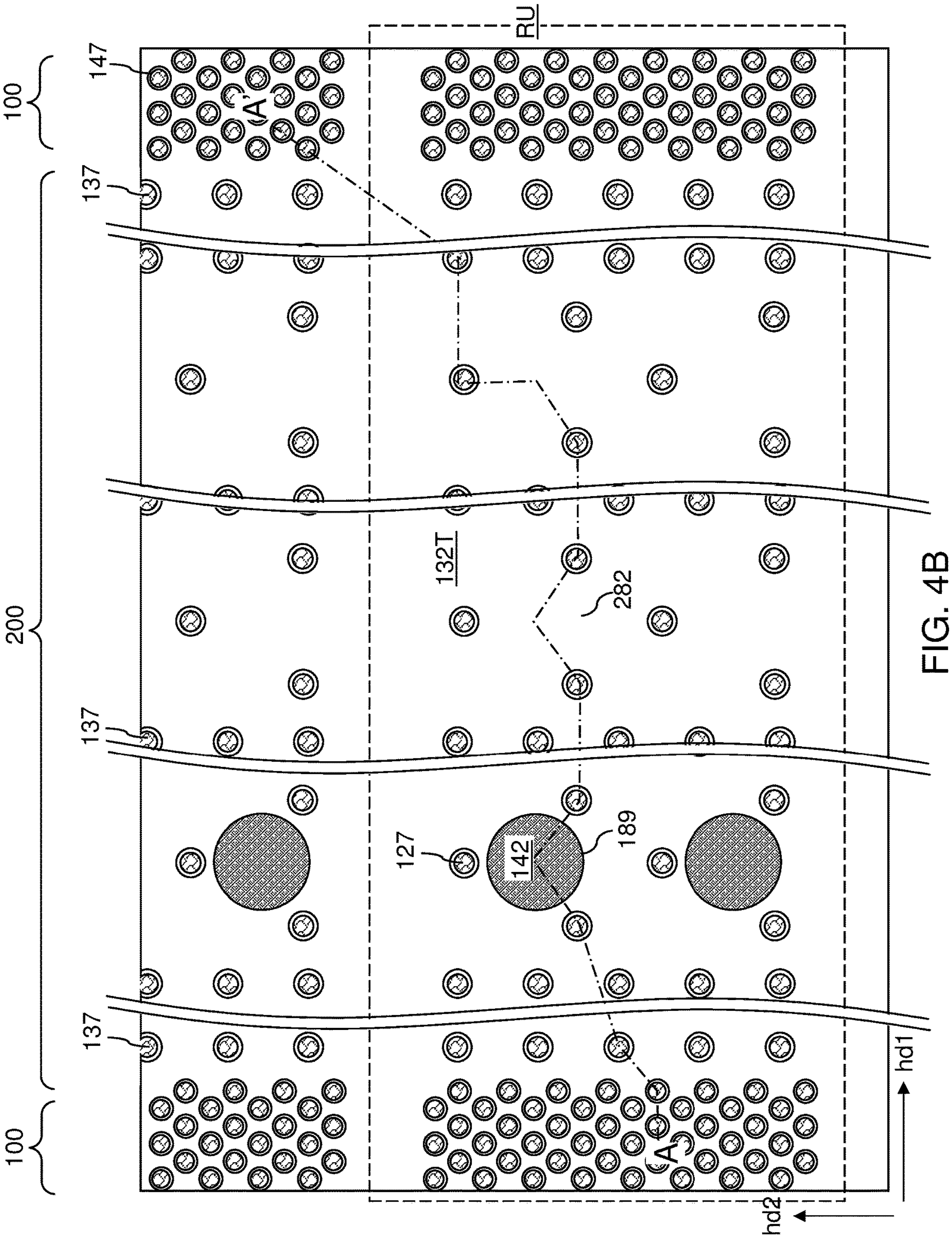
FIG. 4B is a top-down view of the exemplary structure of FIG. 4A. The hinged vertical plane A-A' is a cut plane of the vertical cross-sectional view of FIG. 4A.

Referring to FIGS. 4A and 4B, first via cavities 189 having different depths may be formed in the contact region 200. The first via cavities 189 can be formed such that each first insulating layer 132 except the bottommost first insulating layer 132B is physically exposed to at least one first via cavity 189. Alternatively, the first sacrificial materials 142 may be exposed at the bottom of the first via cavities 189. The first via cavities 189 can be formed at locations at which first layer contact via structures (e.g., word line contact via structures) are to be subsequently formed. The locations of the first via cavities 189 are herein referred to as first layer contact via locations LCV1.

For example, a patterned hard mask layer (not shown) can be formed over the first alternating stack (132, 142) such that openings extend through the patterned hard mask layer in areas in which the first via cavities 189 are to be subsequently formed. In case the total number of the first sacrificial material layers 142 is less than $2^N$ in which P is a positive integer, a combination of an etch mask formation process and an anisotropic etch process may be repeated N times with variations in the patterns of openings in the etch masks and with changes in the duration of the anisotropic etch processes. The integer N may be in integer from 2 to 10, such as from 3 to 8. The first via cavities 189 are formed in areas of the openings in the patterned hard mask layer.

For each i-th iteration of the combination of an etch mask formation process and an anisotropic etch process for which the integer i runs from 1 to N, an i-th masking layer, such as an i-th photoresist, can be applied over the patterned hard mask layer (not illustrated), and can be lithographically patterned to form openings therethrough. The areas of the pattern of the openings in the i-th masking layer includes areas of an i-th subset of the mask openings in the patterned hard mask layer. In one embodiment, the i-th subset of the mask openings may comprise about one half of all i-th subset of the mask openings.

An i-th anisotropic etch process can be performed to transfer the pattern of the openings in the i-th masking layer through a respective set of F(i) first insulating layers 132 and F(i) first sacrificial material layers 142 within each opening in the i-th masking layer. In one embodiment, each function F(i) may have a different positive integer value for each integer value i. In one embodiment, the value of each function F(i) may be positive integers that are integer powers of 2. In an illustrative example, F(i) may be 2(i−1). In another example, F(i) may be 2(N−i). In yet another example, the set of all values for F(i), $0<i<N+1$, may include all integer powers of 2 between 1 and $2^{N-1}$ in any order. In still another example, the set of all values of F(i) may include any set of non-overlapping positive integers less than $2^{N-1}$.

In one embodiment, the first insulating layers 132 can include silicon oxide and the first sacrificial material layers 142 can include a sacrificial material, such as silicon nitride. In this case, an anisotropic etch process that etches F(i) pairs of first insulating layers 132 and first sacrificial material layers 142 can include F(i) iterations of a first anisotropic etch step that etches the sacrificial material of the first sacrificial material layers 142 selective to silicon oxide, and a second anisotropic etch step that etches silicon oxide selective to the sacrificial material of the first sacrificial material layers 142. The i-th subset of the first via cavities 189 can be vertically extended through a respective contiguous set of F(i) first sacrificial material layers 142 and F(i) first insulating layers 132. The i-th subset of the first via cavities 189 can be vertically extended through a respective contiguous set of F(i) first sacrificial material layers 142 and F(i) first insulating layers 132. The i-th masking layer can be subsequently removed, for example, by ashing and/or selective etching.

Generally, the masking patterns for the N masking layers (which may be N patterned photoresist layers) and the set of values for F(i), $0<i<N+1$, may be selected such that the first via cavities 189 (which are formed underneath the mask openings a respective patterned photoresist layer) have different depths. In one embodiment, the masking patterns for the N masking layers (which may be N patterned photoresist layers) and the set of values for F(i), 0<i<N+1, may be selected such that each first insulating layer 132 other than the bottommost first insulating layer 132B is physically exposed to a respective first via cavity 189.

The patterned hard mask layer can be removed after formation of the first via cavities 189. Generally, each first via cavity 189 can be formed through a respective subset of layers within the first alternating stack (132, 242). It is understood that only a subset of the first via cavities 189 is illustrated in the drawings.

FIGS. 5A-5J are sequential vertical cross-sectional views of a region around a first via cavity 189 during formation of a first sacrificial via fill structure 183 according to an embodiment of the present disclosure.

Figure 5A:
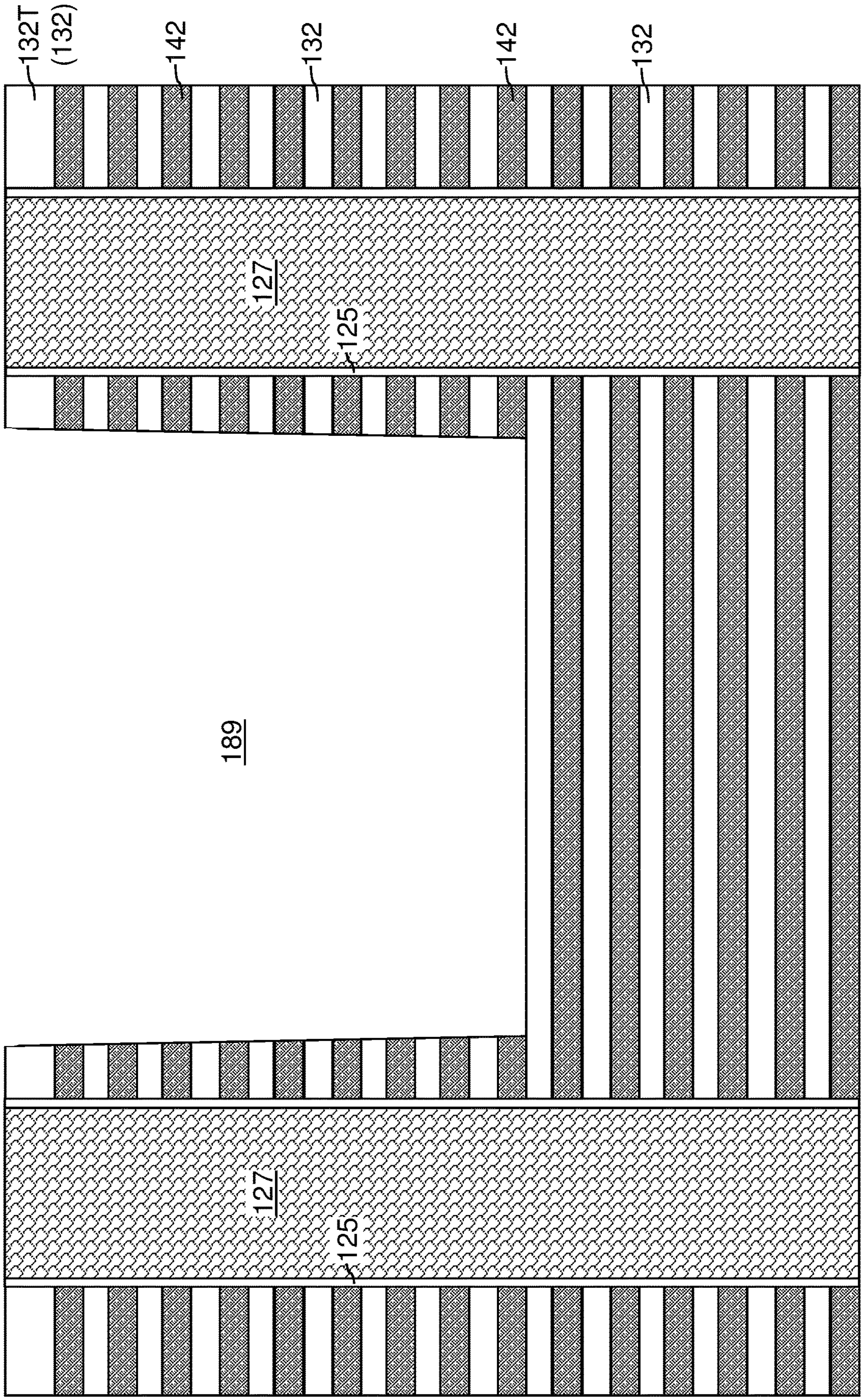
FIGS. 5A-5J are sequential vertical cross-sectional views of a region around a first via cavity during formation of a first sacrificial via fill structure according to an embodiment of the present disclosure.

Referring to FIG. 5A, a first via cavity 189 is illustrated after the processing steps described with reference to FIGS. 4A and 4B. Generally, each first via cavity 189 may be formed by performing a respective anisotropic etch process including a respective terminal etch step that etches one of the first sacrificial material layers 142 selective to a material of the first insulating layers 132. A horizontal top surface of a first insulating layer 132 can be physically exposed at the bottom of each first via cavity 189.

Figure 5B:
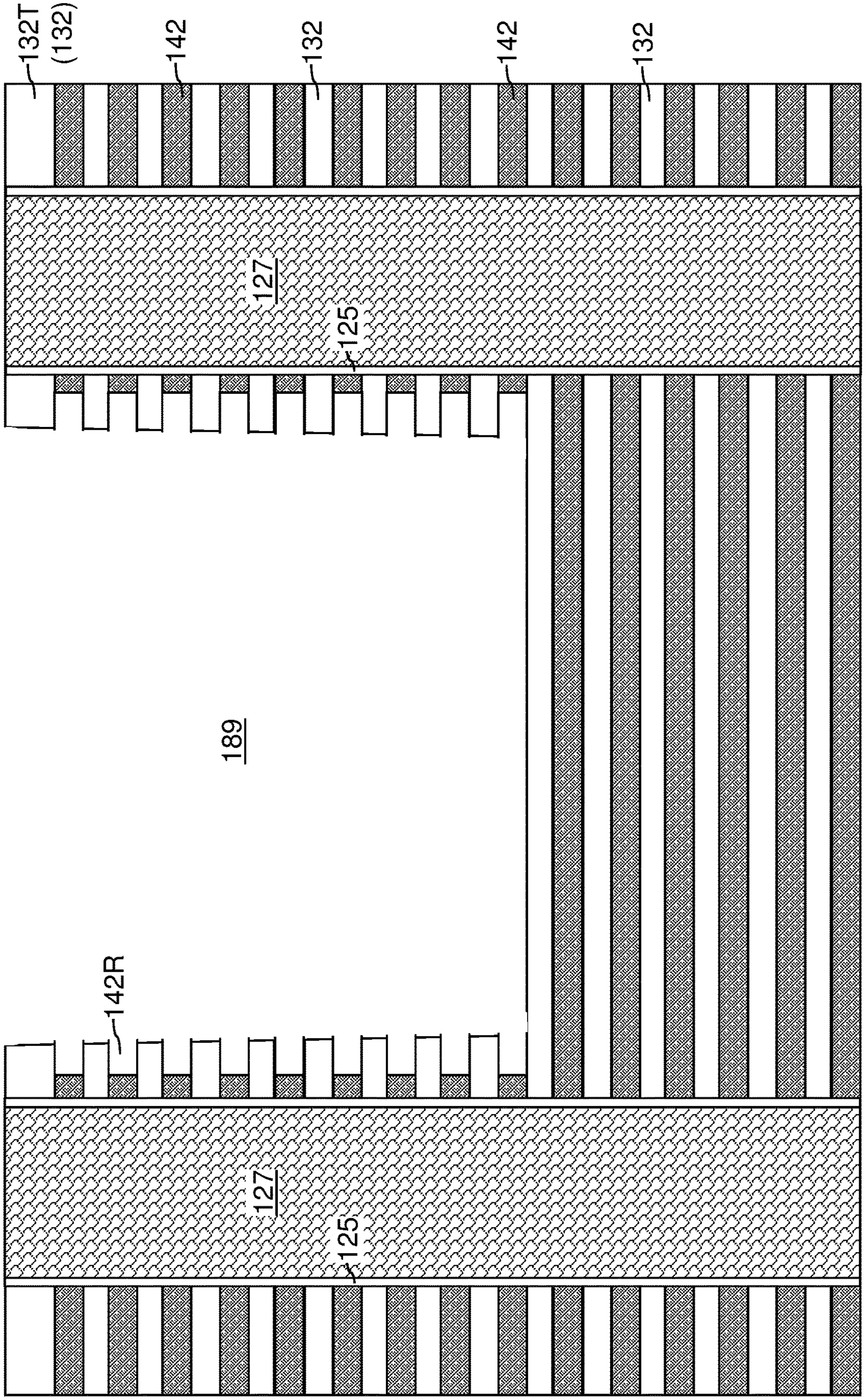

Referring to FIG. 5B, sidewalls of a subset of the first sacrificial material layers 142 that are physically exposed to the first via cavity 189 can optionally be laterally recessed around the first via cavity 189 selective to the first insulating layers 132 by performing an isotropic etch process. In one embodiment, a wet etch process can be performed to etch the material of the first sacrificial material layers 142 selective to the material of the first insulating layers 132. For example, if the first sacrificial material layers 142 comprise silicon nitride and if the first insulating layers 132 comprise silicon oxide, a wet etch process employing hot phosphoric acid can be performed to laterally recess the physically exposed sidewalls of the first sacrificial material layers 142 around each first via cavity 189. An annular lateral recess 142R is formed in each volume from which the material of the first sacrificial material layers 142 is removed. The recess distance of the isotropic etch process may be in a range from 20 nm to 200 nm, such as from 30 nm to 100 nm, although lesser and greater recess distances may also be employed. Generally, the recess distance of the isotropic etch process may be in a range from 1 times the thickness of each first sacrificial material layer 142 to 6 times the thickness of each first sacrificial material layer 142.

Figure 5C:
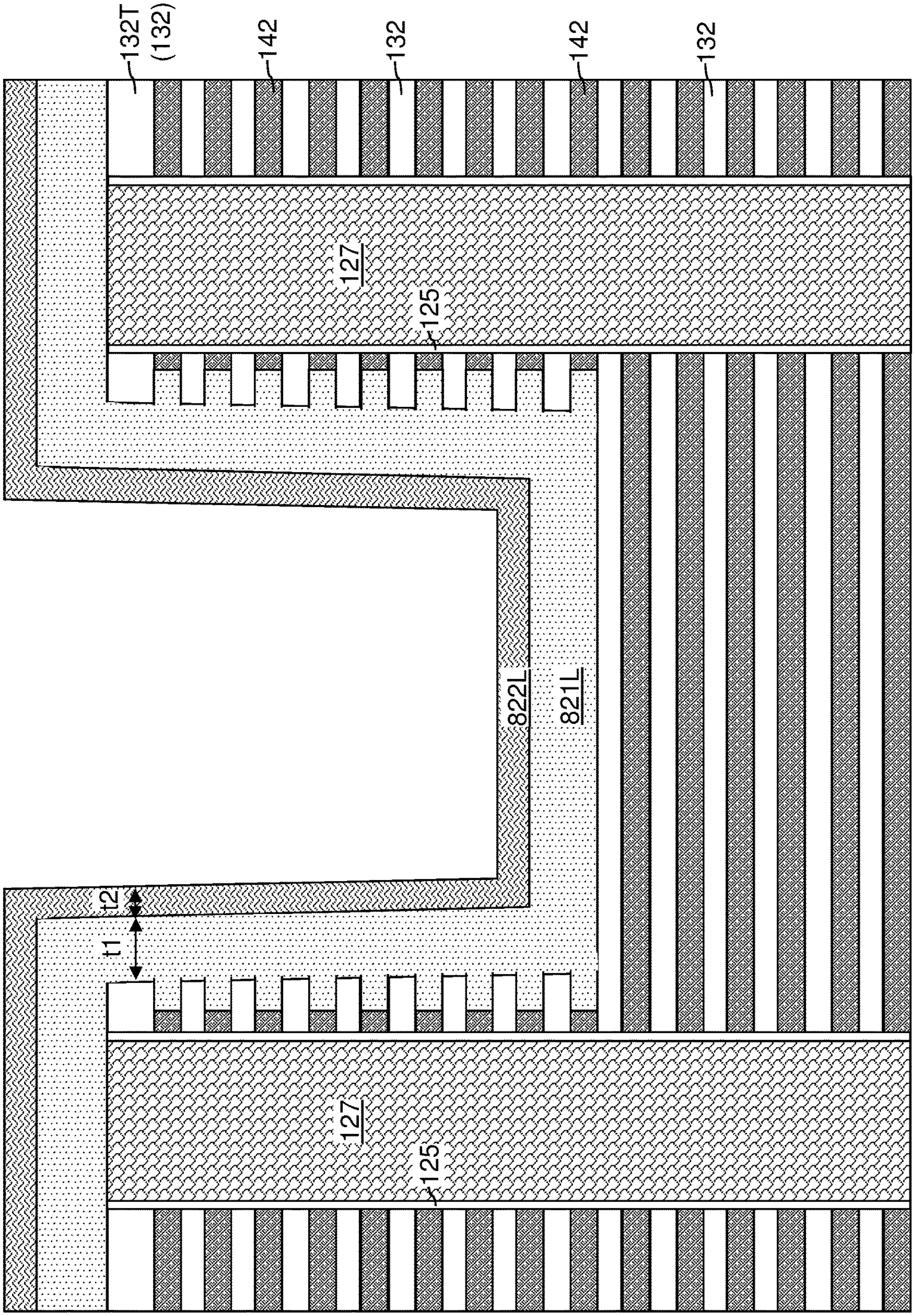

Referring to FIG. 5C, a layer stack of a dielectric spacer material layer 821L and a sacrificial spacer material layer 822L can be deposited in each of the first via cavities 189 and over the first alternating stack (132, 242). The dielectric spacer material layer 821L comprises a dielectric material that is different from the material of the first sacrificial material layers 142. For example, the dielectric spacer material layer 821L comprises silicon oxide. The dielectric spacer material layer 821L may have a first thickness t1, which can be measured along a horizontal direction on a sidewall of the first insulating layers 132 (such as the topmost first insulating layer 132T). The first thickness t1 is greater than one half of the thickness of the first sacrificial material layers 142. In one embodiment, the first thickness t1 may be in a range from 1 times the thickness of each first sacrificial material layer 142 to 6 times the thickness of each first sacrificial material layer 142. Each annular lateral recess 142R is filled with the dielectric spacer material layer 821L.

The sacrificial spacer material layer 822L comprises a material that may be removed selective to the material of the dielectric spacer material layer 821L. For example, the sacrificial spacer material layer 822L may comprise a semiconductor material, such as amorphous silicon or polysilicon. The sacrificial spacer material layer 822L may have a second thickness t2, which can be measured along a horizontal direction on a sidewall of the first insulating layers 132 (such as the topmost first insulating layer 132T). The second thickness may be in a range from 20 nm to 200 nm, such as from 40 nm to 100 nm, although lesser and greater thicknesses may also be employed.

Figure 5D:
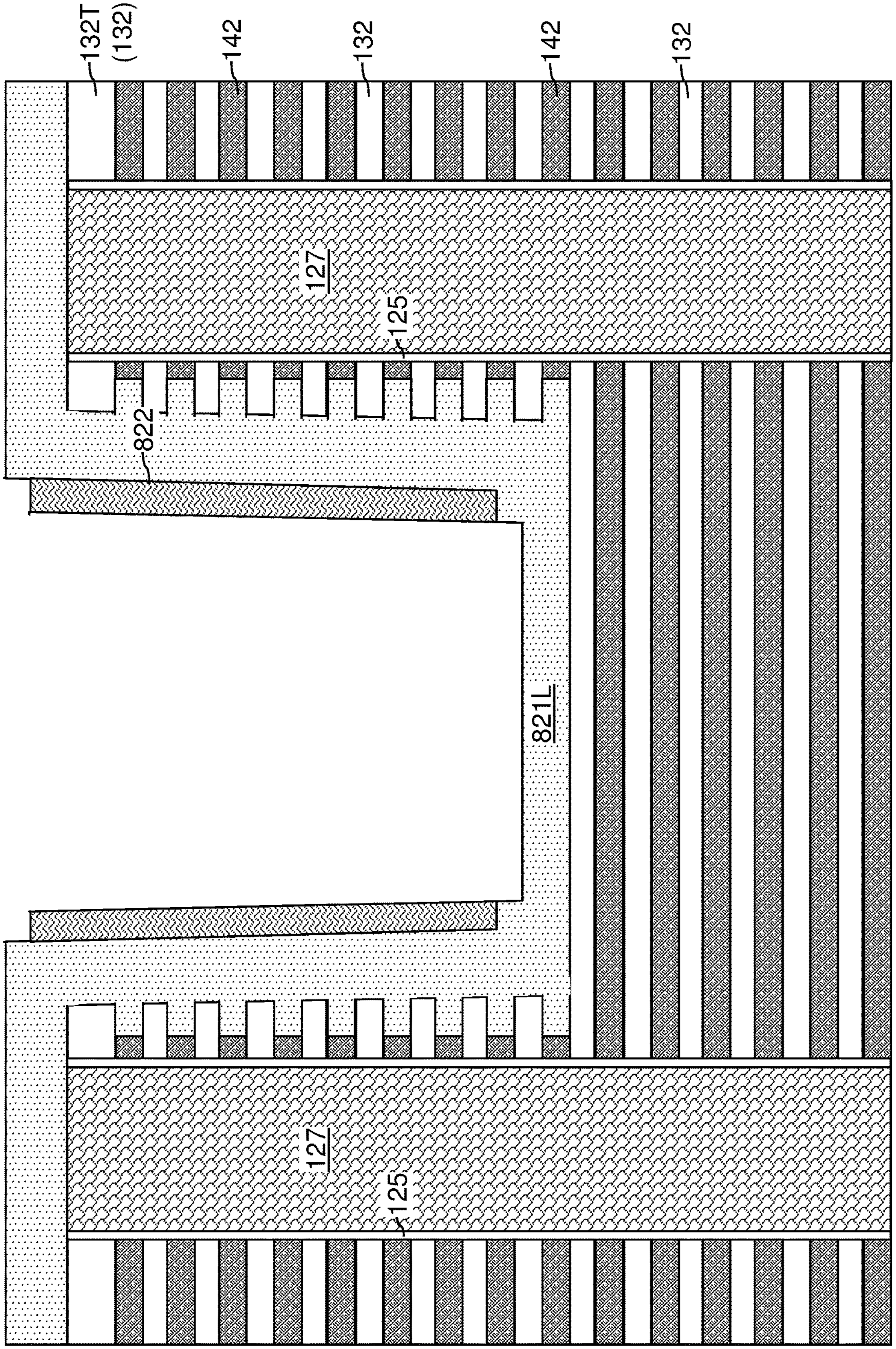

Referring to FIG. 5D, an anisotropic sidewall spacer etch process can be performed to remove horizontally-extending portions of the sacrificial spacer material layer 822L. Each vertically-extending remaining portion of the sacrificial spacer material layer 822L constitutes a tubular sacrificial spacer 822, which can have a tubular configuration. Horizontally-extending portions of the dielectric spacer material layer 821L may be collaterally vertically recessed after removal of the horizontally-extending portions of the sacrificial spacer material layer 822L.

Figure 5E:
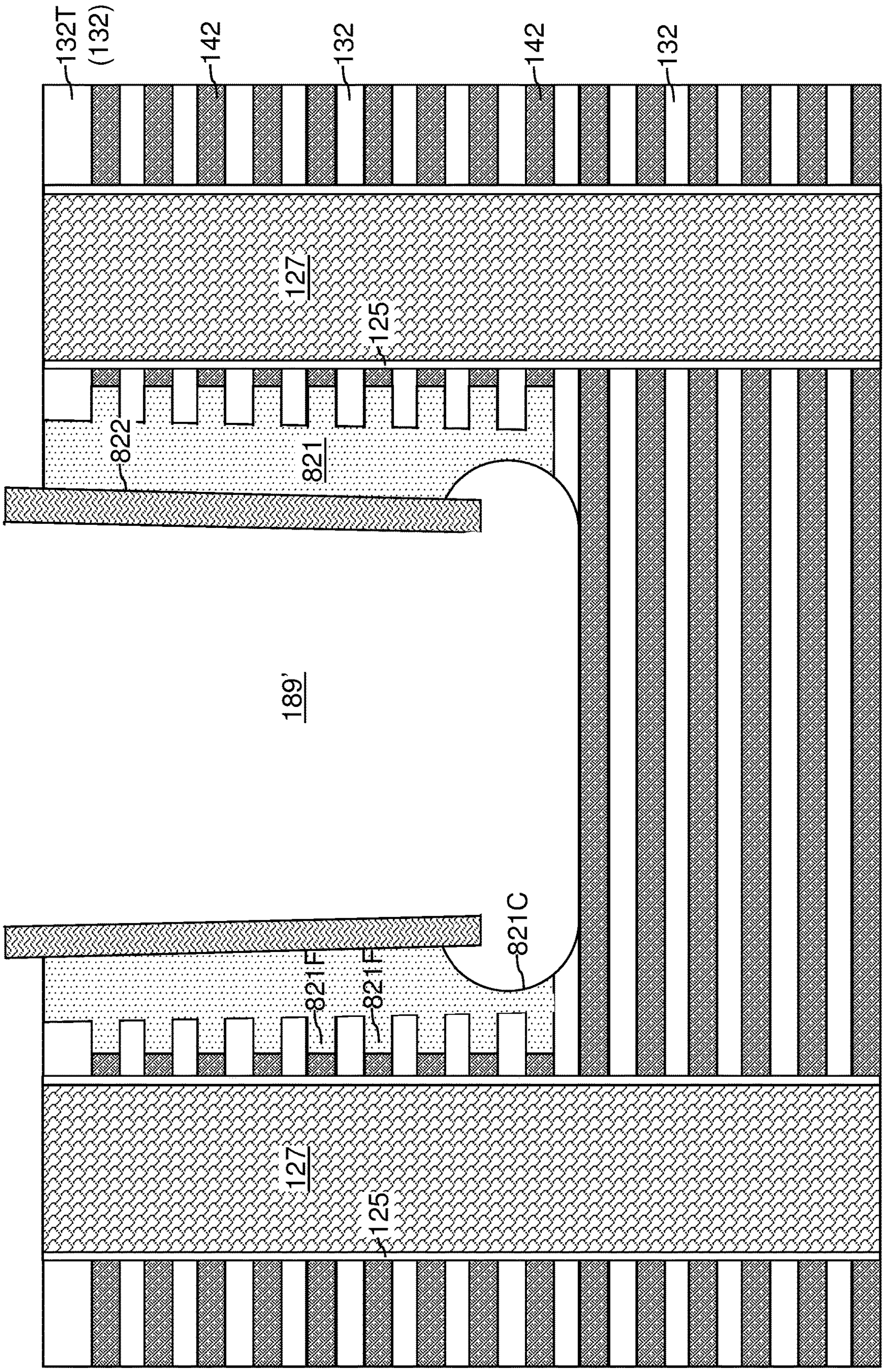

Referring to FIG. 5E, an isotropic etch process can be performed, which etches the material of the dielectric spacer material layer 821L selective to the material of the tubular sacrificial spacers 822. For example, if the dielectric spacer material layer 821L comprises silicon oxide and if the tubular sacrificial spacers 822 comprise polysilicon or amorphous silicon, a wet etch process employing dilute hydrofluoric acid can be performed to isotropically recess unmasked portions of the dielectric spacer material layer 821L selective to the tubular sacrificial spacers 822. The duration of the isotropic etch process can be selected such that the isotropic etch process removes horizontally-extending portions of the dielectric spacer material layer 821L underlying the first via cavities 189 and removes a first insulating layer 132 that underlies the horizontally-extending portions of the dielectric spacer material layer 821L. Each remaining portion of the dielectric spacer material layer 821L constitutes a dielectric spacer portion, which is herein referred to as main dielectric spacer portion 821. The isotropic etch process may be selective to the first sacrificial material layers 142. A top surface of a first sacrificial material layer 142 can be physically exposed at the bottom of each void 189' in the first via cavities 189. The double spacer process illustrated in FIGS. 5A-5E reduces punch through of the first sacrificial material layer 142 during formation of the first via cavities 189. Furthermore, by forming the spacers in each device tier (i.e., in each alternating stack) separately, the punch through and damage of the first sacrificial material layer 142 is reduced or eliminated.

A contoured etch front develops during the isotropic etch process underneath each void 189' in the first via cavities 189. Thus, each main dielectric spacer portion 821 comprises a respective concave annular surface segment 821C that is located below the tubular sacrificial spacers 822 and is physically exposed to a respective void 189'. In one embodiment, each main dielectric spacer portion 821 may comprise at least one annular dielectric fin 821F that fills a respective annular lateral recess 142R and contacts a cylindrical sidewall of a respective one of the first sacrificial material layers 142. In one embodiment, a subset of the main dielectric spacer portions 821 may comprise a respective plurality of annular dielectric fins 821F. Such main dielectric spacer portions 821 may have a vertical cross-sectional profile in which a plurality of annular dielectric fins 821F laterally protrude outward to contact a subset of the first sacrificial material layers 142.

Figure 5F:
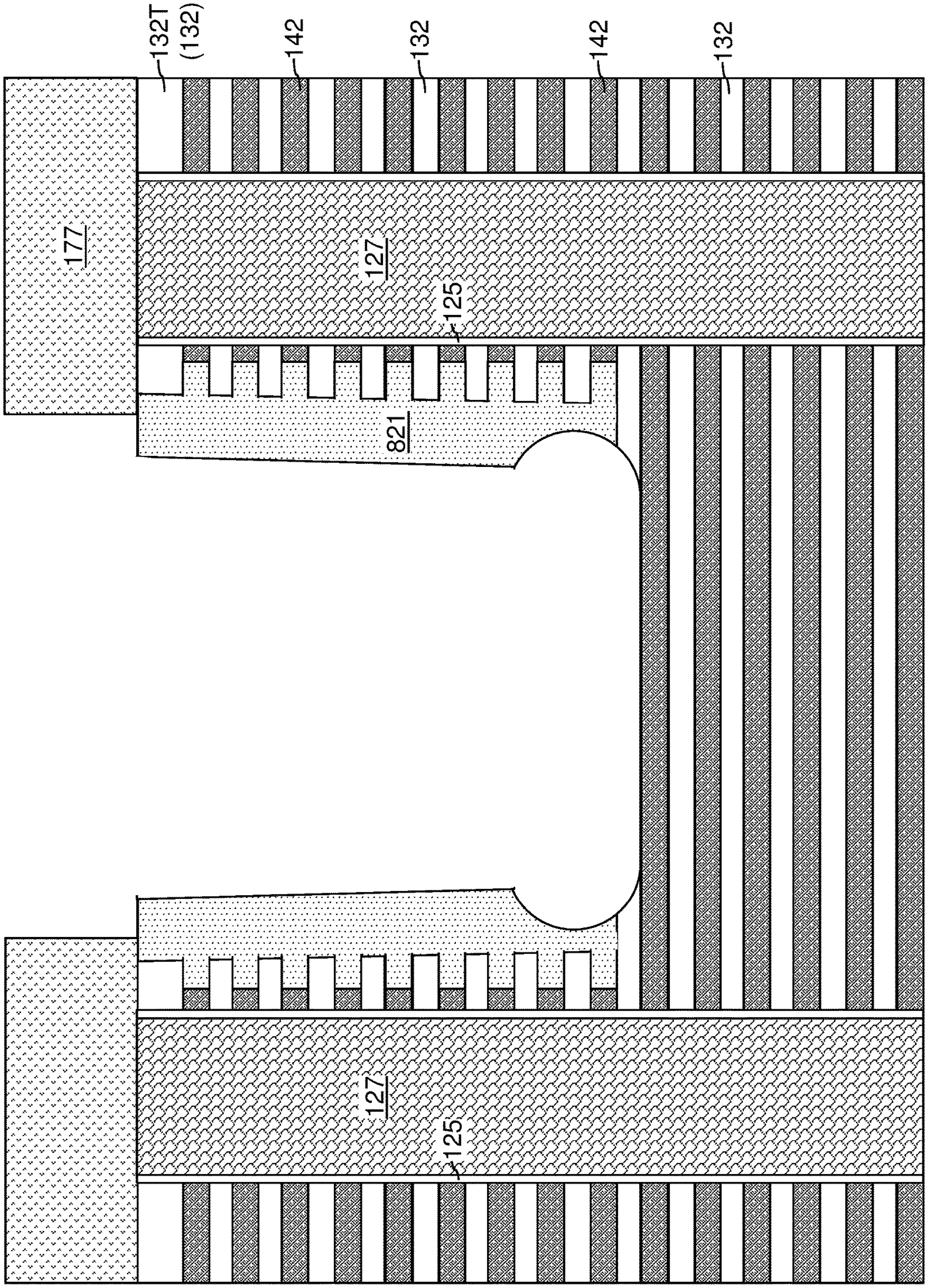

Referring to FIG. 5F, a patterned etch mask layer 117 (such as a patterned photoresist layer) may be optionally formed above the topmost first insulating layer 132 to cover the various first sacrificial opening fill structures {(145, 147), (135, 137), (125, 127)} if the material of the tubular sacrificial spacers 822 is the same as the first sacrificial fill material of the first sacrificial opening fill structures {(145, 147), (135, 137), (125, 127)}. Alternatively if the material of the tubular sacrificial spacers 822 is different from the first sacrificial fill material and can be selectively etch relative to the first sacrificial fill material, then the patterned etch mask 117 may be omitted.

The tubular sacrificial spacers 822 can be removed selective to the materials of the first sacrificial material layers 142 and the main dielectric spacer portions 821. For example, if the tubular sacrificial spacers 822 comprise polysilicon or amorphous silicon, a wet etch process using hot trimethyl-2 hydroxyethyl ammonium hydroxide ("hot TMY") or tetramethyl ammonium hydroxide (TMAH) may be employed to remove the tubular sacrificial spacers 822. The patterned etch mask layer 117 may be subsequently removed, for example, by ashing.

Figure 5G:
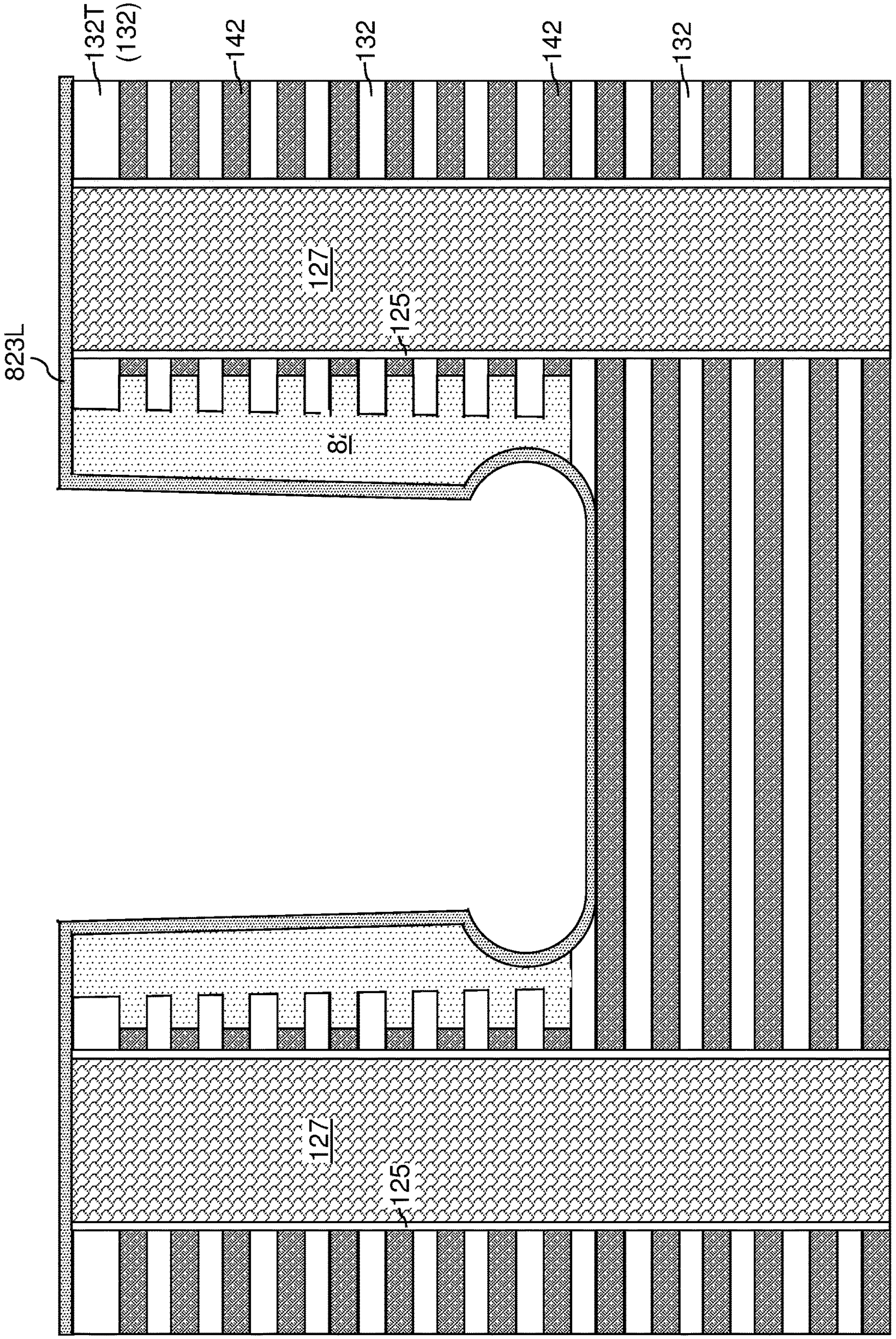

Referring to FIG. 5G, a conformal silicon-containing layer 823L may be optionally deposited over the exemplary structure directly on inner sidewalls of the main dielectric spacer portions 821 and directly on a top surface of the topmost first insulating layer 132T. The conformal silicon-containing layer 823L may comprise silicon nitride, amorphous silicon, or polysilicon. The thickness of the conformal silicon-containing layer 823L may be in a range from 1 nm to 5 nm, although lesser and greater thicknesses may also be employed.

Figure 5H:
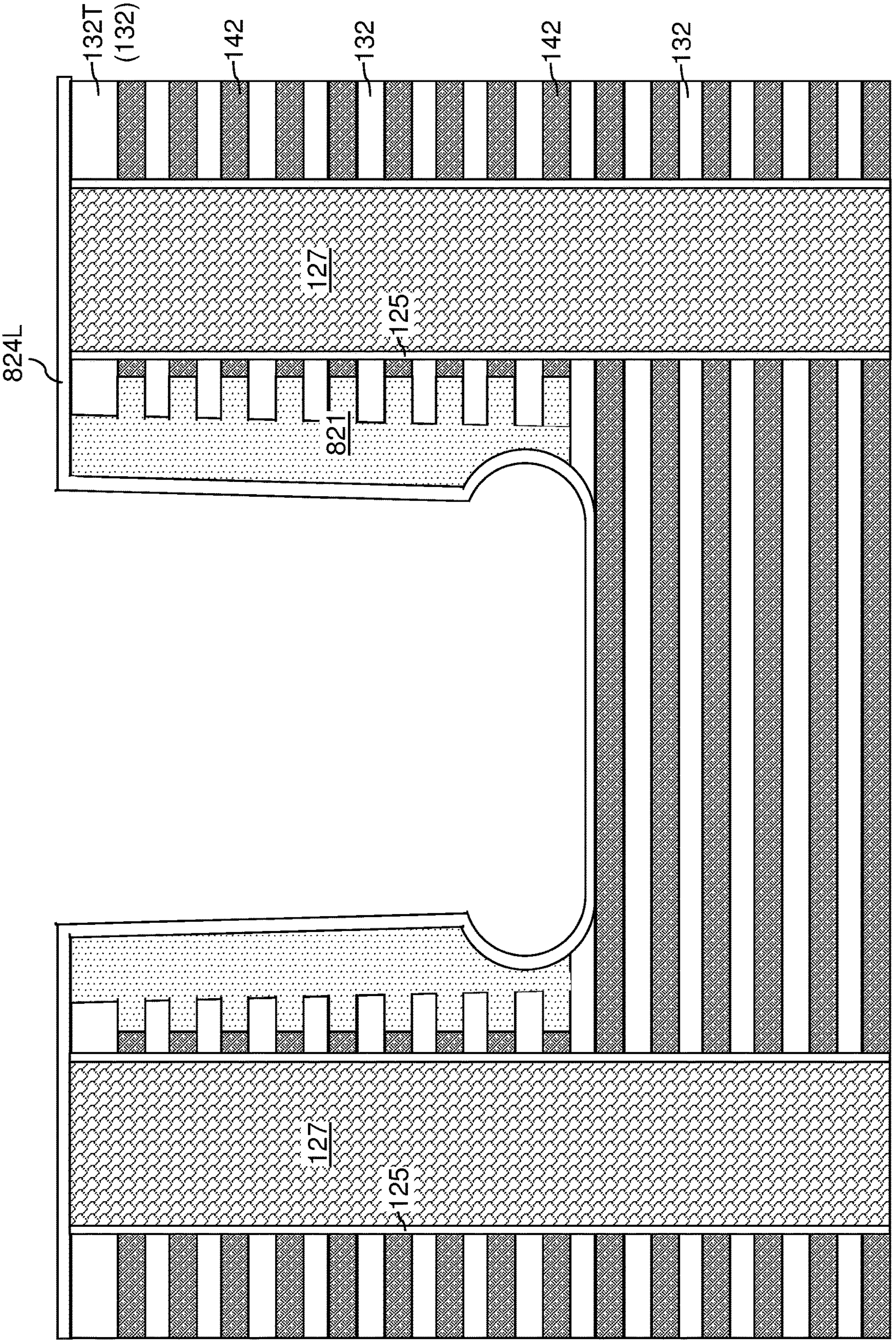

Referring to FIG. 5H, a thermal oxidation process can be performed to convert the conformal silicon-containing layer 823L into a silicon oxide liner layer 824L. Alternatively, instead of depositing the conformal silicon-containing layer 823L and then oxidizing it to form the silicon oxide liner layer 824L, a silicon oxide liner layer 824 may be deposited by CVD or ALD on the inner sidewalls of the main dielectric spacer portions 821 and directly on the top surface of the topmost first insulating layer 132T.

Figure 5I:
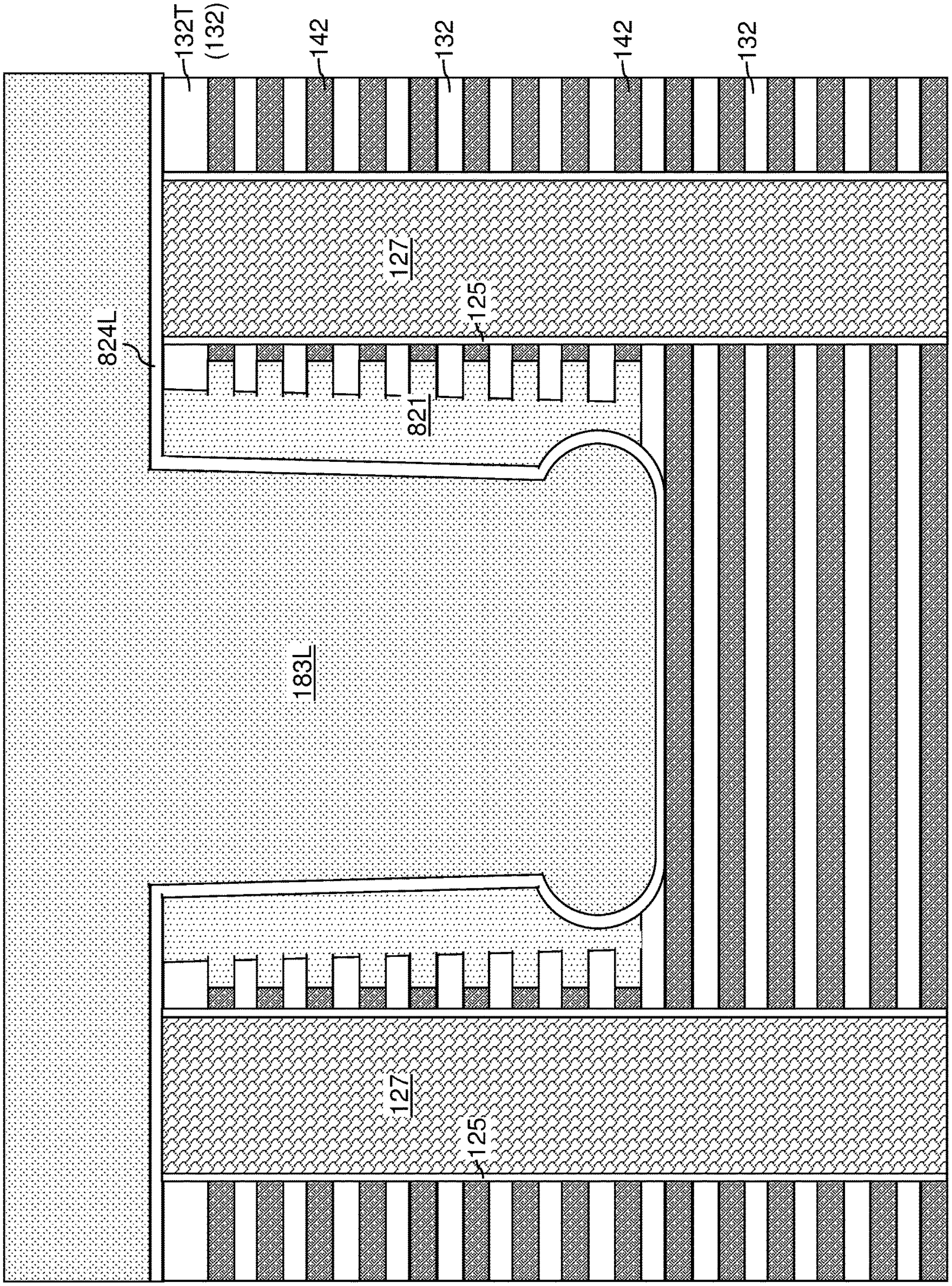

Referring to FIG. 5I, a first sacrificial via fill material layer 183L can be formed by depositing a first sacrificial via fill material in the unfilled volumes of the first via cavities 189. In one embodiment, a conformal deposition process or a self-planarizing deposition process may be employed to deposit the first sacrificial via fill material layer 183L. The first sacrificial via fill material may comprise a material that may be subsequently removed selective to the material of the silicon oxide liner layer 824L. Alternatively, in case the silicon oxide liner layer 824L is omitted, then the first sacrificial via fill material may comprise a material that may be subsequently removed selective to the material of the main dielectric spacer portions 821. In one embodiment, the first sacrificial via fill material may comprise, for example, amorphous carbon, diamond-like carbon, amorphous silicon, organosilicate glass, or a polymer material.

Figure 5J:
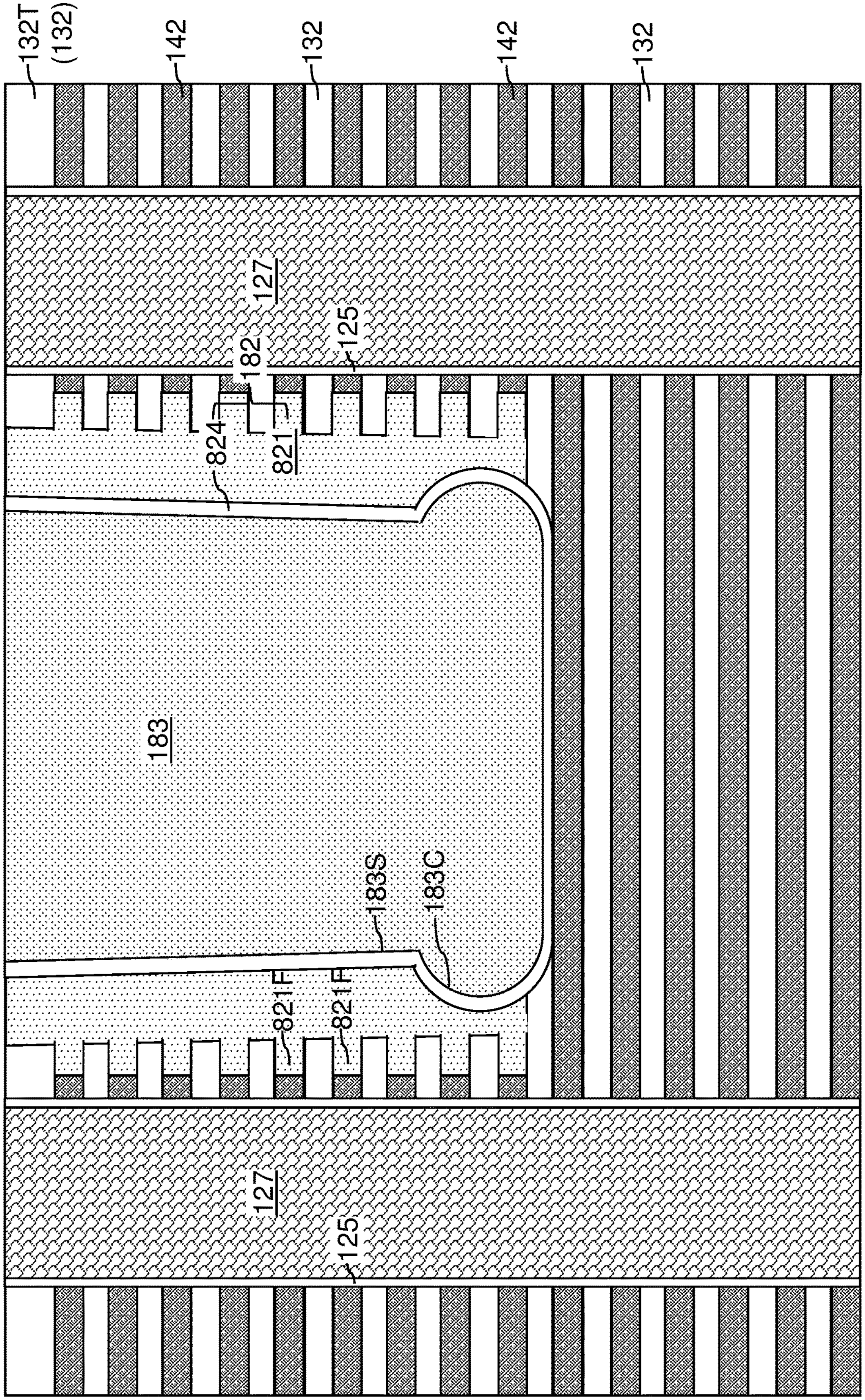

Referring to FIG. 5J, portions of the first sacrificial via fill material layer 183L and the optional silicon oxide liner layer 824L that overlie the horizontal plane including the top surface of the topmost first insulating layer 132T may be removed by a planarization process, which may employ a chemical mechanical polishing process and/or a recess etch process. Each remaining portion of the first sacrificial via fill material layer 183L constitutes a first sacrificial via fill structure 183. Each remaining portion of the silicon oxide liner layer 824L constitutes a silicon oxide liner 824. Each first sacrificial via fill structure 183 is laterally surrounded by a respective first dielectric spacer 182. Each first dielectric spacer 182 comprises a main dielectric spacer portion 821 and an optional silicon oxide liner 824, if present. In one embodiment, each first dielectric spacer 182 may be a tubular dielectric spacer having a tubular configuration with radially extending fins 821F and located within a peripheral portion of a respective first via cavity 189. Each first sacrificial via fill structure 183 can be formed inside the respective first dielectric spacer 182.

According to an aspect of the present disclosure, one, a plurality and/or each of the first sacrificial via fill structures 183 may comprise a respective straight sidewall segment 183S and a respective convex surface segment 183C that is adjoined to a bottom periphery of the respective straight sidewall segment. The respective convex surface 183C segment laterally protrudes outward relative to the respective straight sidewall segment 183S.

Figure 5K:
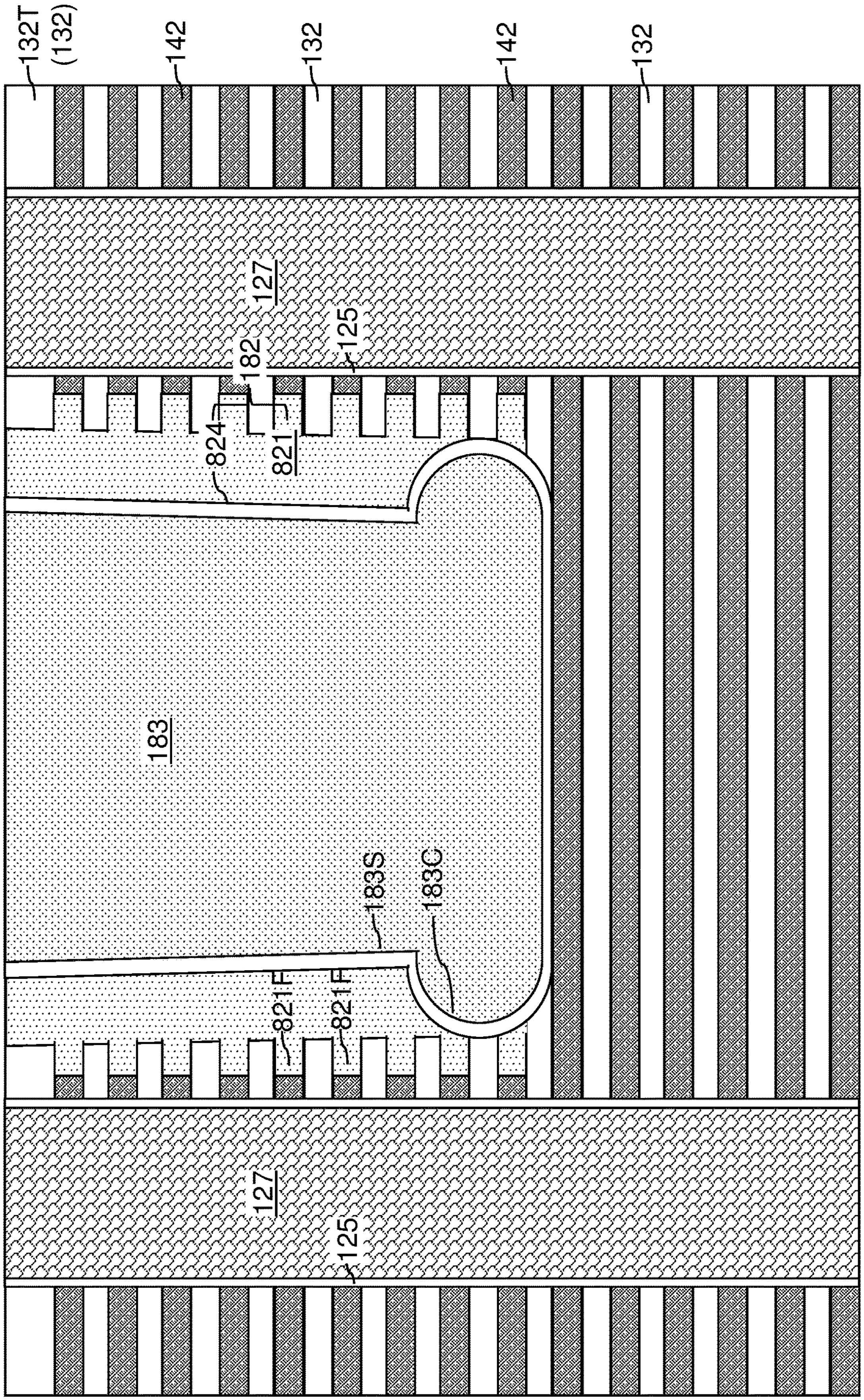
FIG. 5K is a vertical cross-sectional view of an alternative configuration of a first sacrificial via fill structure according to an embodiment of the present disclosure.

Referring to FIG. 5K, an alternative configuration of a first sacrificial via fill structure 183 according to an embodiment of the present disclosure is illustrated. In this case, a laterally-protruding portion of the silicon oxide liner 824 may contact a sidewall of one of the first insulating layers 132.

Figure 6A:
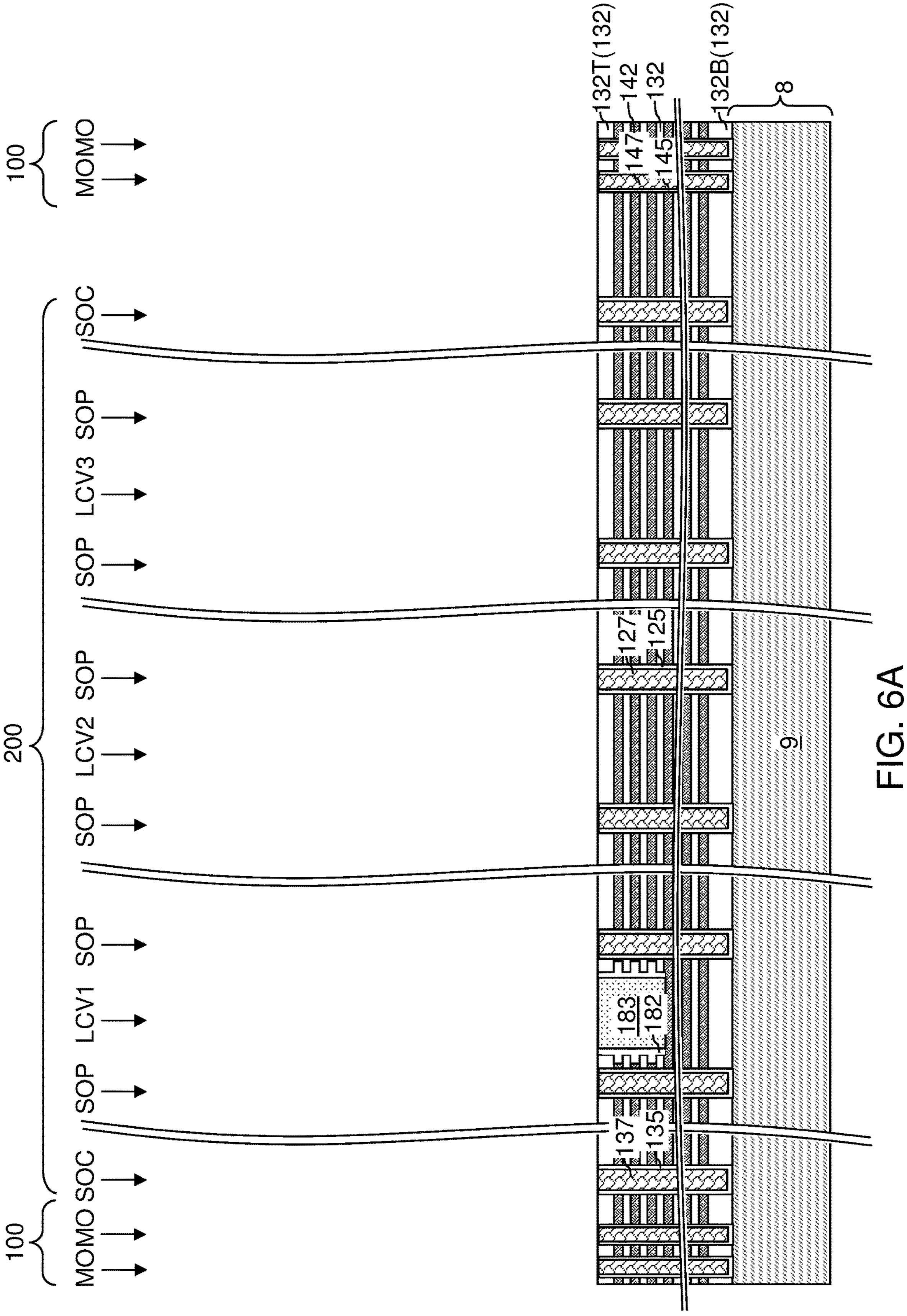
FIG. 6A is a vertical cross-sectional view of the exemplary structure after formation of first sacrificial via fill structures according to an embodiment of the present disclosure.
Figure 6B:
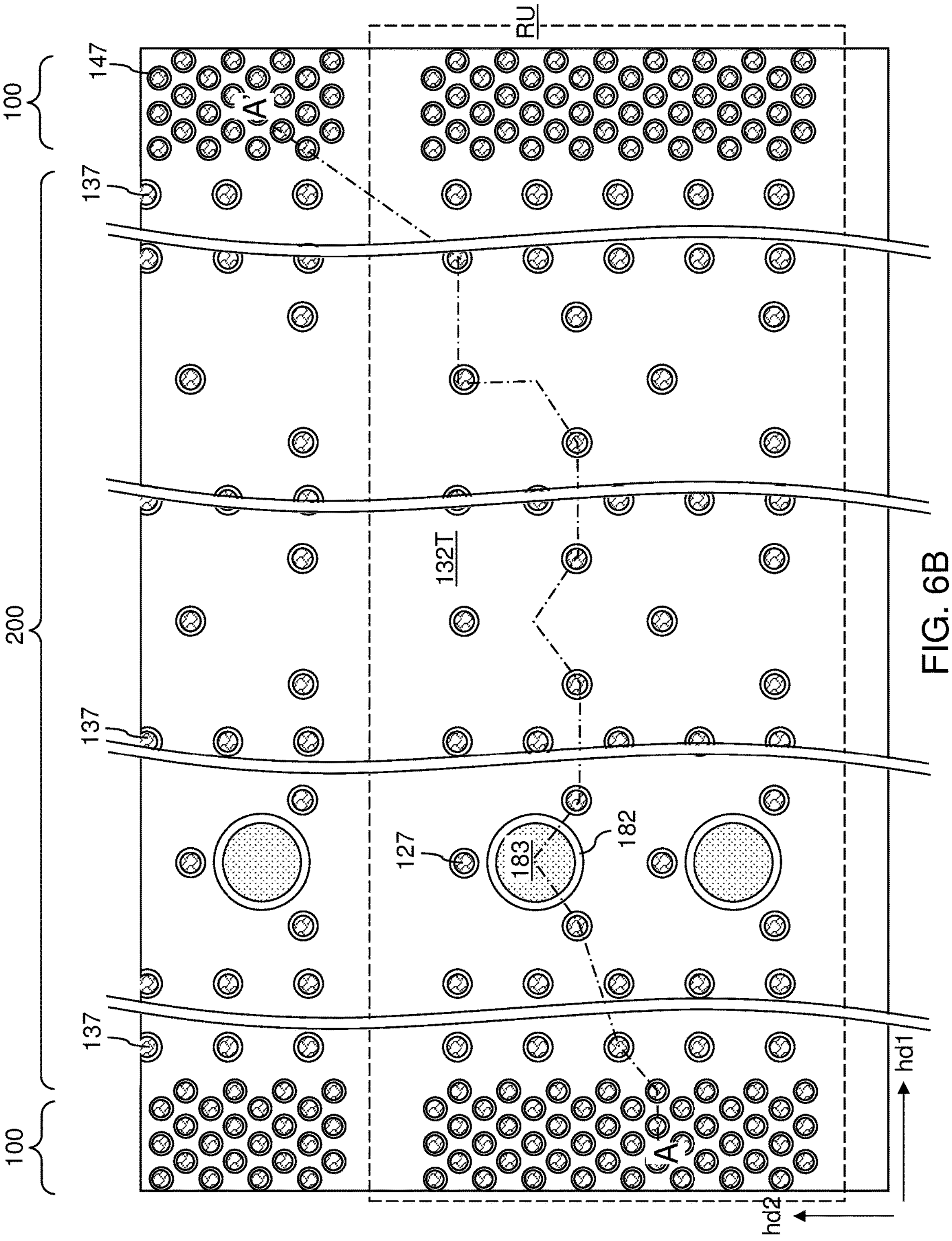
FIG. 6B is a top-down view of the exemplary structure of FIG. 6A. The hinged vertical plane A-A' is a cut plane of the vertical cross-sectional view of FIG. 6A.

Referring to FIGS. 6A and 6B, the exemplary structure is illustrated after formation of the first sacrificial via fill structures 183.

Figure 7:
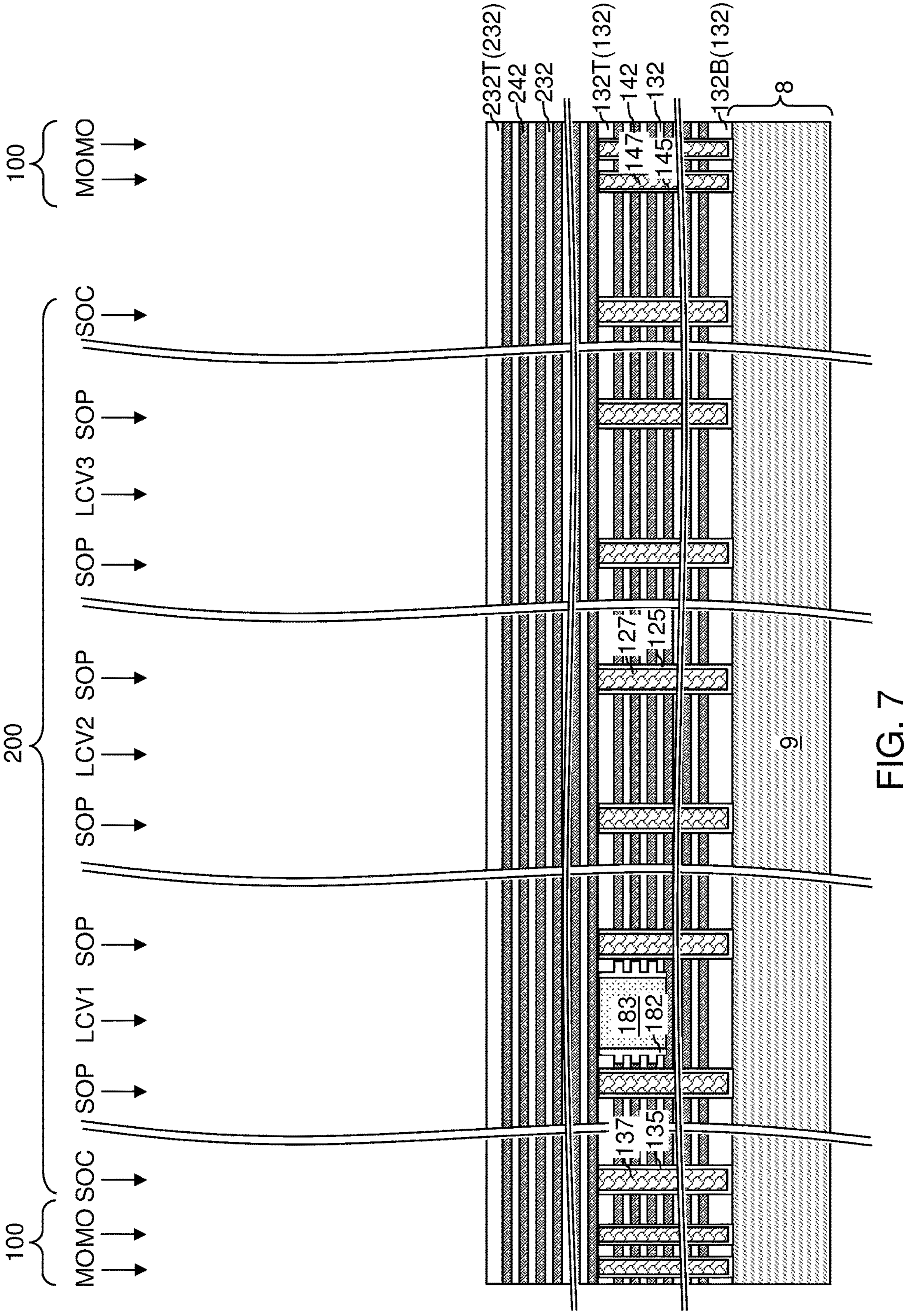
FIG. 7 is a vertical cross-sectional view of the exemplary structure after formation of a second alternating stack of second insulating layers and second sacrificial material layers according to an embodiment of the present disclosure.

Referring to FIG. 7, a second alternating stack (232, 242) of second insulating layers 232 and second sacrificial material layers 242 can be formed above the first alternating stack (132, 142). The second insulating layers 232 may have the same material composition as, and may have the same thicknesses range as, the first insulating layers 132. The second sacrificial material layers 242 may have the same material composition as, and may have the same thickness range as, the first sacrificial material layers 142. Generally, the second alternating stack (232, 242) may be formed by performing the processing steps described with reference to FIG. 1. The topmost one of the second insulating layers 232 is herein referred to as a topmost second insulating layer 232T.

Figure 8:
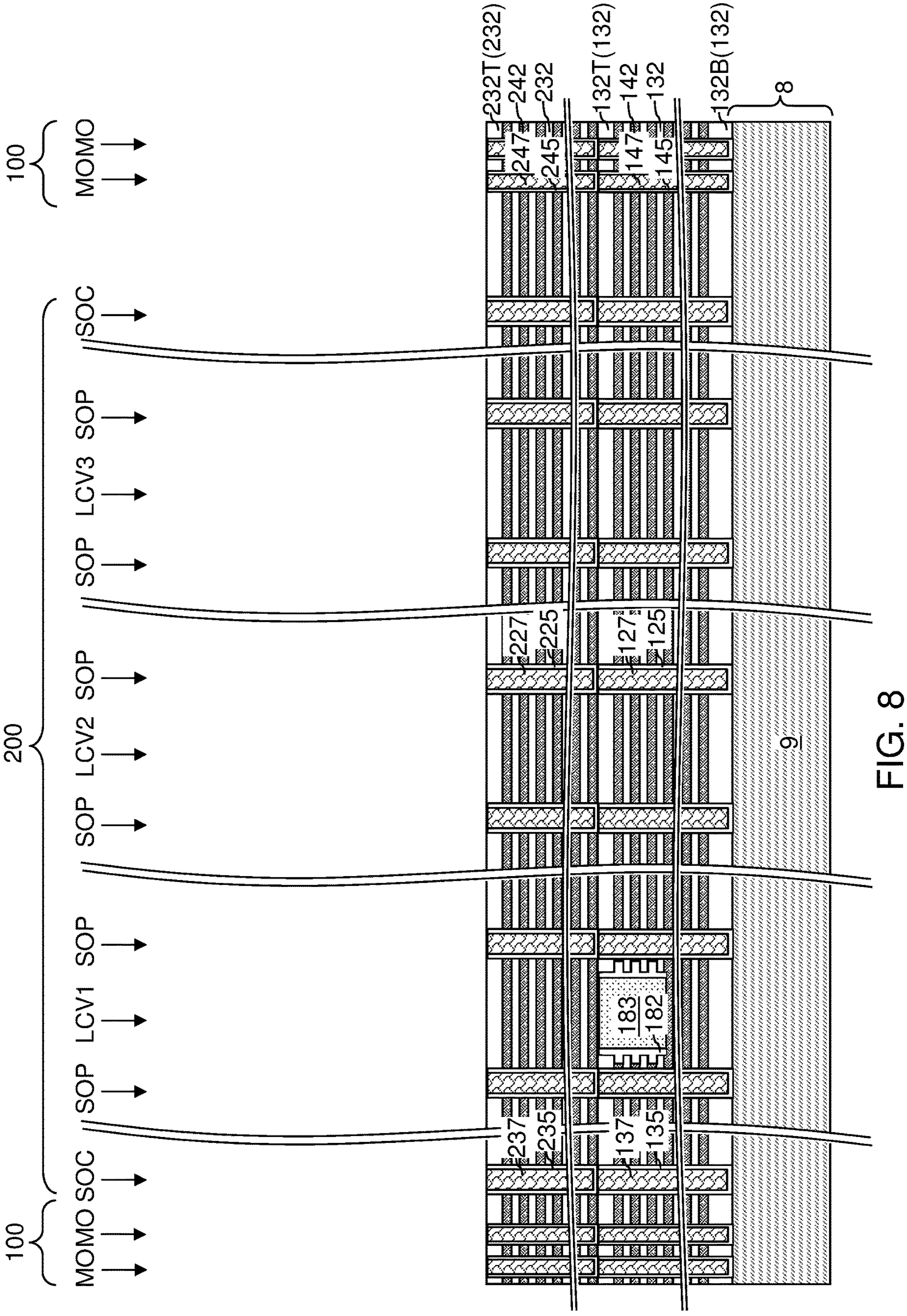
FIG. 8 is a vertical cross-sectional view of the exemplary structure after formation of second-tier sacrificial opening fill structures according to an embodiment of the present disclosure.

Referring to FIG. 8, the set of processing steps described with reference to FIGS. 2A, 2B, and 3 can be performed to form second sacrificial opening fill structures {(245, 247), (235, 237), (225, 227)}. Generally, second-tier openings can be formed through the second alternating stack (232, 242). The second-tier openings may comprise second memory openings that are formed on top of a respective first sacrificial memory opening fill structure (145, 147), primary second sacrificial openings that are formed on top of a respective primary first sacrificial pillar structure (125, 127), and supplementary second sacrificial openings that are formed on top of a respective supplementary first sacrificial pillar structure (135, 137).

The second sacrificial opening fill structures {(245, 247), (235, 237), (225, 227)} may comprise second sacrificial memory opening fill structures (245, 247) that are formed in the second memory opening, primary second sacrificial pillar structure (225, 227) that are formed in the primary second sacrificial opening, and supplementary second sacrificial pillar structure (235, 237) that are formed in the supplementary second sacrificial openings. Each second sacrificial memory opening fill structure (245, 247) may comprise an optional second etch stop liner 245 and a second sacrificial memory opening fill material portion 247. Each primary second sacrificial pillar structure (225, 227) may comprise an optional second etch stop liner 225 and a primary second sacrificial fill material portion 227. Each supplementary second sacrificial pillar structure (235, 237) may comprise an optional second etch stop liner 235 and a supplementary second sacrificial fill material portion 237. The top surfaces of the second sacrificial opening fill structures {(245, 247), (235, 237), (225, 227)} may be coplanar with the top surface of the topmost second insulating layer 232T. Each of the second sacrificial opening fill structures {(245, 247), (235, 237), (225, 227)} may, or may not, include cavities therein.

Figure 9:
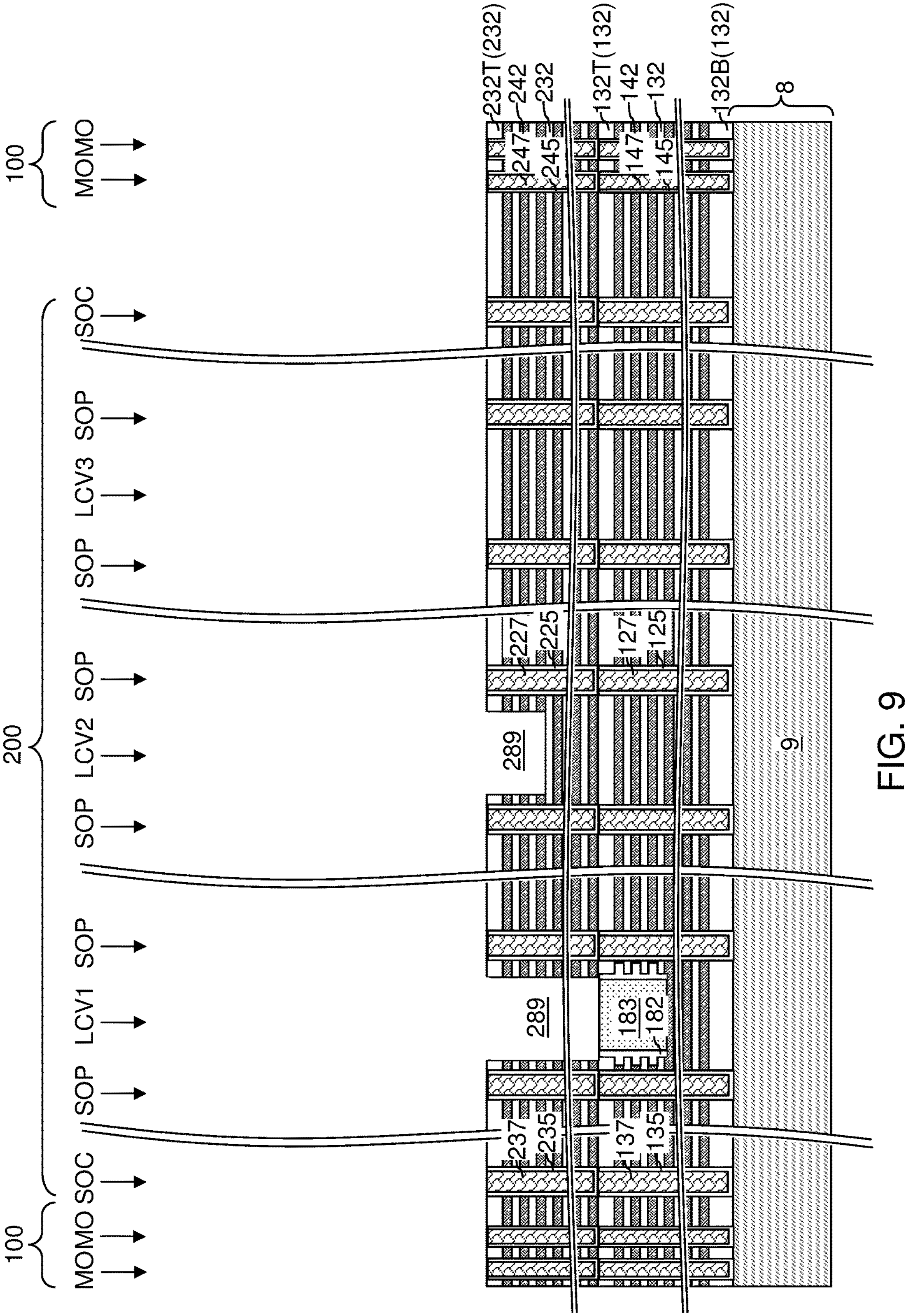
FIG. 9 is a vertical cross-sectional view of the exemplary structure after formation of second via cavities according to an embodiment of the present disclosure.

Referring to FIG. 9, the processing steps described with reference to FIGS. 4A and 4B may be performed with respect to the second alternating stack (232, 242) in lieu of the first alternating stack (132, 142) to form second via cavities 289. A first subset of the second via cavities 289 may be formed at locations at which second layer contact via structures are to be subsequently formed. The locations of first subset of the second via cavities 289 are herein referred to as second layer contact via locations LCV2. The second layer contact via locations LCV2 are different from the first layer contact via locations LCV1. The first subset of the second via cavities 289 can be formed such that each second insulating layer 232 other than the bottommost second insulating layer is physically exposed to at least one second via cavity 289 within the first subset of the second via cavities 289.

A second subset of the second via cavities 289 may be formed at the first layer contact via locations LCV1. Each second via cavity 289 within the second subset of the second via cavities 289 may be formed such that a top surface of a first sacrificial via fill structure 183 is physically exposed underneath each second via cavity 289 within the second subset of the second via cavities 289. In one embodiment, each of the first sacrificial via fill structures 183 may be exposed underneath a respective second via cavity 289 within the second subset of the second via cavities 289. Alternatively, rather than separately forming the first via cavities 189 prior to forming the second alternating stack (232, 242) and then forming the second via cavities 289 after forming the second alternating stack (232, 242), combined first and second via cavities (189, 289) may be formed during the same etching step after forming the second alternating stack (232, 242).

Generally, each second via cavity 289 within the first subset of the second via cavities 289 may be formed by performing a respective anisotropic etch process including a respective terminal etch step that etches one of the second sacrificial material layers 242 selective to a material of the second insulating layers 232. A horizontal top surface of a second insulating layer 232 can be physically exposed at the bottom of each second via cavity 289 within the first subset of the second via cavities. Each second via cavity 289 within the second subset of the second via cavities 289 may be formed through each layer of the second alternating stack (232, 242) such that a top surface of a first sacrificial via fill structure 183 is exposed underneath each second via cavity 289 within the second subset of the second via cavities 289.

FIGS. 10A-10I are sequential vertical cross-sectional views of a region around a second via cavity 289 within the second subset of the second via cavities 289 during formation of a second sacrificial via fill structure 283 according to an embodiment of the present disclosure.

Figure 10A:
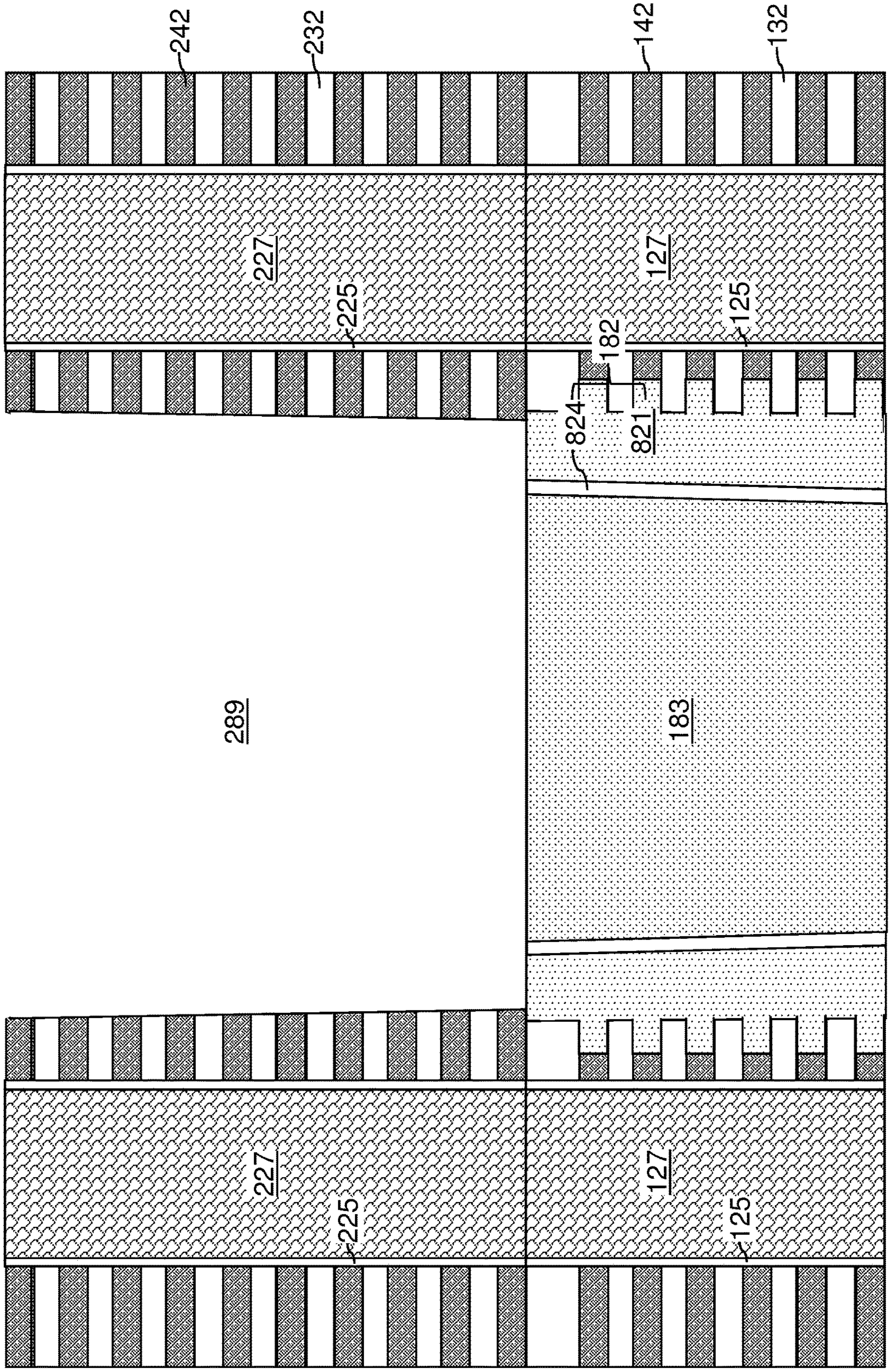
FIGS. 10A-10I are sequential vertical cross-sectional views of a region around a second via cavity during formation of a second sacrificial via fill structure according to an embodiment of the present disclosure.

Referring to FIG. 10A, a second via cavity 289 within the second subset of the second via cavities 289 is illustrated after the processing steps described with reference to FIG. 9.

Figure 10B:
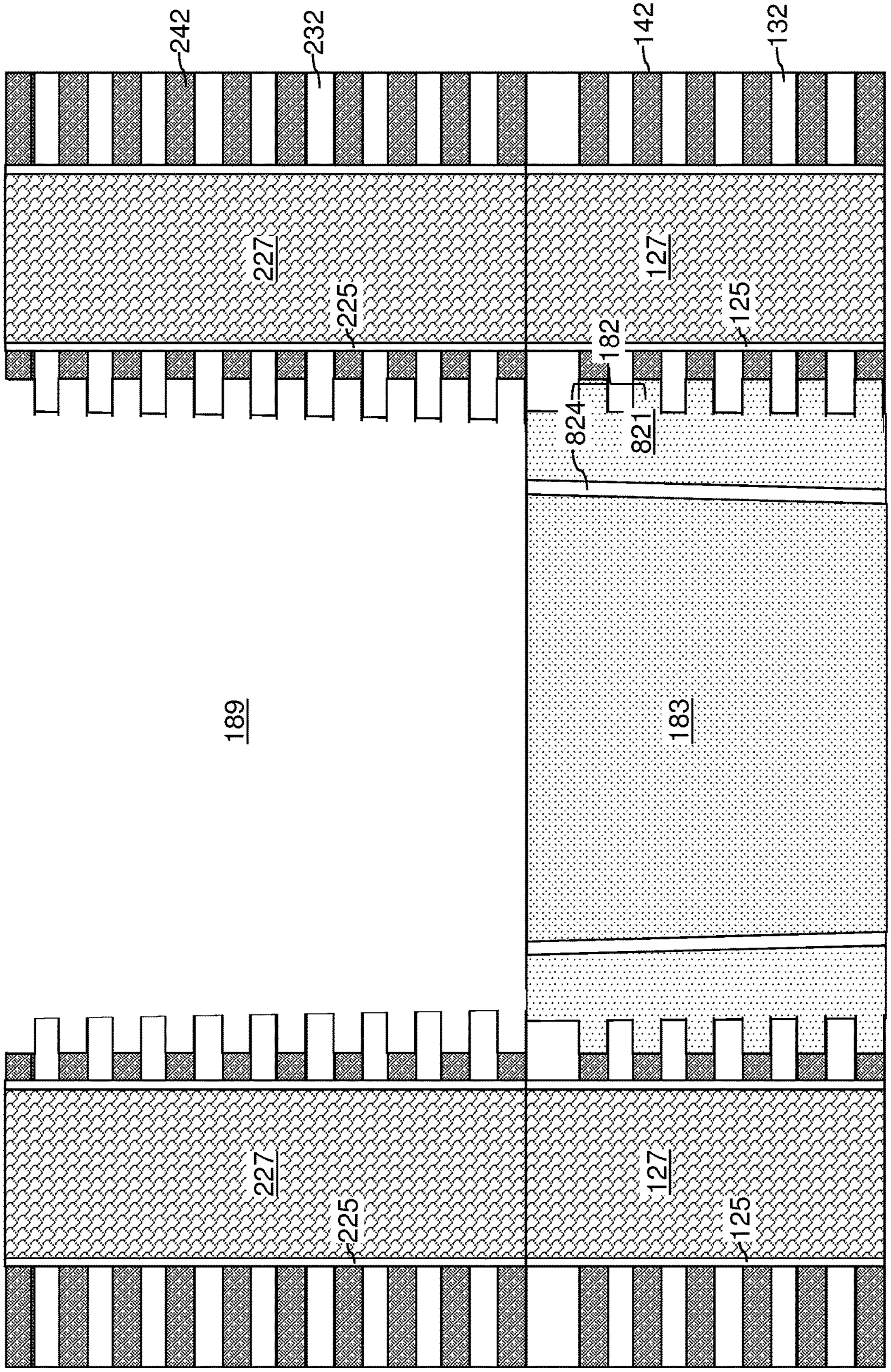

Referring to FIG. 10B, sidewalls of a subset of the second sacrificial material layers 242 that is physically exposed to the second via cavity 289 can be laterally recessed around the second via cavity 289 selective to the second insulating layers 232 by performing an isotropic etch process. In one embodiment, a wet etch process can be performed to etch the material of the second sacrificial material layers 242 selective to the material of the second insulating layers 232. For example, if the second sacrificial material layers 242 comprise silicon nitride and if the second insulating layers 232 comprise silicon oxide, a wet etch process employing hot phosphoric acid can be performed to laterally recess the physically exposed sidewalls of the second sacrificial material layers 242 around each second via cavity 289. An annular lateral recess is formed in each volume from which the material of the second sacrificial material layers 242 is removed. The recess distance of the isotropic etch process may be in a range from 20 nm to 200 nm, such as from 30 nm to 100 nm, although lesser and greater recess distances may also be employed. Generally, the recess distance of the isotropic etch process may be in a range from 1 times the thickness of each second sacrificial material layer 242 to 6 times the thickness of each second sacrificial material layer 242.

Figure 10C:
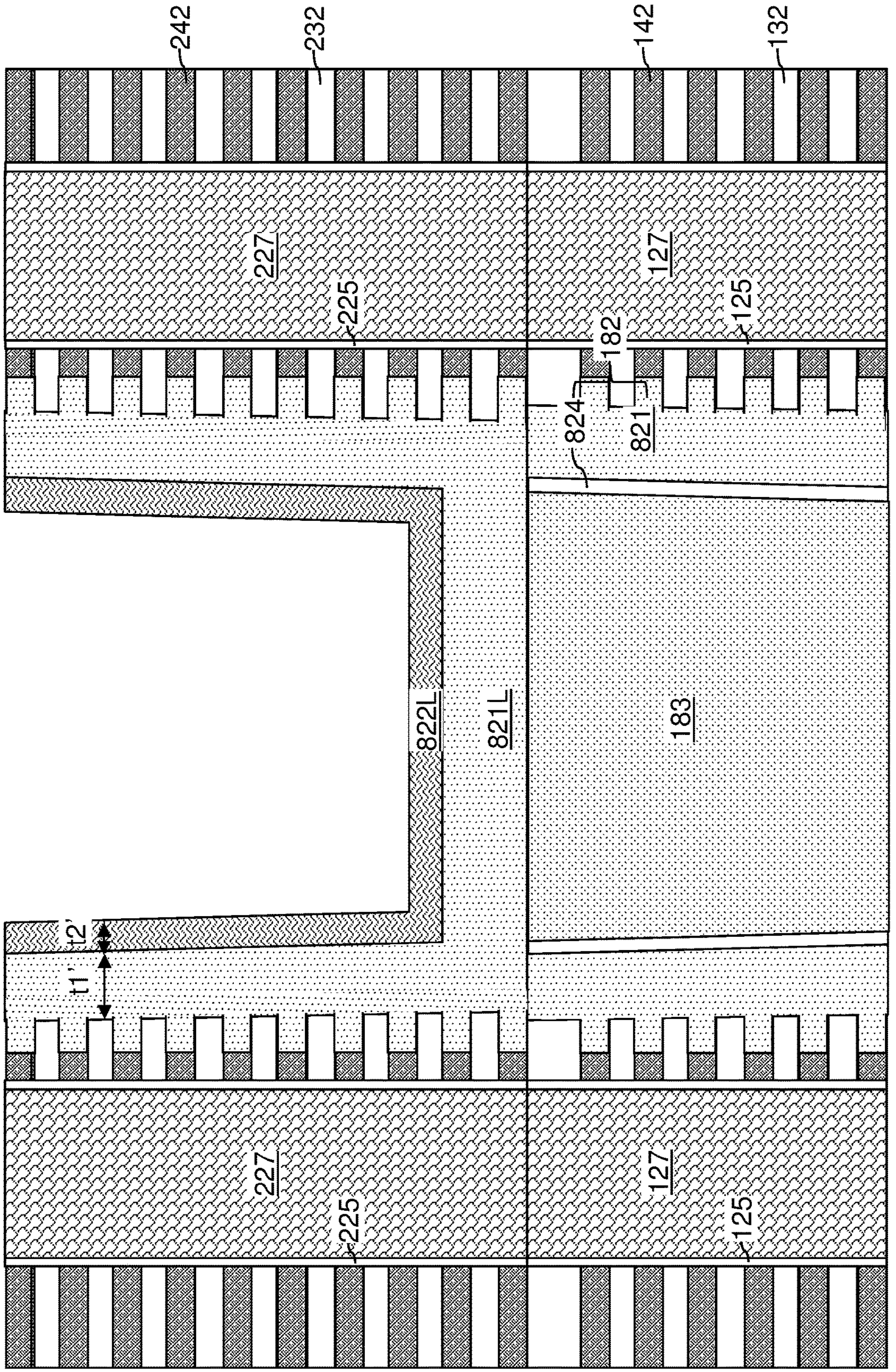

Referring to FIG. 10C, a layer stack of a dielectric spacer material layer 821L and a sacrificial spacer material layer 822L can be deposited in each of the second via cavities 289 and over the second alternating stack (232, 242). The dielectric spacer material layer 821L comprises a dielectric material that is different from the material of the second sacrificial material layers 242. For example, the dielectric spacer material layer 821L comprises silicon oxide. The dielectric spacer material layer 821L may have a first thickness t1', which can be measured along a horizontal direction on a sidewall of the second insulating layers 232. The first thickness t1' is greater than one half of the thickness of the second sacrificial material layers 242. In one embodiment, the first thickness t1' may be in a range from 1 times the thickness of each second sacrificial material layer 242 to 6 times the thickness of each second sacrificial material layer 242. Each annular lateral recess is filled with the dielectric spacer material layer 821L.

The sacrificial spacer material layer 822L comprises a material that may be removed selective to the material of the dielectric spacer material layer 821L. For example, the sacrificial spacer material layer 822L may comprise a semiconductor material such as amorphous silicon or polysilicon. The sacrificial spacer material layer 822L may have a second thickness t2', which can be measured along a horizontal direction on a sidewall of the second insulating layers 232. The second thickness may be in a range from 20 nm to 200 nm, such as from 40 nm to 100 nm, although lesser and greater thicknesses may also be employed.

Figure 10D:
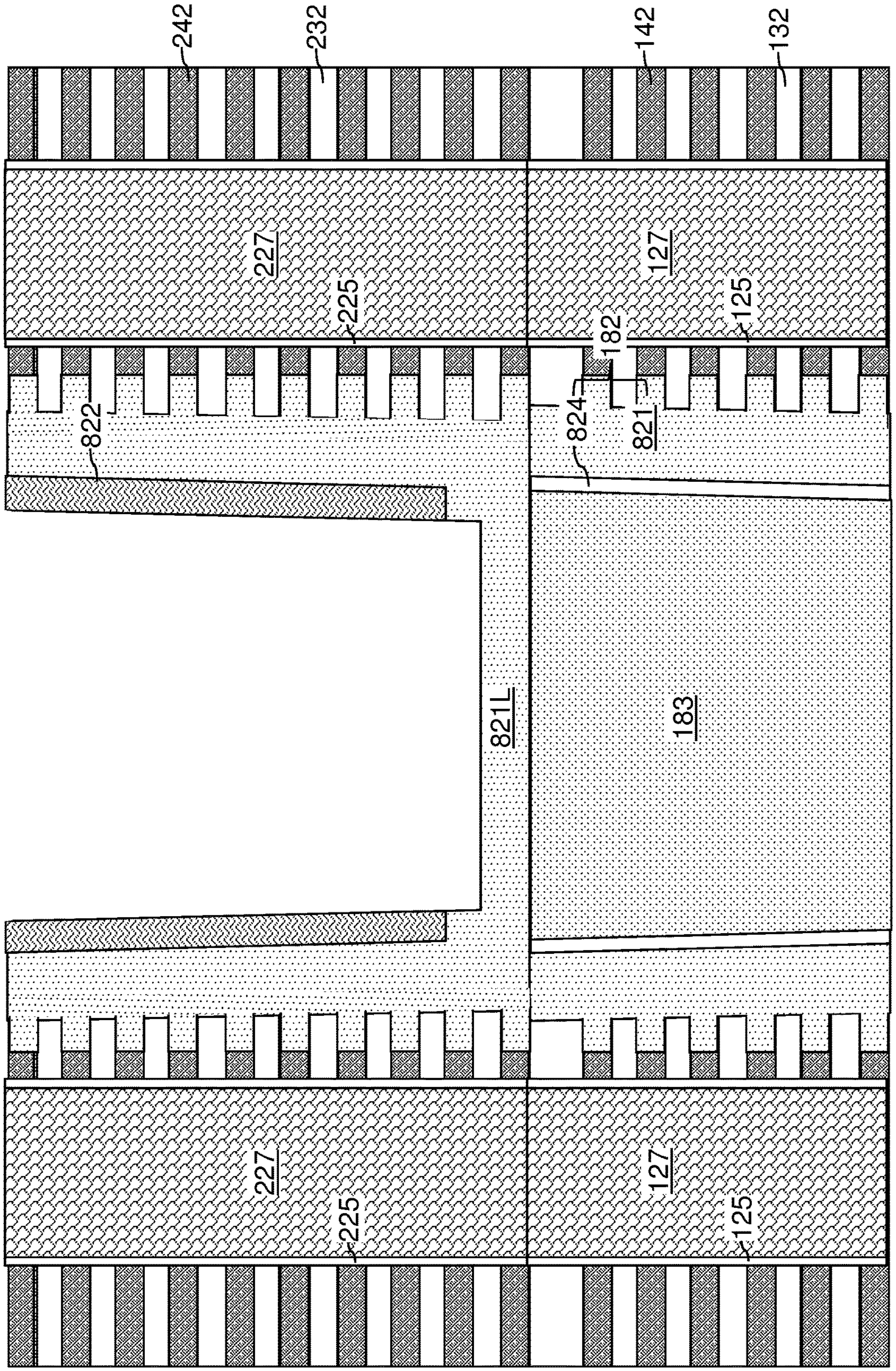

Referring to FIG. 10D, an anisotropic etch process can be performed to remove horizontally-extending portions of the sacrificial spacer material layer 822L. Each vertically-extending remaining portion of the sacrificial spacer material layer 822L constitutes a tubular sacrificial spacer 822, which can have a tubular configuration. Horizontally-extending portions of the dielectric spacer material layer 821L may be collaterally vertically recessed after removal of the horizontally-extending portions of the sacrificial spacer material layer 822L.

Figure 10E:
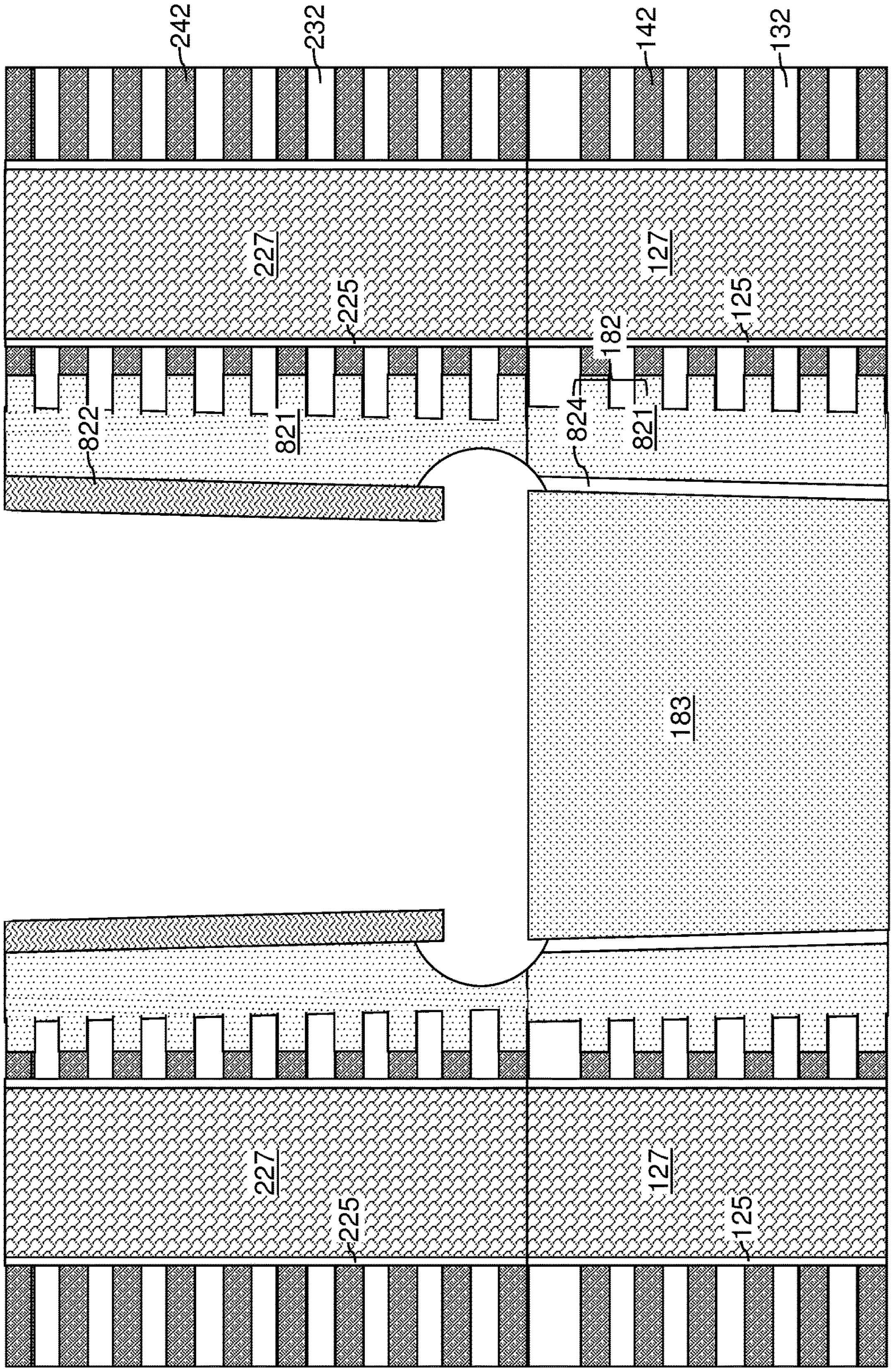

Referring to FIG. 10E, an isotropic etch process can be performed, which etches the material of the dielectric spacer material layer 821L selective to the material of the tubular sacrificial spacers 822. For example, if the dielectric spacer material layer 821L comprises silicon oxide and if the tubular sacrificial spacers 822 comprise polysilicon or amorphous silicon, a wet etch process employing dilute hydrofluoric acid can be performed to isotropically recess unmasked portions of the dielectric spacer material layer 821L selective to the tubular sacrificial spacers 822. The duration of the isotropic etch process can be selected such that the isotropic etch process removes horizontally-extending portions of the dielectric spacer material layer 821L underlying the second via cavities 289 and removes a second insulating layer 232 that underlies the horizontally-extending portions of the dielectric spacer material layer 821L. Each remaining portion of the dielectric spacer material layer 821L constitutes a dielectric spacer portion, which is herein referred to as main dielectric spacer portion 821. The isotropic etch process may be selective to the second sacrificial material layers 242. A top surface of a second sacrificial material layer 242 can be physically exposed at the bottom of each void 289' in first subset of the second via cavities 289. A top surface of a first sacrificial via fill structure 183 can be physically exposed at the bottom of each void 289' in the second subset of the second via cavities 289.

A contoured etch front develops during the isotropic etch process underneath each void 289' in the second via cavities 289. Thus, each main dielectric spacer portion 821 comprises a respective concave annular surface segment that is physically exposed to a respective void 289'. In one embodiment, each main dielectric spacer portion 821 may comprise at least one annular dielectric fin that fills a respective annular lateral recess and contacts a cylindrical sidewall of a respective one of the second sacrificial material layers 242. In one embodiment, a subset of the main dielectric spacer portions 821 may comprise a respective plurality of annular dielectric fins. Such main dielectric spacer portions 821 may have a vertical cross-sectional profile in which a plurality of annular dielectric fins laterally protrude outward to contact a subset of the second sacrificial material layers 242. An inner sidewall of one, a plurality and/or each of the first dielectric spacers 182 may be collaterally chamfered during the isotropic etch process.

Figure 10F:
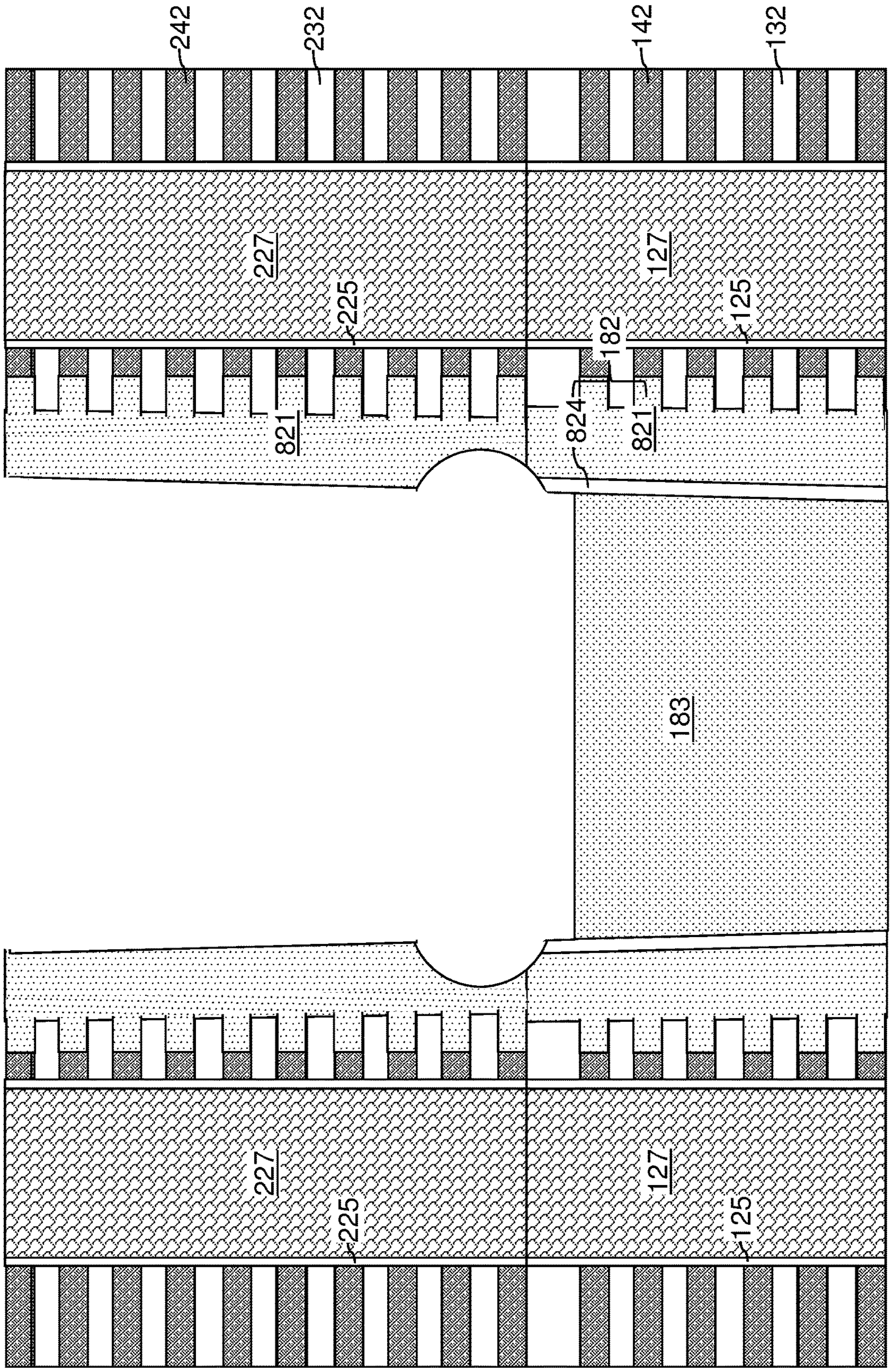

Referring to FIG. 10F, a patterned etch mask layer (not illustrated), which may be a patterned photoresist layer, may be optionally formed above the topmost second insulating layer 232 to cover the various second sacrificial opening fill structures {(245, 247), (235, 237), (225, 227)}. The tubular sacrificial spacers 822 can be removed selective to the materials of the second sacrificial material layers 242 and the main dielectric spacer portions 821. For example, if the tubular sacrificial spacers 822 comprise polysilicon or amorphous silicon, a wet etch process using hot trimethyl-2 hydroxyethyl ammonium hydroxide ("hot TMY") or tetramethyl ammonium hydroxide (TMAH) may be employed to remove the tubular sacrificial spacers 822. The patterned etch mask layer may be subsequently removed, for example, by ashing.

Figure 10G:
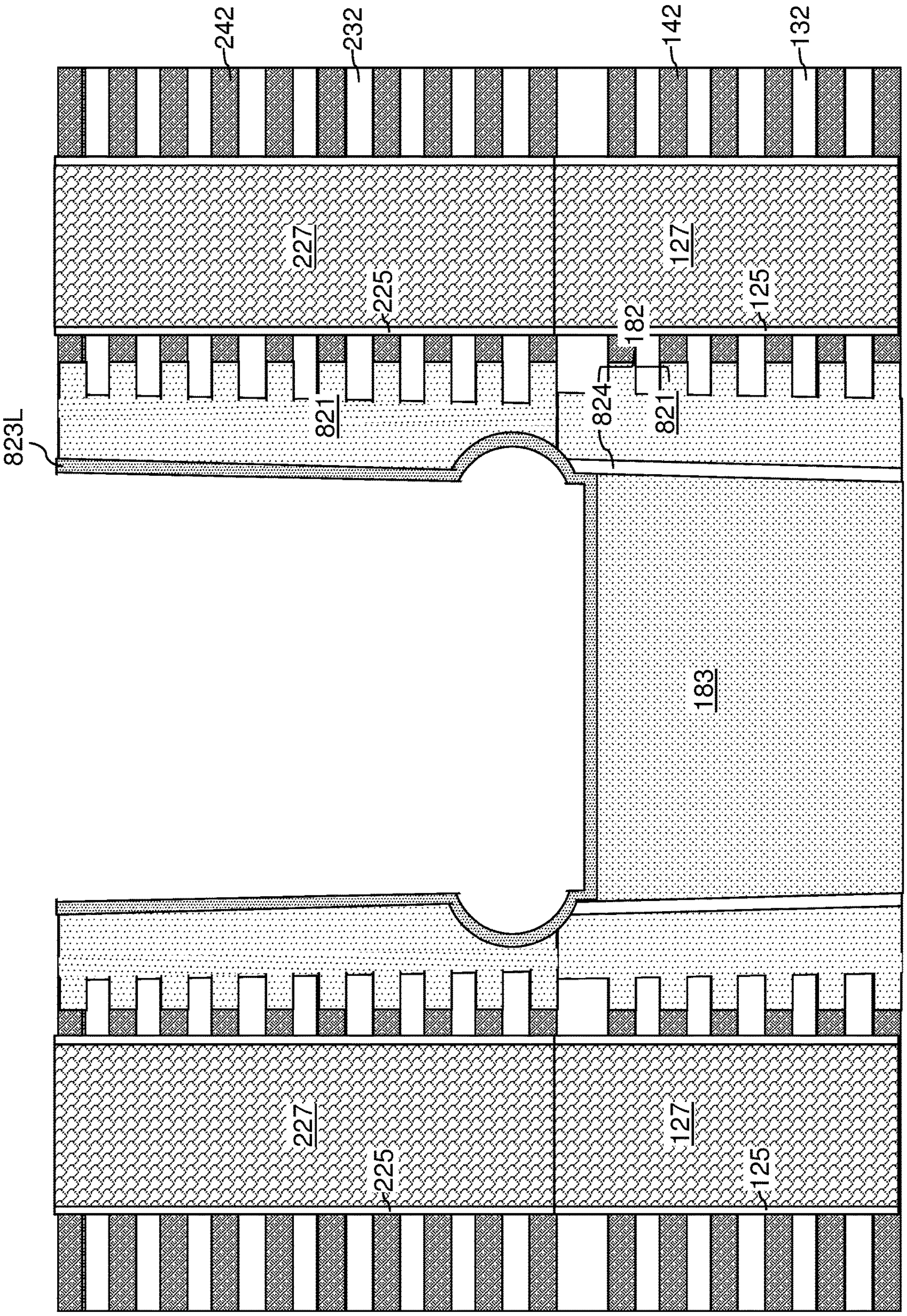

Referring to FIG. 10G, a conformal silicon-containing layer 823L may be optionally deposited over the exemplary structure directly on inner sidewalls of the main dielectric spacer portions 821 and directly on a top surface of the topmost second insulating layer 232T. The conformal silicon-containing layer 823L may comprise silicon nitride, amorphous silicon, or polysilicon. The thickness of the conformal silicon-containing layer 823L may be in a range from 2 nm to 5 nm, although lesser and greater thicknesses may also be employed.

Figure 10H:
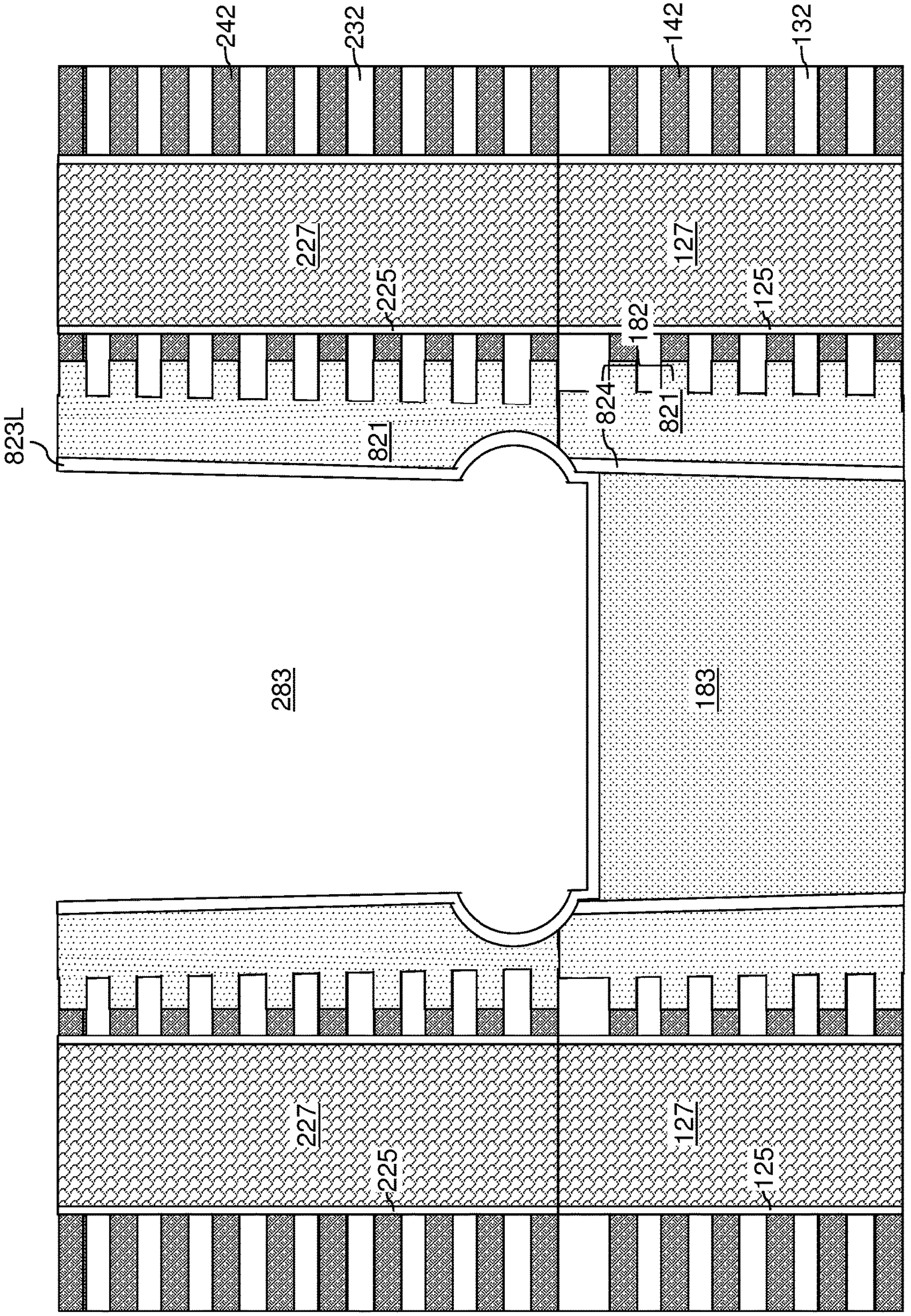

Referring to FIG. 10H, a thermal oxidation process can be performed to convert the conformal silicon-containing layer 823L into a silicon oxide liner layer 824L.

Figure 10I:
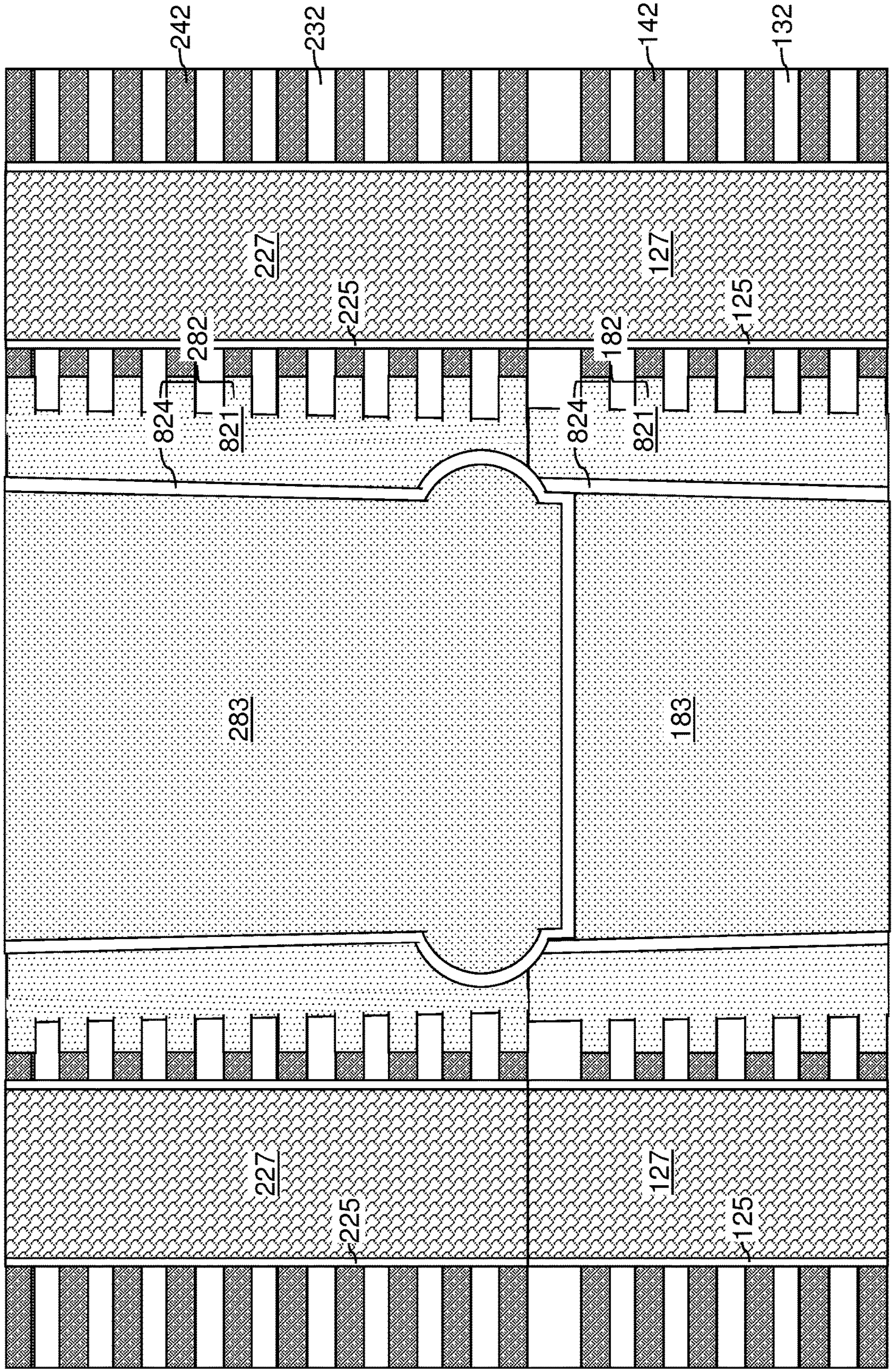

Referring to FIG. 10I, a second sacrificial via fill material layer can be formed by depositing a second sacrificial via fill material in the unfilled volumes of the second via cavities 289. In one embodiment, a conformal deposition process or a self-planarizing deposition process may be employed to deposit the second sacrificial via fill material layer. The second sacrificial via fill material may comprise a material that may be subsequently removed selective to the material of the silicon oxide liner layer 824L. Alternatively, in case the silicon oxide liner layer 824L is not employed, the second sacrificial via fill material may comprise a material that may be subsequently removed selective to the material of the main dielectric spacer portions 821. In one embodiment, the second sacrificial via fill material may comprise, for example, amorphous carbon, diamond-like carbon, organosilicate glass, or a polymer material.

Portions of the second sacrificial via fill material layer 283 and the optional silicon oxide liner layer 824L that overlie the horizontal plane including the top surface of the topmost second insulating layer 232T may be removed by a planarization process, which may employ a chemical mechanical polishing process and/or a recess etch process. Each remaining portion of the second sacrificial via fill material layer constitutes a second sacrificial via fill structure 283. Each remaining portion of the silicon oxide liner layer 824L constitutes a silicon oxide liner 824. Each second sacrificial via fill structure 283 is laterally surrounded by a respective second dielectric spacer 282. Each second dielectric spacer 282 comprises a main dielectric spacer portion 821 and an optional silicon oxide liner 824, if present. In one embodiment, each second dielectric spacer 282 may be a tubular dielectric spacer having a tubular configuration and located within a peripheral portion of a respective second via cavity 289. Each second sacrificial via fill structure 283 can be formed inside a respective tubular dielectric spacer as embodied as a second dielectric spacer 282.

According to an aspect of the present disclosure, one, a plurality and/or each of the second sacrificial via fill structures 283 may comprise a respective straight sidewall segment and a respective convex surface segment that is adjoined to a bottom periphery of the respective straight sidewall segment. The respective convex surface segment laterally protrudes outward relative to the respective straight sidewall segment.

Figure 11A:
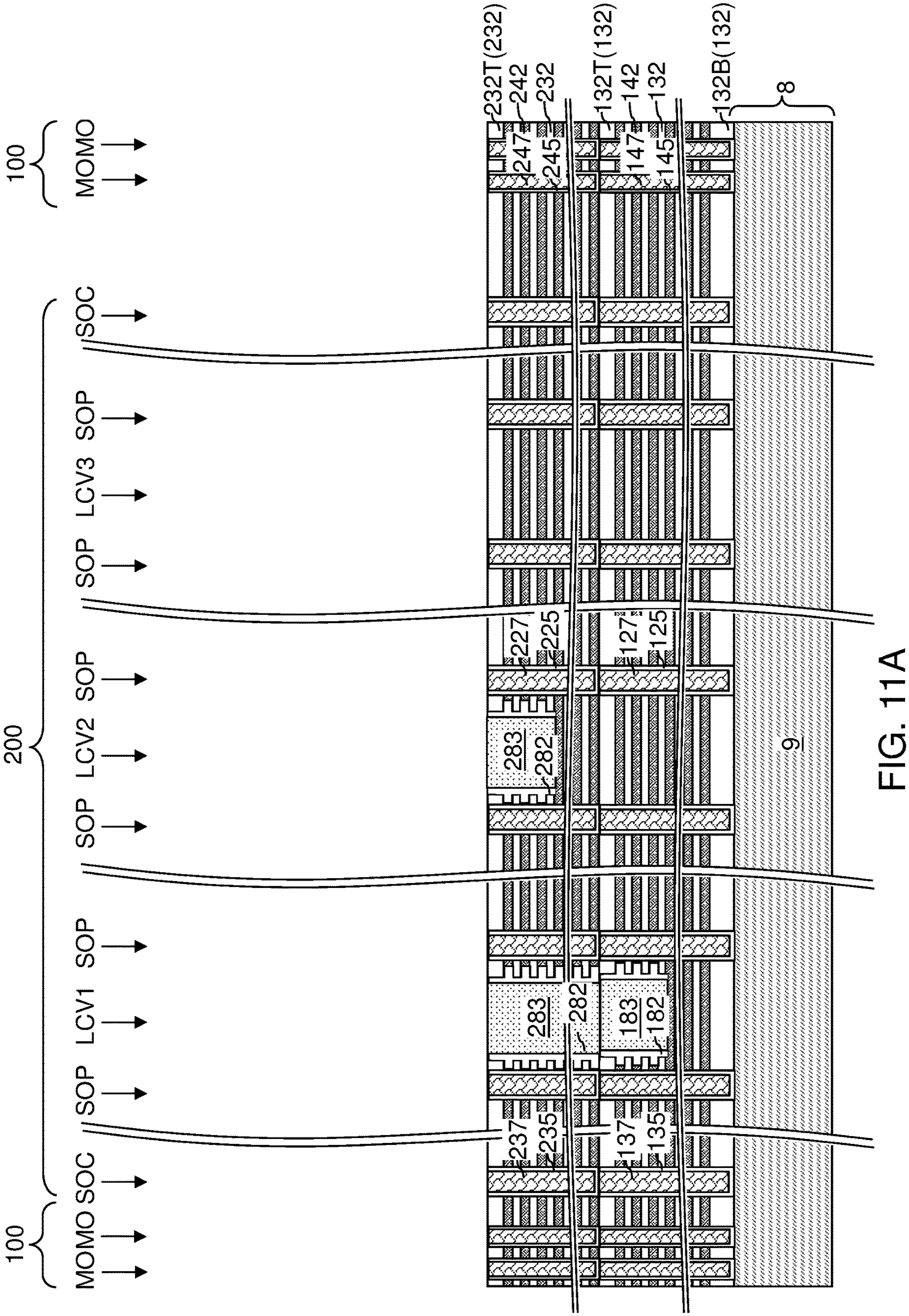
FIG. 11A is a vertical cross-sectional view of the exemplary structure after formation of first sacrificial via fill structures according to an embodiment of the present disclosure.
Figure 11B:
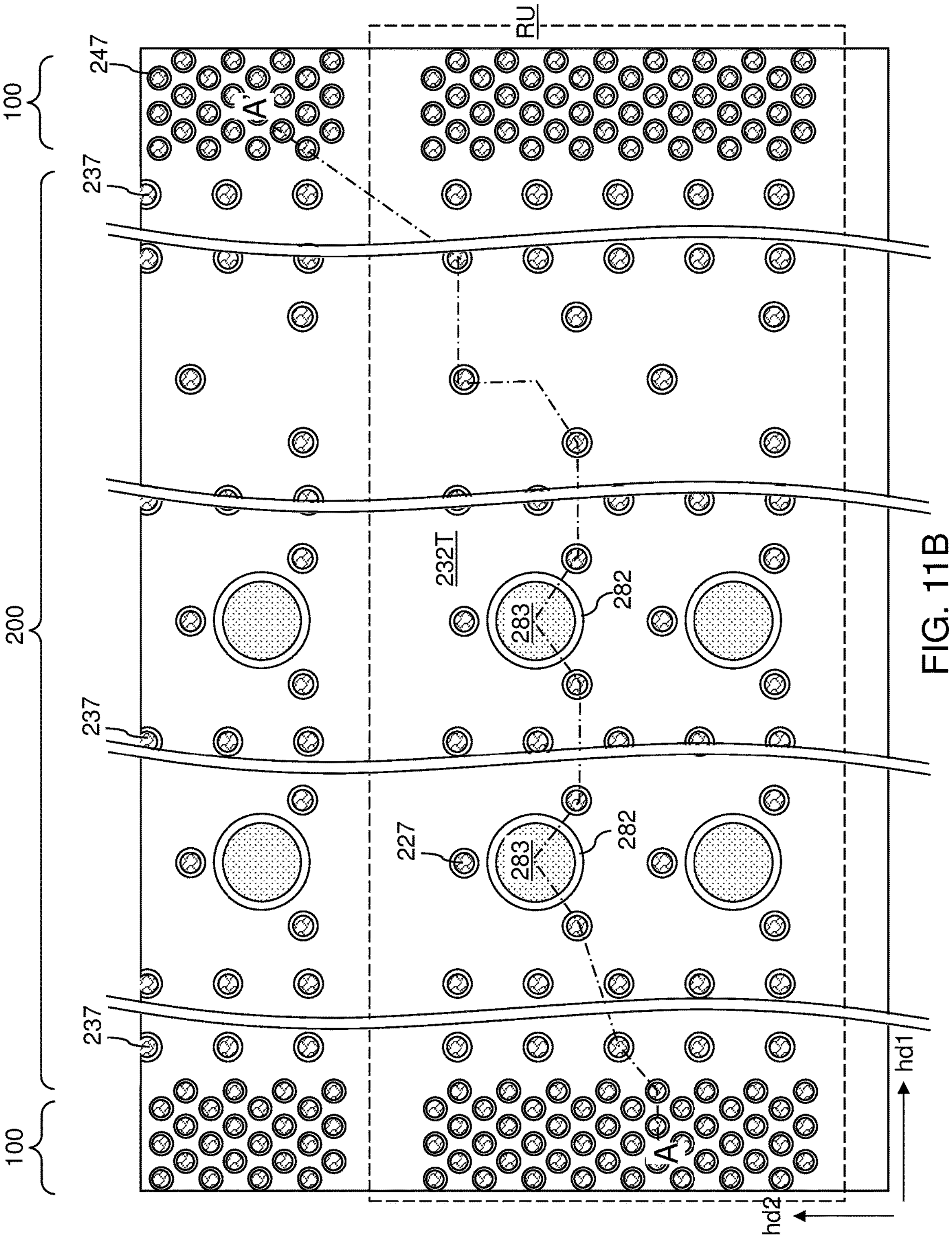
FIG. 11B is a top-down view of the exemplary structure of FIG. 11A. The hinged vertical plane A-A' is a cut plane of the vertical cross-sectional view of FIG. 11A.

Referring to FIGS. 11A and 11B, the exemplary structure is illustrated after formation of the second sacrificial via fill structures 283.

Figure 12:
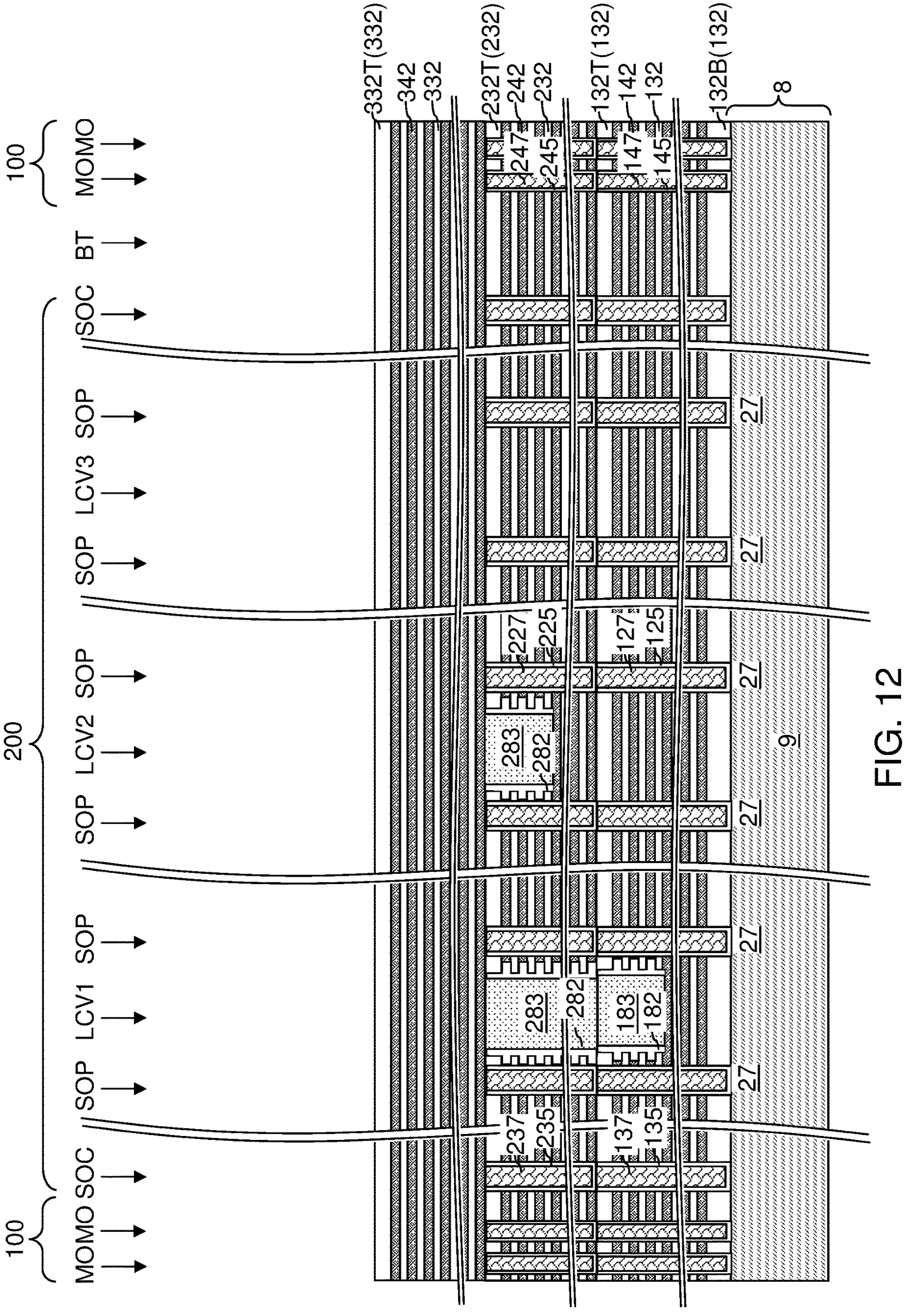
FIG. 12 is a vertical cross-sectional view of the exemplary structure after formation of a third alternating stack of third insulating layers and third sacrificial material layers according to an embodiment of the present disclosure.

Referring to FIG. 12, a third alternating stack (332, 342) of third insulating layers 332 and third sacrificial material layers 342 can be formed above the second alternating stack (232, 242). The third insulating layers 332 may have the same material composition as, and may have the same thicknesses range as, the first insulating layers 132. The third sacrificial material layers 342 may have the same material composition as, and may have the same thickness range as, the first sacrificial material layers 142. Generally, the third alternating stack (332, 342) may be formed by performing the processing steps described with reference to FIG. 1. The topmost one of the third insulating layers 332 is herein referred to as a topmost third insulating layer 332T.

Figure 13A:
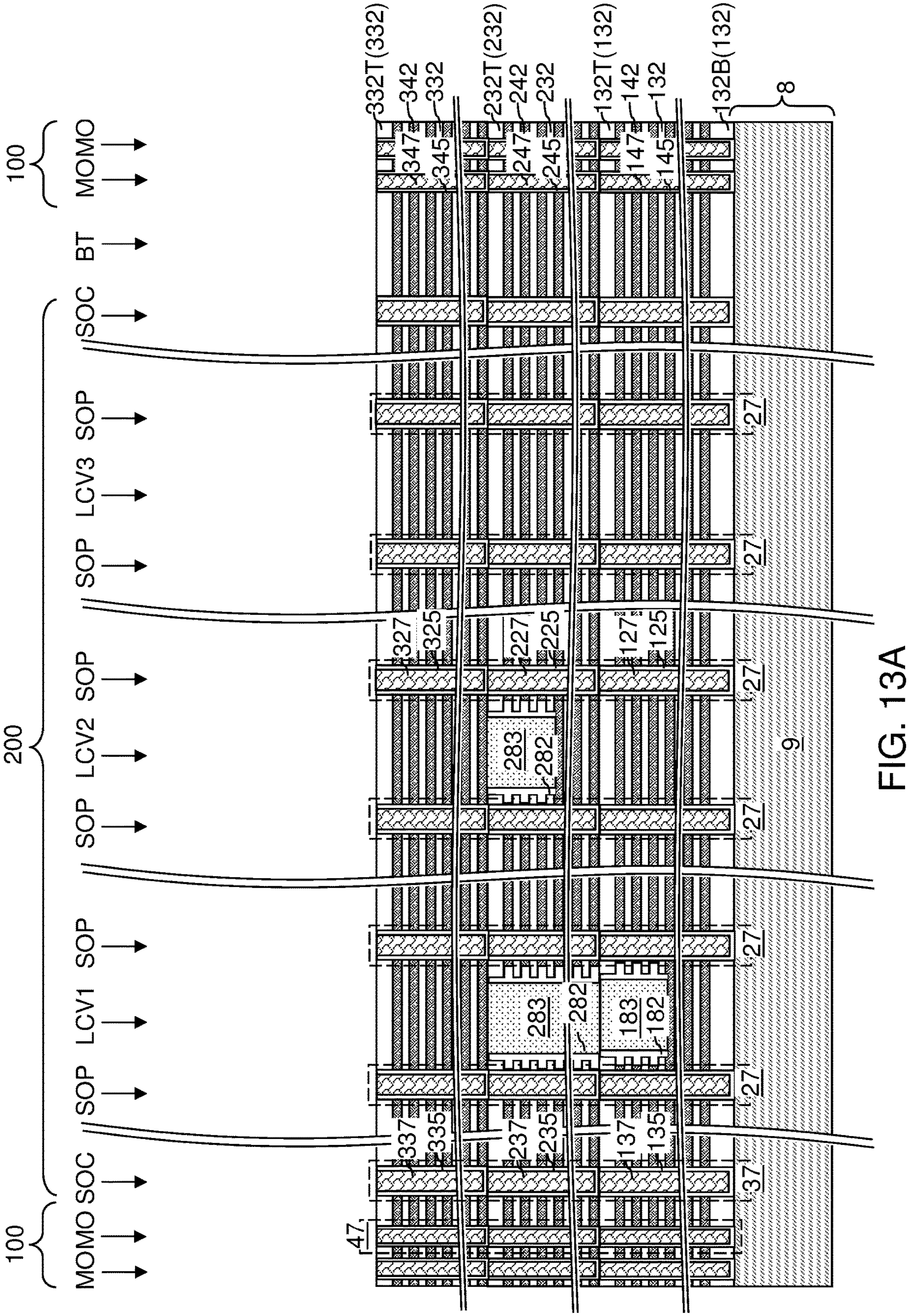
FIG. 13A is a vertical cross-sectional view of the exemplary structure after formation of third-tier sacrificial pillar structures according to an embodiment of the present disclosure.
Figure 13B:
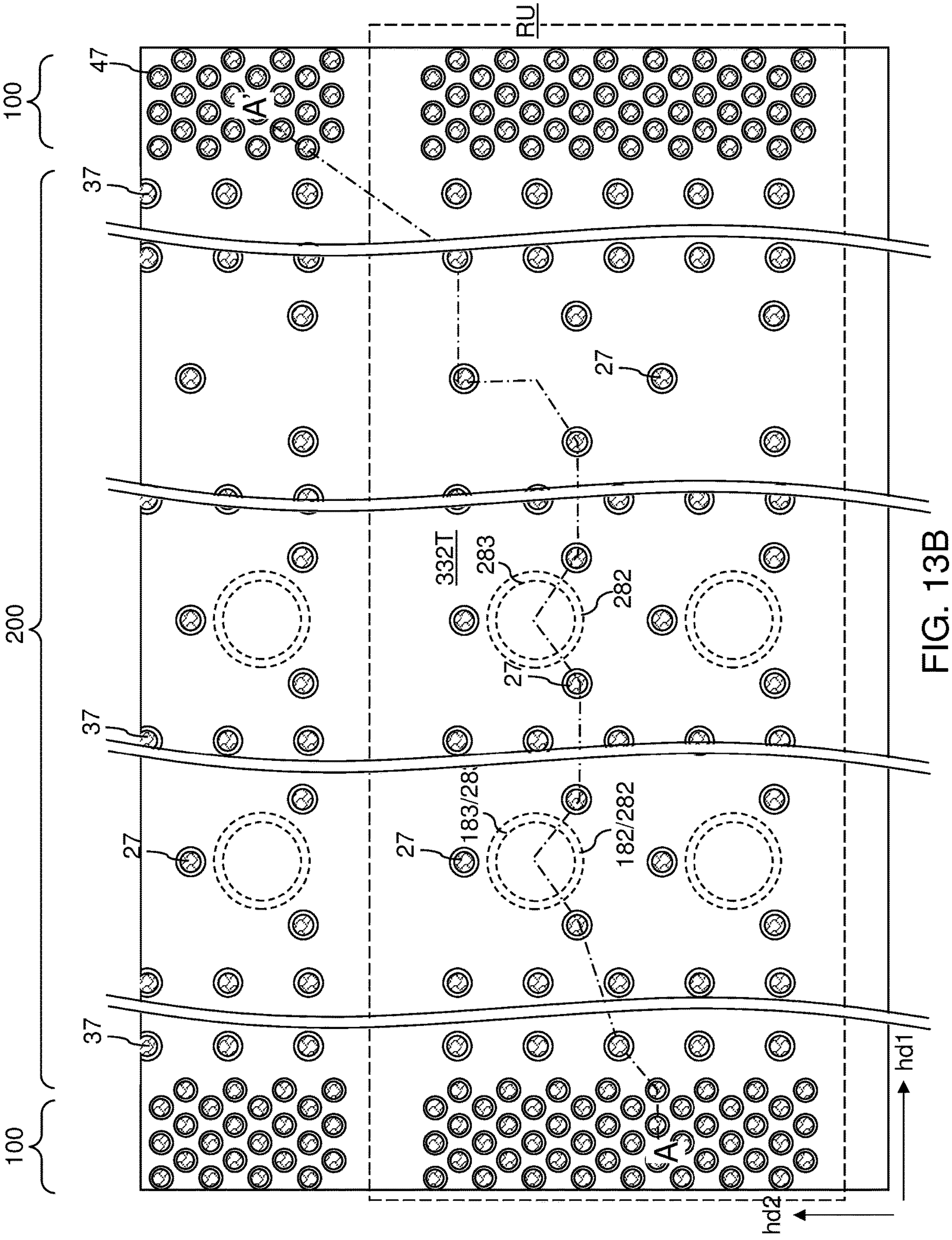
FIG. 13B is a top-down view of the exemplary structure of FIG. 13A. The hinged vertical plane A-A' is a cut plane of the vertical cross-sectional view of FIG. 13A.

Referring to FIGS. 13A and 13B, the set of processing steps described with reference to FIGS. 2A, 2B, and 3 can be performed to form third sacrificial opening fill structures {(345, 347), (325, 327), (335, 337)}. Generally, third-tier openings can be formed through the third alternating stack (332, 342). The third-tier openings may comprise third memory openings that are formed on top of a respective second sacrificial memory opening fill structure (245, 247), primary third sacrificial openings that are formed on top of a respective primary second sacrificial pillar structure (225, 227), and supplementary third sacrificial openings that are formed on top of a respective supplementary second sacrificial pillar structure (235, 237).

The third sacrificial opening fill structures {(345, 347), (335, 337), (335, 337)} may comprise third sacrificial memory opening fill structures (345, 347) that are formed in the third memory opening, primary third sacrificial pillar structure (325, 327) that are formed in the primary third sacrificial opening, and supplementary third sacrificial pillar structure (335, 337) that are formed in the supplementary third sacrificial openings. Each third sacrificial memory opening fill structure (345, 347) may comprise an optional third etch stop liner 345 and a third sacrificial memory opening fill material portion 347. Each primary third sacrificial pillar structure (325, 327) may comprise an optional third etch stop liner 325 and a primary third sacrificial fill material portion 327. Each supplementary third sacrificial pillar structure (335, 337) may comprise an optional third etch stop liner 335 and a supplementary third sacrificial fill material portion 337. The top surfaces of the third sacrificial opening fill structures {(345, 347), (335, 337), (335, 337)} may be coplanar with the top surface of the topmost third insulating layer 332T. Each of the third sacrificial opening fill structures {(345, 347), (335, 337), (335, 337)} may, or may not, include cavities therein.

Each vertical stack of a first sacrificial memory opening fill structure (145, 147), a second sacrificial memory opening fill structure (245, 247), and a third sacrificial memory opening fill structure (345, 347) constitutes a sacrificial memory opening fill structure stack 47. Each vertical stack of a primary first sacrificial pillar structure (125, 127), a primary second sacrificial pillar structure (225, 227), and a primary third sacrificial pillar structure (325, 327) constitutes a primary sacrificial pillar structure stack 27. Each vertical stack of a supplementary first sacrificial pillar structure (135, 137), a supplementary second sacrificial pillar structure (235, 237), and a supplementary third sacrificial pillar structure (335, 337) constitutes a supplementary sacrificial pillar structure stack 37.

Figure 14:
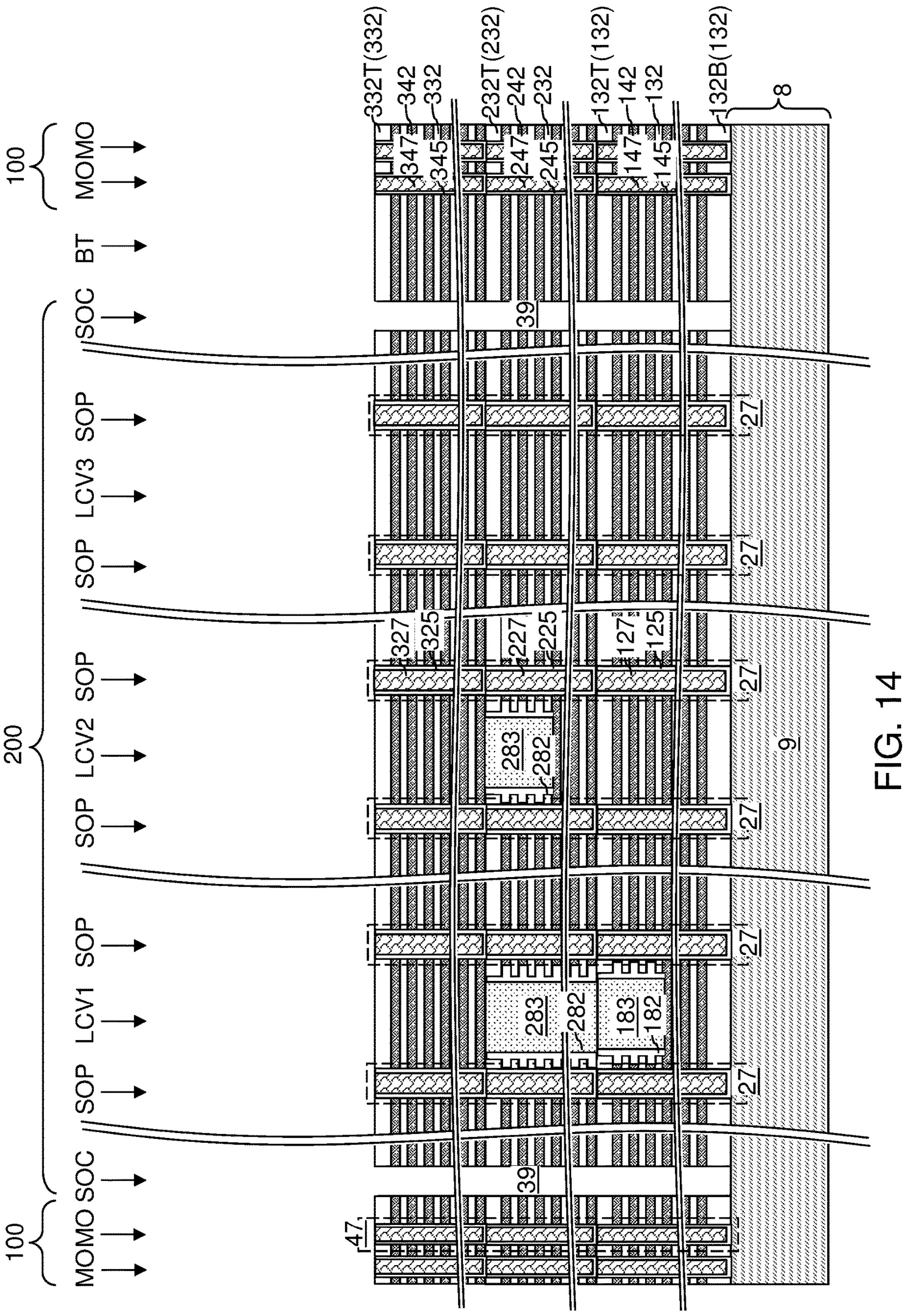
FIG. 14 is a vertical cross-sectional view of the exemplary structure after formation of pillar cavities by removal of supplementary sacrificial pillar structures according to an embodiment of the present disclosure.

Referring to FIG. 14, a photoresist layer (not shown) can be applied over the third alternating stack (332, 342), and can be lithographically patterned to form discrete openings over the areas of the supplementary sacrificial pillar structure stacks 37. At least one etch selective etch process can be performed to remove the supplementary sacrificial pillar structure stacks 37, i.e., to remove the supplementary third sacrificial pillar structures (335, 337), the supplementary second sacrificial pillar structures (235, 237), and the supplementary first sacrificial pillar structures (135, 137). Supplementary pillar cavities 39 can be formed in volumes from which the supplementary sacrificial pillar structure stacks 37 are removed. Each supplementary pillar cavity 39 comprises a respective void formed by removal of a respective one of the supplementary first sacrificial pillar structures (135, 137), a respective one of the supplementary second sacrificial pillar structures (235, 237), and a respective one of the supplementary third sacrificial pillar structures (335, 337).

Figure 15:
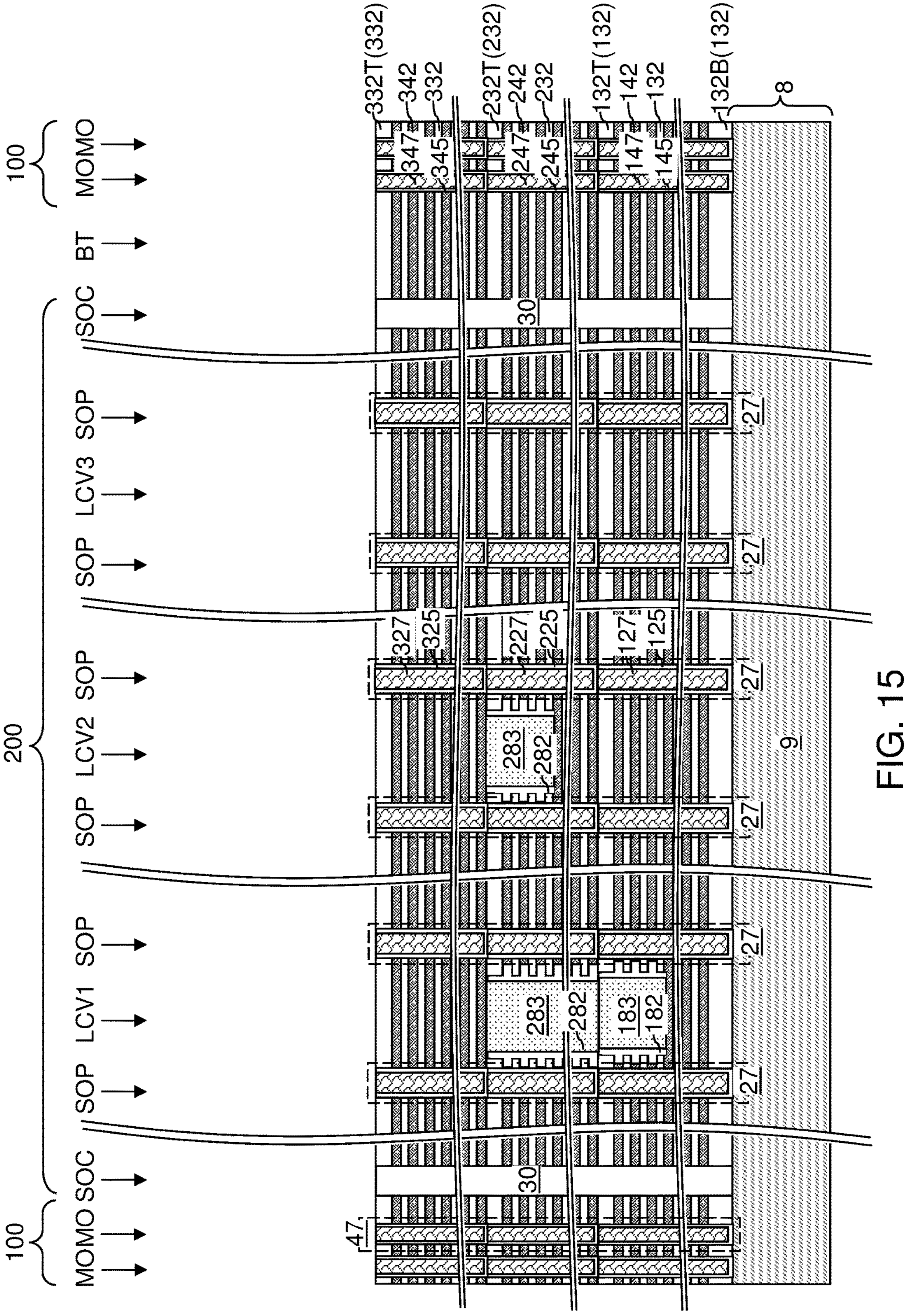
FIG. 15 is a vertical cross-sectional view of the exemplary structure after formation of supplementary dielectric pillar structures according to an embodiment of the present disclosure.

Referring to FIG. 15, a dielectric fill material, such as silicon oxide, can be deposited in the supplementary pillar cavities 39. Excess portions of the dielectric fill material can be removed from above the horizontal plane including the top surface of the topmost third-tier insulating layer 332T. Each remaining portion of the dielectric fill material that fills a respective supplementary pillar cavity 39 constitutes a supplementary dielectric pillar structure 30. Each supplementary dielectric pillar structure 30 may vertically extend through each layer within the alternating stacks {(132, 242), (232, 242), (332, 342)}.

Figure 16:
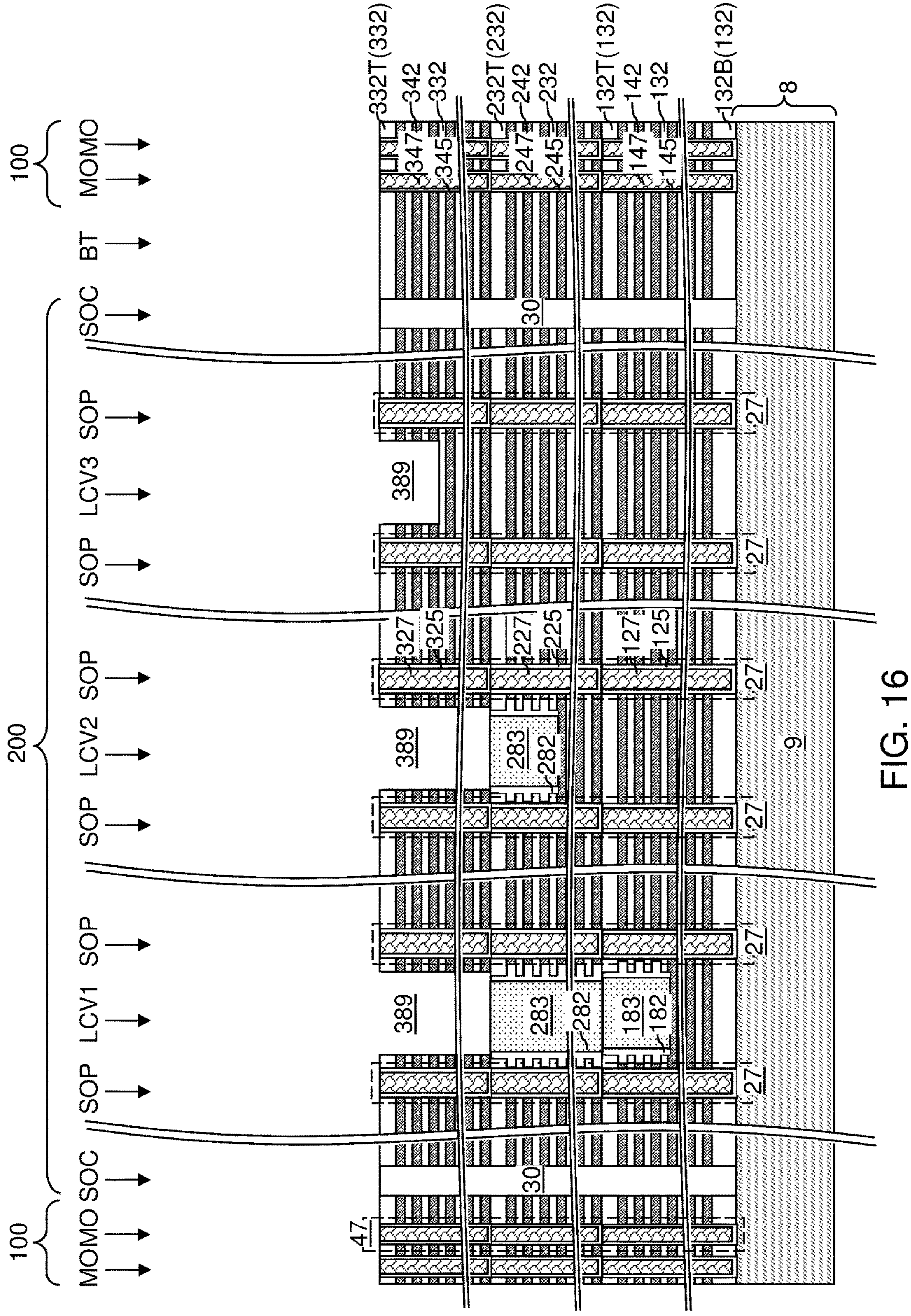
FIG. 16 is a vertical cross-sectional view of the exemplary structure after formation of third via cavities according to an embodiment of the present disclosure.

Referring to FIG. 16, the processing steps described with reference to FIG. 9 may be performed with respect to the third alternating stack (332, 342) in lieu of the second alternating stack (232, 242) to form third via cavities 389. A first subset of the third via cavities 389 may be formed at locations at which third layer contact via structures are to be subsequently formed. The locations of first subset of the third via cavities 389 are herein referred to as third layer contact via locations LCV3. The third layer contact via locations LCV3 are different from the second layer contact via locations LCV2 and the first layer contact via locations LCV1. The first subset of the third via cavities 389 can be formed such that each third insulating layer 332 other than the bottommost third insulating layer is physically exposed to at least one third via cavity 389 within the first subset of the third via cavities 389.

A second subset of the third via cavities 389 may be formed at the second layer contact via locations LCV2 and at the first layer contact via locations LCV1. Each third via cavity 389 within the second subset of the third via cavities 389 may be formed such that a top surface of a second sacrificial via fill structure 283 is physically exposed underneath each third via cavity 389 within the second subset of the third via cavities 389. In one embodiment, each of the second sacrificial via fill structures 283 may be exposed underneath a respective third via cavity 389 within the second subset of the third via cavities 389.

Generally, each third via cavity 389 within the first subset of the third via cavities 389 may be formed by performing a respective anisotropic etch process including a respective terminal etch step that etches one of the third sacrificial material layers 342 selective to a material of the third insulating layers 332. A horizontal top surface of a third insulating layer 332 can be physically exposed at the bottom of each third via cavity 389 within the first subset of the third via cavities. Each third via cavity 389 within the second subset of the third via cavities 389 may be formed through each layer of the third alternating stack (232, 342) such that a top surface of a second sacrificial via fill structure 283 is exposed underneath each third via cavity 389 within the third subset of the third via cavities 389.

Figure 17A:
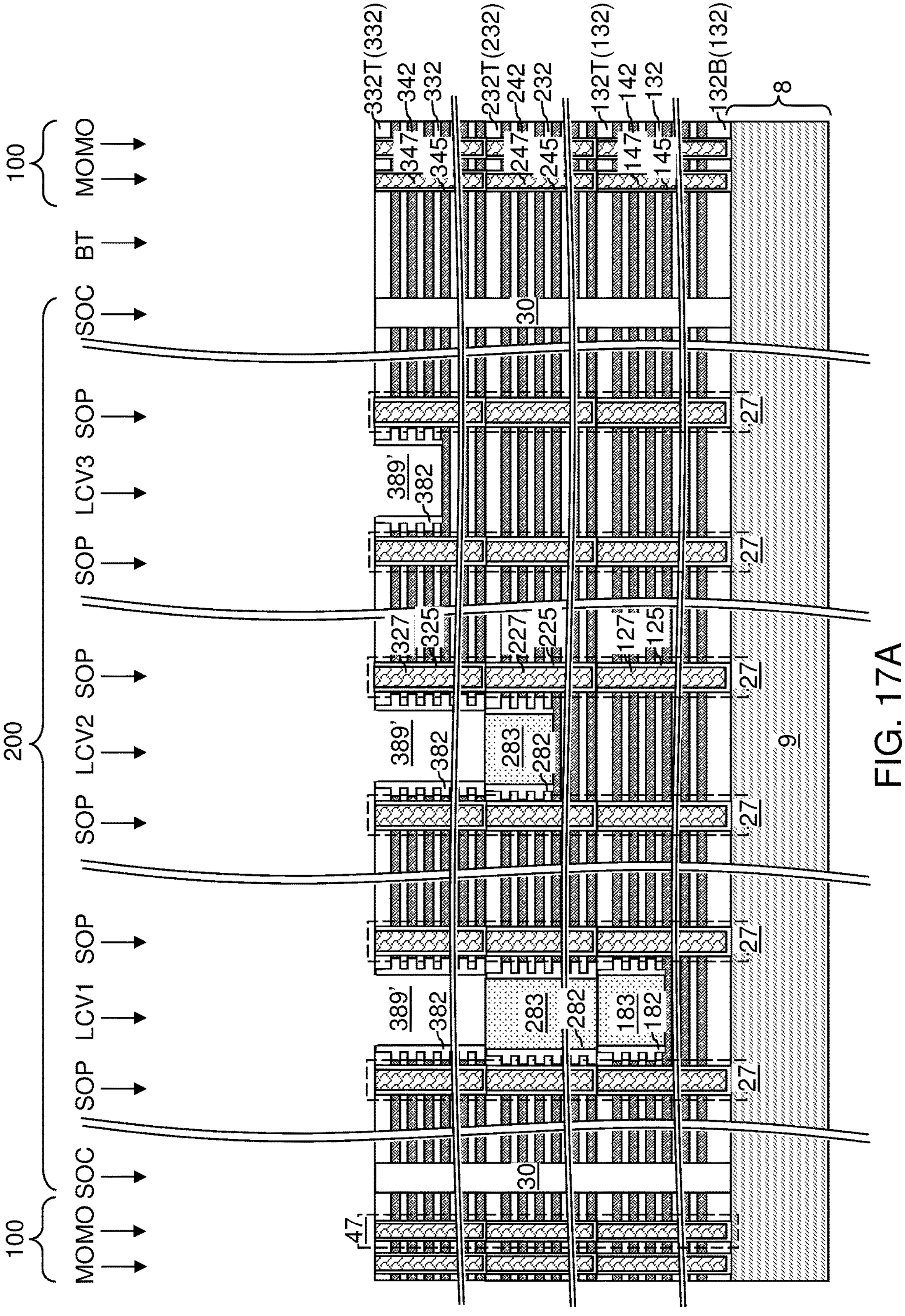
FIG. 17A is a vertical cross-sectional view of the exemplary structure after formation of third dielectric spacers according to an embodiment of the present disclosure.
Figure 17B:
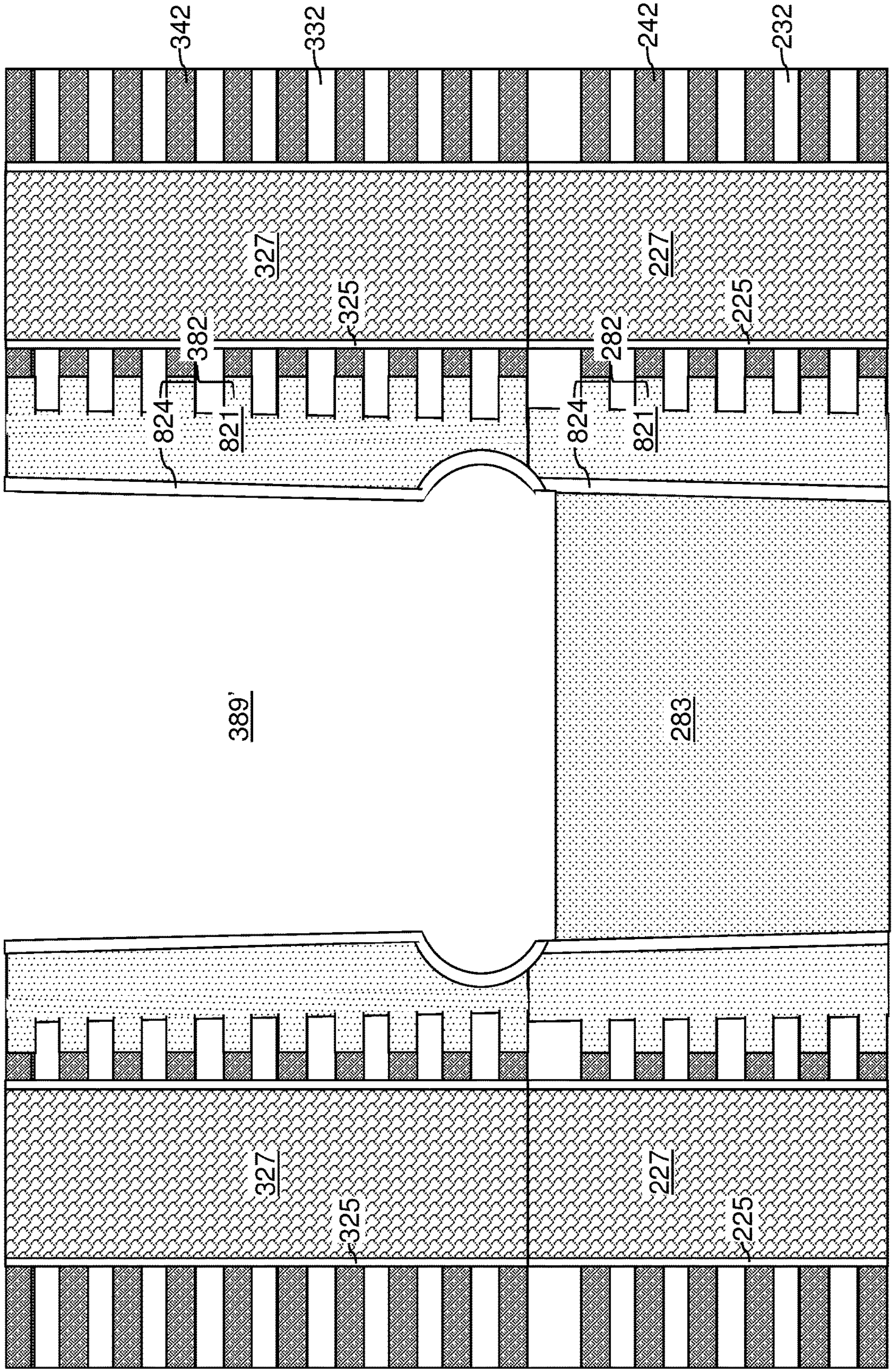
FIG. 17B is a magnified view of a region around a third via cavity in the exemplary structure of FIG. 17A.

Referring to FIGS. 17A and 17B, the processing steps described with reference to FIGS. 10B-10H can be performed. Specifically, sidewalls of the third sacrificial material layers 342 that are exposed to the third via cavities 389 can be laterally recessed by an isotropic etch process. An annular lateral recess is formed in each volume from which the material of the third sacrificial material layers 342 is removed. A layer stack of a dielectric spacer material layer and a sacrificial spacer material layer can be deposited in each of the third via cavities 389 and over the third alternating stack (332, 342). An anisotropic etch process can be performed to remove horizontally-extending portions of the sacrificial spacer material layer. Each vertically-extending remaining portion of the sacrificial spacer material layer constitutes a tubular sacrificial spacer 822, which can have a tubular configuration. Horizontally-extending portions of the dielectric spacer material layer may be collaterally vertically recessed after removal of the horizontally-extending portions of the sacrificial spacer material layer.

An isotropic etch process can be performed, which etches the material of the dielectric spacer material layer selective to the material of the tubular sacrificial spacers 822. The duration of the isotropic etch process can be selected such that the isotropic etch process removes horizontally-extending portions of the dielectric spacer material layer underlying the third via cavities 389 and removes a third insulating layer 332 that underlies the horizontally-extending portions of the dielectric spacer material layer. Each remaining portion of the dielectric spacer material layer constitutes a dielectric spacer portion, which is herein referred to as main dielectric spacer portion 821. The isotropic etch process may be selective to the third sacrificial material layers 342. A top surface of a third sacrificial material layer 342 can be physically exposed at the bottom of each void 389' in the first subset of the third via cavities 389. A top surface of a second sacrificial via fill structure 283 can be physically exposed at the bottom of each void 389' in the second subset of the second via cavities 389.

A contoured etch front develops during the isotropic etch process underneath each void 389' in the third via cavities 389. Thus, each main dielectric spacer portion 821 comprises a respective concave annular surface segment that is physically exposed to a respective void 389'. In one embodiment, each main dielectric spacer portion 821 may comprise at least one annular dielectric fin that fills a respective annular lateral recess and contacts a cylindrical sidewall of a respective one of the third sacrificial material layers 342. In one embodiment, a subset of the main dielectric spacer portions 821 may comprise a respective plurality of annular dielectric fins. Such main dielectric spacer portions 821 may have a vertical cross-sectional profile in which a plurality of annular dielectric fins laterally protrude outward to contact a subset of the third sacrificial material layers 342. An inner sidewall of one, a plurality and/or each of the second dielectric spacers 282 may be collaterally chamfered during the isotropic etch process.

The tubular sacrificial spacers 822 can be removed selective to the materials of the third sacrificial material layers 342 and the main dielectric spacer portions 821. A conformal silicon-containing layer may be optionally deposited over the exemplary structure directly on inner sidewalls of the main dielectric spacer portions 821 and directly on a top surface of the topmost third insulating layer 332T, and a thermal oxidation process can be performed to convert the conformal silicon-containing layer into a silicon oxide liner layer.

Subsequently, an anisotropic etch process may be performed to remove horizontally-extending portions of the silicon oxide liner layer. A top surface of a second sacrificial via fill structure 283 can be exposed underneath each third via cavity 389 within the second subset of the third via cavities 389. Each remaining portion of the silicon oxide liner layer 824L constitutes a silicon oxide liner 824. Each void 383' is laterally surrounded by a respective third dielectric spacer 382. Each third dielectric spacer 382 comprises a main dielectric spacer portion 821 and an optional silicon oxide liner 824, if present. In one embodiment, each third dielectric spacer 382 may be a tubular dielectric spacer having a tubular configuration and located within a peripheral portion of a respective third via cavity 389.

According to an aspect of the present disclosure, one, a plurality and/or each of the voids 389' may comprise a respective straight sidewall segment and a respective convex surface segment that is adjoined to a bottom periphery of the respective straight sidewall segment. The respective convex surface segment laterally protrudes outward relative to the respective straight sidewall segment.

Figure 18:
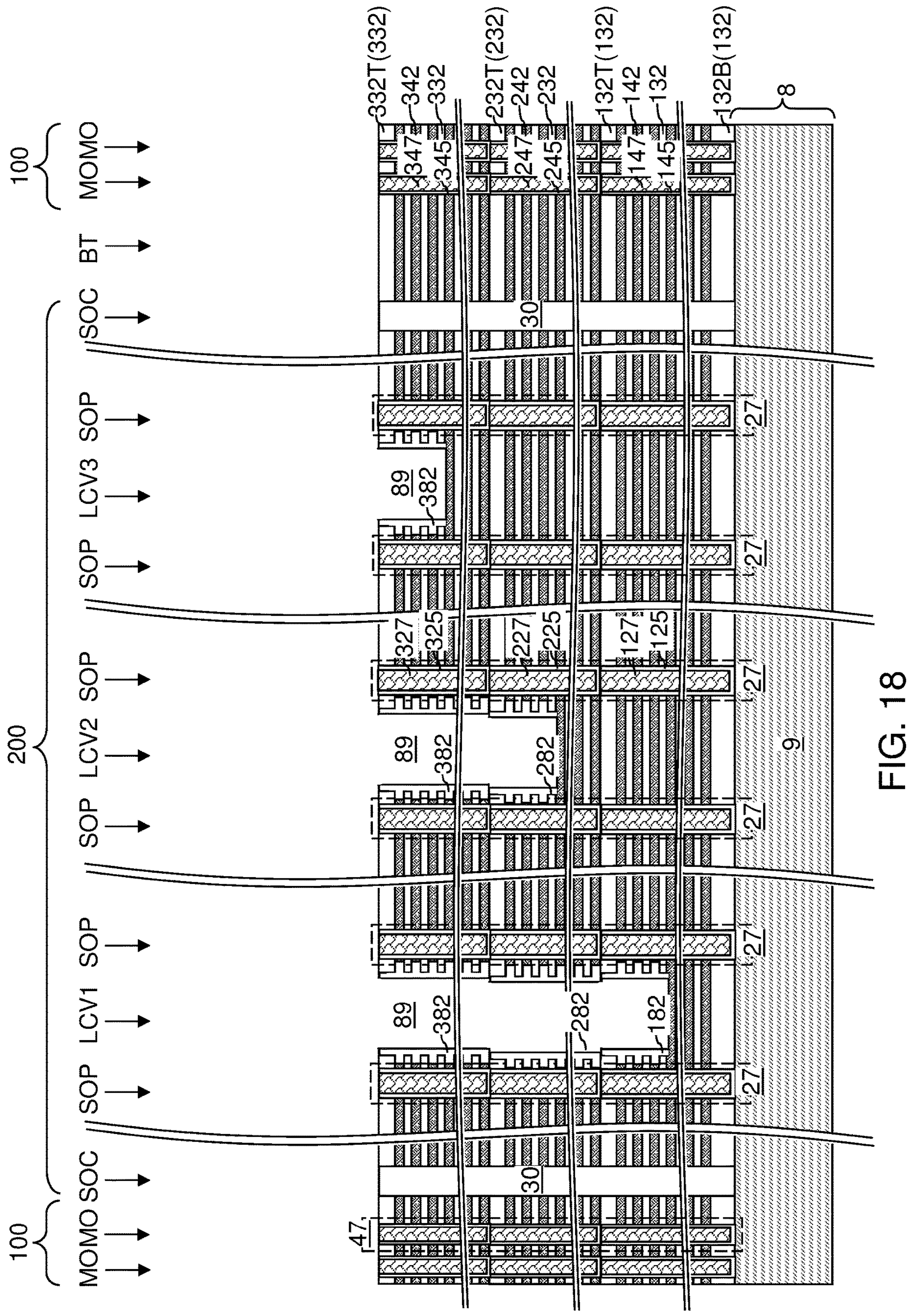
FIG. 18 is a vertical cross-sectional view of the exemplary structure after formation of layer contact via cavities according to an embodiment of the present disclosure.

Referring to FIG. 18, the second sacrificial via fill structures 283, horizontally-extending portions of a silicon oxide liner 824 within each second dielectric spacer 282, and the first sacrificial via fill structures 183 may be sequentially removed selective to the materials of the third sacrificial material layers 342 and the second sacrificial material layers 242. Layer contact via cavities 89 are formed in each continuous unfilled volume that is laterally surrounded by at least one dielectric spacer (182, 282, 382). Each contact via cavity 89 comprises a volume of a respective void 389' that is laterally surrounded by a respective third dielectric spacer 382, and may further comprise a volume of at least one additional void that is laterally surrounded by a respective second dielectric spacer 282 and/or by a respective first dielectric spacer 182.

Figure 19A:
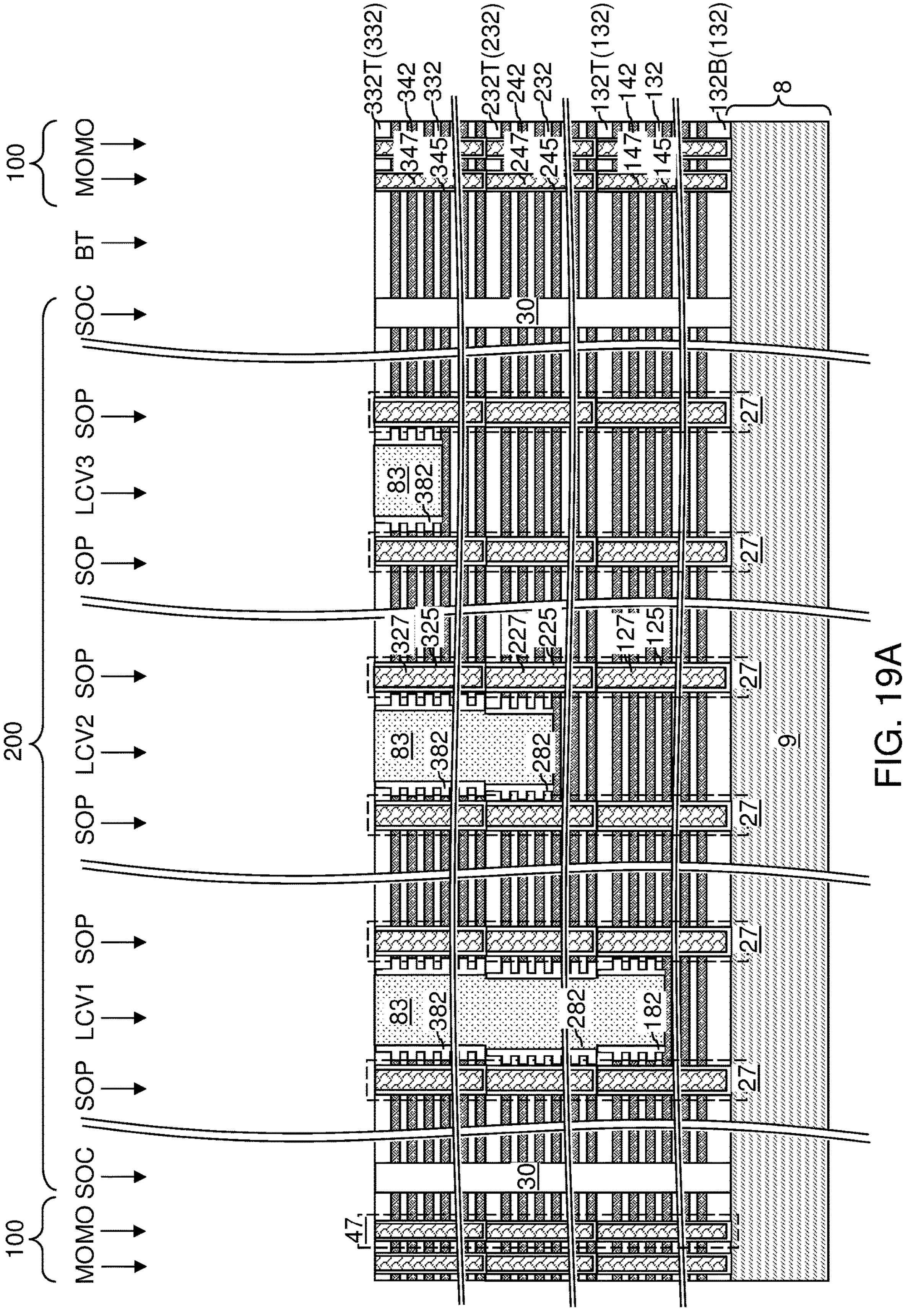
FIG. 19A is a vertical cross-sectional view of the exemplary structure after formation of sacrificial via fill structures according to an embodiment of the present disclosure.
Figure 19B:
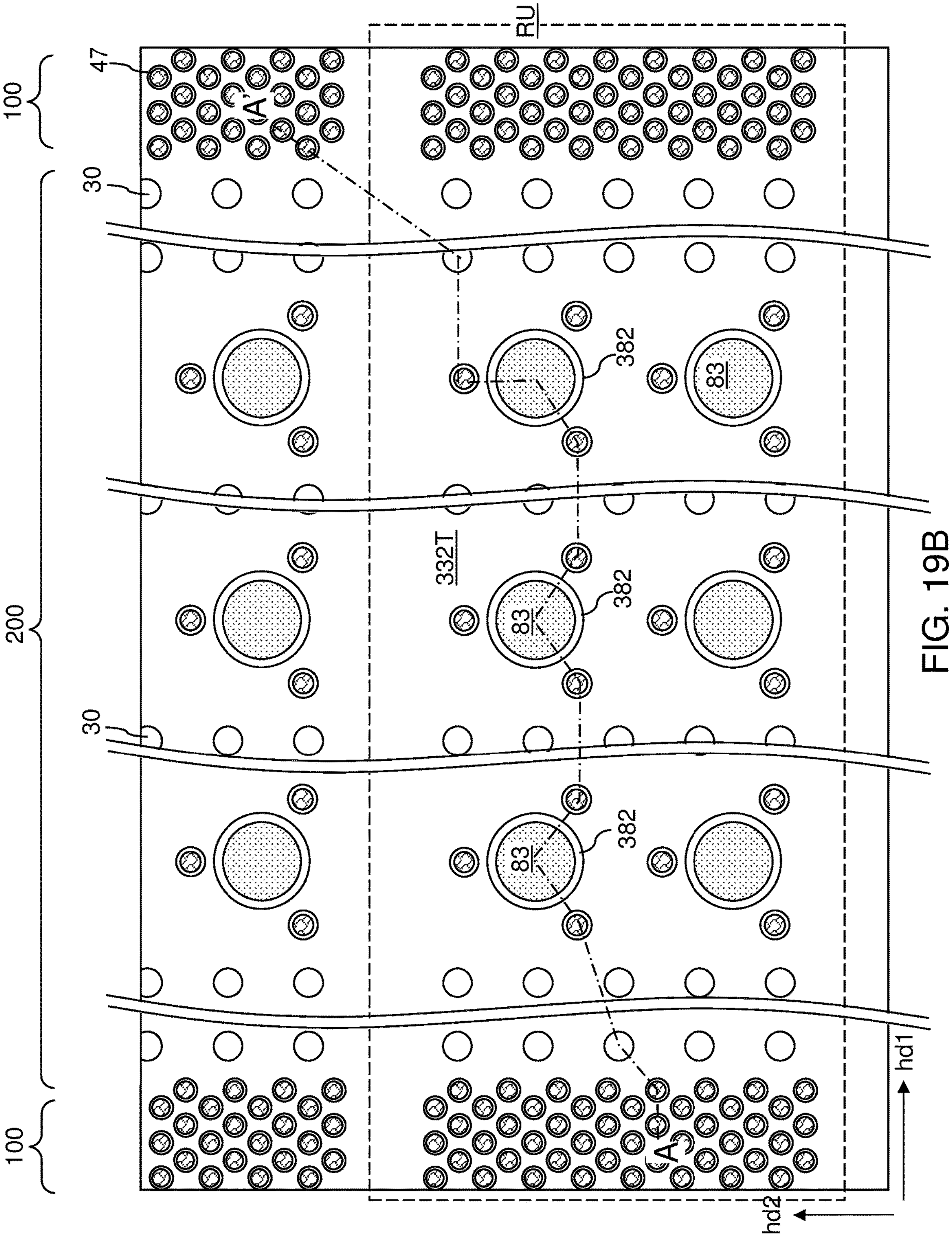
FIG. 19B is a top-down view of the exemplary structure of FIG. 19A. The hinged vertical plane A-A' is a cut plane of the vertical cross-sectional view of FIG. 19A.

Referring to FIGS. 19A and 19B, a sacrificial via fill material may be deposited in the layer contact via cavities 89 to form sacrificial via fill structures 83. The sacrificial via fill structures 83 comprises a sacrificial via fill material such as amorphous carbon, diamond-like carbon, organosilicate glass, or a polymer material.

While an embodiment is described in which each layer contact via cavity 89 is filled with a respective sacrificial via fill structure 83, an alternative embodiment is expressly contemplated herein in which each layer contact via cavity is filled with a respective set of at least one sacrificial via fill structure (183, 283, 383). In the alternative embodiment, the processing steps described with reference to FIG. 18 may be omitted, and a sacrificial via fill material can be deposited in the voids 389' in the third via cavities 389 to form a third sacrificial via fill structure. In this case, the volumes of the layer contact via cavities 89 may be filled with a respective set of at least one sacrificial vial fill material portion (183, 283, 383) that includes at least a respective third sacrificial via fill structure 383 and optionally includes a respective second sacrificial via fill structure 283 and/or a respective first sacrificial via fill structure 183.

Figure 20A:
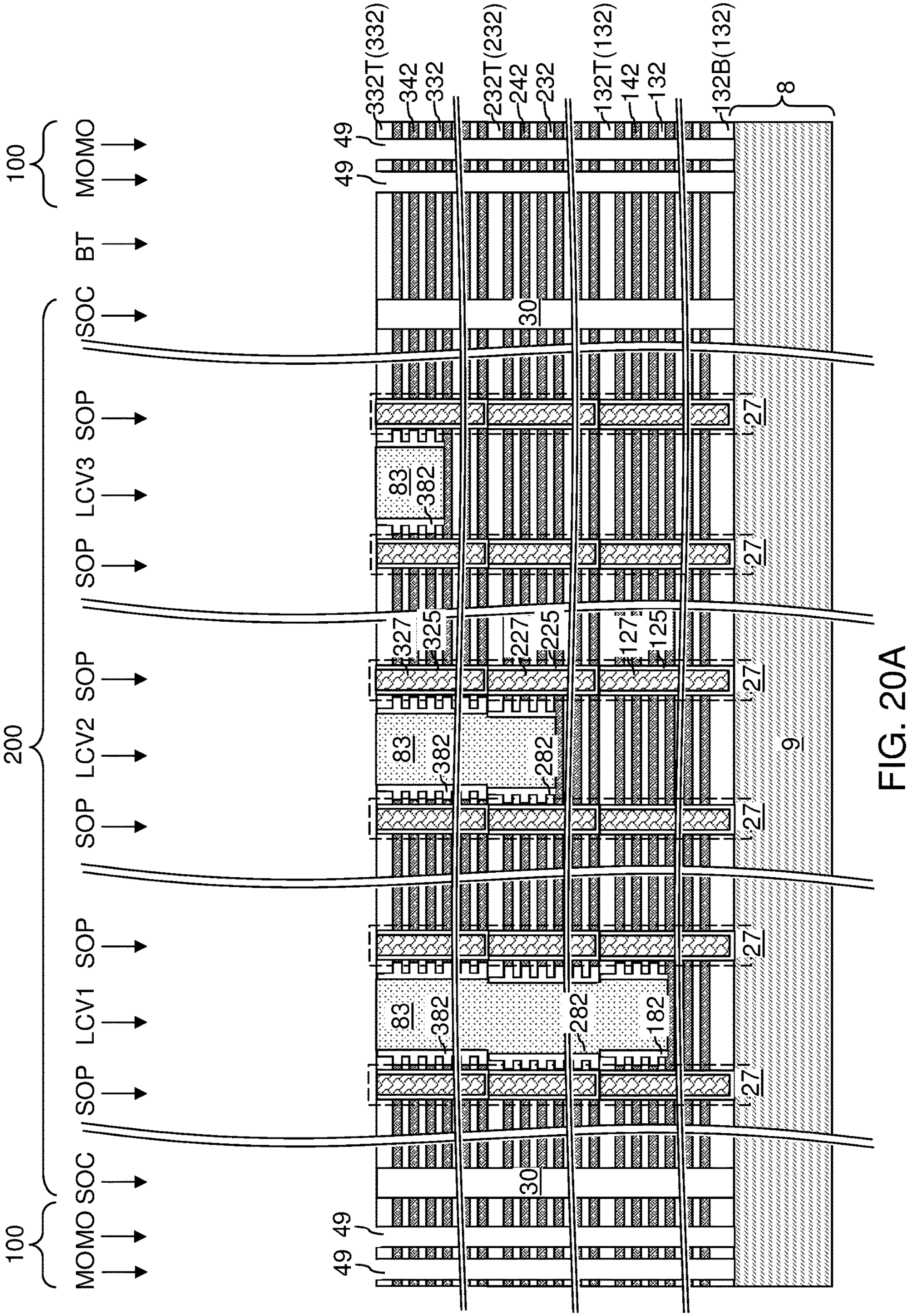
FIG. 20A is a vertical cross-sectional view of the exemplary structure after formation of inter-tier memory openings according to an embodiment of the present disclosure.
Figure 20B:
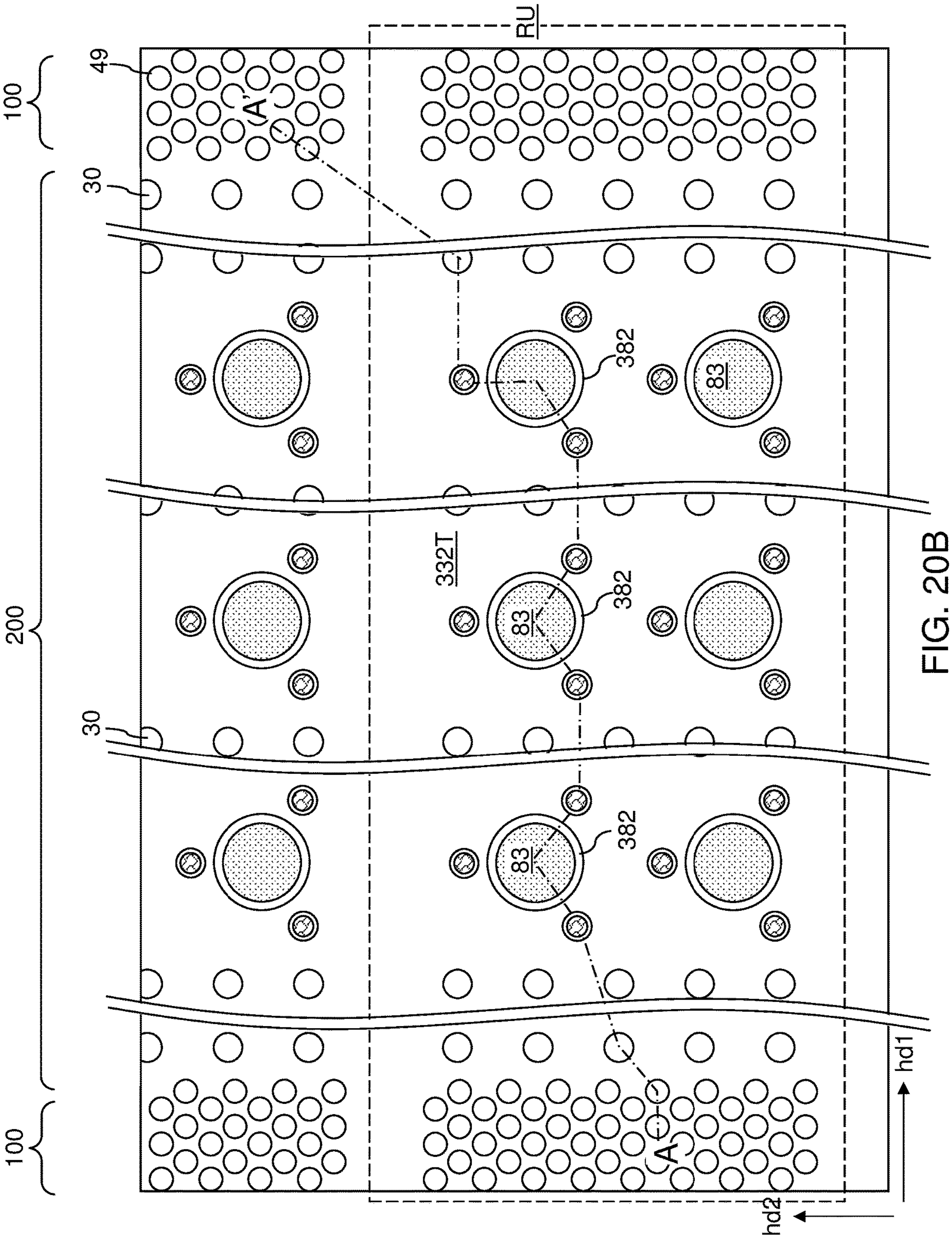
FIG. 20B is a top-down view of the exemplary structure of FIG. 20A. The hinged vertical plane A-A' is a cut plane of the vertical cross-sectional view of FIG. 20A.

Referring to FIGS. 20A and 20B, a photoresist layer can be applied over the third alternating stack (332, 342), and can be lithographically patterned to cover the primary sacrificial pillar structure stack 27 and the supplementary dielectric pillar structures 30 without covering the sacrificial memory opening fill structure stacks 47. The sacrificial memory opening fill structure stacks 47 are removed selective to materials of the alternating stacks {(132, 142), (232, 242), (332, 342)} by performing at least one selective etch process, which may comprise at least one isotropic etch process and/or at least one anisotropic etch process. Each void formed by removal of a sacrificial memory opening fill structure stack 47 is herein referred to as a memory opening 49, or as an inter-tier memory opening 49.

Figure 21B:
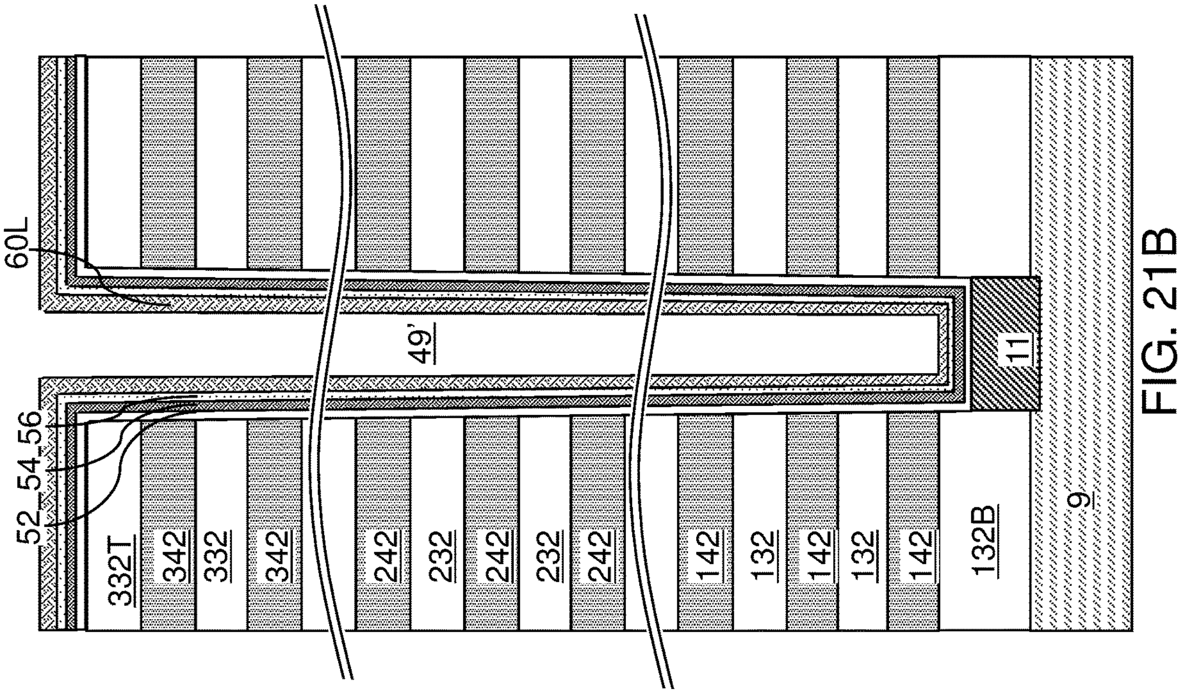
FIGS. 21A-21D are sequential vertical cross-sectional views of an inter-tier memory opening during formation of a memory opening fill structure according to an embodiment of the present disclosure.
Figure 21A:
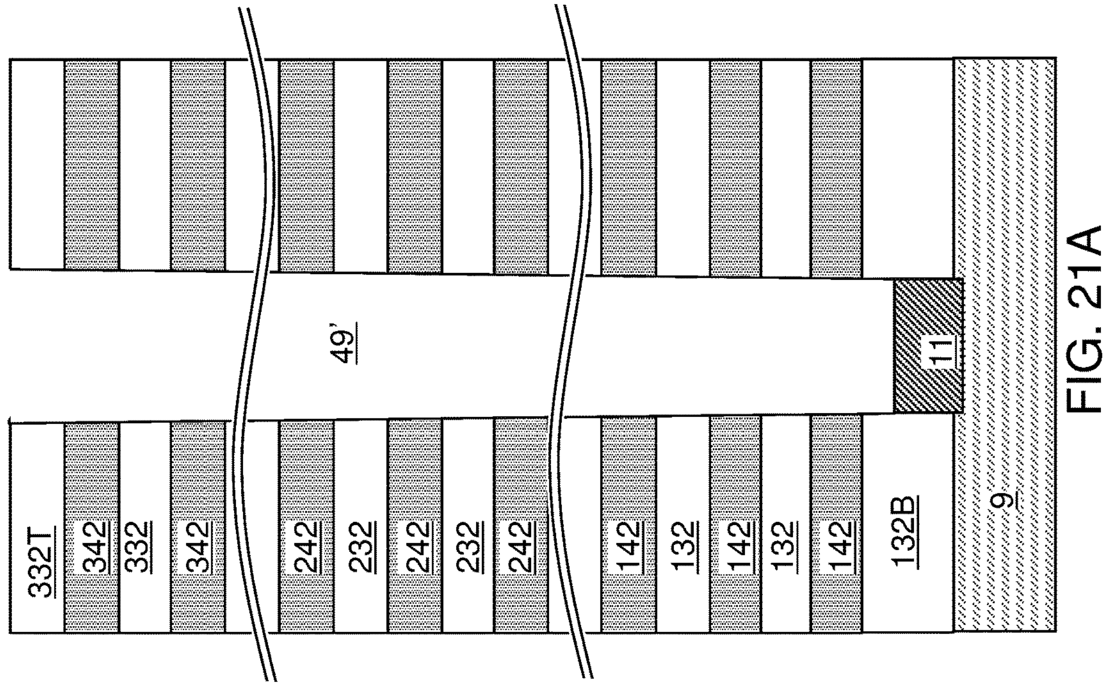

Referring to FIG. 21A, an optional semiconductor pedestal 11 may be formed at a bottom portion of each memory opening 49. In one embodiment, the semiconductor pedestals 11 may comprise a semiconductor material that is grown on physically exposed surfaces of the substrate 8 by a selective deposition process. For example, bottom surfaces of the memory opening 49 may be semiconductor surfaces of the substrate material layer 9 within the substrate 8, and a selective semiconductor deposition process may be performed to grow a semiconductor material (such as silicon or a silicon-germanium alloy) from the physically exposed semiconductor surfaces of the substrate material layer 9 to form the semiconductor pedestals 11. In one embodiment, the top surfaces of the semiconductor pedestals 11 may be formed below the horizontal plane including the top surface of the bottommost first insulating layer 132B. In an alternative embodiment, the semiconductor pedestals 11 may be formed prior to formation of the first sacrificial opening fill structures {(145, 147), (135, 137), (125, 127)} after the processing steps described with reference to FIGS. 2A and 2B. In this case, the sacrificial memory opening fill structure stacks 47 may be removed selective to the semiconductor pedestals 11.

Referring to FIG. 21B, a stack of layers including a blocking dielectric layer 52, a memory material layer 54, a optional dielectric liner 56, and a semiconductor channel material layer 60L can be sequentially deposited in the memory openings 49 over each semiconductor pedestal 11. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include discrete floating gates of a conductive material, such as heavily doped polysilicon or a metallic material that is patterned into multiple electrically isolated portions (e.g., floating gates), for example, by being formed within lateral recesses into sacrificial material layers (142, 242, 342). In one embodiment, the memory material layer 54 includes a silicon nitride layer. In one embodiment, the sacrificial material layers (142, 242, 342) and the insulating layers (132, 232, 332) can have vertically coincident sidewalls, and the memory material layer 54 can be formed as a single continuous layer.

In another embodiment, the sacrificial material layers (142, 242, 342) can be laterally recessed with respect to the sidewalls of the insulating layers (132, 232, 332), and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

Generally, any vertical stack of memory elements known in the art may replace the memory material layer 54. The vertical stack of memory elements can be formed at levels of the sacrificial material layers (142, 242, 342) within each memory opening 49, and may be formed as portions of a continuous memory material layer, or may be formed as discrete memory material portions.

The optional dielectric liner 56, if present, includes a dielectric material. In one embodiment, the optional dielectric liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The optional dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the optional dielectric liner 56 can include a stack of a first silicon oxide layer, a silicon oxynitride layer, and a second silicon oxide layer, which is commonly known as an ONO stack. In one embodiment, the optional dielectric liner 56 can include a silicon oxide layer that is substantially free of carbon or a silicon oxynitride layer that is substantially free of carbon. The thickness of the optional dielectric liner 56 can be in a range from 2 nm to 20 nm, although lesser and greater thicknesses can also be employed. The stack of the blocking dielectric layer 52, the memory material layer 54, and the optional dielectric liner 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Figure 21D:
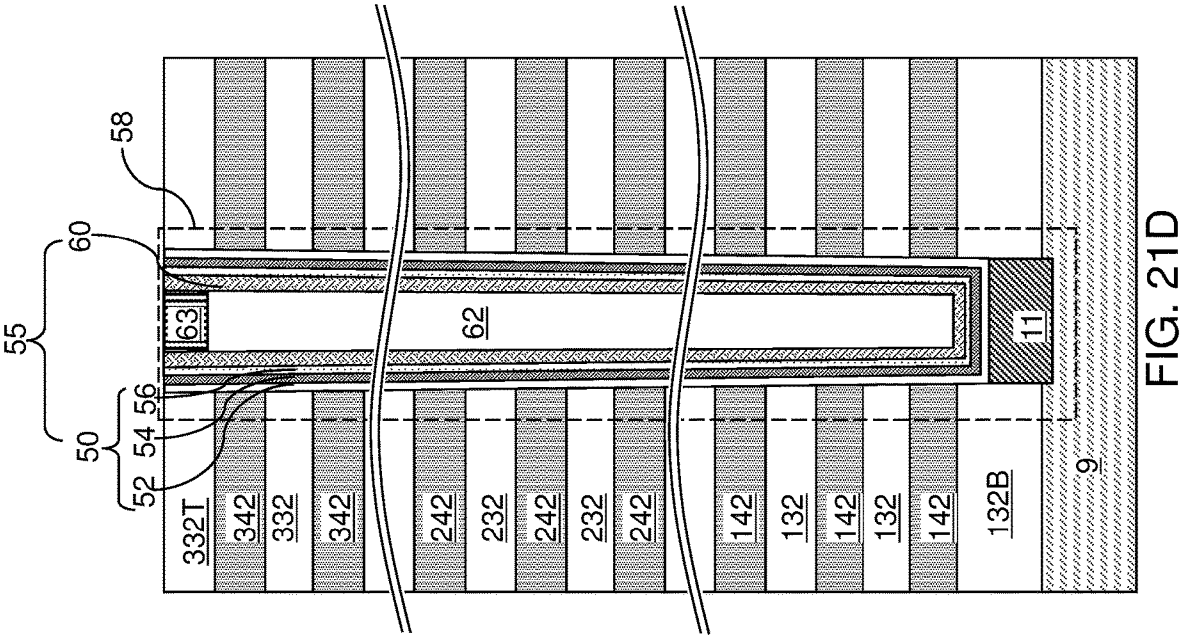
Figure 21C:
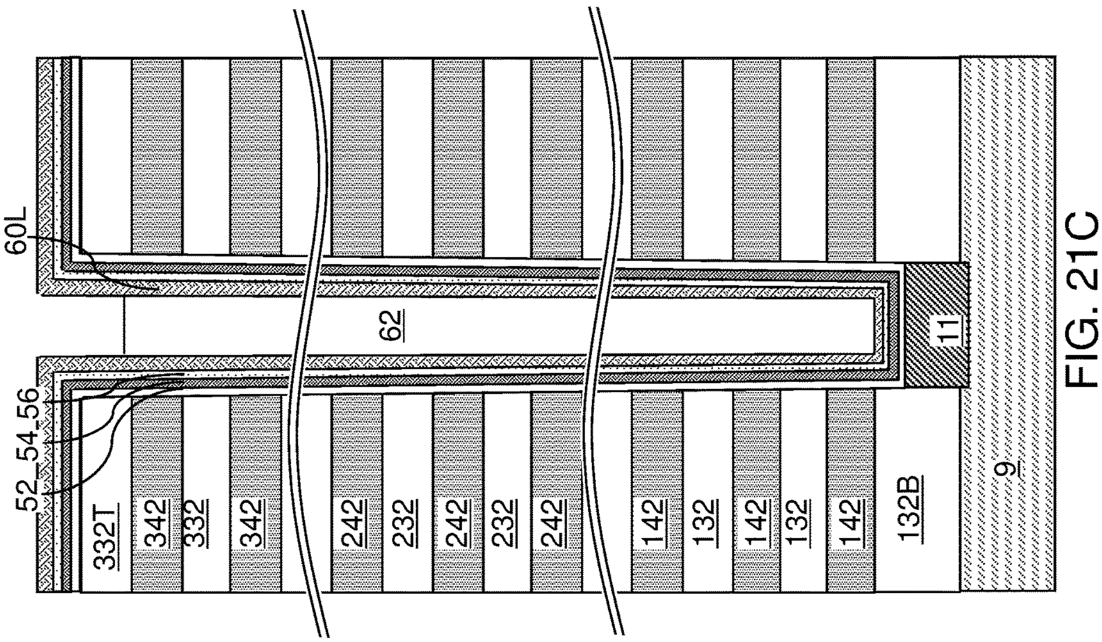

Referring to FIG. 21C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the topmost first insulating layer 132T can be removed, for example, by a recess etch. The recess etch continues until top surfaces of the remaining portions of the dielectric core layer are recessed to a height between the top surface of the topmost first insulating layer 132T and the bottom surface of the topmost first insulating layer 132T. Each remaining portion of the dielectric core layer constitutes a dielectric core 62.

Referring to FIG. 21D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the optional dielectric liner 56, the memory material layer 54, and the blocking dielectric layer 52 that overlie the horizontal plane including the top surface of the topmost first insulating layer 132T can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{18}/cm^3$ to $2.0\times10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. An optional dielectric liner 56 is surrounded by a memory material layer 54, and laterally surrounds a vertical semiconductor channel 60. Each adjoining set of a blocking dielectric layer 52, a memory material layer 54, and an optional dielectric liner 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a optional dielectric liner 56, a plurality of memory elements comprises portions of the memory material layer 54, and an optional blocking dielectric layer 52. Each combination of a memory stack structure 55, a dielectric core 62, and a drain region 63 within a memory opening 49 constitutes a memory opening fill structure 58.

While an embodiment is described in which three alternating stacks {(132, 142), (232, 242), (332, 342)} are formed over a substrate, embodiments are expressly contemplated herein in which one, two, or four or more alternating stacks are formed over a substrate. Generally, each of the memory stack structures 55 vertically extends through each layer within at least one alternating stack {(132, 142), (232, 242), (332, 342)}. Each of the memory stack structures 55 comprises a respective vertical stack of memory elements.

Figure 22A:
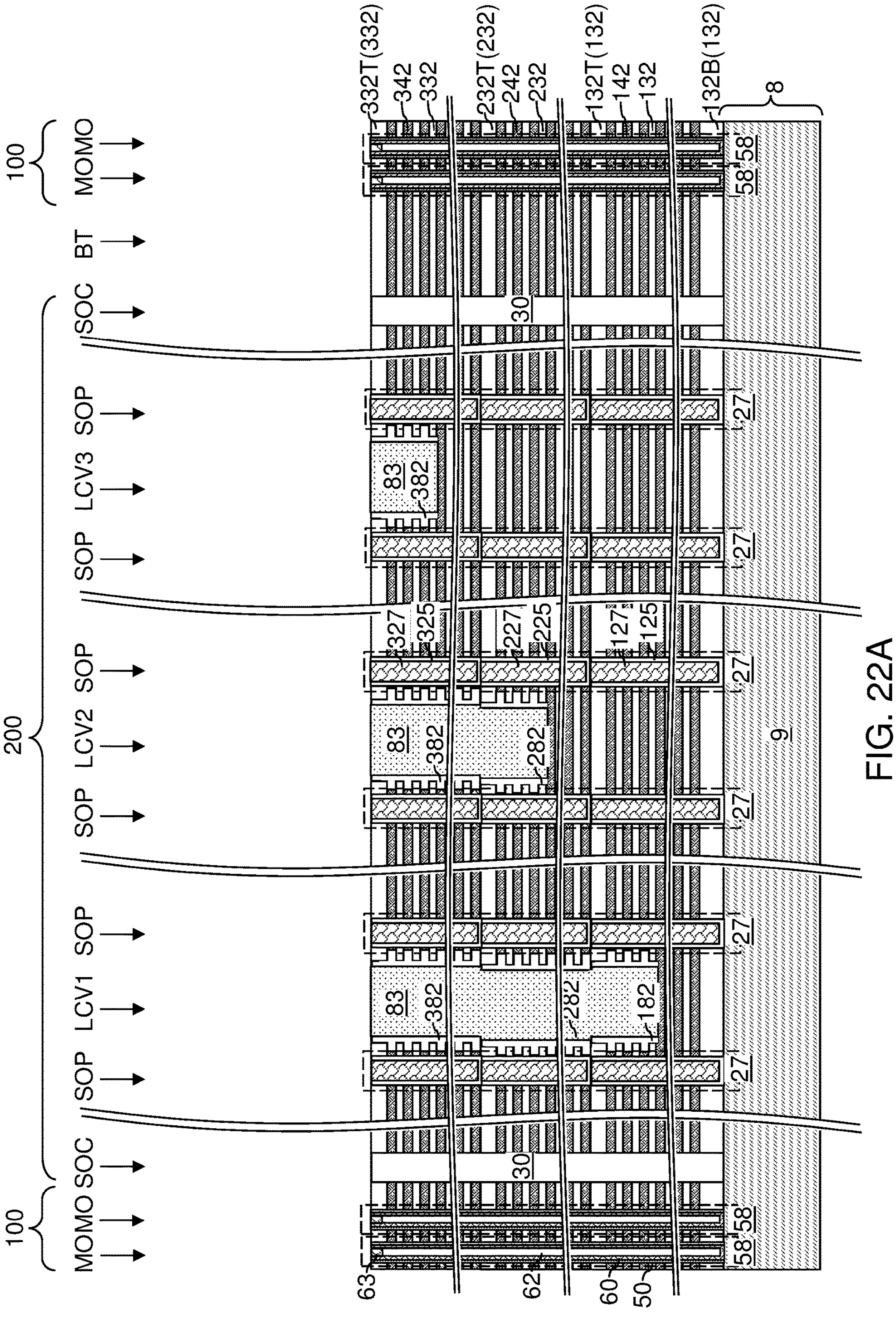
FIG. 22A is a vertical cross-sectional view of the exemplary structure after formation of memory opening fill structures according to an embodiment of the present disclosure.
Figure 22B:
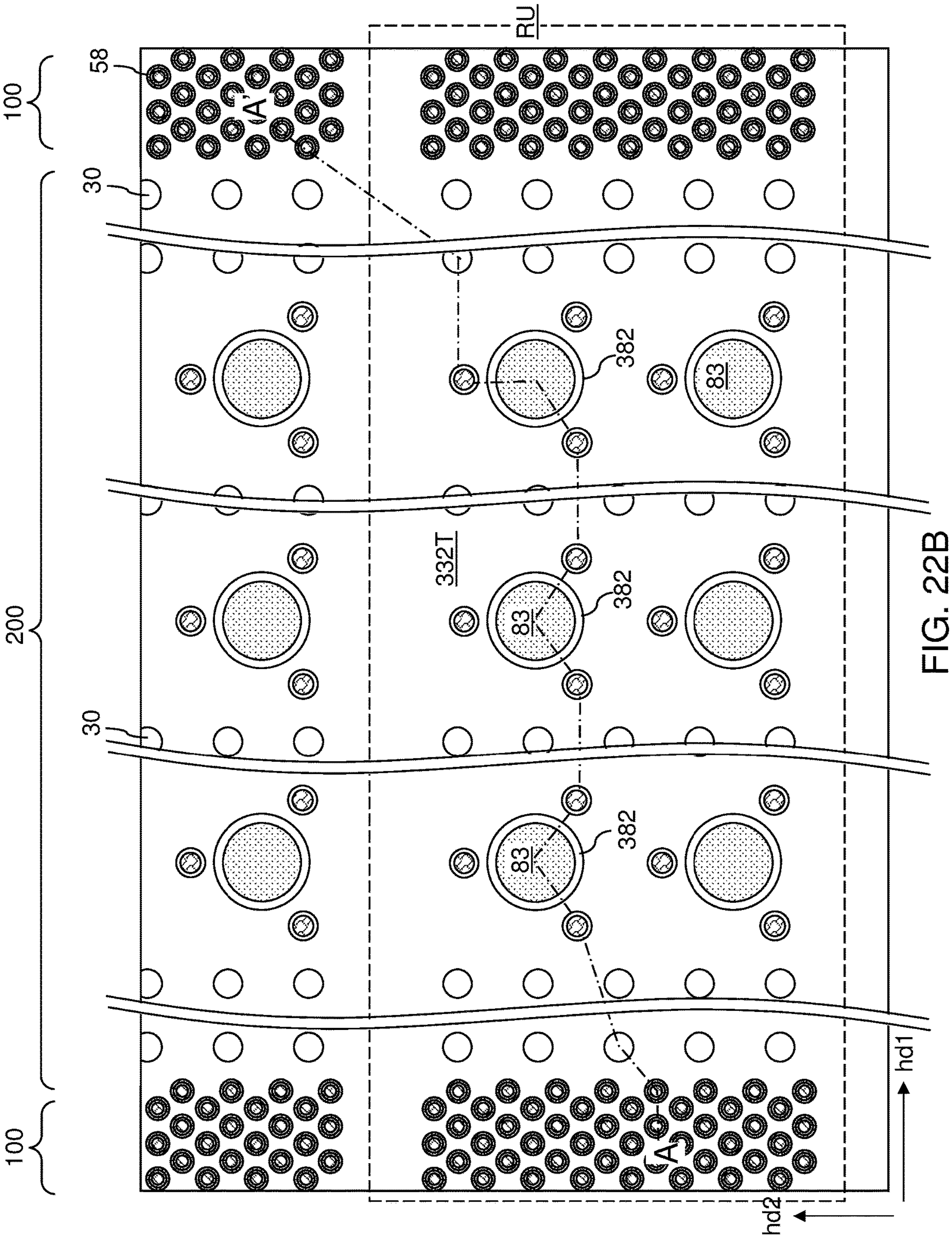
FIG. 22B is a top-down view of the exemplary structure of FIG. 22A. The hinged vertical plane A-A' is a cut plane of the vertical cross-sectional view of FIG. 22A.

Referring to FIGS. 22A and 22B, the exemplary structure is illustrated after formation of the memory opening fill structures 58. Generally, each of the sacrificial memory opening fill structure stacks 47 can be replaced with a respective memory opening fill structure 58. Each memory opening fill structure 58 may or may not comprise a semiconductor pedestal 11.

Figure 23:
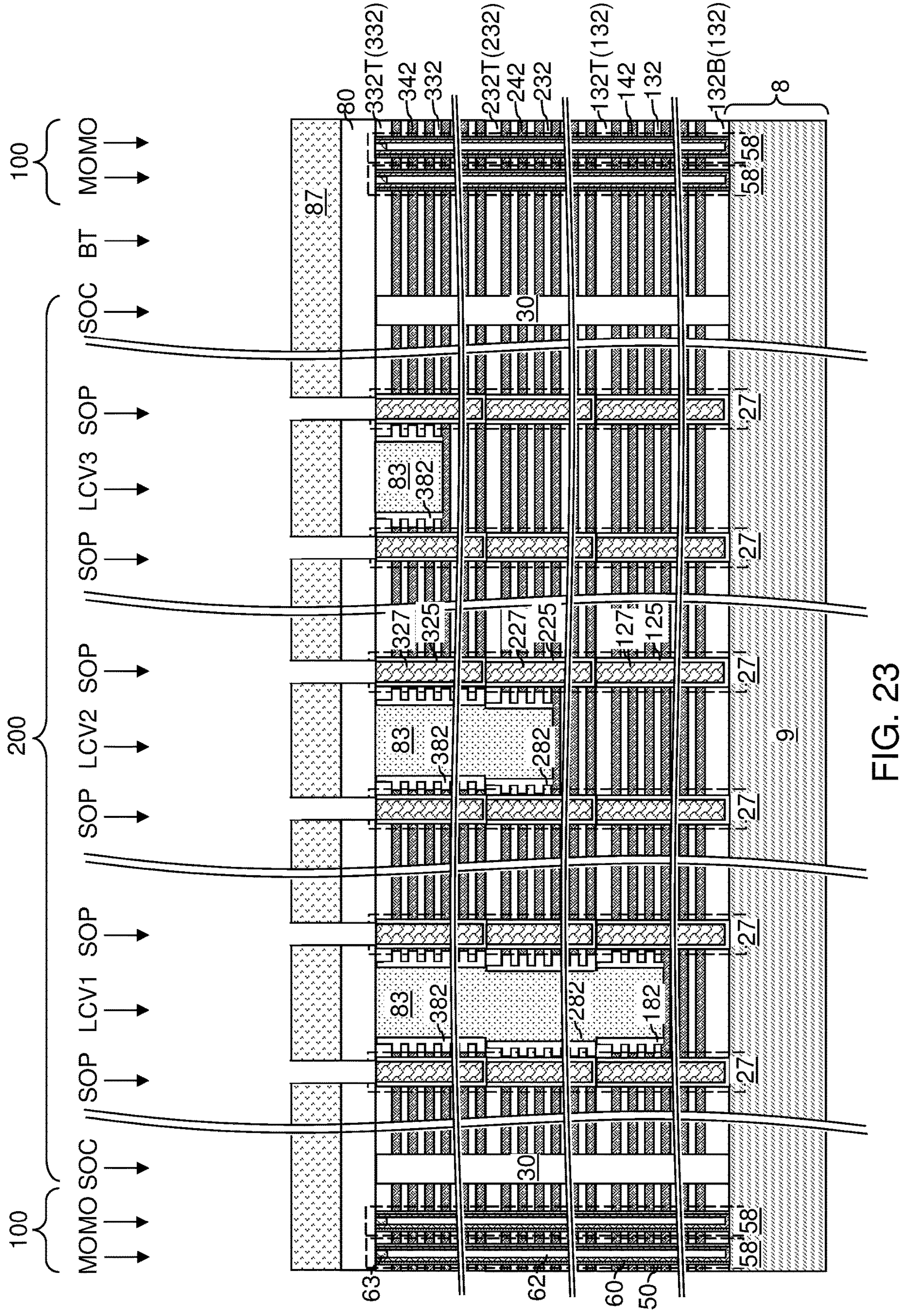
FIG. 23 is a vertical cross-sectional view of the exemplary structure after formation of a contact-level dielectric layer, a patterned etch mask layer, and openings through the contact-level dielectric layer that overlies primary sacrificial pillar structures according to an embodiment of the present disclosure.

Referring to FIG. 23, a contact-level dielectric layer 80 can be formed over the third alternating stack (332, 342). The contact-level dielectric layer 80 comprises a dielectric material, such as undoped silicate glass or a doped silicate glass. The thickness of the contact-level dielectric layer 80 may be in a range from 50 nm to 600 nm, such as from 100 nm to 300 nm, although lesser and greater thicknesses may also be employed.

A patterned etch mask layer 87 (such as a patterned photoresist layer) can be applied over the contact-level dielectric layer 80, and is lithographically patterned to form discrete openings over the primary sacrificial pillar structure stacks 27. An anisotropic etch can be performed to form openings through the contact-level dielectric layer 80 so that each top surface of the primary sacrificial pillar structure stacks 27 is physically exposed.

Figure 24:
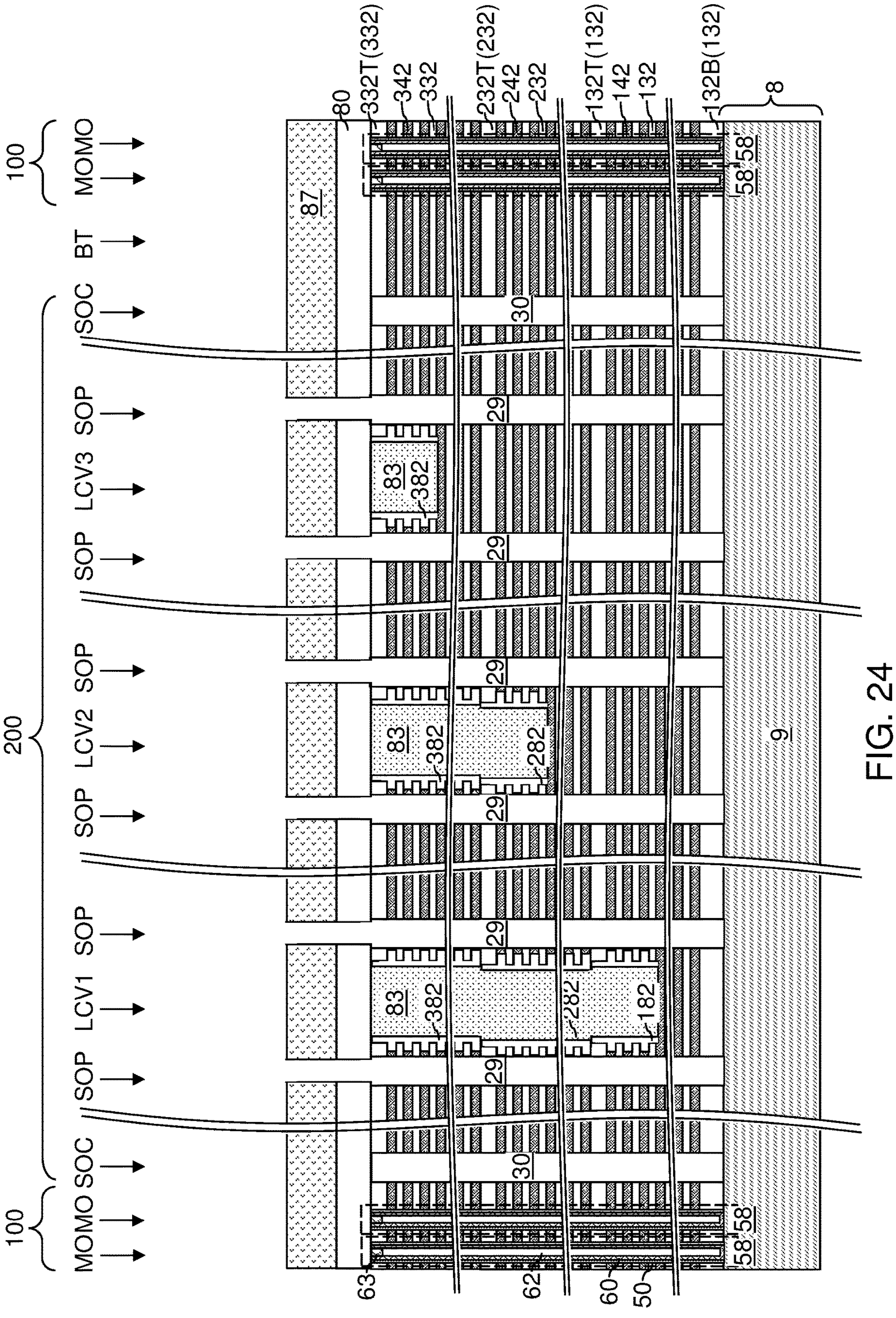
FIG. 24 is a vertical cross-sectional view of the exemplary structure after formation of pillar cavities according to an embodiment of the present disclosure.

Referring to FIG. 24, at least one etch process can be performed to remove the primary sacrificial pillar structure stacks 27, i.e., to remove the primary third sacrificial pillar structures (325, 327), the primary second sacrificial pillar structures (225, 227), and the primary first sacrificial pillar structures (125, 127). Primary pillar cavities 29 can be formed in volumes from which the primary sacrificial pillar structure stacks 27 are removed. For example, if the primary sacrificial fill material portions (127, 227, 327) comprise a semiconductor material, such as amorphous silicon, then at least one wet etch process employing hot trimethyl-2 hydroxyethyl ammonium hydroxide ("hot TMY") or tetramethyl ammonium hydroxide (TMAH) can be performed to remove the primary sacrificial fill material portions (127, 227, 327). Each etch stop liner (125, 225, 325), if employed, can be removed by performing a wet etch process or a reactive ion etch process. Each primary pillar cavity 29 comprises a respective void formed by removal of a respective one of the primary first sacrificial pillar structures (125, 127), a respective one of the primary second sacrificial pillar structures (225, 227), and a respective one of the primary third sacrificial pillar structures (325, 327).

Figure 25A:
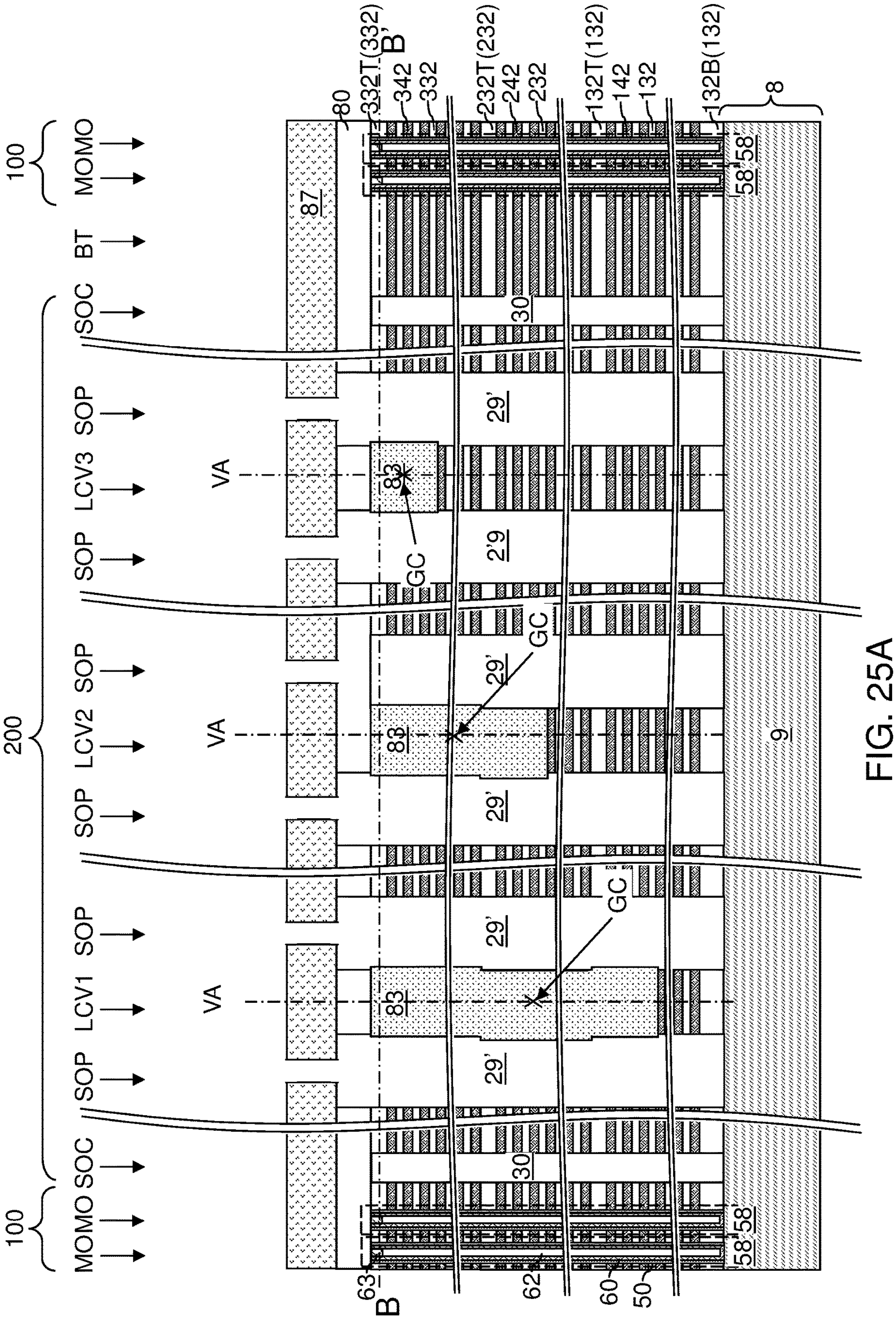
FIG. 25A is a vertical cross-sectional view of the exemplary structure after lateral expansion of the pillar cavities according to an embodiment of the present disclosure.
Figure 25B:
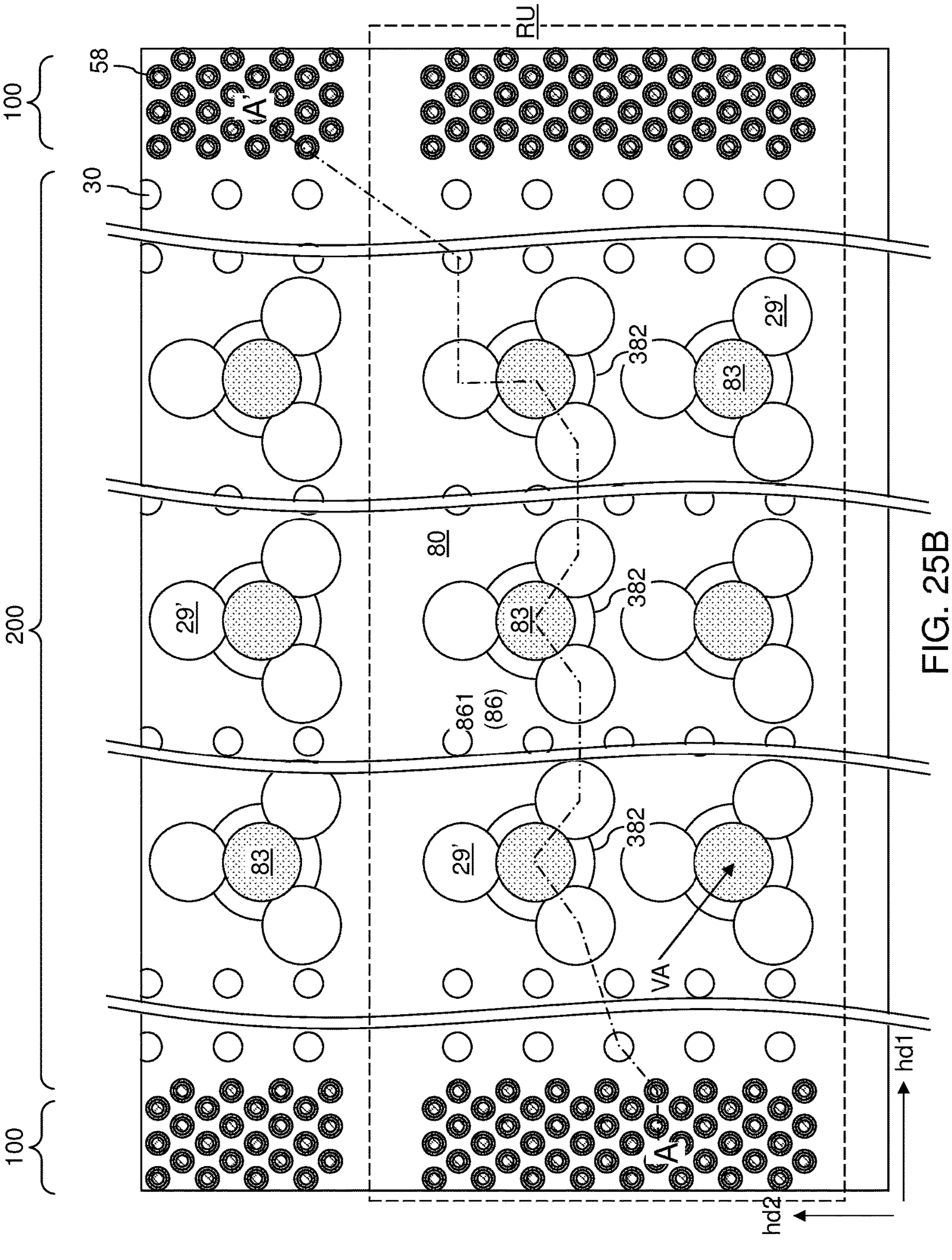
FIG. 25B is a horizontal cross-sectional view of the exemplary structure along the horizontal plane A-A' of FIG. 25A. The hinged vertical plane A-A' is a cut plane of the vertical cross-sectional view of FIG. 25A.

Referring to FIGS. 25A and 25B, the primary pillar cavities 29 can be laterally expanded by performing at least one isotropic etch process to form the expanded pillar cavities 29'. The at least one isotropic etch process may etch only the material of the sacrificial via structures or the materials of both the sacrificial via structures and the insulating layers. The at least one isotropic etch process may undercut the alternating stacks such that portions of the expanded pillar cavities 29' extend below the sacrificial via structures filling the layer contact via cavities 89. The at least one isotropic etch process may also expose surface segments of the material portions occupying the sacrificial via structures filling the layer contact via cavities 89.

As discussed above, the first sacrificial via fill structures 183 and the second sacrificial via fill structures 283 may or may not be replaced with the sacrificial via fill structures 83. In case the first sacrificial via fill structures 183 and the second sacrificial via fill structures 283 are replaced with the sacrificial via fill structures 83, surface segments of the sacrificial via fill structures 83 can be exposed to expanded pillar cavities 29', which are pillar cavities formed by lateral expansion of the primary pillar cavities 29.

In case the first sacrificial via fill structures 183 and the second sacrificial via fill structures 283 are not replaced with sacrificial via fill structures 83 and a third sacrificial via fill structure fills each void 389' as provided at the processing steps of FIGS. 17A and 17B, then surface segments of the first sacrificial via fill structures 183, the second sacrificial via fill structures 283, and third sacrificial via fill structures can be exposed to the expanded pillar cavities 29'. Generally, each via-shaped material portion occupying a volume of the first sacrificial via fill structures 183, the second sacrificial via fill structures 283, or the voids 389' within the third via cavities 389 as formed at the processing steps of FIGS. 17A and 17B can be physically exposed to the expanded pillar cavities 29'.

As used herein, a "via-shaped" material portion refers to a material portion having a top surface, a bottom surface, and vertically-extending surfaces that may be vertical, tapered, or may have lateral protrusions. In the instant case, the via-shaped material portions comprise at least one annular lateral protrusion having a respective annular convex surface.

In one embodiment, the at least one isotropic etch process employed to form the expanded pillar cavities 29' may comprise an isotropic etch process that isotropically etches the insulating layers (132, 232, 332) and the sacrificial material layers (142, 242, 342) simultaneously. Alternatively, the at least one isotropic etch process employed to form the expanded pillar cavities 29' may comprise a combination of a first isotropic etch process and a second isotropic etch process that is performed after, or prior to, the first isotropic etch process. The first isotropic etch process isotropically etches the sacrificial material layers (142, 242, 342) selective to the insulating layers (132, 232, 332) and selective to the via-shaped material portions (such as the sacrificial via fill structures 83), and the second isotropic etch process isotropically etches the insulating layers (132, 232, 332) selective to the sacrificial material layers (142, 242, 342) and selective to the via-shaped material portions (such as the sacrificial via fill structures 83).

In one embodiment, the duration(s) of the at least one isotropic etch process can be selected such that dielectric spacers (182, 282, 382) are etched through. In one embodiment, each of the dielectric spacers (182, 282, 382) may be formed as tubular dielectric spacers having a tubular configuration (and including ribbed outer sidewalls), and the at least one isotropic etch process may etch portions of the tubular dielectric spacer until sidewall segments of the via-shaped material portions are exposed. In this case, the tubular dielectric spacer is divided into a plurality of dielectric spacers (182, 282, 382) that are azimuthally spaced apart around the via-shaped material portions. In this case, a dielectric spacer (182, 282, 382) can be divided into a plurality of dielectric spacers (182, 282, 382) that are azimuthally spaced apart around a vertical axis VA passing through a center (e.g., geometrical center) GC of a respective via-shaped material portion (such as a sacrificial via fill structure 83).

In one embodiment, a plurality of surfaces of each via-shaped material portion (such as the sacrificial via fill structures 83) can be exposed to a respective subset of the expanded pillar cavities 29' upon laterally expanding the primary pillar cavities 29. In one embodiment, each exposed surface of the via-shaped material portions (such as the sacrificial via fill structures 83) that is exposed to a respective one of the expanded pillar cavities 29' continuously extends from a top surface of a respective via-shaped material portion to a bottom surface of the respective via-shaped material portion. The patterned etch mask layer 87 can be subsequently removed, for example, by ashing.

Figure 26A:
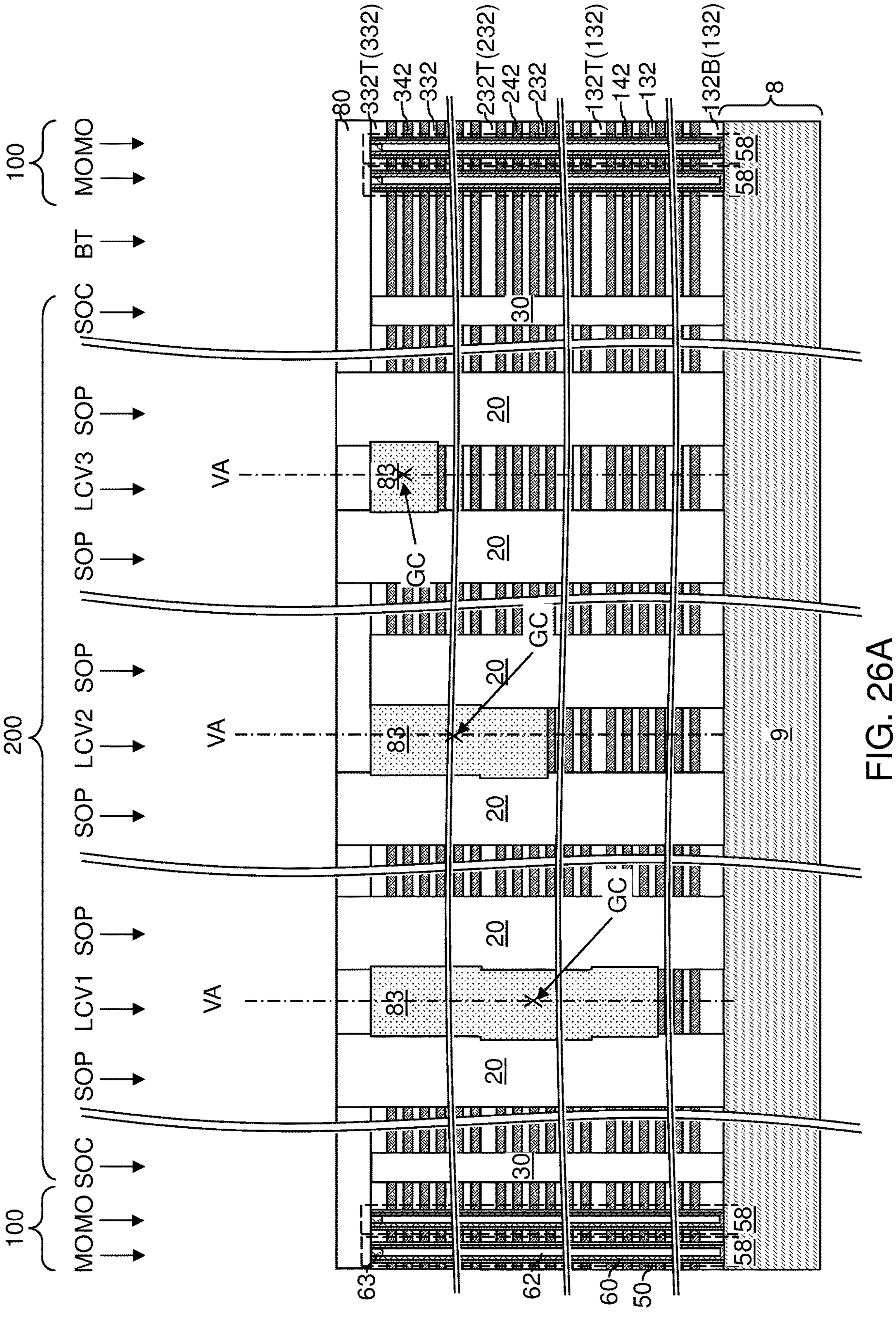
FIG. 26A is a vertical cross-sectional view of the exemplary structure after formation of primary dielectric pillar structures according to an embodiment of the present disclosure.
Figure 26B:
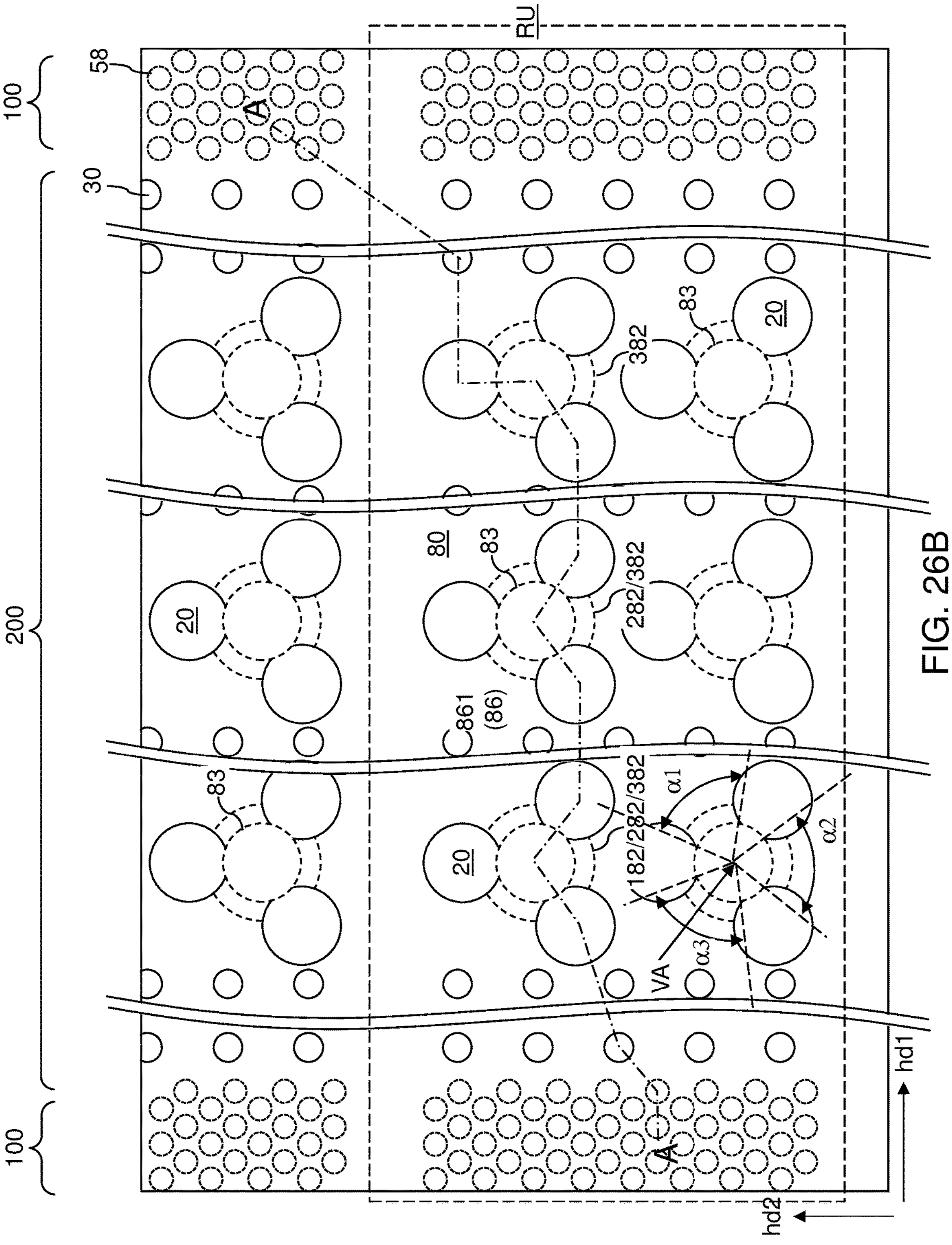
FIG. 26B is a top-down view of the exemplary structure of FIG. 26A. The hinged vertical plane A-A' is a cut plane of the vertical cross-sectional view of FIG. 26A.
Figure 26C:
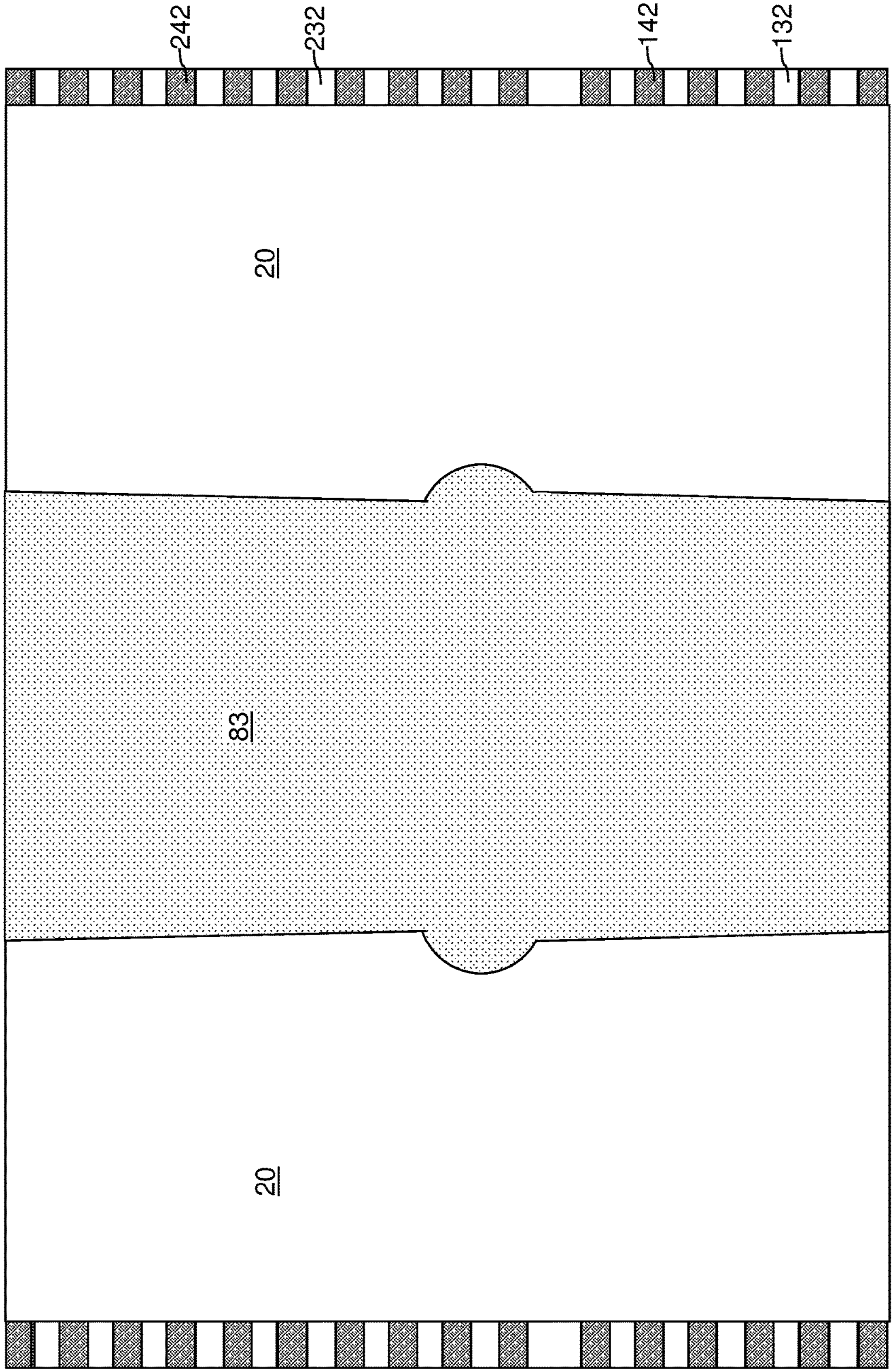
FIG. 26C is a magnified view of a region around a portion of a sacrificial via fill structure in the exemplary structure of FIG. 26A.

Referring to FIGS. 26A-26C, a dielectric fill material, such as silicon oxide, can be deposited in the expanded pillar cavities 29' by a conformal deposition process. Excess portions of the dielectric fill material can be removed from above the horizontal plane including the top surface of the contact-level dielectric layer 80 by performing a planarization process such as a chemical mechanical polishing process and/or a recess etch process. Each remaining portion of the dielectric fill material that fills a respective expanded pillar cavity 29' constitutes a dielectric support pillar structure 20, which is also referred to as a primary dielectric support pillar structures 20.

In one embodiment, lower portions of the primary dielectric support pillar structures 20 extend below the sacrificial via structures filling the layer contact via cavities 89 while upper portions of the primary dielectric support pillar structures 20 may contact surface segments of the material portions occupying the sacrificial via structures filling the layer contact via cavities 89. The lower portions provide additional structural support to the in-process structure. The upper portions of the primary dielectric support pillar structures 20 may comprise a respective laterally-concave and vertically-straight surface that contacts a respective via-shaped material portion (such as a sacrificial via fill structure 83).

In one embodiment shown in FIG. 26B, a via-shaped material portion (such as a sacrificial via fill structure 83) may be contacted a plurality of dielectric support pillar structures 20 and a plurality of dielectric spacers (182, 282, 382). In one embodiment, the plurality of dielectric support pillar structures 20 and the plurality of dielectric spacers (182, 282, 382) are azimuthally interlaced around a vertical axis VA passing through a center (e.g., a geometrical center) GC of the via-shaped material portion (such as a sacrificial via fill structure 83).

In one embodiment shown in FIG. 26B, the plurality of dielectric support pillar structures 20 comprises P dielectric support pillar structures 20 surrounding a layer via cavity filled with a via-shaped material portion (such as a sacrificial via fill structure 83). The plurality of dielectric spacers (182, 282, 382) comprises at least P dielectric spacers (182, 282, 382); and P is an integer greater than 1. For example, P may be 2, 3, 4, 5, 6, etc. For example, the plurality of dielectric spacers (182, 282, 382) contacting a via-shaped material portion may comprise P third dielectric spacers 382, any may include P second dielectric spacers 282 (in case the via-shaped material portion extends into the second alternating stack (232, 242)), and may include P first dielectric spacers 182 (in case the via-shaped material portion extends into the first alternating stack (132, 142)). In one embodiment, each of the plurality of dielectric spacers (182, 282, 382) is located within a respective azimuthal angle range (α1, α2, α3) around the vertical axis VA extending through the via-shaped material portion and having a magnitude less than 2π/P radian.

In some embodiments, the at least one alternating stack {(132, 142), (232, 242), (332, 342)} comprises M alternating stacks {(132, 142), (232, 242), (332, 342)}, in which M is an integer greater than 1; and the plurality of dielectric spacers (182, 282, 382) comprises a total of M×P dielectric spacers (182, 282, 382). In the illustrated example shown in FIGS. 26A and 26B, P is 3 and M is 3. For a subset of the via-shaped material portions, the M×P dielectric spacers (182, 282, 382) comprises M sets of P dielectric spacers (182, 282, 382) that are azimuthally spaced apart around the vertical axis VA. Each set of respective P dielectric spacers (182, 282, 382) overlies or underlies any other set of respective P dielectric spacers (182, 282, 382).

In one embodiment, each of the plurality of dielectric support pillar structures 20 has a respective geometrical center GC and a respective vertical axis VA passing through the respective geometrical center GC; and each of the vertical axes VA of the plurality of dielectric support pillar structures 20 is laterally spaced from the vertical axis VA passing through the geometrical center GC of a respective via-shaped material portion by a greater lateral distance than any point within the plurality of dielectric spacers (182, 282, 382) is from the vertical axis VA passing through the geometrical center GC of the via-shaped material portion.

In one embodiment, each surface segment of a via-shaped material portion located below a horizontal surface including a topmost surface of the at least one alternating stack {(132, 142), (232, 242), (332, 342)} is in direct contact with one of plurality of dielectric support pillar structures 20 or with one of the plurality of dielectric spacers (182, 282, 382).

In one embodiment, each interface between a via-shaped material portion (such as a sacrificial via fill structure 83) and a plurality of dielectric support pillar structures 20 has a horizontal cross-sectional profile in which a convex surface segment of the via-shaped material portion is in direct contact with a concave surface segment of a respective one of the dielectric support pillar structures 20. In one embodiment, each of the plurality of dielectric support pillar structures 20 may be in in direct contact with a respective pair of dielectric spacers (182, 282, 382) among the plurality of dielectric spacers (182, 282, 382); and each of the plurality of dielectric spacers (182, 282, 382) may be in direct contact with a respective pair of dielectric support pillar structures 20.

In one embodiment, each of the plurality of dielectric support pillar structures 20 is in direct contact with each insulating layer (132, 232, 332) within the at least one alternating stack {(132, 142), (232, 242), (332, 342)}; and each insulating layer (132, 232, 332) within the at least one alternating stack {(132, 142), (232, 242), (332, 342)} that overlies a horizontal plane including the bottom surface of the via-shaped material portion may be in direct contact with at least two dielectric spacers (182, 282, 382) within the plurality of dielectric spacers (182, 282, 382).

In one embodiment, top surfaces of the plurality of dielectric support pillar structures 20 may be located within a horizontal plane including a top surface of the contact-level dielectric layer 80; and topmost surfaces of the plurality of dielectric spacers (182, 282, 382) may be located within a horizontal plane including top surfaces of the at least one alternating stack {(132, 142), (232, 242), (332, 342)}.

In one embodiment, each interface between a via-shaped material portion (such as a sacrificial via fill structure 83) and a respective one of the plurality of dielectric support pillar structures 20 vertically extends from a bottommost surface of the via-shaped material portion to a horizontal plane including a topmost surface of the at least one alternating stack {(132, 142), (232, 242), (332, 342)} without horizontally-extending surface segments.

Generally, a via-shaped material portion (such as a sacrificial via fill structure 83) vertically extends through a respective subset of layers within at least one alternating stack {(132, 142), (232, 242), (332, 342)}. In one embodiment, the via-shaped material portion is laterally surrounded by and is laterally contacted by a set of at least one dielectric isolation structure (182, 282, 382, 20).

In one embodiment, the via-shaped material portion (such as a sacrificial via fill structure 83) comprises a sidewall that includes a first straight sidewall segment that contacts a first portion of a first dielectric spacer 182 and a first convex surface segment that contacts a concave surface of a second portion of the first dielectric spacer 182. In one embodiment, a top periphery of the first convex surface segment is adjoined to a bottom periphery of the first straight sidewall segment. In one embodiment, the first convex surface segment laterally protrudes outward relative to the bottom periphery of the first straight sidewall segment. In one embodiment, the first convex surface segment laterally protrudes outward from a periphery of an interface between the via-shaped material portion and an underlying sacrificial material layer (142, 242, 342).

In one embodiment, the at least one alternating stack {(132, 142), (232, 242), (332, 342)} comprises a plurality of alternating stacks {(132, 142), (232, 242), (332, 342)} that are stacked along the vertical direction; the set of at least one dielectric isolation structure (182, 282, 382, 20) comprises at least one additional dielectric spacer (282, 382) that overlies the first dielectric spacer 182 and laterally surrounded by a respective alternating stack {(232, 242) or (332, 342)} among the plurality of alternating stacks {(132, 142), (232, 242), (332, 342)}; and each of the at least one additional dielectric spacer (282, 382) has a respective top surface located within a horizontal plane including a top surface of a respective alternating stack {(132, 142), (232, 242), or (332, 342)}. In one embodiment, the plurality of alternating stacks {(132, 142), (232, 242), (332, 342)} comprises a second alternating stack (232, 242) that overlies, and is in contact with, the first alternating stack (132, 242); the at least one additional dielectric spacer (282, 382) comprises a second dielectric spacer 282 that contacts the first dielectric spacer 182; and the sidewall of the via-shaped material portion comprises a second straight sidewall segment that contacts the second dielectric spacer 282 and a second convex surface segment that contacts a concave surface of the second dielectric spacer 282. In one embodiment, a top periphery of the second convex surface segment is adjoined to a bottom periphery of the second straight sidewall segment; and a bottom portion of the second convex surface segment is in contact with a chamfered surface of the first insulating spacer.

In one embodiment, a plurality of dielectric support pillar structures 20 vertically extends through each layer within the at least one alternating stack {(132, 142), (232, 242), (332, 342)} and contact a respective sidewall segment of the via-shaped material portion. In one embodiment, the set of at least one dielectric isolation structure (182, 282, 382, 20) comprises at least one additional first dielectric spacer 182 having a same vertical extent as the first dielectric spacer 182; and the first dielectric spacer 182 and the at least one additional first dielectric spacer 182 are azimuthally spaced apart around the layer contact via structure 86 and are not in direct contact among one another. In one embodiment, the first dielectric spacer 182 and the at least one additional first dielectric spacer 182 are azimuthally interlaced with the plurality of dielectric support pillar structures 20 around a vertical axis VA passing through a geometrical center GC of the via-shaped material portion (such as a sacrificial via fill structure 83).

In one embodiment, the first dielectric spacer 182 and the at least one additional first dielectric spacer 182 comprises P dielectric spacers 182; the plurality of dielectric support pillar structures 20 comprises P dielectric support pillar structures 20; P is an integer greater than 1; and each of the P dielectric spacers 182 is located within a respective azimuthal angle range ($\alpha 1$, $\alpha 2$, $\alpha 3$) around the vertical axis VA that has a magnitude less than $2\pi/P$ radian.

In one embodiment, each of the respective sidewall segment of the via-shaped material portion comprises: at least one straight sidewall segment that contacts a straight sidewall surface segment of a respective one of the plurality of dielectric support pillar structures 20; and at least one convex surface segment that contacts a concave surface segment of the respective one of the plurality of dielectric support pillar structures 20. In one embodiment, the at least one alternating stack {(132, 142), (232, 242), (332, 342)} comprises a plurality of alternating stacks {(132, 142), (232, 242), (332, 342)} that are stacked along the vertical direction; at least one straight sidewall segment comprises a plurality of straight sidewall segments; the at least one convex surface segment comprises a plurality of convex surface segments; and one of the plurality of convex surface segments intersects a horizontal plane including an interface between one of the plurality of alternating stacks {(132, 142), (232, 242), (332, 342)} and another of the alternating stacks {(132, 142), (232, 242), (332, 342)}.

Figure 27A:
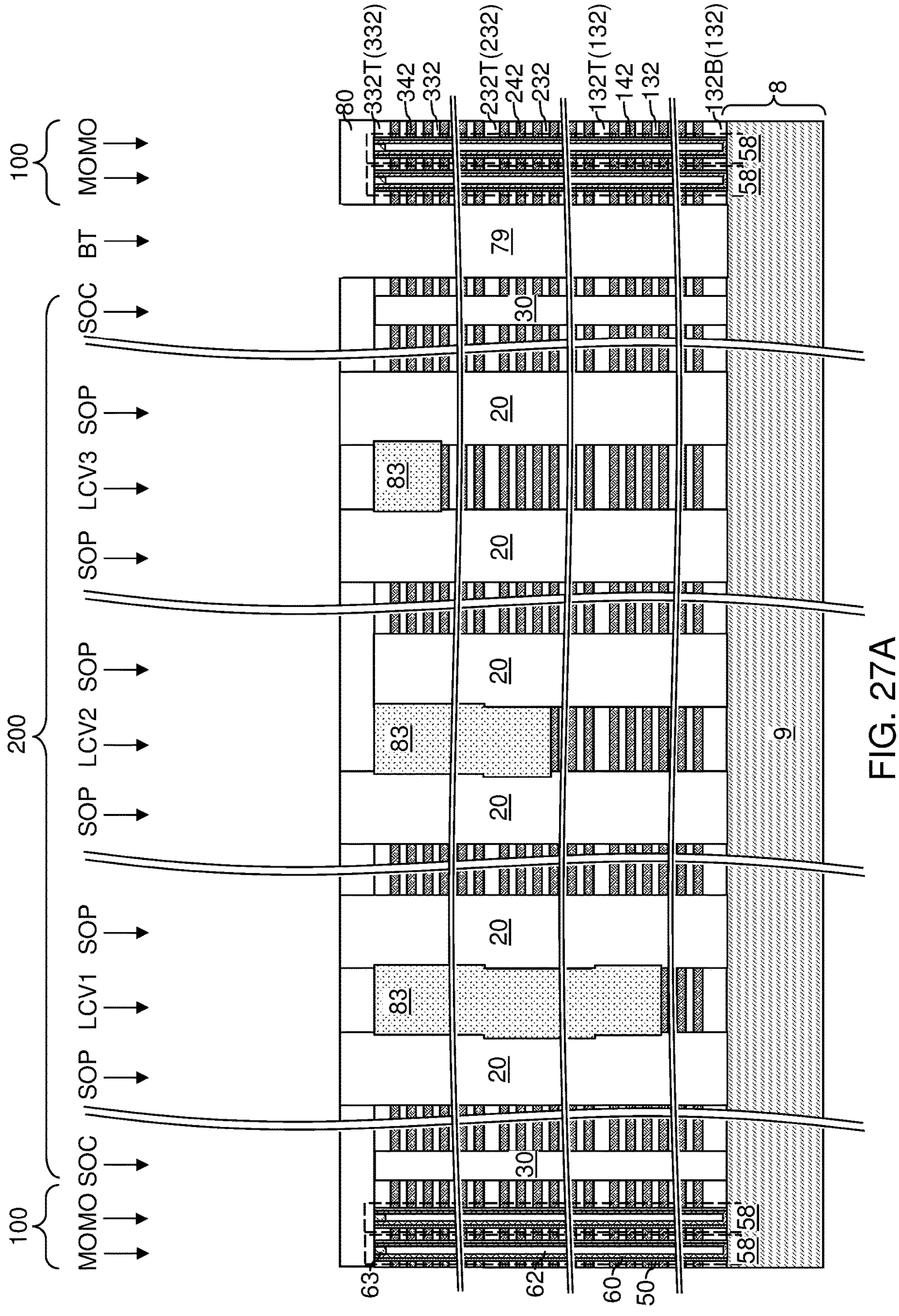
FIG. 27A is a vertical cross-sectional view of the exemplary structure after formation of backside trenches according to an embodiment of the present disclosure.
Figure 27B:
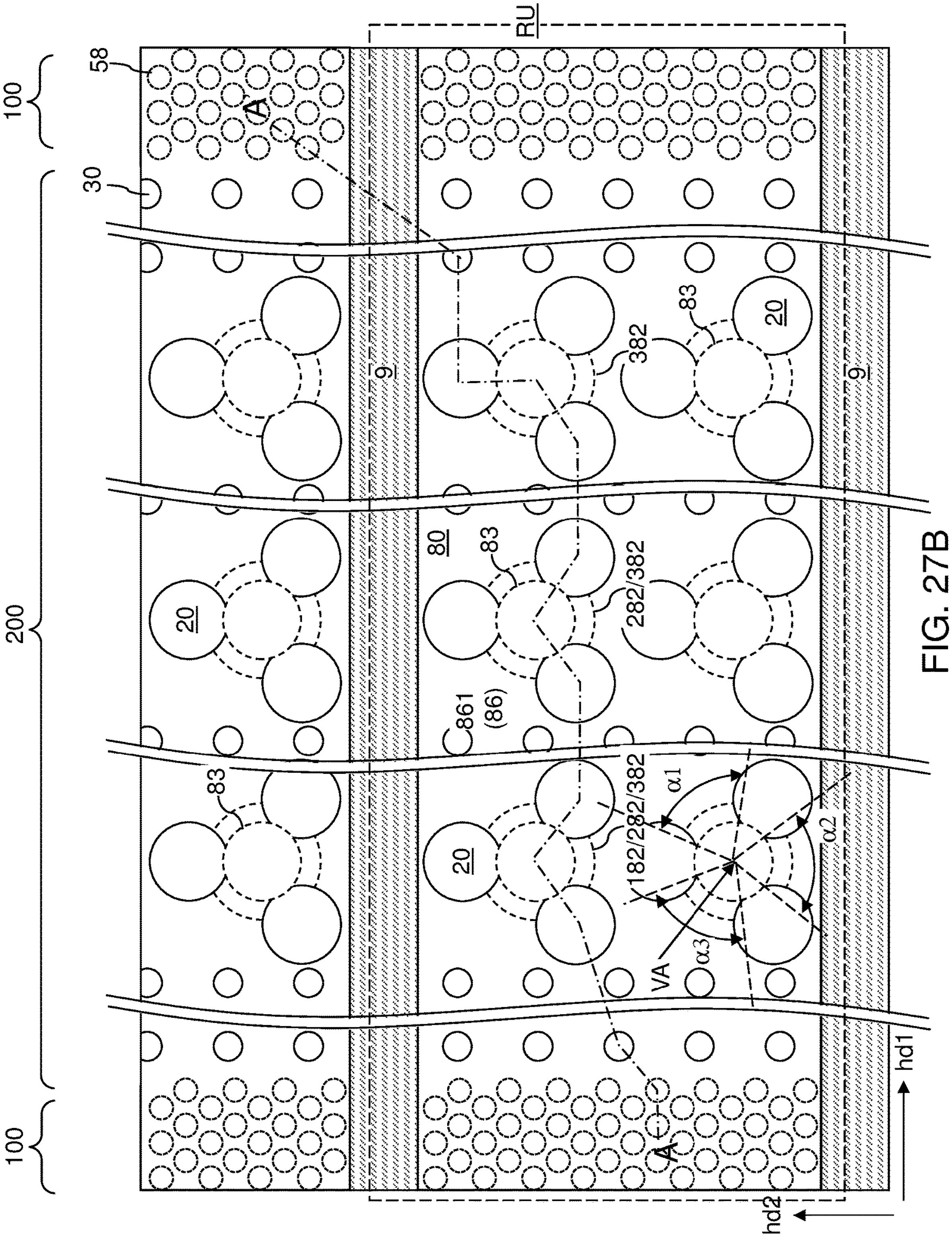
FIG. 27B is a top-down view of the exemplary structure of FIG. 27A. The hinged vertical plane A-A' is a cut plane of the vertical cross-sectional view of FIG. 27A.

Referring to FIGS. 27A and 27B, a photoresist layer (not shown) can be applied over the contact-level dielectric layer 80, and is lithographically patterned to form elongated openings in areas between clusters of memory opening fill structures 58. The pattern in the photoresist layer can be transferred through the contact-level dielectric layer 80 and the alternating stacks {(132, 142), (232, 242), (332, 342)} employing an anisotropic etch to form backside trenches 79. The locations of the backside trenches 39 are herein referred to as backside trench locations BT. The backside trenches 79 vertically extend from the top surface of the contact-level dielectric layer 80 to the top surface of the substrate 8. The backside trenches 79 laterally extend along the first horizontal direction hd1 between neighboring arrays of memory opening fill structures 58 and between neighboring arrays of in-process layer contact assemblies. In one embodiment, the backside trenches 79 may laterally extend through the memory array regions 100 and the contact region 200.

Figure 28:
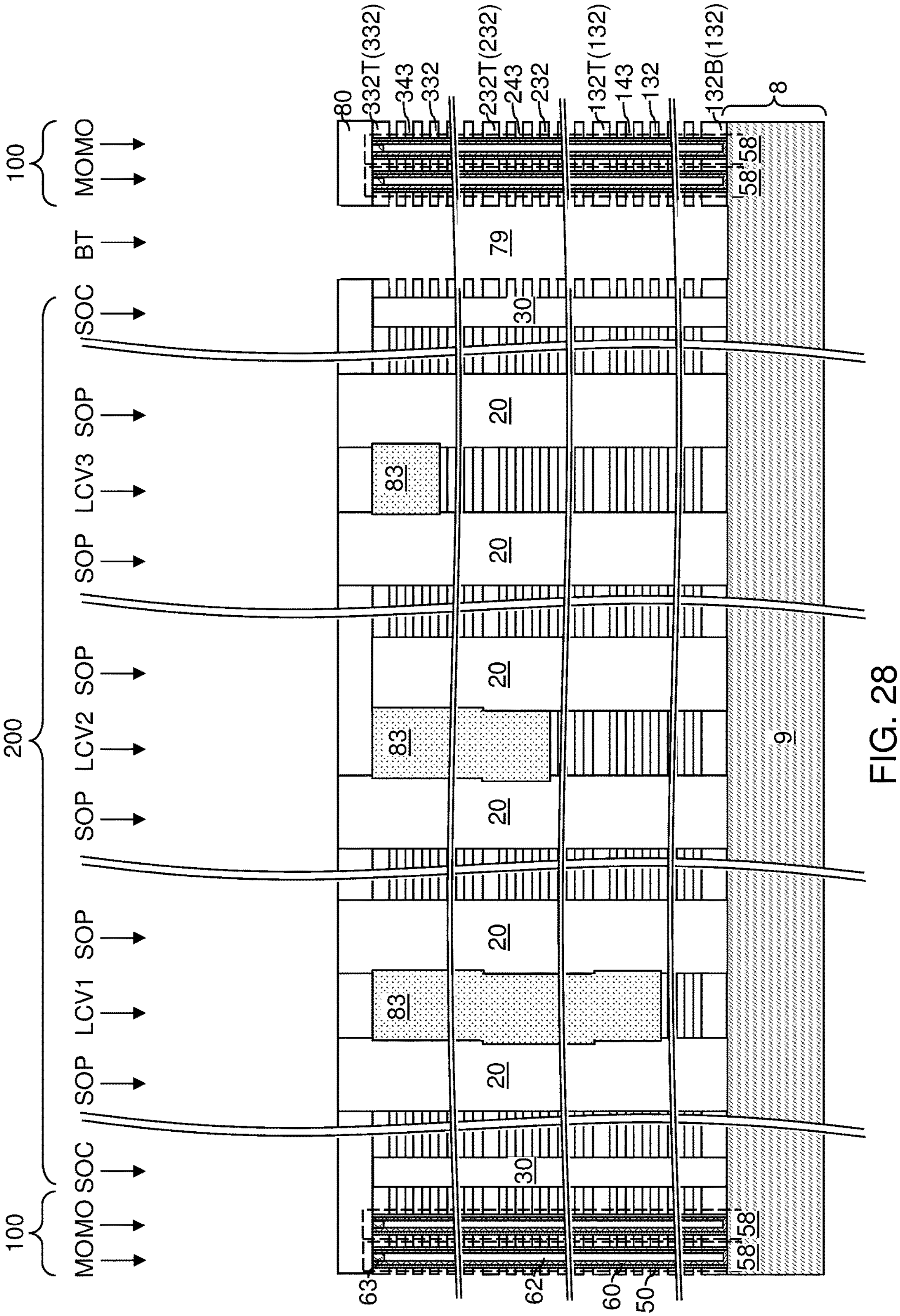
FIG. 28 is a vertical cross-sectional view of the exemplary structure after formation of backside recesses according to an embodiment of the present disclosure.

Referring to FIG. 28, an etchant that selectively etches the materials of the sacrificial material layers (142, 242, 342) with respect to the materials of the insulating layers (132, 232, 332), the dielectric spacers (182, 282, 382), the primary dielectric support pillar structures 20, the supplementary dielectric support pillar structures 30, and the outermost layer of the memory films 50 can be introduced into the backside trenches 79, for example, employing an isotropic etch process. For example, the sacrificial material layers (142, 242, 342) can include silicon nitride, the materials of the insulating layers (132, 232, 332) and the material of the outermost layer of the memory films 50 can include silicon oxide materials. Backside recesses (143, 243, 343) are formed in volumes from which the sacrificial material layers (142, 242, 342) are removed. The backside recesses (143, 243, 343) may comprise first backside recesses 143 that are formed in volumes from which the first sacrificial material layers 142 are removed, second backside recesses 243 that are formed in volumes from which the second sacrificial material layers 242 are removed, and third backside recesses 343 that are formed in volumes from which the third sacrificial material layers 342 are removed.

The isotropic etch process can be a wet etch process employing a wet etch solution, or can be a gas phase (dry) etch process in which the etchant is introduced in a vapor phase into the backside trenches 79. For example, if the sacrificial material layers (142, 242, 342) include silicon nitride, the etch process can be a wet etch process in which the exemplary structure is immersed within a wet etch tank including phosphoric acid, which etches silicon nitride selective to silicon oxide, silicon, and various other materials employed in the art.

Each of the backside recesses (143, 243, 343) can be a laterally extending cavity having a lateral dimension that is greater than the vertical extent of the cavity. In other words, the lateral dimension of each of the backside recesses (143, 243, 343) can be greater than the height of the respective backside recess 43. Each of the backside recesses (143, 243, 343) can laterally extend substantially parallel to the top surface of the substrate 8. A backside recess (143, 243, 343) can be vertically bounded by a top surface of an underlying insulating layer (132, 232, 332) and a bottom surface of an overlying insulating layer (132, 232, 332). In one embodiment, each of the backside recesses (143, 243, 343) can have a uniform height throughout.

Figure 29A:
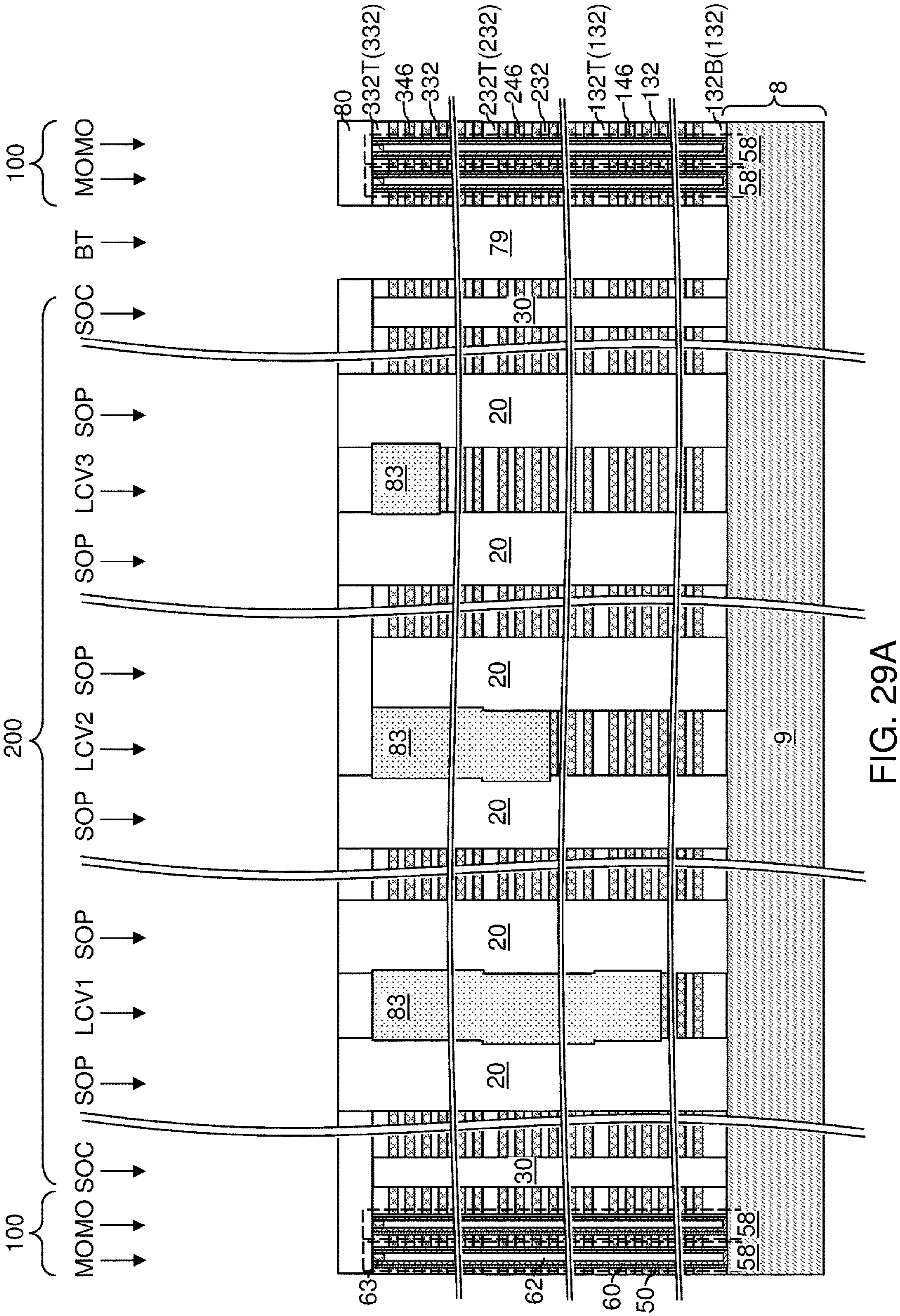
FIG. 29A is a vertical cross-sectional view of the exemplary structure after formation of electrically conductive layers according to an embodiment of the present disclosure.
Figure 29B:
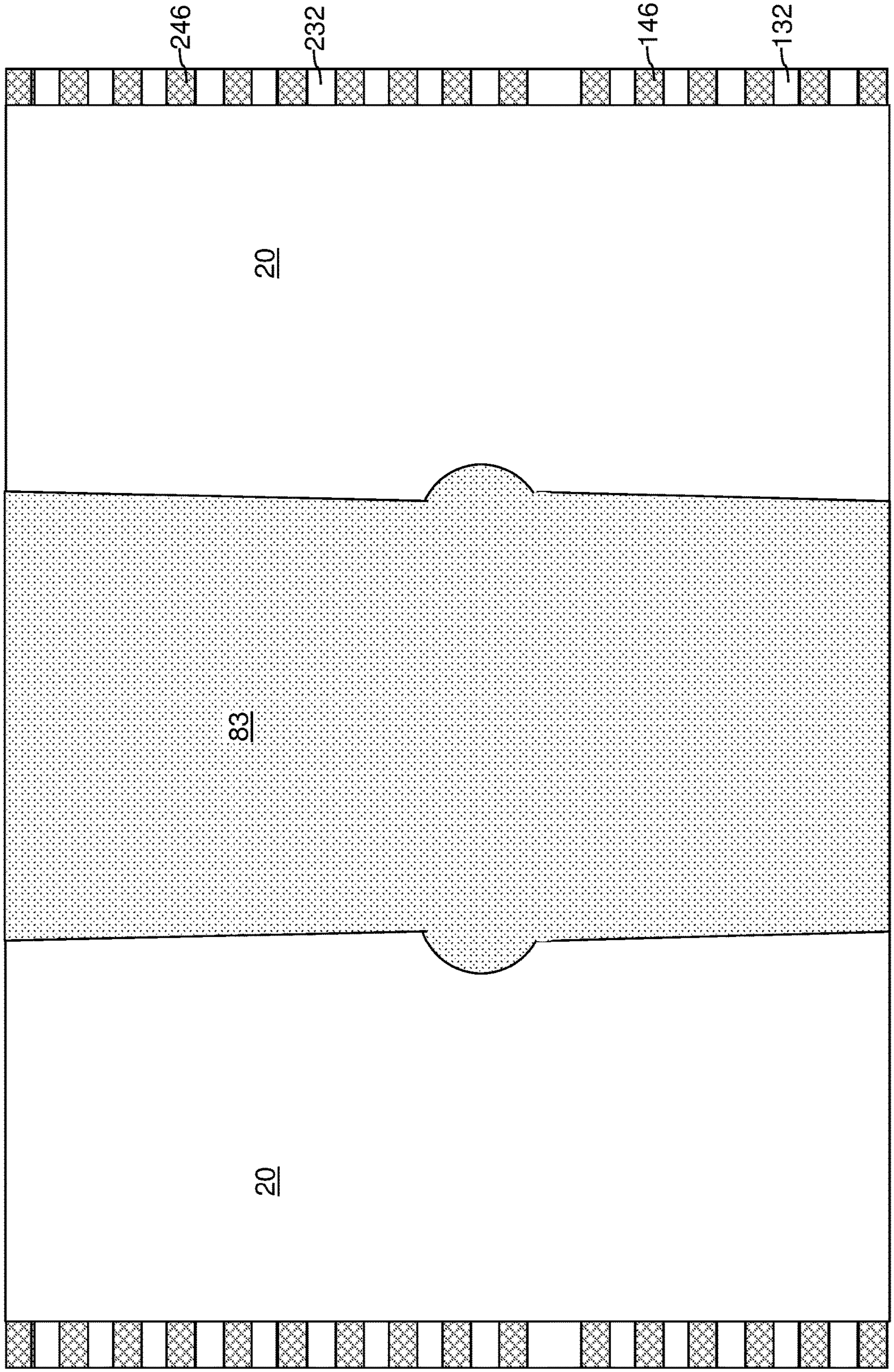
FIG. 29B is a magnified view of a region around a portion of a sacrificial via fill structure in the exemplary structure of FIG. 29A.

Referring to FIGS. 29A and 29B, a backside blocking dielectric layer (not shown) may be optionally formed in the backside recesses (143, 243, 343). At least one conductive material such as at least one metallic material may be conformally deposited in the backside recesses (143, 243, 343). The at least one conductive material may comprise, for example, a metallic barrier liner material (such as TiN, TaN, WN, MoN, TiC, TaC, WC, etc.) and a metallic fill material (such as W, Ti, Ta, Co, Ru, Mo, Cu, etc.). Portions of the at least one conductive material that are deposited in the backside trenches 79 or above the contact-level dielectric layer 80 can be removed by a recess etch process, which may comprise an isotropic etch process and/or an anisotropic etch process. Each remaining portion of the at least one conductive material that fills a respective backside recess (143, 243, 343) constitutes an electrically conductive layer (146, 246, 346). The electrically conductive layers (146, 246, 346) comprise first electrically conductive layers 146 that replace the first sacrificial material layers 142, second electrically conductive layers 246 that replace the second sacrificial material layers 242, and third electrically conductive layers 346 that replace the third sacrificial material layers 342.

At least one alternating stack {(132, 142), (232, 246), (332, 346)} of respective insulating layers (132, 232, 332) and respective electrically conductive layers (146, 246, 346) can be formed over the substrate 8. The combination of the memory stack structures 55 located in the memory opening fill structures 58 and the at least one alternating stack {(132, 142), (232, 246), (332, 346)} constitute a three-dimensional array of memory elements. In this case, the electrically conductive layers (146, 246, 346) may comprise word lines of the three-dimensional array of memory elements, while one or more topmost and bottommost electrically conductive layers (146, 346) comprise drain side and source side select gate electrodes, respectively.

Figure 30A:
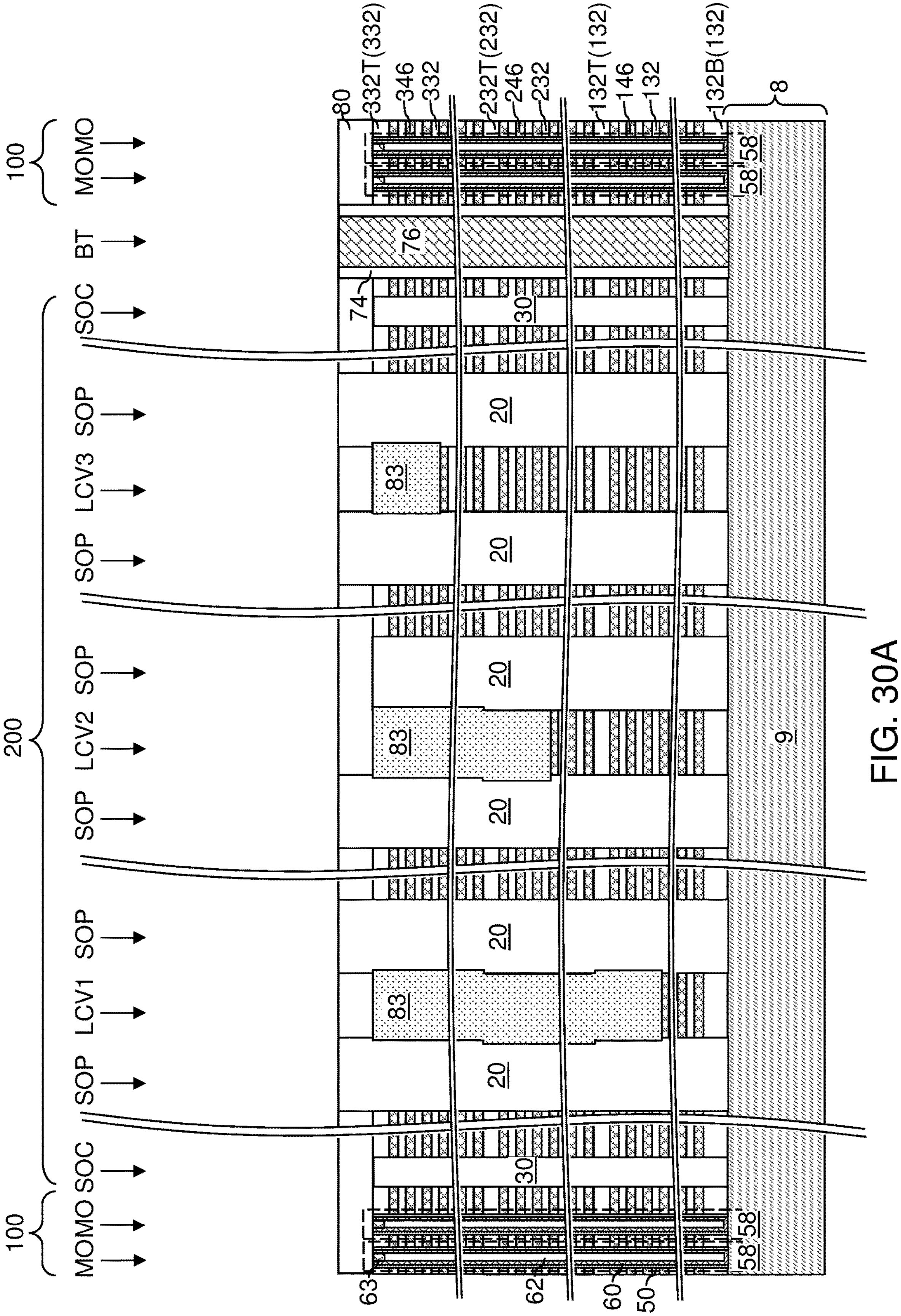
FIG. 30A is a vertical cross-sectional view of the exemplary structure after formation of backside trench fill structures according to an embodiment of the present disclosure.
Figure 30B:
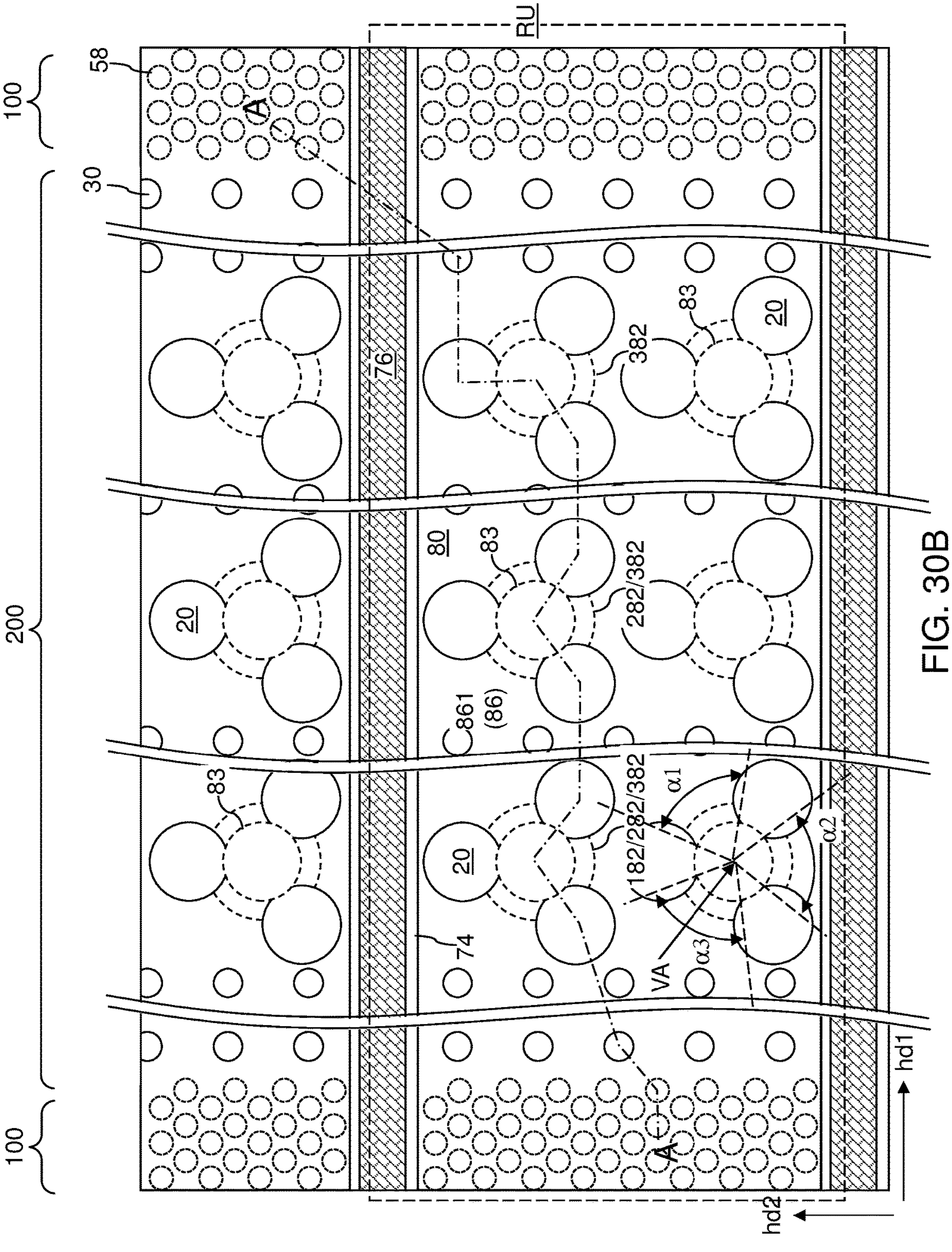
FIG. 30B is a top-down view of the exemplary structure of FIG. 30A. The hinged vertical plane A-A' is a cut plane of the vertical cross-sectional view of FIG. 30A.

Referring to FIGS. 30A and 30B, an insulating material layer can be formed in the backside trenches 79 and over the contact-level dielectric layer 80 by a conformal deposition process. An anisotropic etch is performed to remove horizontally-extending portions of the insulating material layer from above the contact-level dielectric layer 80 and at the bottom of each backside trench 79. Each remaining portion of the insulating material layer constitutes an insulating spacer 74. A backside cavity is present within a volume surrounded by each insulating spacer 74.

A backside contact via structure 76 can be formed within each backside cavity. Each backside contact via structure 76 can fill a respective backside cavity. Each contact via structures 76 can be formed by depositing at least one conductive material in a remaining unfilled volume (i.e., a backside cavity) of the backside trenches 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact-level dielectric layer 80 as a stopping layer. If chemical mechanical planarization (CMP) process is employed, the contact-level dielectric layer 80 can be employed as a CMP stopping layer. Each remaining continuous portion of the at least one conductive material in the backside trenches 79 constitutes a backside contact via structure 76. Each contiguous combination of an insulating spacer 74 and a backside contact via structure 76 constitutes a backside trench fill structure (74, 76). Generally, each backside trench fill structures (74, 76) can vertically extend through each layer within the at least one alternating stack {(132, 142), (232, 246), (332, 346)} of respective insulating layers (132, 232, 332) and respective electrically conductive layers (146, 246, 346).

Figure 31:
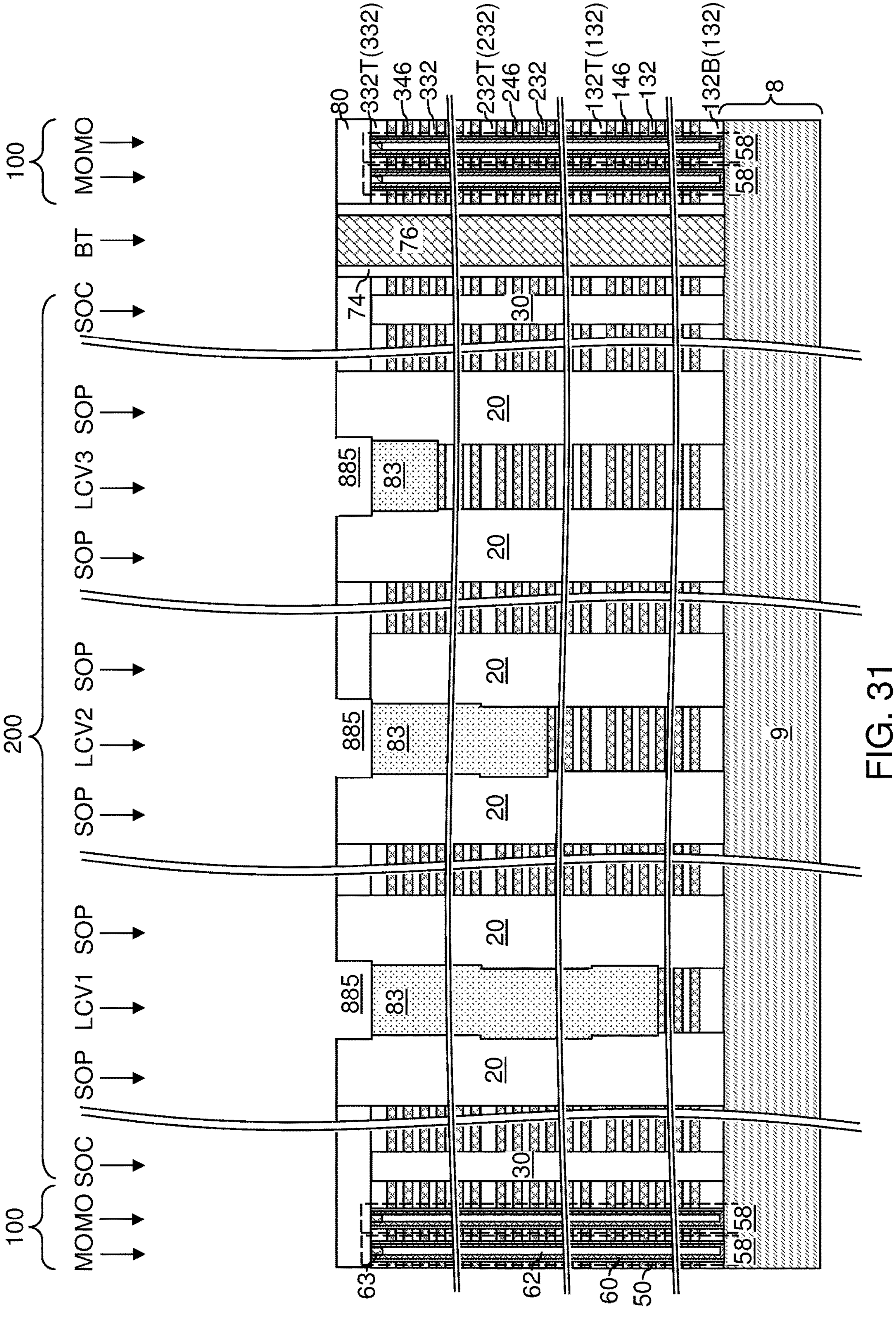
FIG. 31 is a vertical cross-sectional view of the exemplary structure after formation of access via cavities according to an embodiment of the present disclosure.

Referring to FIG. 31, a photoresist layer (not shown) can be applied over the contact-level dielectric layer 80, and can be lithographically patterned to form openings over the via-shaped material portions (such as the sacrificial via fill structures 83). An anisotropic etch process can be formed to form via cavities through the contact-level dielectric layer 80, which are herein referred to as access via cavities 885. A top surface of a via-shaped material portion (sch as a sacrificial via fill structure 83) can be exposed at the bottom of each access via cavity 885. The photoresist layer can be removed, for example, by ashing.

Figure 32A:
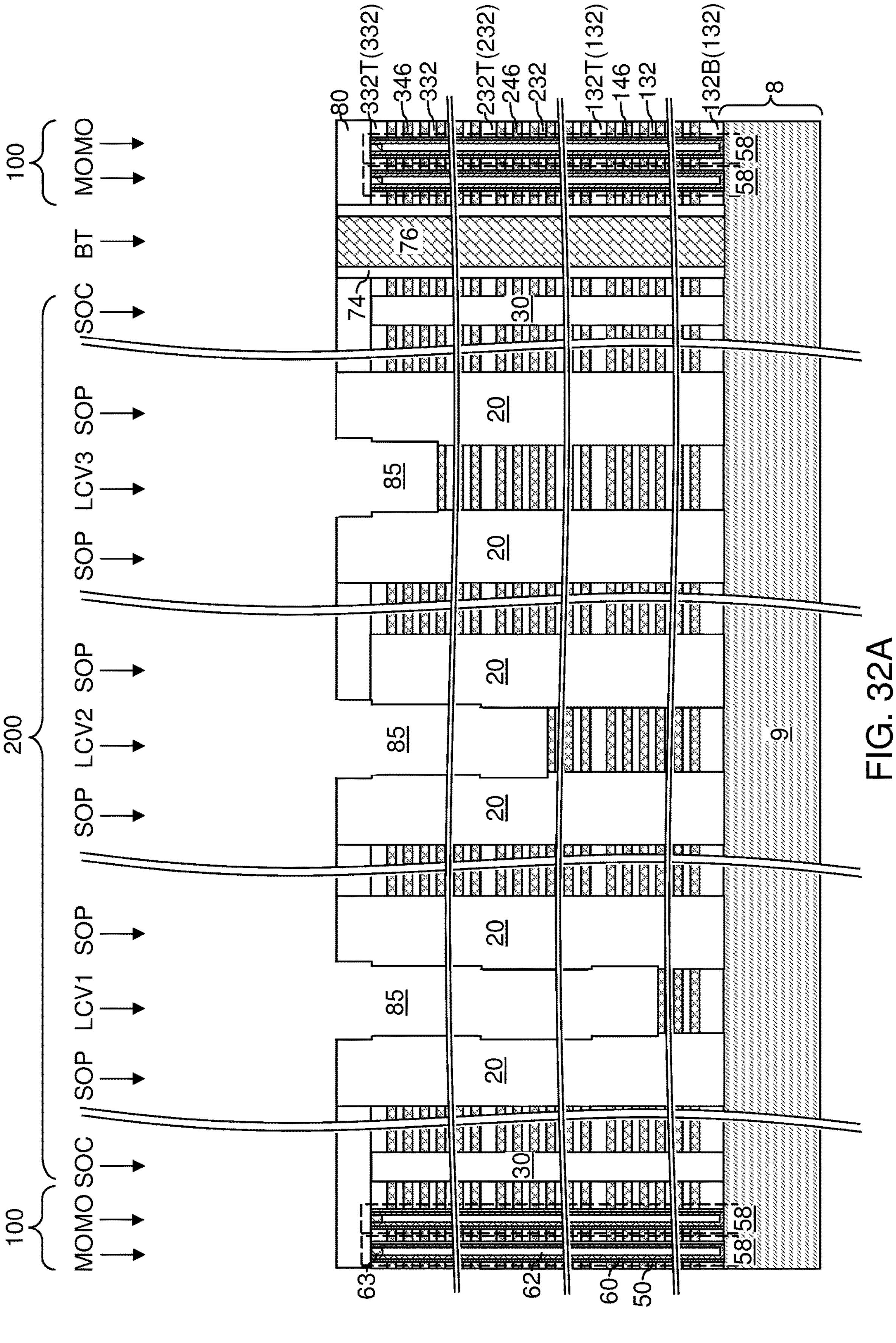
FIG. 32A is a vertical cross-sectional view of the exemplary structure after formation of layer contact via cavities according to an embodiment of the present disclosure.
Figure 32B:
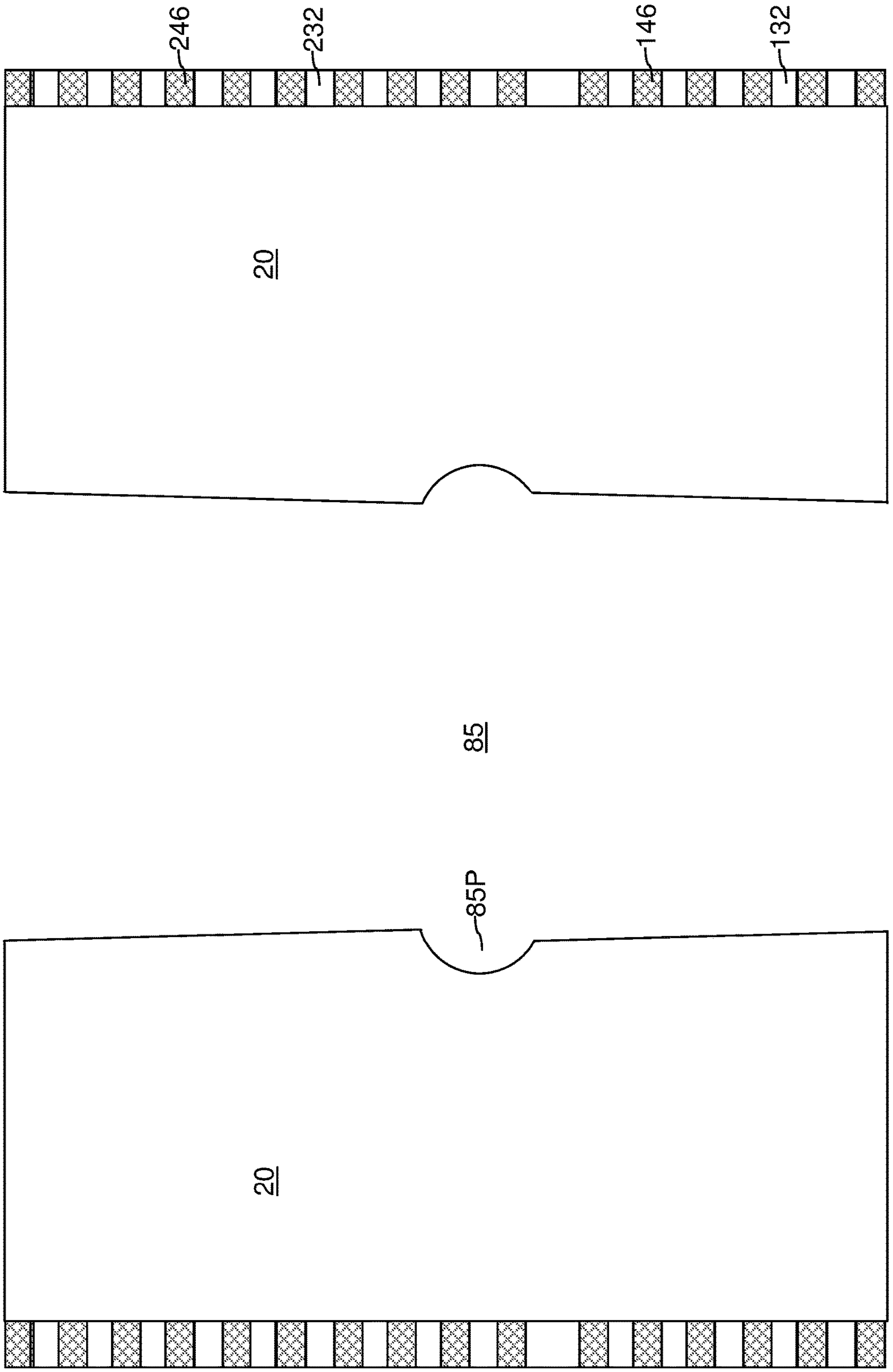
FIG. 32B is a magnified view of a region around a portion of a layer contact via cavity in the exemplary structure of FIG. 32A.

Referring to FIGS. 32A and 32B, the via-shaped material portions (such as the sacrificial via fill structures 83) can be removed selective to the dielectric spacers (182, 282, 382), the primary dielectric support pillar structures 20, the electrically conductive layers (146, 246. 246), and the contact-level dielectric layer 80. For example, the via-shaped material portions (such as the sacrificial via fill structures 83) may be removed by performing an ashing process or an isotropic etch process. Each continuous void including a volume from which a via-shaped material portion is removed and a volume of an overlying access cavity 885 constitutes a contact via cavity, which is herein referred to as a layer contact via cavity 85.

As shown in FIG. 32B, each layer contact via cavity 85 may comprise at least one laterally-protruding portion 85P that is laterally bounded by concave surfaces of a respective set of dielectric spacers (182, 282, 382) and primary dielectric support pillar structures 20. A subset of the layer contact via cavities 85 may comprise a plurality laterally-protruding portion0 85Ps. A top surface of an electrically conductive layer (146, 246, 346) can be physically exposed at the bottom of each layer contact via cavity 85.

Figure 33A:
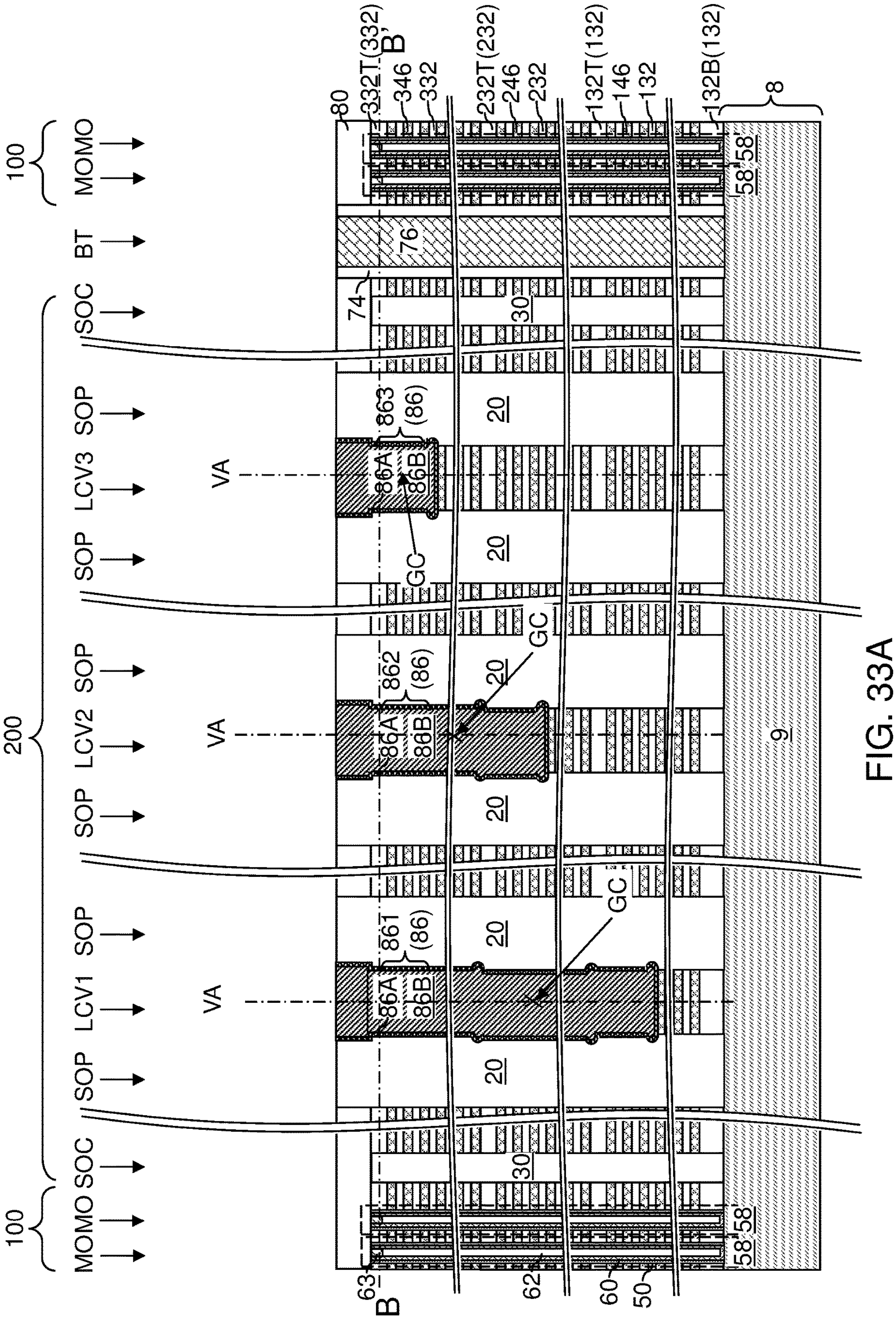
FIG. 33A is a vertical cross-sectional view of the exemplary structure after formation of layer contact via structures according to an embodiment of the present disclosure.
Figure 33B:
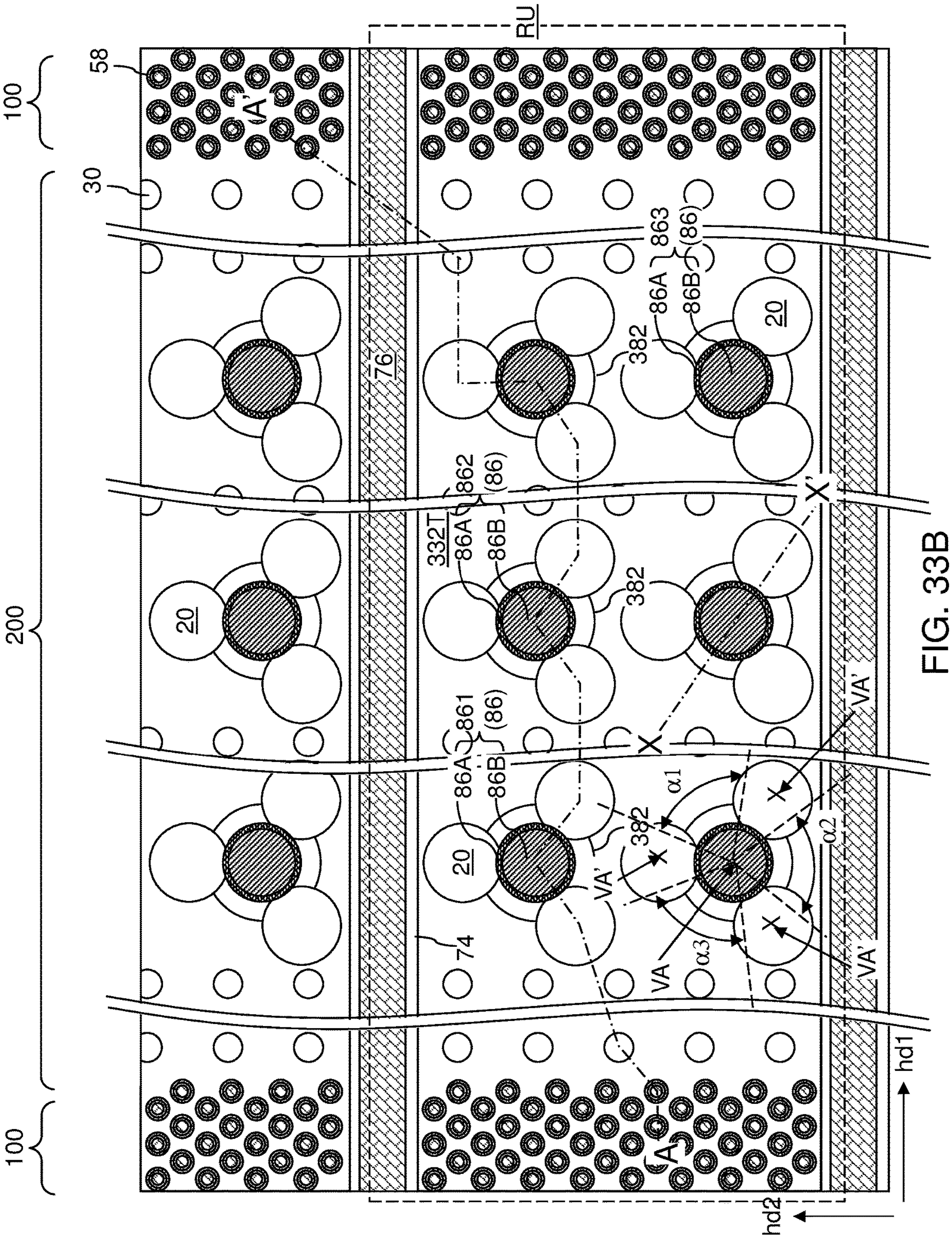
FIG. 33B is a horizontal cross-sectional view of the exemplary structure along the horizontal plane A-A' of FIG. 33A. The hinged vertical plane A-A' is a cut plane of the vertical cross-sectional view of FIG. 33A.
Figure 33C:
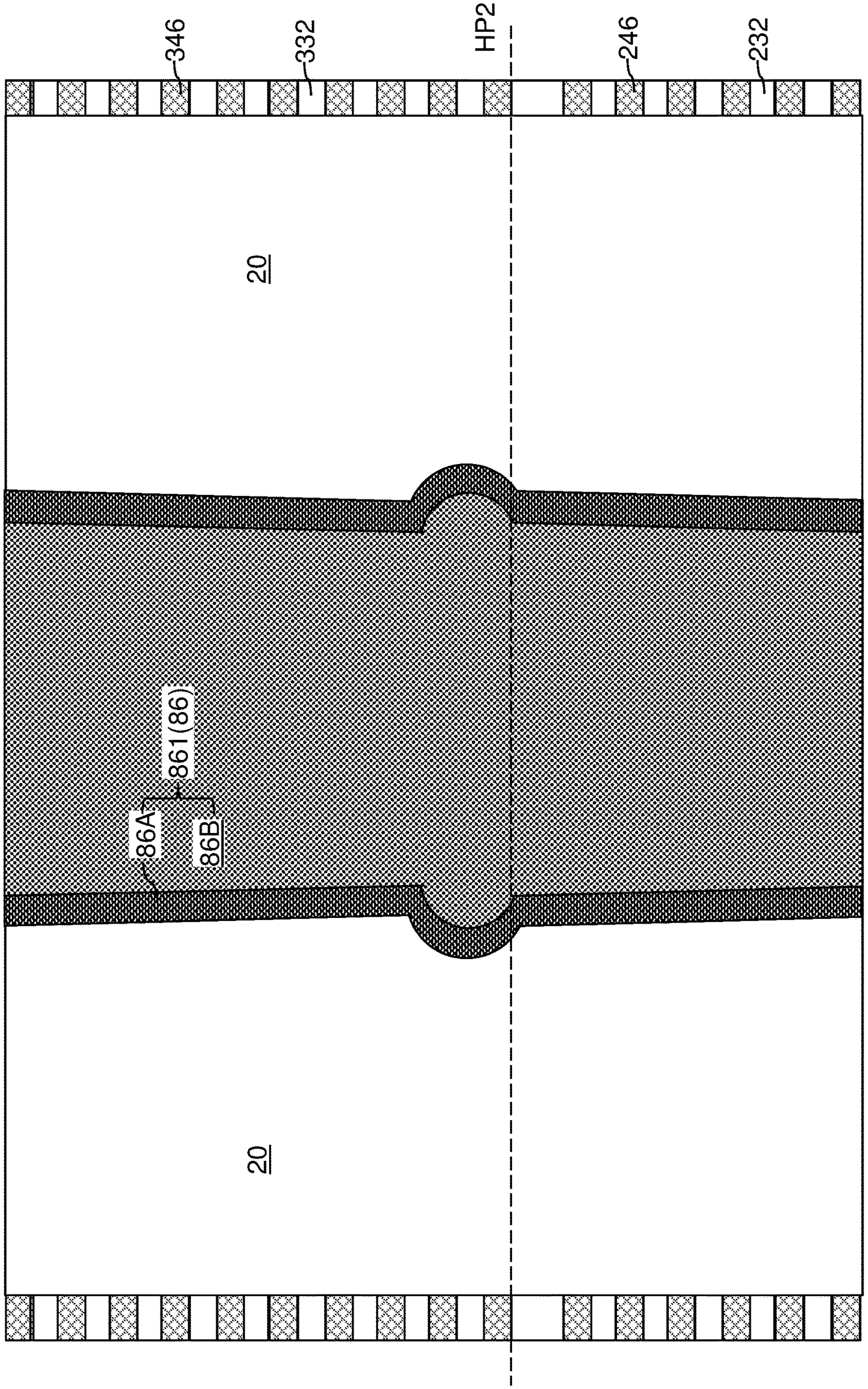
FIGS. 33C, 33D, and 33E are magnified views of a respective portion of a layer contact via structure in the exemplary structure of FIG. 33A.
Figure 33D:
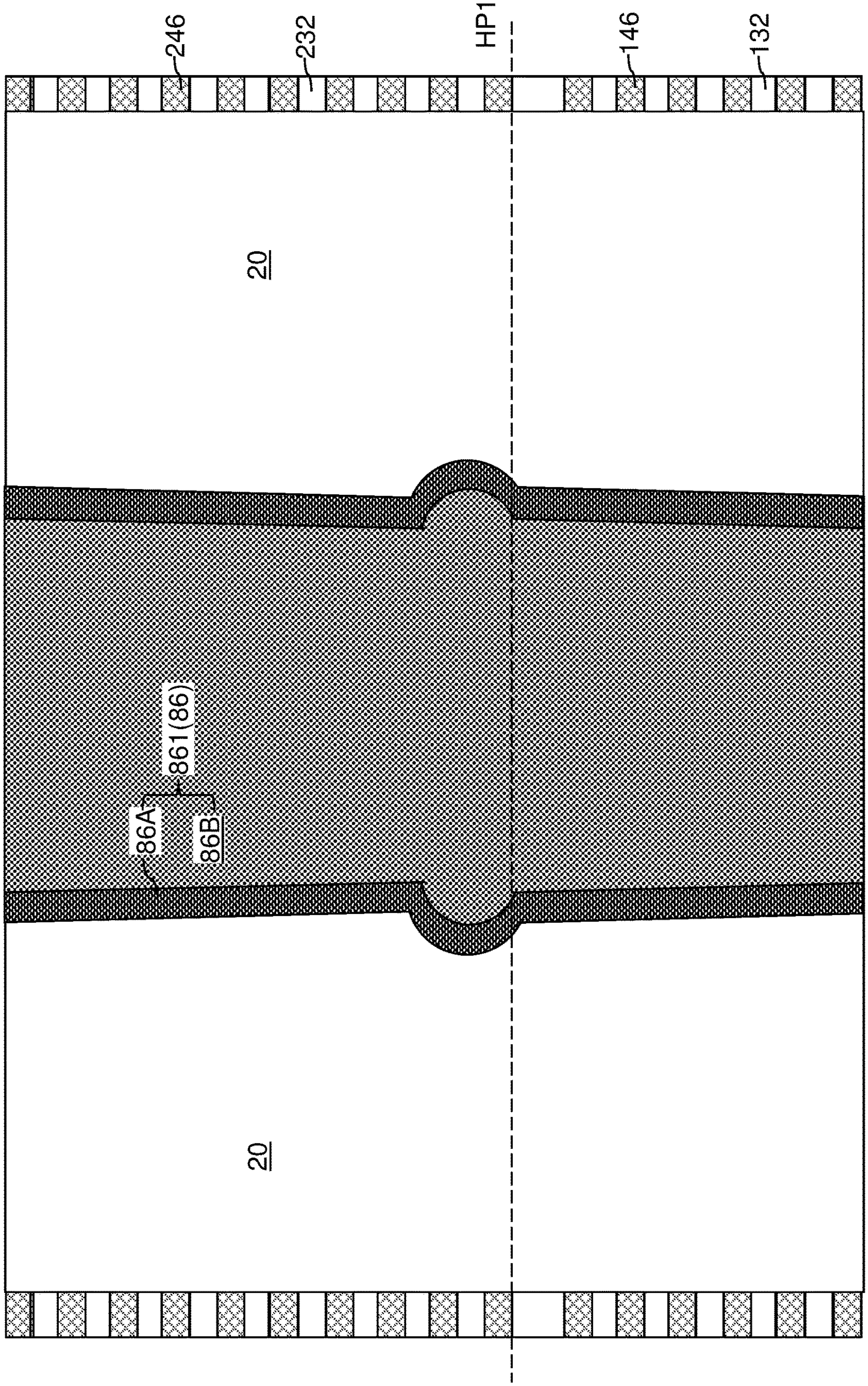
Figure 33E:
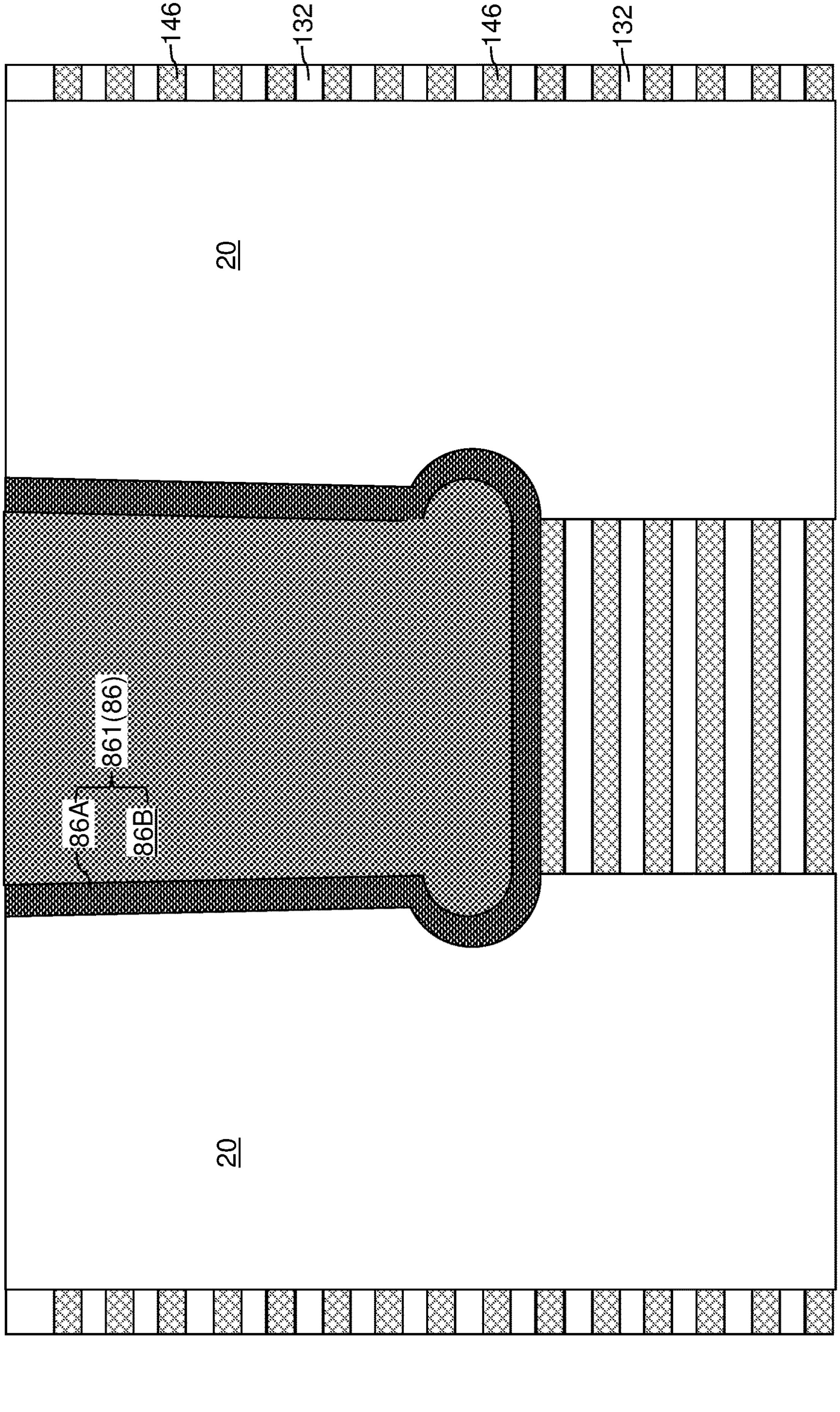
Figure 33F:
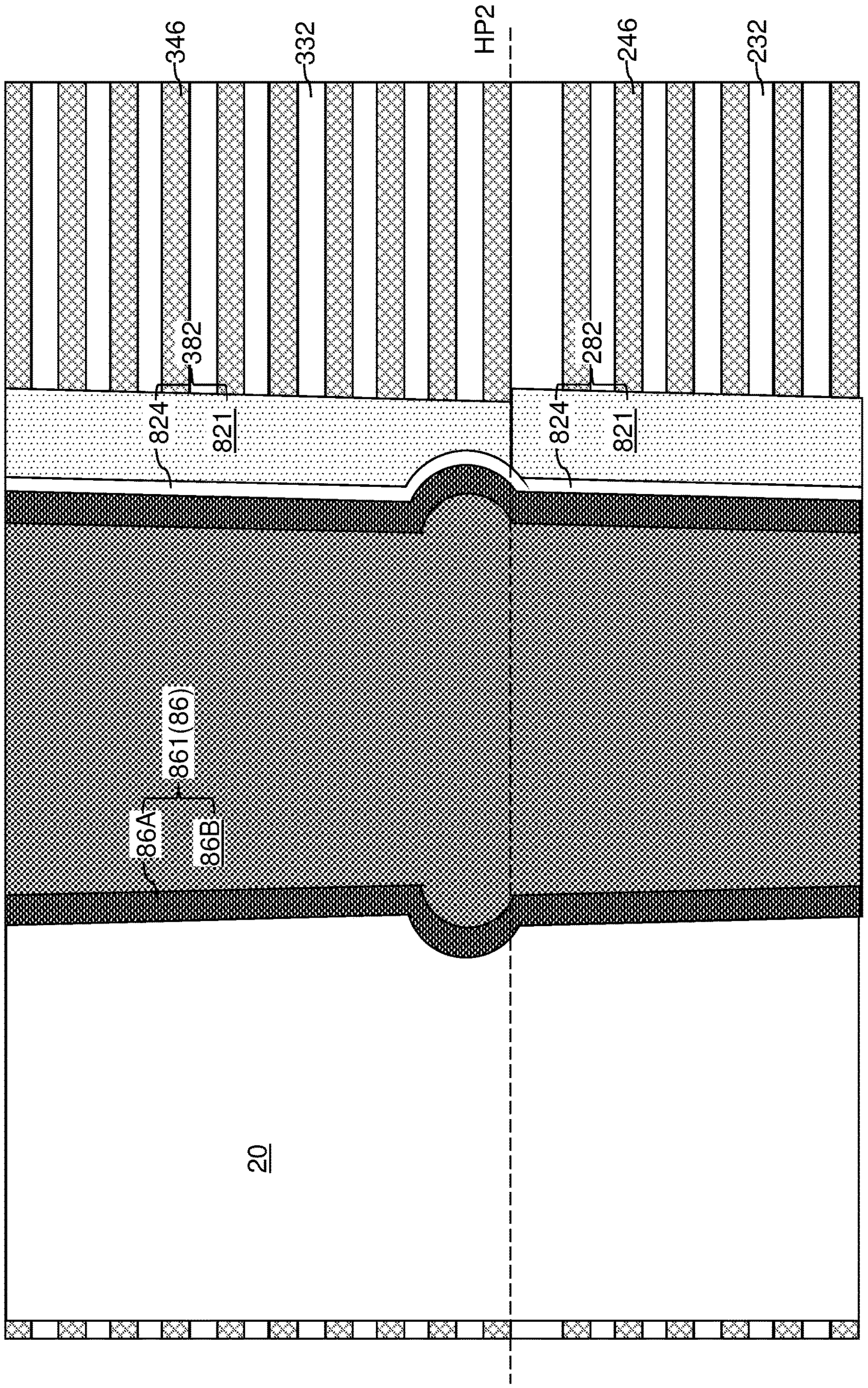
FIGS. 33F, 33G, and 33H are magnified views of a respective portion of a layer contact via structure along a vertical plane X-X' in the exemplary structure of FIG. 33B.
Figure 33G:
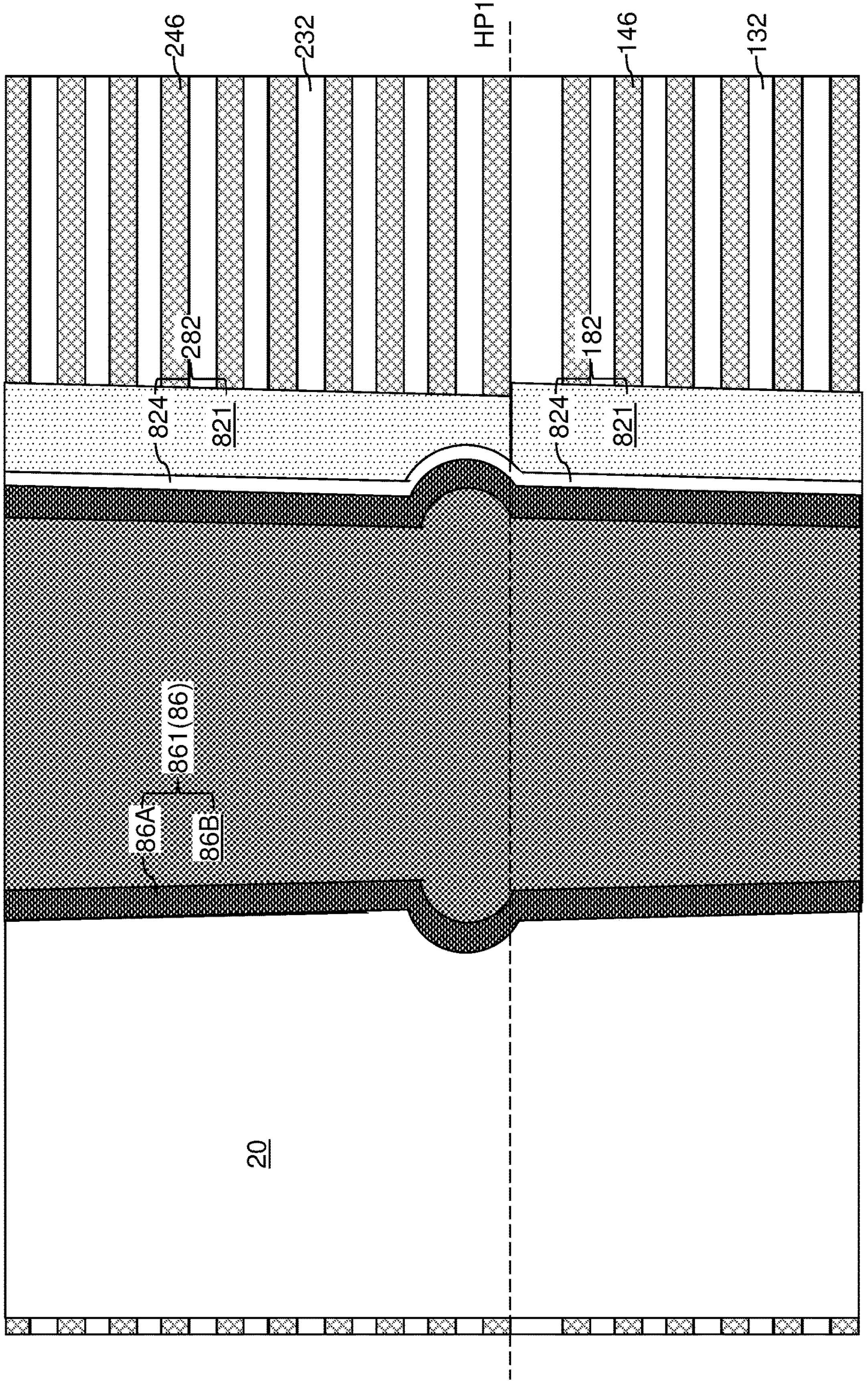
Figure 33H:
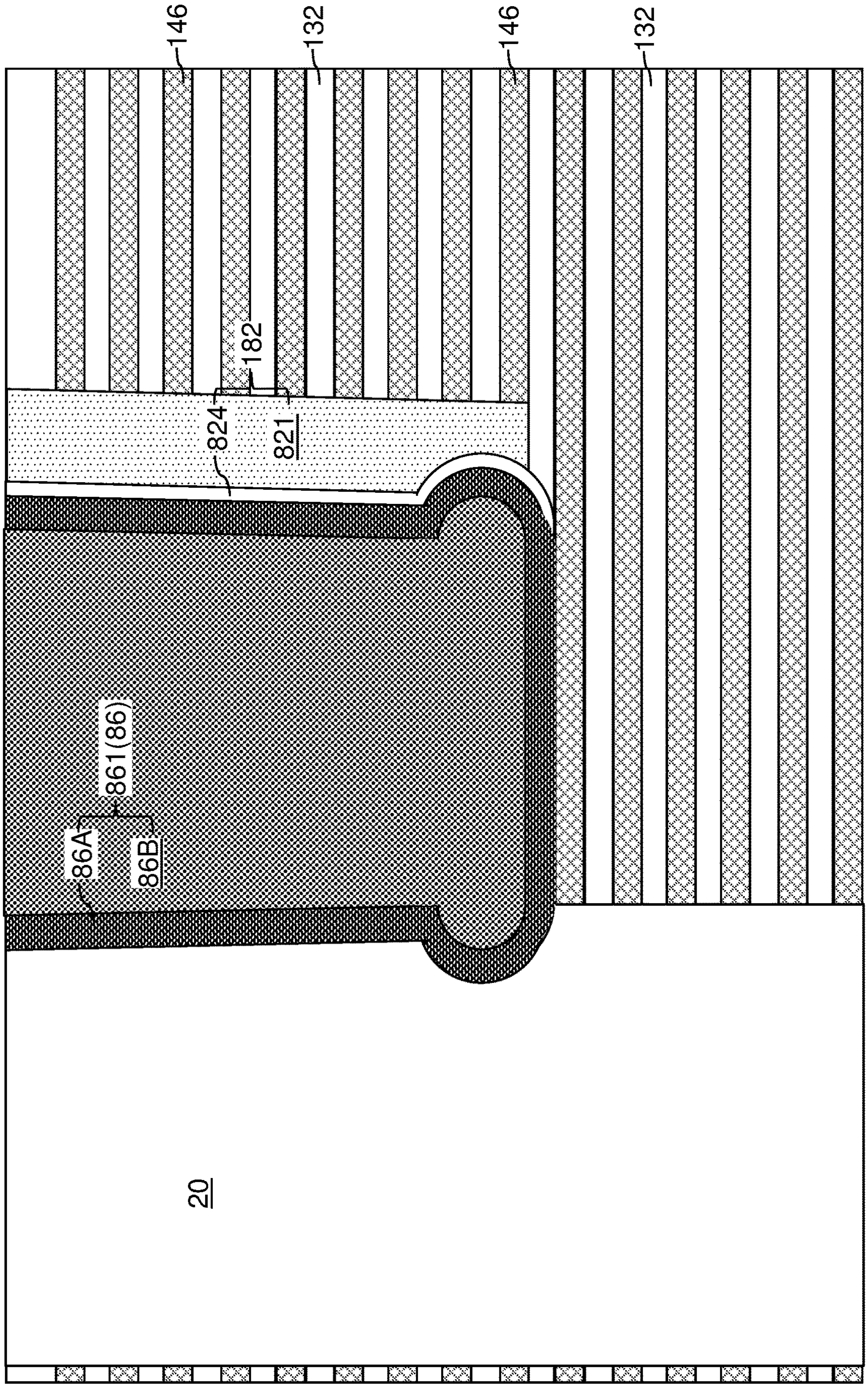

Referring to FIGS. 33A-33H, layer contact via structures 86 can be formed in the layer contact via cavities 85. FIG. 33A is a vertical cross-sectional view; FIG. 33B is a top-down view, FIGS. 33C, 33D, and 33E are magnified views of a respective portion of a layer contact via structure 86 in the exemplary structure of FIG. 33A in area LCV1; and FIGS. 33F, 33G, and 33H are magnified views of a respective portion of a layer contact via structure 86 along a vertical plane X-X' in the exemplary structure of FIG. 33B.

For example, at least one conductive material can be deposited in the layer contact via cavities 85, and excess portions of the at least one conductive material can be removed from above the horizontal plane including the top surface of the contact-level dielectric layer 80 by a planarization process such as a chemical mechanical polishing process. The at least one conductive material may comprise a metallic barrier material and a metallic fill material. In this case, each layer contact via structure 86 may comprise a metallic barrier liner 86A and a metallic fill material portion 86B. Each metallic barrier liner 86A may comprise a metallic barrier material such as TiN, TaN, WN, MoN, TiC, TaC, WC, or a combination thereof, and may have a thickness in a range from 3 nm to 50 nm, such as from 6 nm to 30 nm, although lesser and greater thicknesses may also be employed. Each metallic fill material portion 86B may comprise a material such as W, Ti, Ta, Ru, Co, Mo, Cu, etc.

The layer contact via structures 86 may comprise first layer contact via structures 861 that contact a top surface of a first electrically conductive layer 146, second layer contact via structures 862 that contact a top surface of a second electrically conductive layer 246, and third layer contact via structures 863 that contact a top surface of a third electrically conductive layer 346. Each first layer contact via structure 861 can be laterally surrounded by, and can be laterally contacted by, a respective set of first dielectric spacers 182, a respective set of second dielectric spacers 282, and a respective set of third dielectric spacers 382. Each second layer contact via structure 862 can be laterally surrounded by, and can be laterally contacted by, a respective set of second dielectric spacers 282 and a respective set of third dielectric spacers 382. Each third layer contact via structure 863 can be laterally surrounded by, and can be laterally contacted by, a respective set of third dielectric spacers 382.

As shown in FIG. 33E, at least one dielectric support pillar structure 20 includes a lower portion which underlies a peripheral portion of a layer contact via structure 86. The lower portion is formed in the expanded pillar cavities 29' which include an undercut (shown in FIG. 25A) under the space subsequently filled by the layer contact via structures 86. Since the layer contact via structures 86 may have a relatively large width (e.g., diameter), it may create word line deflection since it may be difficult to support the insulating layers located below the layer contact via structure 86. The lower portion(s) of the dielectric support pillar structure(s) 20 provide additional structural support for the layer contact via structure 86, which may reduce or eliminate word line deflection.

Generally speaking, a set of material portions comprising a first sacrificial via fill structure 183 can be replaced with a first layer contact via structure 861 that directly contacts a top surface of a first electrically conductive layer 146, with or without intermediate replacement of the first sacrificial via fill structure 183 with a portion of a sacrificial via fill structure 83. A set of material portions comprising a second sacrificial via fill structure 283 can be replaced with a second layer contact via structure 862 that directly contacts a top surface of a second electrically conductive layer 246, with or without intermediate replacement of the second sacrificial via fill structure 283 with a portion of a sacrificial via fill structure 83. Each material portion that fills a void 389' in a third via cavity 389 (such as a sacrificial via fill structure 83) may be replaced with a third layer contact via structure 863.

In one embodiment, a layer contact via structure 86 (such as a first layer contact via structure 861) vertically extends through an upper portion of the at least one alternating stack {(132, 142), (232, 246), (332, 346)} and contacts a top surface of one of the electrically conductive layers (146, 246, 346). A plurality of dielectric support pillar structures 20 vertically extend through each layer within the at least one alternating stack {(132, 142), (232, 246), (332, 346)} and contact a respective first sidewall segment of the layer contact via structure 86. A plurality of dielectric spacers (182, 282, 382) vertically extend through the upper portion of the at least one alternating stack {(132, 142), (232, 246), (332, 346)} and contact a respective second sidewall segment of the layer contact via structure 86. In one embodiment shown in FIG. 33B, the plurality of dielectric support pillar structures 20 and the plurality of dielectric spacers (182, 282, 382) are azimuthally interlaced around a vertical axis VA passing through a center GC of the layer contact via structure 86.

In one embodiment, the plurality of dielectric support pillar structures 20 comprises P dielectric support pillar structures 20; and the plurality of dielectric spacers (182, 282, 382) comprises at least P dielectric spacers (182, 282, 382); and P is an integer greater than 1. In one embodiment, each of the plurality of dielectric spacers (182, 282, 382) is located within a respective azimuthal angle range ($\alpha$1, $\alpha$2, $\alpha$3) around the vertical axis VA that has a magnitude less than $2\pi/P$ radian. In one embodiment, the at least one alternating stack {(132, 142), (232, 246), (332, 346)} comprises M alternating stacks {(132, 142), (232, 246), (332, 346)}, in which M is an integer greater than 1; and the plurality of dielectric spacers (182, 282, 382) comprises a total of M×P dielectric spacers (182, 282, 382). In one embodiment, the M×P dielectric spacers (182, 282, 382) comprises M sets of P dielectric spacers (182, 282, 382) that are azimuthally spaced apart around the vertical axis VA. Each set of respective P dielectric spacers (182, 282, 382) overlies or underlies any other set of respective P dielectric spacers (182, 282, 382).

In one embodiment, each of the plurality of dielectric support pillar structures 20 has a respective center and a respective vertical axis VA' passing through the respective center; and each of the vertical axes VA' of the plurality of dielectric support pillar structures 20 is laterally spaced from the vertical axis VA passing through the center GC of the layer contact via structure 86 by a greater lateral distance than any point within the plurality of dielectric spacers (182, 282, 382) is from the vertical axis VA passing through the center GC of the layer contact via structure 86.

In one embodiment, each surface segment of the layer contact via structure 86 located above a horizontal plane including a top surface of the one of the electrically conductive layers (146, 246, 346) and below a horizontal surface including a topmost surface of the at least one alternating stack {(132, 142), (232, 246), (332, 346)} is in direct contact with one of plurality of dielectric support pillar structures 20 or with one of the plurality of dielectric spacers (182, 282, 382).

In one embodiment, each interface between the layer contact via structure 86 and the plurality of dielectric support pillar structures 20 has a horizontal cross-sectional profile in which a convex surface segment of the layer contact via structure 86 is in direct contact with a concave surface segment of a respective one of the dielectric support pillar structures 20.

In one embodiment, each of the plurality of dielectric support pillar structures 20 is in in direct contact with a respective pair of dielectric spacers (182, 282, 382) among the plurality of dielectric spacers (182, 282, 382); and each of the plurality of dielectric spacers (182, 282, 382) is in direct contact with a respective pair of dielectric support pillar structures 20.

In one embodiment, each of the plurality of dielectric support pillar structures 20 is in direct contact with each insulating layer (132, 232, 332) within the at least one alternating stack {(132, 142), (232, 246), (332, 346)}; and each insulating layer (132, 232, 332) within the at least one alternating stack {(132, 142), (232, 246), (332, 346)} that overlies the one of the electrically conductive layers (146, 246, 346) is in direct contact with at least two dielectric spacers (182, 282, 382) (which may be P dielectric spacers (182, 282, 382)) within the plurality of dielectric spacers (182, 282, 382).

In one embodiment, a contact-level dielectric layer 80 overlies the at least one alternating stack {(132, 142), (232, 246), (332, 346)}. Top surfaces of the plurality of dielectric support pillar structures 20 located within a horizontal plane including a top surface of the contact-level dielectric layer 80; and topmost surfaces of the plurality of dielectric spacers (182, 282, 382) is located within a horizontal plane including topmost surfaces of the at least one alternating stack {(132, 142), (232, 246), (332, 346)}.

In one embodiment, each interface between the layer contact via structure 86 and a respective one of the plurality of dielectric support pillar structures 20 vertically extends from the one of the electrically conductive layers (146, 246, 346) to a horizontal plane including a topmost surface of the at least one alternating stack {(132, 142), (232, 246), (332, 346)} without horizontally-extending surface segments.

In one embodiment, each of the plurality of dielectric spacers (182, 282, 382) comprises at least one laterally-extending fin portion which is located at a level of a respective one of the electrically conductive layers (146, 246, 346), has a respective horizontally-extending top surface contacting a respective overlying insulating layer (132, 232, 332) within the at least one alternating stack {(132, 142), (232, 246), (332, 346)}, and has a respective horizontally-extending bottom surface segment contacting a respective underlying insulating layer (132, 232, 332) within the at least one alternating stack {(132, 142), (232, 246), (332, 346)}.

According to an aspect of the present disclosure, a layer contact via structure 86 vertically extends through an upper portion of the at least one alternating stack {(132, 142), (232, 246), (332, 346)} and contacts a top surface of one of the electrically conductive layers (146, 246, 346). The layer contact via structure 86 is electrically isolated from each electrically conductive layer within the at least one alternating stack {(132, 142), (232, 246), (332, 346)} that overlies the one of the electrically conductive layers (146, 246, 346) by a set of at least one dielectric isolation structure (182, 282, 382, 20) that comprises a first dielectric spacer 182. A sidewall of the layer contact via structure 86 comprises a first straight sidewall segment that contacts a first portion of the first dielectric spacer 182 and a first convex surface segment that contacts a concave surface of a second portion of the first dielectric spacer 182.

In one embodiment, a top periphery of the first convex surface segment is adjoined to a bottom periphery of the first straight sidewall segment. In one embodiment, the first convex surface segment laterally protrudes outward relative to the bottom periphery of the first straight sidewall segment. In one embodiment, the first convex surface segment laterally protrudes outward from a periphery of an interface between the layer contact via structure 86 and the one of the electrically conductive layers (146, 246, 346).

In one embodiment, the at least one alternating stack {(132, 142), (232, 246), (332, 346)} comprises a plurality of alternating stacks {(132, 142), (232, 246), (332, 346)} that are stacked along the vertical direction; the set of at least one dielectric isolation structure (182, 282, 382, 20) comprises at least one additional dielectric spacer (282, 382) that overlies the first dielectric spacer 182 and laterally surrounded by a respective alternating stack {(132, 142), (232, 246), or (332, 346)} among the plurality of alternating stacks {(132, 142), (232, 246), (332, 346)}; and each of the at least one additional dielectric spacer (282, 382) has a respective top surface located within a horizontal plane including a top surface of a respective alternating stack {(232, 246) or (332, 346)}.

In one embodiment, the plurality of alternating stacks {(132, 142), (232, 246), (332, 346)} comprises a second alternating stack (232, 246) that overlies, and is in contact with, the first alternating stack (132, 246); the at least one additional dielectric spacer (282, 382) comprises a second dielectric spacer 282 that contacts the first dielectric spacer 182; and the sidewall of the layer contact via structure 86 comprises a second straight sidewall segment that contacts the second dielectric spacer 282 and a second convex surface segment that contacts a concave surface of the second dielectric spacer 282. In one embodiment, a top periphery of the second convex surface segment is adjoined to a bottom periphery of the second straight sidewall segment; and a bottom portion of the second convex surface segment is in contact with a chamfered surface of the first insulating spacer.

In one embodiment, a plurality of dielectric support pillar structures 20 may vertically extend through each layer within the at least one alternating stack {(132, 142), (232, 246), (332, 346)} and may contact a respective sidewall segment of the layer contact via structure 86. In one embodiment, the set of at least one dielectric isolation structure (182, 282, 382, 20) comprises at least one additional first dielectric spacer 182 having a same vertical extent as the first dielectric spacer 182; and the first dielectric spacer 182 and the at least one additional first dielectric spacer 182 are azimuthally spaced apart around the layer contact via structure 86 and are not in direct contact among one another. In one embodiment, the first dielectric spacer 182 and the at least one additional first dielectric spacer 182 are azimuthally interlaced with the plurality of dielectric support pillar structures 20 around a vertical axis VA passing through a center GC of the layer contact via structure 86.

In one embodiment, the first dielectric spacer 182 and the at least one additional first dielectric spacer 182 comprises P dielectric spacers (182, 282, 382); the plurality of dielectric support pillar structures 20 comprises P dielectric support pillar structures 20; P is an integer greater than 1; and each of the P dielectric spacers (182, 282, 382) is located within a respective azimuthal angle range ($\alpha$1, $\alpha$2, $\alpha$3) around the vertical axis VA that has a magnitude less than $2\pi/P$ radian.

In one embodiment, each of the respective sidewall segment of the layer contact via structure 86 comprises: at least one straight sidewall segment that contacts a straight sidewall surface segment of a respective one of the plurality of dielectric support pillar structures 20; and at least one convex surface segment that contacts a concave surface segment of the respective one of the plurality of dielectric support pillar structures 20. In one embodiment, the at least one alternating stack {(132, 142), (232, 246), (332, 346)} comprises a plurality of alternating stacks {(132, 142), (232, 246), (332, 346)} that are stacked along the vertical direction; at least one straight sidewall segment comprises a plurality of straight sidewall segments; the at least one convex surface segment comprises a plurality of convex surface segments; and one of the plurality of convex surface segments intersects a horizontal plane including an interface between one of the plurality of alternating stacks {(132, 142), (232, 246), (332, 346)} and another of the alternating stacks {(132, 142), (232, 246), (332, 346)}.

Figure 34A:
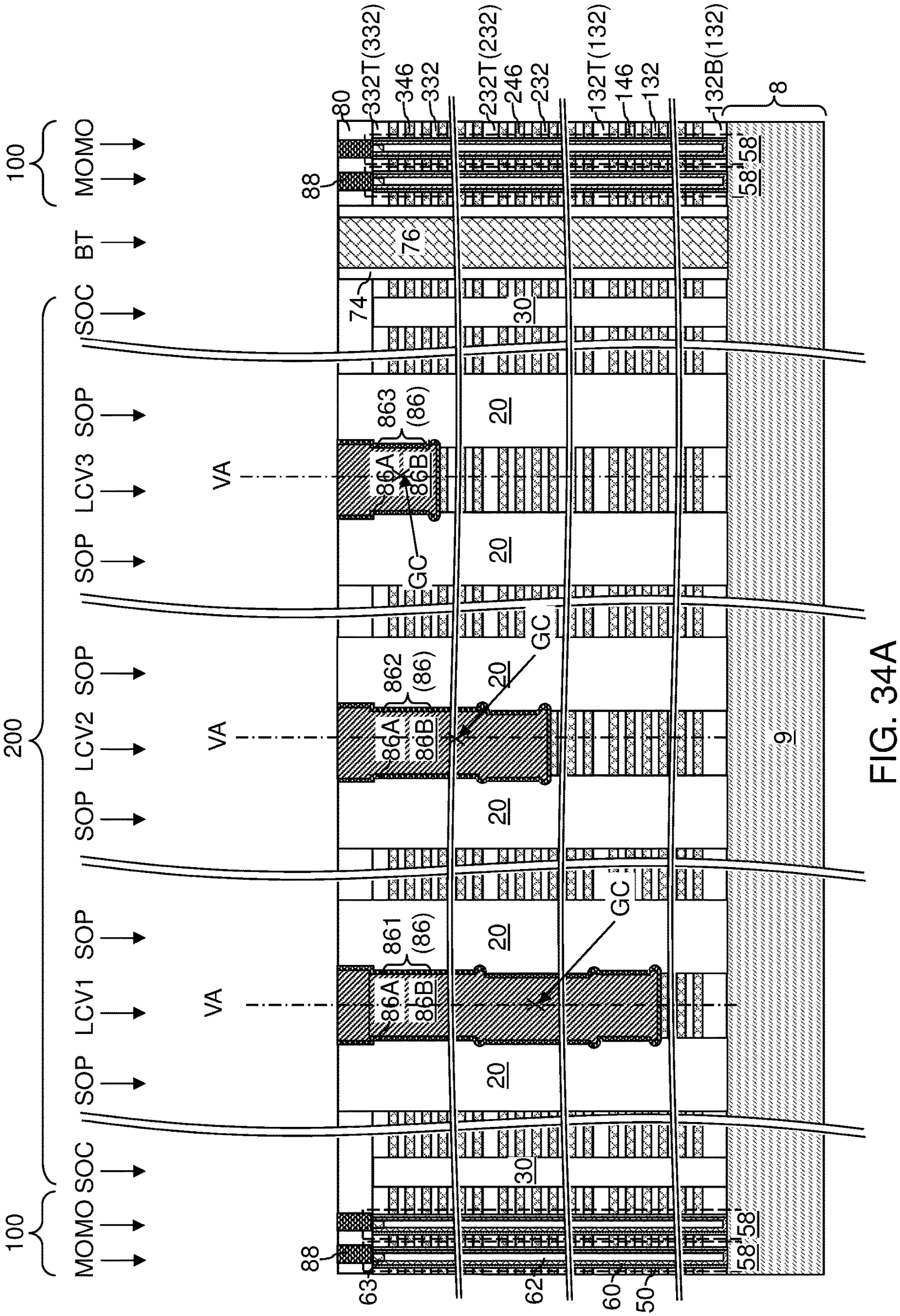
FIG. 34A is a vertical cross-sectional view of the exemplary structure after formation of drain contact via structures according to an embodiment of the present disclosure.
Figure 34B:
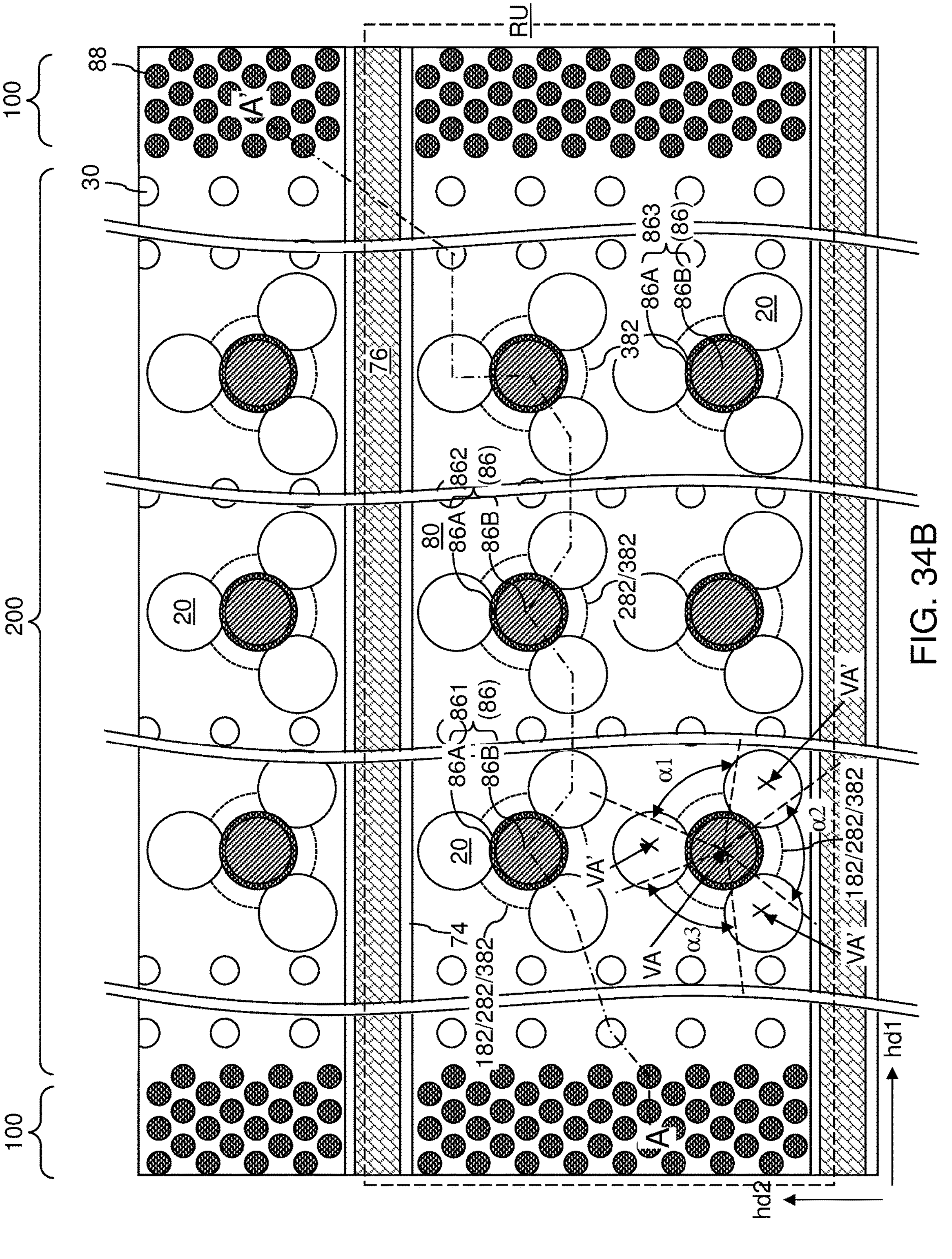
FIG. 34B is a top-down view of the exemplary structure of FIG. 34A. The hinged vertical plane A-A' is a cut plane of the vertical cross-sectional view of FIG. 34A.

Referring to FIGS. 34A and 34B, additional contact via structures may be formed as needed. For example, drain contact via structures 88 can be formed through the contact-level dielectric layer 80 on a respective one of the drain regions 63.

In one embodiment, a control circuitry (e.g., driver circuit) configured to control operation of the vertical stack of memory cell within each NAND memory string (e.g., in the memory opening fill structure 58) may be located on the substrate 8 below the alternating stacks{(132, 142), (232, 246), (332, 346)}. In another embodiment, the control circuitry (e.g., driver circuit) may be formed on a separate substrate and then bonded to the three-dimensional memory device, will be described with respect to FIGS. 35 to 39.

Figure 35:
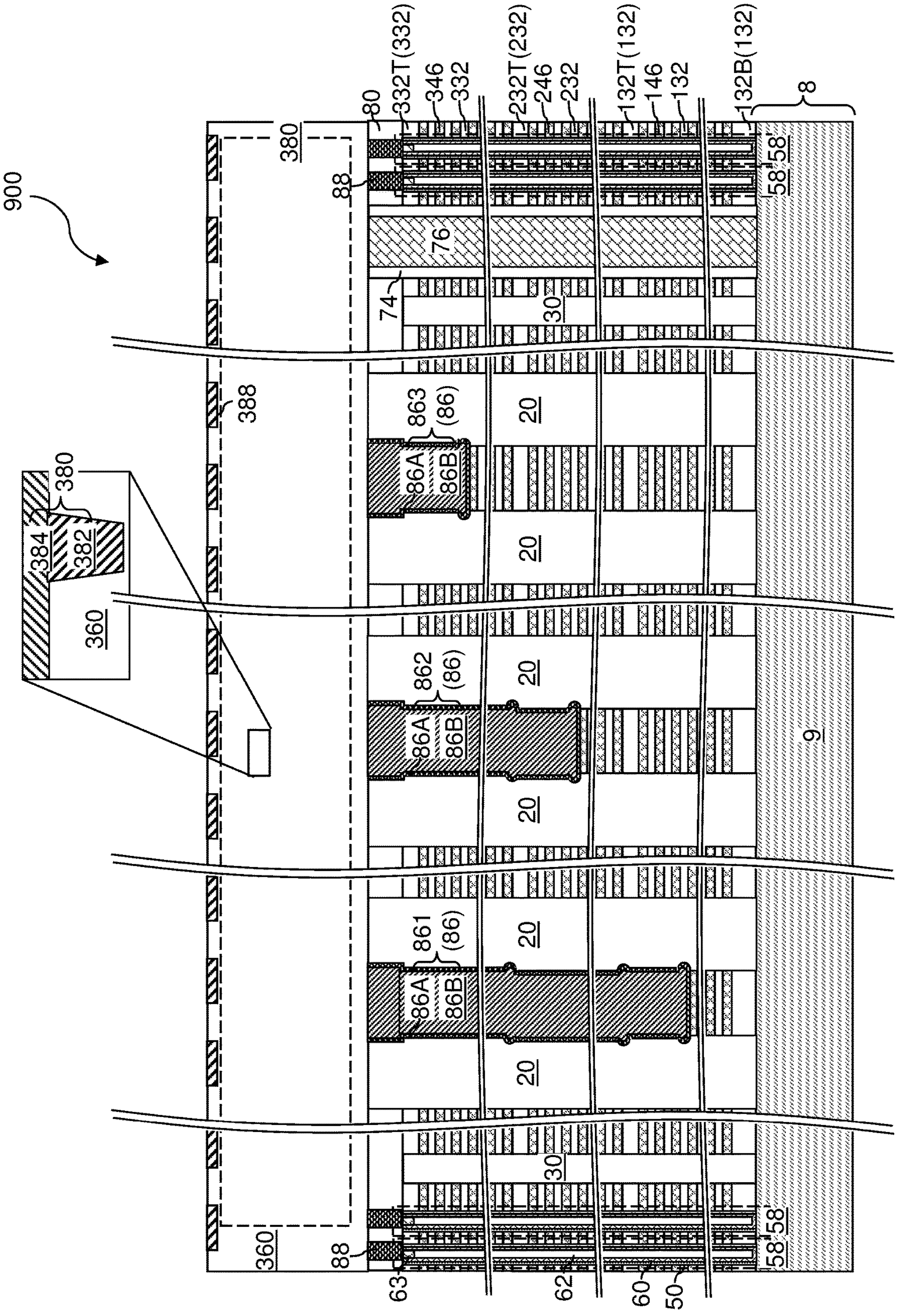
FIG. 35 is a vertical cross-sectional view of the exemplary structure after formation of dielectric material layers and metal interconnect structures according to an embodiment of the present disclosure.

Referring to FIG. 35, memory-side metal interconnect structures 380 and memory-side dielectric material layers 360 may be formed above the contact-level dielectric layer 80. The memory-side metal interconnect structures 380 can be embedded within the memory-side dielectric material layers 360. The memory-side metal interconnect structures 380 may comprise upper metal via structures 382 and upper metal line structures 384. In one embodiment, the upper metal via structures 382 may have a respective lateral extent that increases with a vertical distance upward from a topmost surface of the at least one alternating stack {(132, 146), (232, 246), (332, 346)}. The memory-side metal interconnect structures 380 may comprise bit lines that are electrically connected to a respective subset of the drain regions 63 through a respective subset of the drain contact via structures 88. Memory-side bonding pads 388 may be formed at the topmost level of the memory-side dielectric material layers 380. The exemplary structure can include at least one memory die 900, which may be a plurality of memory dies 900 such as a two-dimensional array of memory dies 900 formed on the substrate 8.

Figure 36:
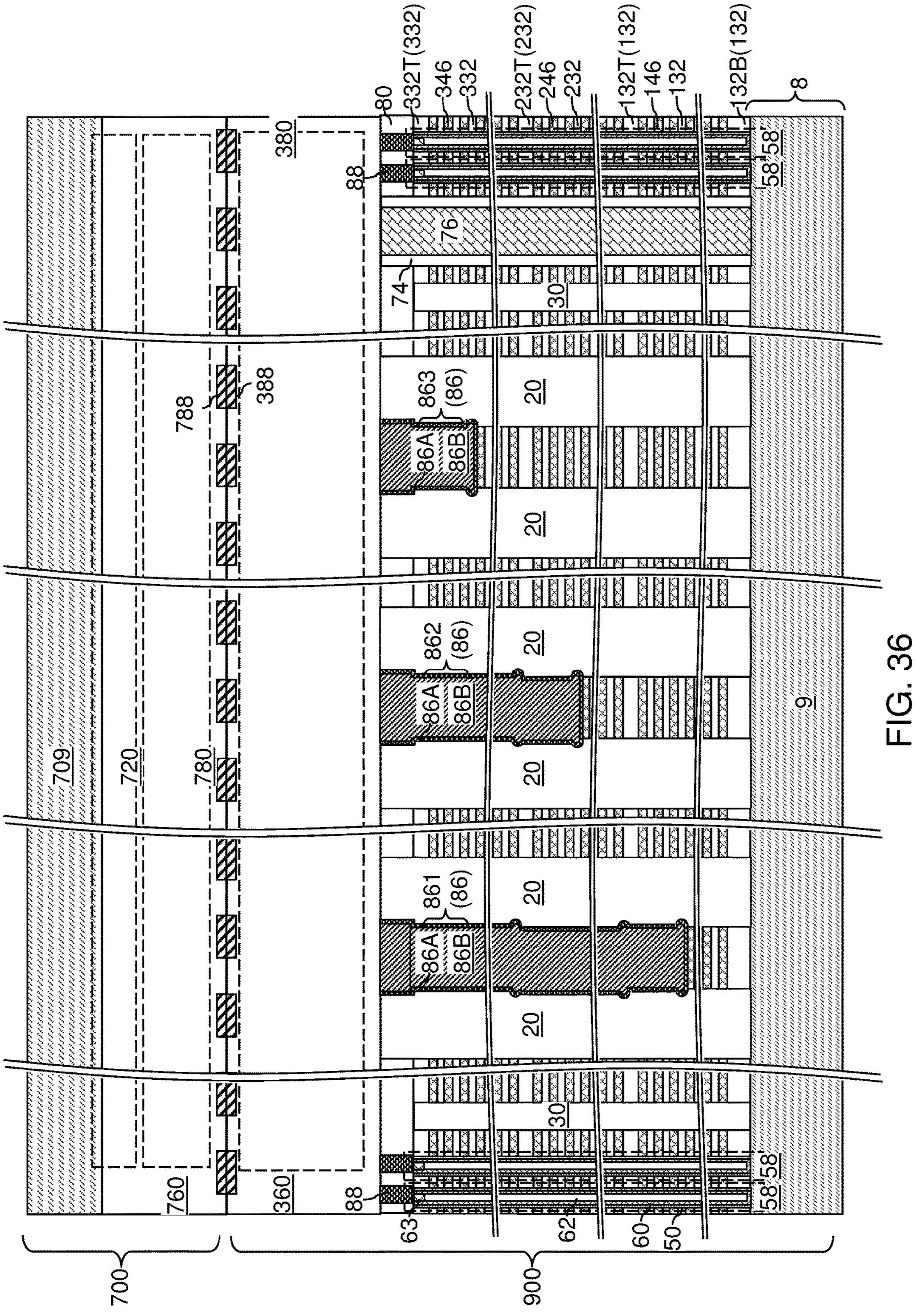
FIG. 36 is a vertical cross-sectional view of the exemplary structure after attaching a logic die to a memory die according to an embodiment of the present disclosure.

Referring to FIG. 36, a logic die 700 can be provided. The logic die 700 comprises a logic-side substrate 709 (which may be a semiconductor substrate), logic-side semiconductor devices 720 which includes a peripheral circuitry for controlling operation of the three-dimensional memory device within the memory die 900, logic-side metal interconnect structures 780 embedded within logic-side dielectric material layers 760, and logic-side bonding pads 788 configured to mate with the memory-die bonding pads 388. The logic-side metal interconnect structures 780 may comprise logic-side metal lines 784 and logic-side metal via structures 782. The logic-side metal via structures 782 may have a respective variable lateral extent that increases with a vertical distance from a horizontal plane including an interface between the logic-side substrate 709 and the logic-side dielectric material layers 760.

Generally, the logic-side semiconductor devices 720 comprise the control circuitry configured to control operation of the vertical stack of memory elements within each memory opening fill structure 58 in the memory die 900. The logic-side semiconductor devices 720 may be electrically connected to the logic-side bonding pads 788 through the logic-side metal interconnect structures 780. Thus, the logic-side bonding pads 788 are electrically connected to the logic-side semiconductor devices 720 through the logic-side metal interconnect structures 780.

The logic die 700 can be attached to the memory die 900, for example, by bonding the memory-side bonding pads 388 with the logic-side bonding pads 788. For example, the memory-side bonding pads 388 can be bonded with the logic-side bonding pads 788 by metal-to-metal bonding such as copper-to-copper bonding. In some embodiments, hybrid bonding may be employed, in which contacting surfaces of the memory-side dielectric material layers 960 and the logic-side dielectric material layers 760 are bonded through dielectric-to-dielectric bonding (such as oxide-to-oxide bonding). In one embodiment, a plurality of logic dies 700 such as a two-dimensional array of logic dies 700 may be provided on the logic-side substrate, and the plurality of logic dies 700 may be simultaneously bonded to a plurality of memory dies 900 employing wafer-to-wafer bonding.

Figure 37:
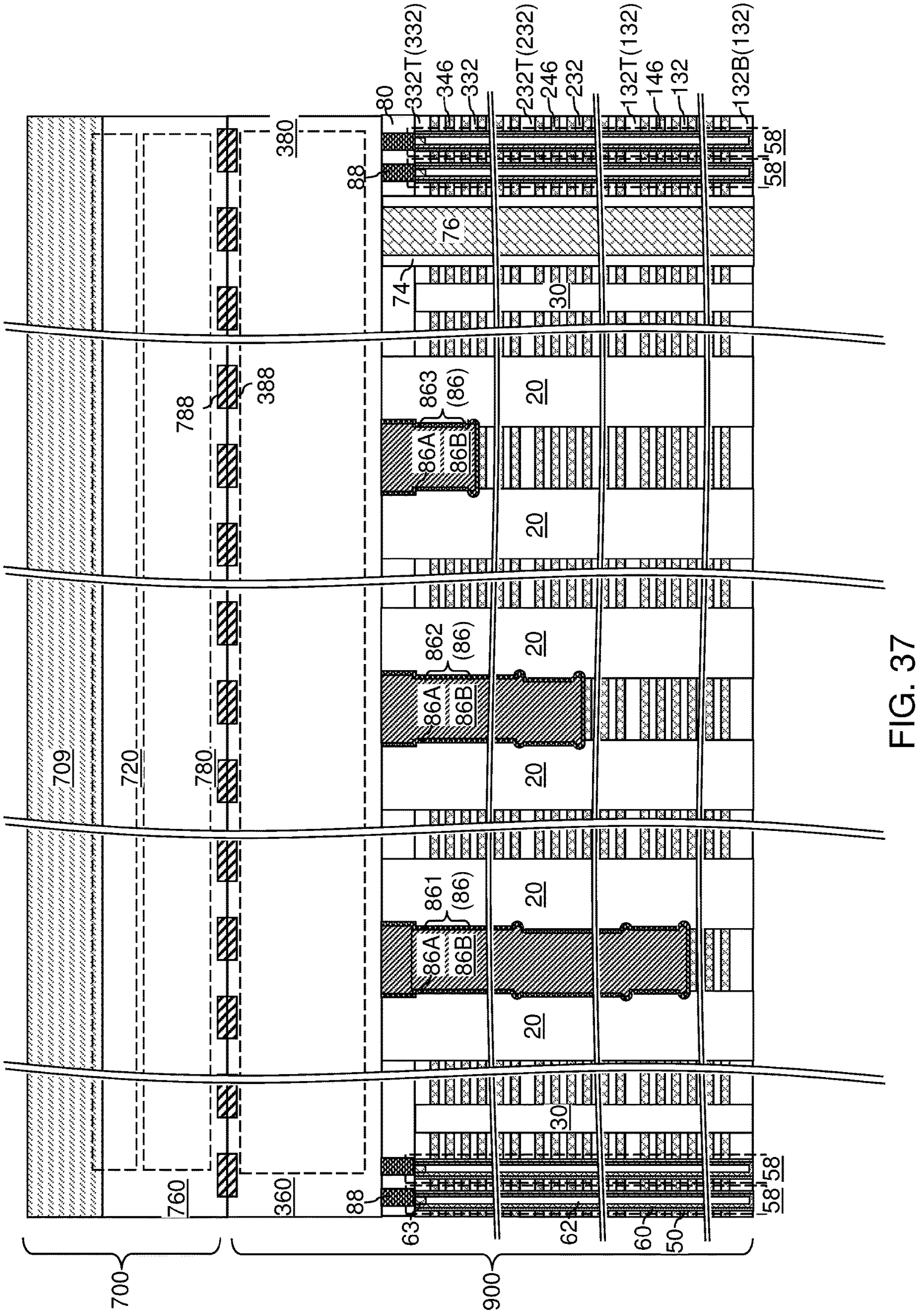
FIG. 37 is a vertical cross-sectional view of the exemplary structure after removal of a carrier substrate according to an embodiment of the present disclosure.

Referring to FIG. 37, in case the substrate 8 is a carrier substrate, the substrate 8 may be removed from the assembly of the memory die 900 and the logic die 700. For example, the substrate 8 may be removed from the backside by grinding, polishing, at least one isotropic etch process, at least one anisotropic etch process, or a combination thereof. Alternative schemes for removing the substrate 8, such as cleaving of the substrate 8 or removal of a sacrificial material layer (not shown) within the substrate 8, may be employed to remove the substrate 8. Bottom surfaces of the memory opening fill structures 58 can be physically exposed after removal of the substrate 8.

Figure 38:
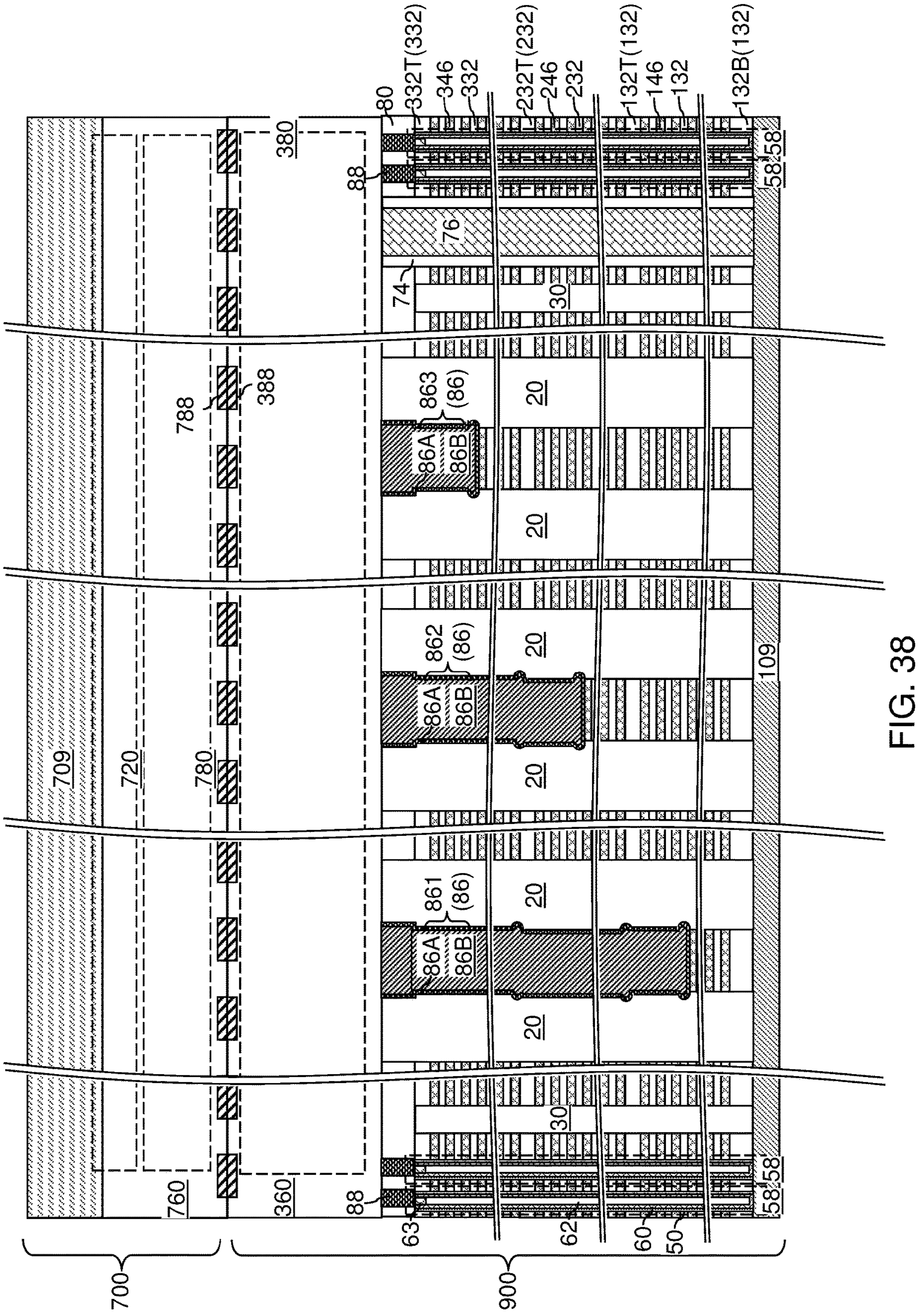
FIG. 38 is a vertical cross-sectional view of the exemplary structure after formation of a source layer according to an embodiment of the present disclosure.

Referring to FIG. 38, a source layer 109 may be formed on the backside, i.e., the bottom side, of the at least one alternating stack {(132, 146), (232, 246), (332, 346)} directly on a bottom end of each vertical semiconductor channel 60 or on the bottom end of the semiconductor pedestals 11 if present. The source layer 109 may comprise a metallic material (such as a combination of a metallic barrier material (e.g., TiN) and a high-conductivity metal (such as W, Cu, etc.), and/or may comprise a doped semiconductor material (e.g., polysilicon) having a doping of a second conductivity type that is the opposite of the first conductivity type.

Figure 39:
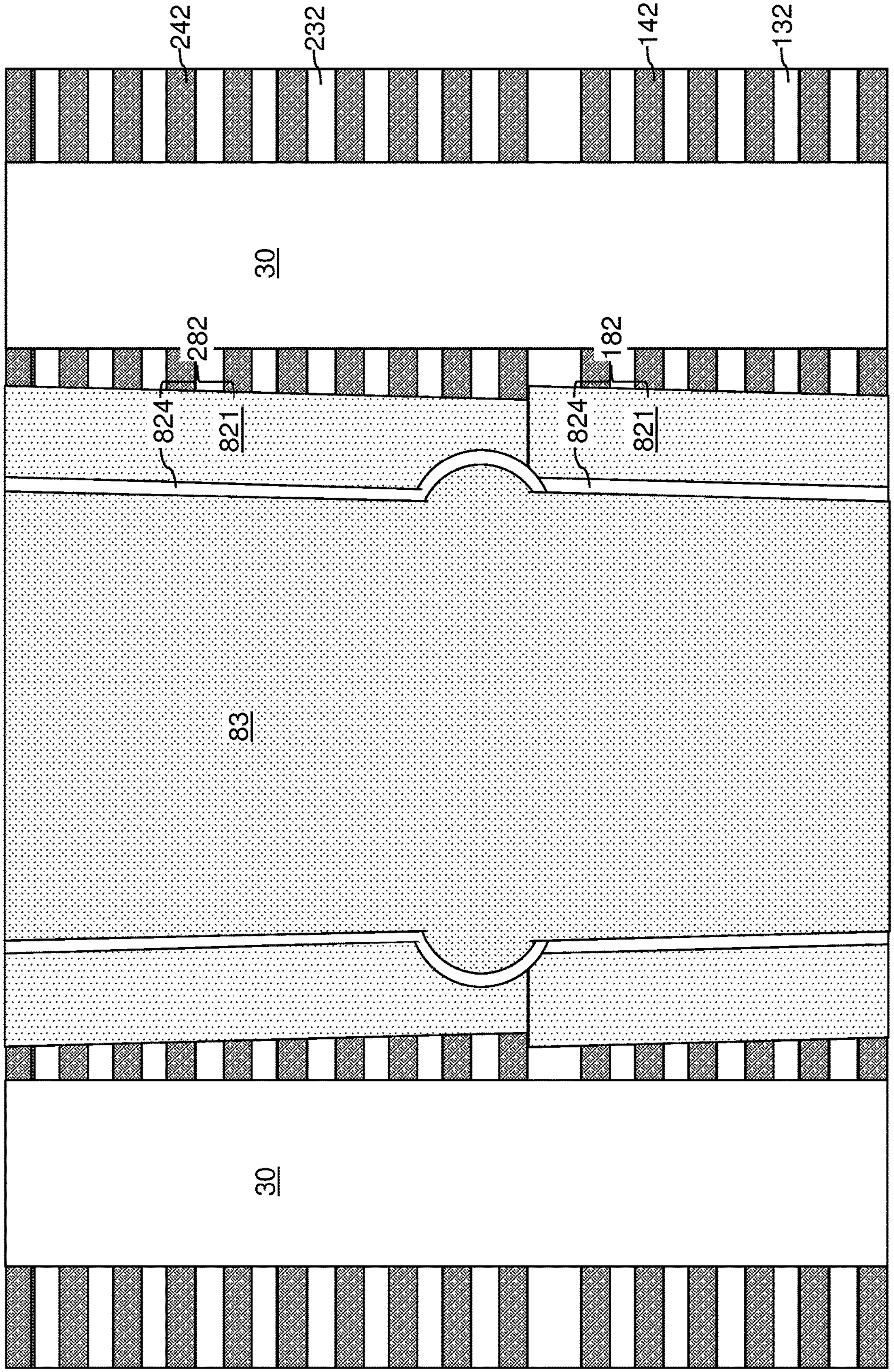
FIG. 39 is a vertical cross-sectional view of a region of an alternative configuration of the exemplary structure after formation of sacrificial via fill structures according to an embodiment of the present disclosure.

Referring to FIG. 39, a region in an alternative configuration of the exemplary structure is illustrated after formation of sacrificial via fill structures 83, i.e., after the processing steps described with reference to FIGS. 19A and 19B. The alternative configuration of the exemplary structure can be derived from the exemplary structure illustrated in FIGS. 13A and 13B by replacing each primary sacrificial pillar structure stack 27 with a respective supplementary dielectric support pillar structure 30. In other words, each of the primary sacrificial pillar structure stacks 27 and the supplementary sacrificial pillar structure stacks 37 can be removed at the processing steps of FIG. 14 to form pillar cavities, and can be filled with a dielectric material to form dielectric support pillar structures. Thus, the processing steps described with reference to FIGS. 23-26C used to form the expanded support cavities 29' and support pillar structures 20 may be omitted in this alternative embodiment, while still using the double spacer method described with reference to FIGS. 5A-5J.

Each of the dielectric support pillar structures in the alternative configuration of the exemplary structure can be formed as supplementary dielectric support pillar structures 30. Thus, the supplementary dielectric support pillar structures 30 in the alternative configuration of the exemplary structure are herein referred to as dielectric support pillar structures 30.

Figure 40:
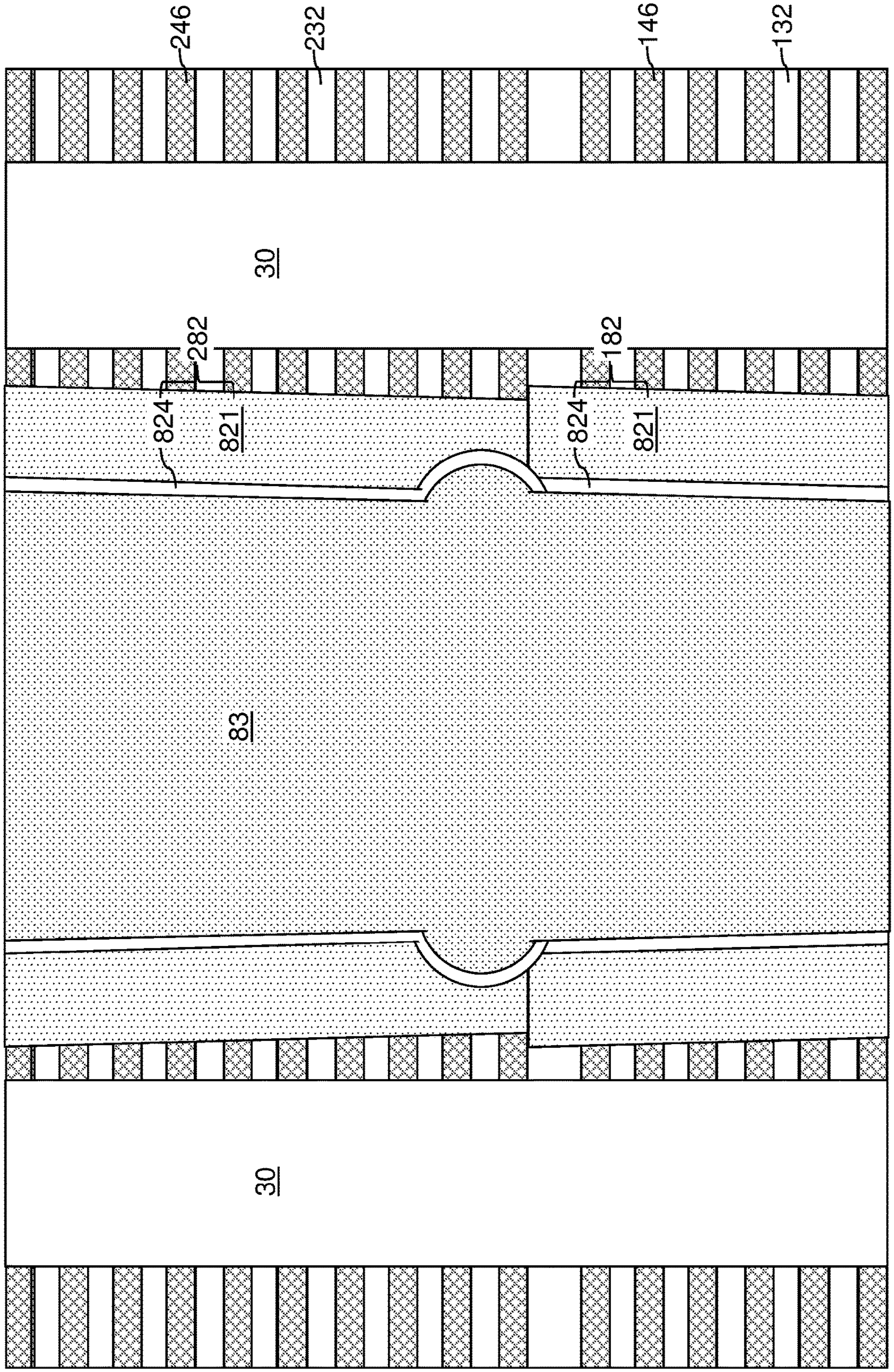
FIG. 40 is a vertical cross-sectional view of a region of the alternative configuration of the exemplary structure after replacement of sacrificial material layers with electrically conductive layers according to an embodiment of the present disclosure.

Referring to FIG. 40, the processing steps described with reference to FIGS. 27A-30B can be performed to replace the sacrificial material layers (142, 242, 342) with electrically conductive layers (146, 246, 346).

Figure 41A:
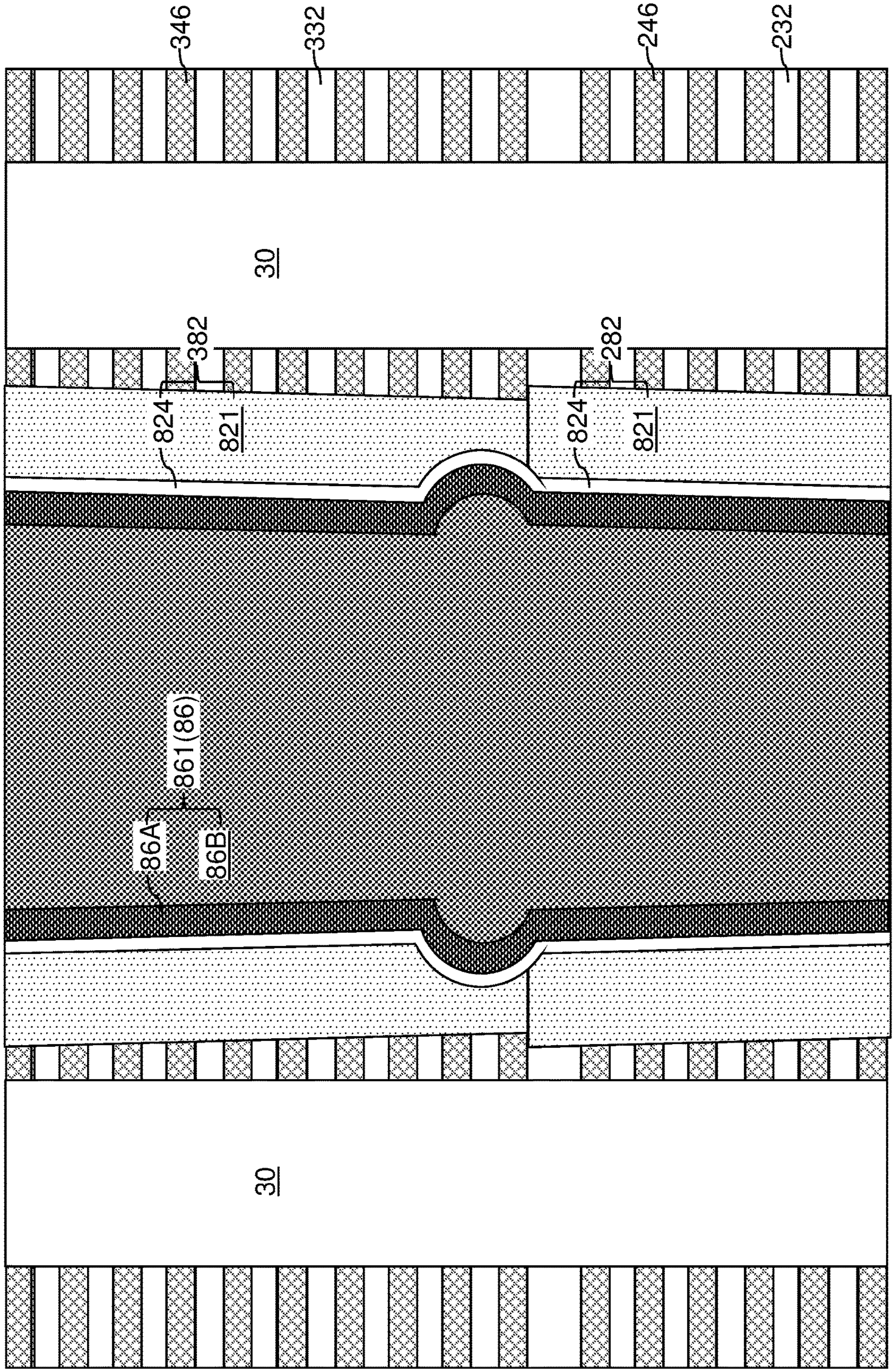
FIGS. 41A, 41B, and 41C are vertical cross-sectional views of a region of the alternative configuration of the exemplary structure after formation of layer contact via structures according to an embodiment of the present disclosure.
Figure 41B:
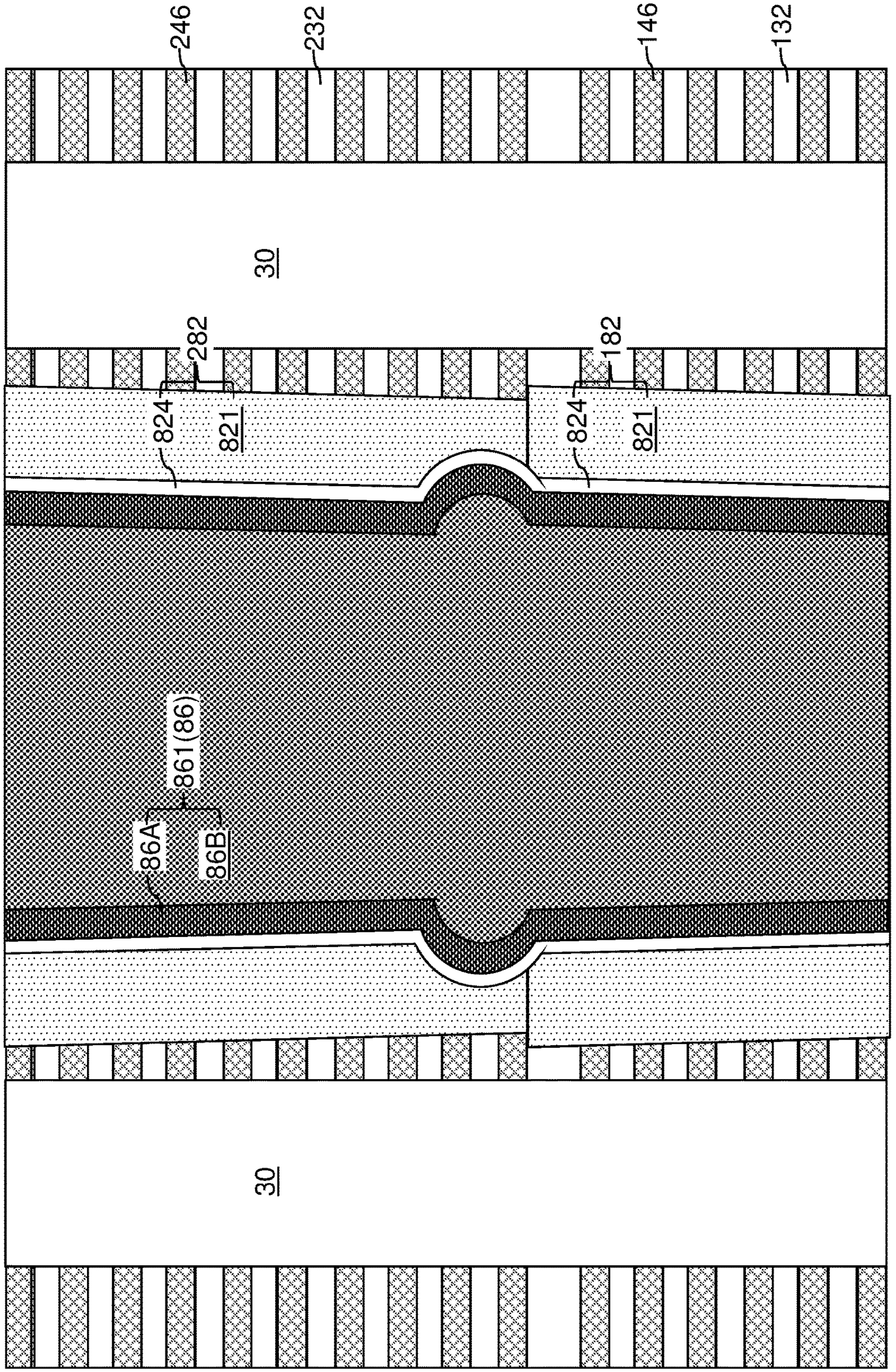
Figure 41C:
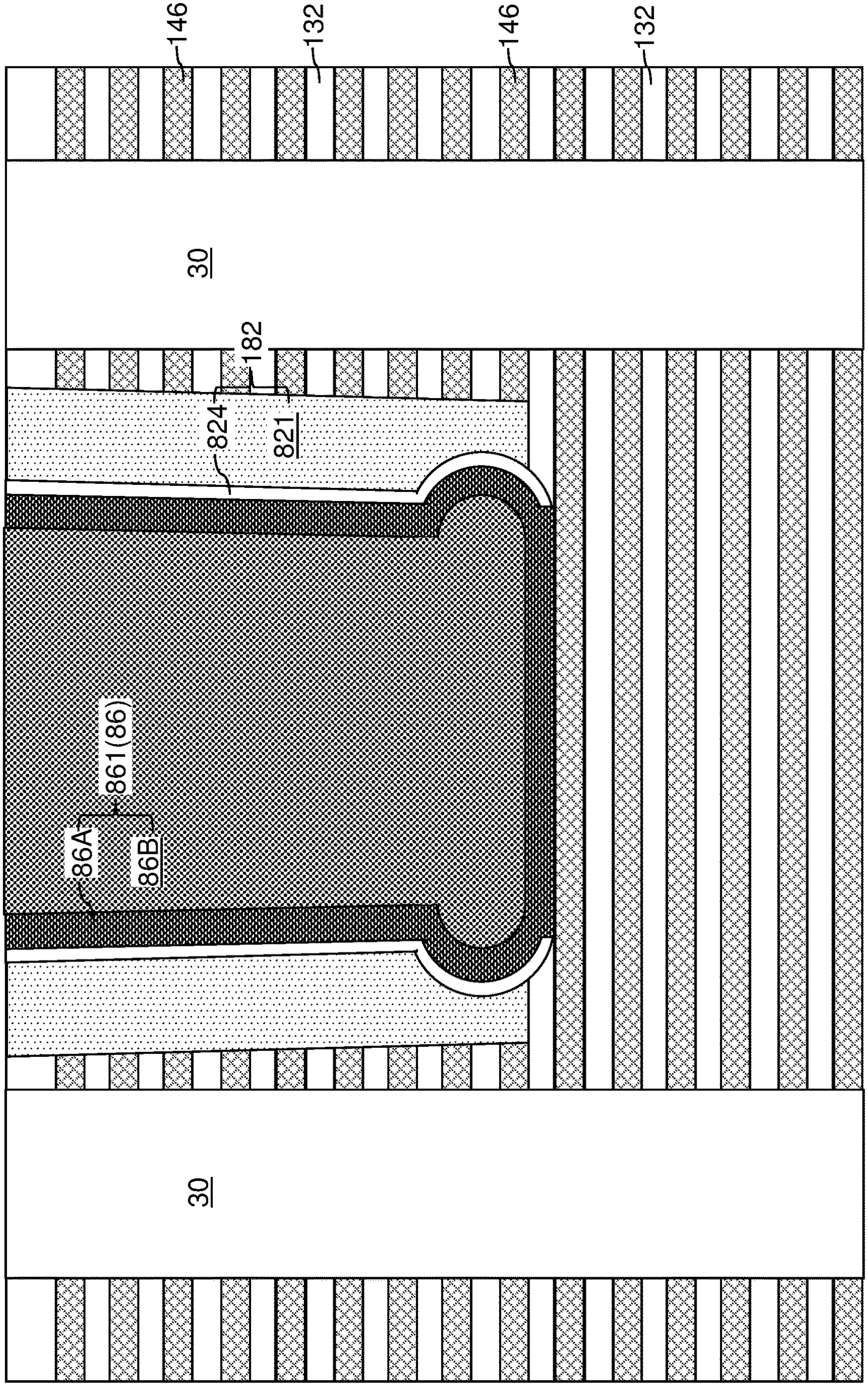

Referring to FIGS. 41A-41C, the processing steps described with reference to FIGS. 31-33H can be performed to replace the sacrificial via fill structures 83 with layer contact via structures 86.

Figure 42A:
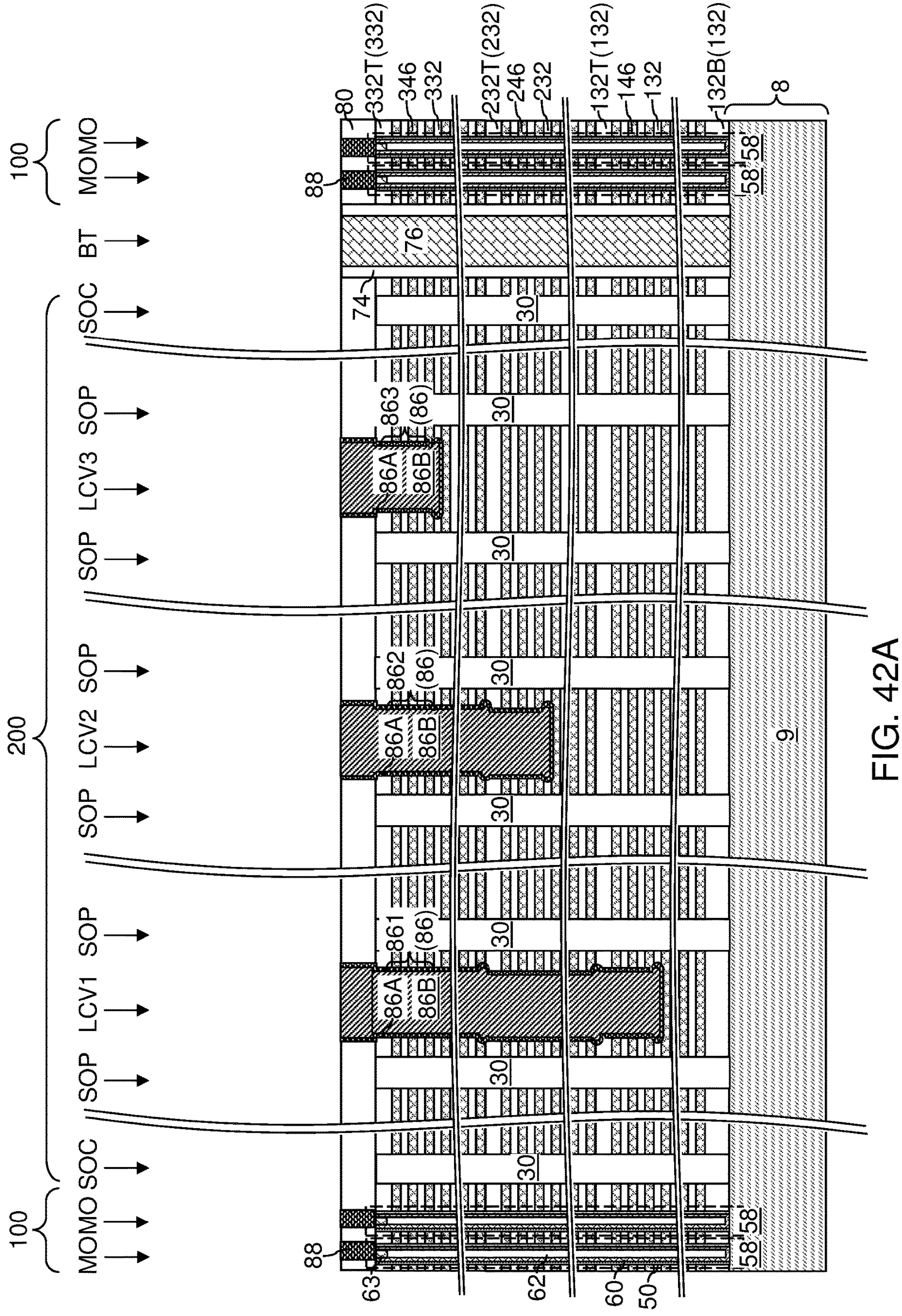
FIG. 42A is a vertical cross-sectional view of the alternative embodiment of the exemplary structure after formation of drain contact via structures according to an embodiment of the present disclosure.
Figure 42B:
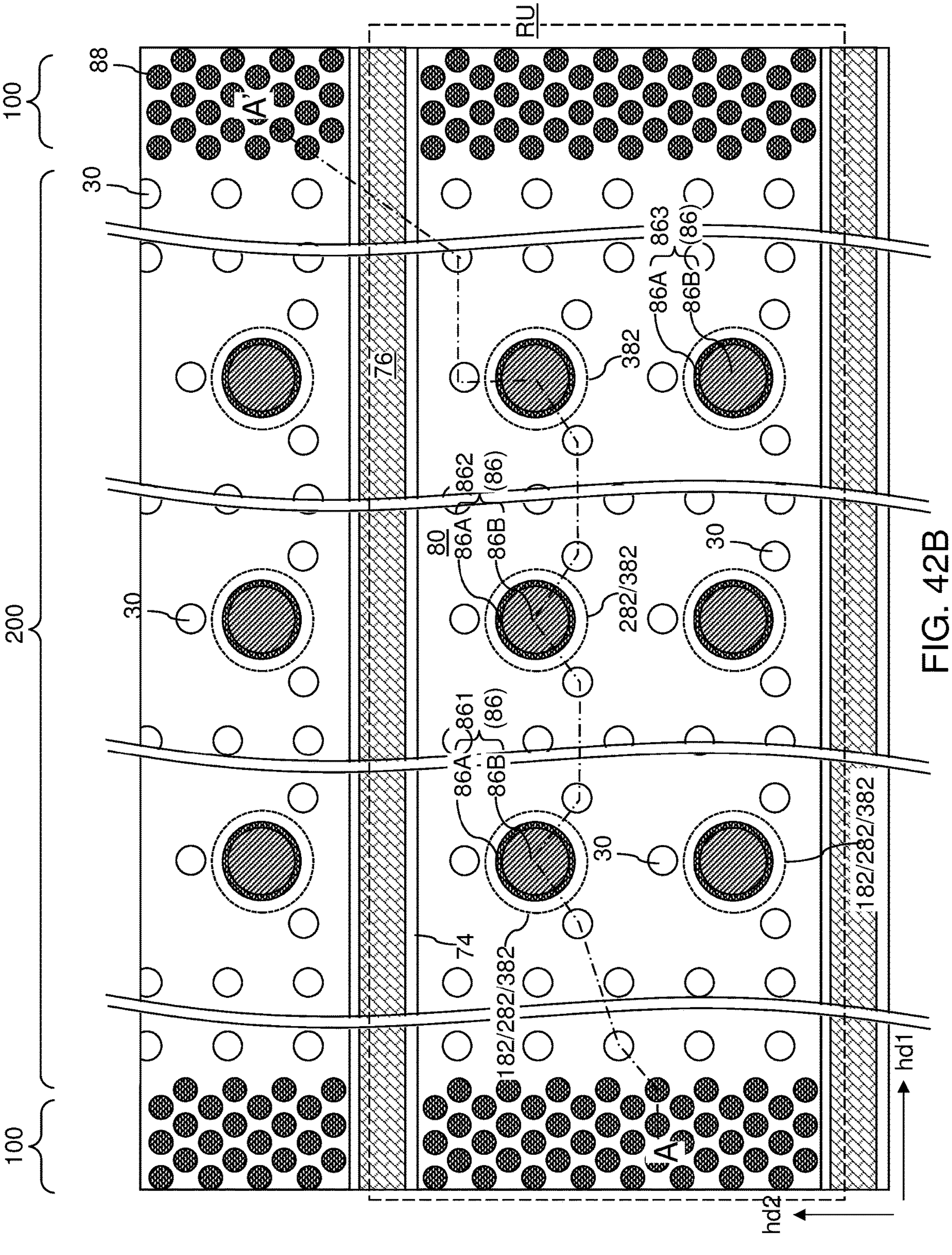
FIG. 42B is a top-down view of the exemplary structure of FIG. 42A. The hinged vertical plane A-A' is a cut plane of the vertical cross-sectional view of FIG. 42A.

Referring to FIGS. 42A and 42B, the processing steps described with reference to FIGS. 34A and 34B may be performed to form drain contact via structures 88.

In the alternative configuration of the exemplary structure, the layer contact via structures 86 may comprise first layer contact via structures 861 that contacts a top surface of a first electrically conductive layer 146, second layer contact via structures 862 that contacts a top surface of a second electrically conductive layer 246, and third layer contact via structures 863 that contacts a top surface of a third electrically conductive layer 346. Each first layer contact via structure 861 can be laterally surrounded by, and can be laterally contacted by, a respective first dielectric spacer 182, a respective second dielectric spacer 282, and a third dielectric spacer 382. Each second layer contact via structure 862 can be laterally surrounded by, and can be laterally contacted by, a respective second dielectric spacer 282 and a respective third dielectric spacer 382. Each third layer contact via structure 863 can be laterally surrounded by, and can be laterally contacted by, a respective third dielectric spacer 382.

Generally speaking, a set of material portions comprising a first sacrificial via fill structure 183 can be replaced with a first layer contact via structure 861 that directly contacts a top surface of a first electrically conductive layer 146, with, or without, intermediate replacement of the first sacrificial via fill structure 183 with a portion of a sacrificial via fill structure 83. A set of material portions comprising a second sacrificial via fill structure 283 can be replaced with a second layer contact via structure 862 that directly contacts a top surface of a second electrically conductive layer 246, with, or without, intermediate replacement of the second sacrificial via fill structure 283 with a portion of a sacrificial via fill structure 83. Each material portion that fills a void 389' in a third via cavity 389 (such as a sacrificial via fill structure 83) may be replaced with a third layer contact via structure 863.

In the alternative configuration of the exemplary structure, each of the dielectric spacers (182, 282, 382) can be formed as a tubular dielectric spacer, i.e., a dielectric spacer having a generally tubular configuration. For example, each first dielectric spacer 182 may comprise a tubular dielectric spacer that laterally encloses a respective first layer contact via structure 861; each second dielectric spacer 282 may comprise a tubular dielectric spacer that laterally encloses a respective first layer contact via structure 861 or a respective second layer contact via structure 862; and each third dielectric spacer 382 may comprise a tubular dielectric spacer that laterally encloses a respective first layer contact via structure 861, a respective second layer contact via structure 862, or a respective third layer contact via structure. Each tubular dielectric spacer may comprise a straight cylindrical outer sidewall that vertically extends from an outer periphery of a top surface of the tubular dielectric spacer to an outer periphery of a bottom surface of the tubular dielectric spacer.

Referring to all drawings and according to various embodiments of the present disclosure, a memory device is provided, which comprises: at least one alternating stack {(132, 142), (232, 246), (332, 346)} of insulating layers (132, 232, 332) and electrically conductive layers (146, 246, 346); memory stack structures 55 vertically extending through the at least one alternating stack {(132, 142), (232, 246), (332, 346)}, wherein each of the memory stack structures 55 comprises a respective vertical stack of memory elements (e.g., portions of the memory film 50) and a vertical semiconductor channel 60; and an electrically conductive layer contact via structure 86 vertically extending through an upper portion of the at least one alternating stack {(132, 142), (232, 246), (332, 346)} and contacting a top surface of one of the electrically conductive layers (146, 246, 346); a plurality of dielectric support pillar structures 20 vertically extending through each layer within the at least one alternating stack {(132, 142), (232, 246), (332, 346)} and contacting a respective first sidewall segment of the layer contact via structure 86; and a plurality of dielectric spacers (182, 282, 382) vertically extending through the upper portion of the at least one alternating stack {(132, 142), (232, 246), (332, 346)} and contacting a respective second sidewall segment of the layer contact via structure 86.

In one embodiment of the present disclosure, at least one of the plurality of dielectric support pillar structures 20 comprises a lower portion which is located under a bottom surface of the layer contact via structure 86.

According to another aspect of the present disclosure, a device structure is provided, which comprises: at least one alternating stack {(132, 142), (232, 246), (332, 346)} of insulating layers (132, 232, 332) and electrically conductive layers (146, 246, 346); memory stack structures 55 vertically extending through the at least one alternating stack {(132, 142), (232, 246), (332, 346)}, wherein each of the memory stack structures 55 comprises a respective vertical stack of memory elements and a vertical semiconductor channel 60; and an electrically conductive layer contact via structure 86 vertically extending through an upper portion of the at least one alternating stack {(132, 142), (232, 246), (332, 346)} and contacting a top surface of one of the electrically conductive layers (146, 246, 346), wherein the layer contact via structure 86 is electrically isolated from each electrically conductive layer within the at least one alternating stack {(132, 142), (232, 246), (332, 346)} that overlies the one of the electrically conductive layers (146, 246, 346) by a set of at least one dielectric isolation structure (182, 282, 382, 20) that comprises a first dielectric spacer 182, and wherein a sidewall of the layer contact via structure 86 comprises a first straight sidewall segment that contacts a first portion of the first dielectric spacer 182 and a first convex surface segment that contacts a concave surface of a second portion of the first dielectric spacer 182.

The various embodiments of the present disclosure may be employed to provide contact via structures that contact a respective electrically conductive layer within an alternating stack of insulating layers and electrically conductive layers without forming a staircase region including stepped surfaces. In one embodiment, the methods and structures of the present disclosure may be employed to provide a three-dimensional memory array including layer contact via structures 86 that contact a respective electrically conductive layer (146, 256, 346) in at least one alternating stack of insulating layers and electrically conductive layers. In a non-limiting example, the methods and structures of the present disclosure may be employed to form a three-dimensional NAND array.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:

at least one alternating stack of insulating layers and electrically conductive layers;

memory stack structures vertically extending through the at least one alternating stack, wherein each of the memory stack structures comprises a respective vertical stack of memory elements and a vertical semiconductor channel;

an electrically conductive layer contact via structure vertically extending through an upper portion of the at least one alternating stack and contacting a top surface of one of the electrically conductive layers;

a plurality of support pillar structures having at least a dielectric outer sidewall vertically extending through each layer within the at least one alternating stack and contacting a respective first sidewall segment of the electrically conductive layer contact via structure; and a plurality of dielectric spacers vertically extending through the upper portion of the at least one alternating stack and contacting a respective second sidewall segment of the electrically conductive layer contact via structure;

wherein each interface between the electrically conductive layer contact via structure and the plurality of support pillar structures has a horizontal cross-sectional profile in which a convex surface segment of the electrically conductive layer contact via structure is in direct contact with a concave surface segment of a respective one of the support pillar structures of the plurality of support pillar structures.

2. The memory device of claim 1, wherein:
the plurality of support pillar structures comprises a plurality of dielectric support pillar structures; and
the plurality of dielectric support pillar structures and the plurality of dielectric spacers are azimuthally interlaced around a vertical axis passing through a center of the electrically conductive layer contact via structure.

3. The memory device of claim 2, wherein:
the plurality of dielectric support pillar structures comprises P dielectric support pillar structures; and
P is an integer greater than 1.

4. The memory device of claim 3, wherein each of the plurality of dielectric spacers is located within a respective azimuthal angle range around the vertical axis that has a magnitude less than $2\pi/P$ radian.

5. The memory device of claim 3, wherein:
the at least one alternating stack comprises M alternating stacks, in which M is an integer greater than 1;
the plurality of dielectric spacers comprises a total of M×P dielectric spacers; and
the M×P dielectric spacers comprises M sets of P dielectric spacers that are azimuthally spaced apart around the vertical axis, wherein each set of respective P dielectric spacers overlies or underlies any other set of respective P dielectric spacers.

6. The memory device of claim 2, wherein:
each of the plurality of dielectric support pillar structures has a respective center and a respective vertical axis passing through the respective center; and
each of the vertical axes of the plurality of dielectric support pillar structures is laterally spaced from the vertical axis passing through the center of the electrically conductive layer contact via structure by a greater lateral distance than any point within the plurality of dielectric spacers is from the vertical axis passing through the center of the electrically conductive layer contact via structure.

7. The memory device of claim 1, wherein at least one of the plurality of dielectric support pillar structures comprises a lower portion which is located under a bottom surface of the electrically conductive layer contact via structure.

8. The memory device of claim 1, wherein each surface segment of the electrically conductive layer contact via structure located above a horizontal plane including a top surface of the one of the electrically conductive layers and below a horizontal surface including a
topmost surface of the at least one alternating stack is in direct contact with one of plurality of support pillar structures or with one of the plurality of dielectric spacers.

9. The memory device of claim 1, wherein:
each of the plurality of support pillar structures is in direct contact with a respective pair of dielectric spacers of the plurality of dielectric spacers; and
each of the plurality of dielectric spacers is in direct contact with a respective pair of the support pillar structures of the plurality of support pillar structures.

10. The memory device of claim 1, wherein:
each of the plurality of support pillar structures is in direct contact with each insulating layer within the at least one alternating stack; and
each insulating layer within the at least one alternating stack that overlies the one of the electrically conductive layers is in direct contact with at least two dielectric spacers of the plurality of dielectric spacers.

11. The memory device of claim 1, further comprising a contact-level dielectric layer that overlies the at least one alternating stack, wherein:
top surfaces of the plurality of support pillar structures located within a horizontal plane including a top surface of the contact-level dielectric layer; and
topmost surfaces of the plurality of dielectric spacers are located within a horizontal plane including top surfaces of the at least one alternating stack.

12. The memory device of claim 1, wherein each interface between the electrically conductive layer contact via structure and a respective one of the plurality of support pillar structures vertically extends from the one of the electrically conductive layers to a horizontal plane including a topmost surface of the at least one alternating stack.

13. The memory device of claim 1, wherein each of the plurality of dielectric spacers comprises at least one laterally-extending fin portion which is located at a level of a respective one of the electrically conductive layers, has a respective horizontally-extending top surface contacting a respective overlying insulating layer within the at least one alternating stack, and has a respective horizontally-extending bottom surface segment contacting a respective underlying insulating layer within the at least one alternating stack.

14. The memory device of claim 1, further comprising:
additional memory stack structures vertically extending through the at least one alternating stack, wherein the memory stack structure and the additional memory stack structures comprise a three-dimensional array of memory elements; and
the electrically conductive layers comprise word lines for the three-dimensional array of memory elements.

15. A memory device, comprising:
at least one alternating stack of insulating layers and electrically conductive layers;
memory stack structures vertically extending through the at least one alternating stack, wherein each of the memory stack structures comprises a respective vertical stack of memory elements and a vertical semiconductor channel;
an electrically conductive layer contact via structure vertically extending through an upper portion of the at least one alternating stack and contacting a top surface of one of the electrically conductive layers;
a plurality of support pillar structures having at least a dielectric outer sidewall vertically extending through each layer within the at least one alternating stack and contacting a respective first sidewall segment of the electrically conductive layer contact via structure; and
a plurality of dielectric spacers vertically extending through the upper portion of the at least one alternating stack and contacting a respective second sidewall segment of the electrically conductive layer contact via structure;
wherein:
each of the plurality of support pillar structures is in direct contact with a respective pair of dielectric spacers of the plurality of dielectric spacers; and
each of the plurality of dielectric spacers is in direct contact with a respective pair of the support pillar structures of the plurality of support pillar structures.

16. A memory device, comprising:
at least one alternating stack of insulating layers and electrically conductive layers;
memory stack structures vertically extending through the at least one alternating stack, wherein each of the memory stack structures comprises a respective vertical stack of memory elements and a vertical semiconductor channel;

an electrically conductive layer contact via structure vertically extending through an upper portion of the at least one alternating stack and contacting a top surface of one of the electrically conductive layers;

a plurality of support pillar structures having at least a dielectric outer sidewall vertically extending through each layer within the at least one alternating stack and contacting a respective first sidewall segment of the electrically conductive layer contact via structure; and a plurality of dielectric spacers vertically extending through the upper portion of the at least one alternating stack and contacting a respective second sidewall segment of the electrically conductive layer contact via structure;

wherein:

each of the plurality of support pillar structures is in direct contact with each insulating layer within the at least one alternating stack; and each insulating layer within the at least one alternating stack that overlies the one of the electrically conductive layers within the at least one alternating stack is in direct contact with at least two dielectric spacers of the plurality of dielectric spacers.

* * * * *